US011620936B2

(12) United States Patent
Pan

(10) Patent No.: US 11,620,936 B2
(45) Date of Patent: Apr. 4, 2023

(54) INTEGRATED ACTIVE-MATRIX LIGHT EMITTING PIXEL ARRAYS BASED DEVICES BY LASER-ASSISTED BONDING

(71) Applicant: Shaoher Pan, Palo Alto, CA (US)

(72) Inventor: Shaoher Pan, Palo Alto, CA (US)

(73) Assignee: Shaoher Pan, Palo Alto City, CA (US)

( * ) Notice: Subject to any disclaimer, the term of this patent is extended or adjusted under 35 U.S.C. 154(b) by 237 days.

(21) Appl. No.: 17/078,006

(22) Filed: Oct. 22, 2020

(65) Prior Publication Data

US 2021/0110762 A1 Apr. 15, 2021

Related U.S. Application Data

(60) Division of application No. 16/675,107, filed on Nov. 5, 2019, now Pat. No. 10,847,083, which is a
(Continued)

(51) Int. Cl.
*G09G 3/32* (2016.01)
*H01L 27/32* (2006.01)
*H01L 25/00* (2006.01)

(52) U.S. Cl.
CPC .............. *G09G 3/32* (2013.01); *H01L 25/50* (2013.01); *H01L 27/3262* (2013.01); *G09G 2310/0221* (2013.01); *G09G 2330/021* (2013.01)

(58) Field of Classification Search
CPC ............. G09G 3/32; G09G 2310/0221; G09G 2330/021; H01L 25/50; H01L 27/3262;
(Continued)

(56) References Cited

U.S. PATENT DOCUMENTS

| 5,827,753 A | 10/1998 | Huang et al. |
| 6,844,903 B2 | 1/2005 | Mueller-Mach et al. |

(Continued)

FOREIGN PATENT DOCUMENTS

| CN | 102751296 | 10/2012 |
| JP | 2002-141492 | 5/2002 |

(Continued)

OTHER PUBLICATIONS

Horng et al., "Performance of GaN-based Light-emitting Diodes Fabricated Using GaN Epilayers Grown on Silicon Substrates," Optics Express, 22(1):179-187.
(Continued)

*Primary Examiner* — S M Sohel Imtiaz

(57) ABSTRACT

Integrated active-matrix light emitting pixel arrays based displays and methods of fabricating the integrated displays are provided. One of the methods include: forming first color light emitting diodes (LEDs) and respective intermediate metallic layers on a first substrate, integrating the first color LEDs with pixel circuits in a backplane device, injecting laser pulses into particular first color LEDs, such that each particular first color LED is individually separated from the first substrate and locally bonded with a respective pixel circuit through a respective intermediate metallic layer, and removing the first substrate from the backplane device. The backplane device bonded with the particular first color LEDs can be further bonded with other different color LEDs formed on other substrates. Other first color LEDs without exposure of the laser pulses are removed with the first substrate and can be further used to integrate with another backplane device bonded with another color LEDs.

25 Claims, 63 Drawing Sheets

Related U.S. Application Data continuation-in-part of application No. 16/601,542, filed on Oct. 14, 2019, now Pat. No. 11,011,669.

(58) Field of Classification Search
CPC ..... H01L 25/16; H01L 33/62; H01L 25/0753; H01L 27/15

See application file for complete search history.

(56) References Cited

U.S. PATENT DOCUMENTS

| | | | |
|---|---|---|---|
| 7,248,310 | B2 | 7/2007 | Mueller-Mach et al. |
| 7,956,370 | B2 | 6/2011 | Pan |
| 8,642,363 | B2 | 2/2014 | Lau et al. |
| 8,674,383 | B2 | 3/2014 | Pan |
| 9,184,211 | B2 | 11/2015 | Hirakata |
| 9,287,382 | B1 | 3/2016 | Lee et al. |
| 9,423,535 | B1 | 8/2016 | Hu et al. |
| 9,905,602 | B2 | 2/2018 | Takahashi et al. |
| 10,079,265 | B1 | 9/2018 | Wu et al. |
| 10,128,308 | B1 | 11/2018 | Shin et al. |
| 10,325,894 | B1 | 6/2019 | Pan |
| 10,437,402 | B1 | 10/2019 | Pan |
| 10,847,083 | B1 | 11/2020 | Pan |
| 2003/0025118 | A1 | 2/2003 | Yamazaki et al. |
| 2003/0082889 | A1 | 5/2003 | Maruyama et al. |
| 2004/0238827 | A1 | 12/2004 | Takayama et al. |
| 2008/0116468 | A1 | 5/2008 | Radkov et al. |
| 2009/0032799 | A1 | 2/2009 | Pan |
| 2010/0308300 | A1 | 12/2010 | Pan |
| 2011/0062434 | A1* | 3/2011 | Eguchi ............. H01L 27/12 257/E29.095 |
| 2011/0177636 | A1 | 7/2011 | Pan et al. |
| 2011/0193056 | A1 | 8/2011 | Wang |
| 2011/0309378 | A1 | 12/2011 | Lau et al. |
| 2012/0146066 | A1 | 6/2012 | Tischler et al. |
| 2012/0169682 | A1 | 7/2012 | Kuhlman et al. |
| 2012/0205695 | A1 | 8/2012 | Lin et al. |
| 2012/0223875 | A1* | 9/2012 | Lau ............. H05B 45/44 345/82 |
| 2012/0241809 | A1 | 9/2012 | Pan et al. |
| 2014/0063393 | A1 | 3/2014 | Zhong et al. |
| 2014/0111404 | A1* | 4/2014 | Omata ............. G09G 3/32 345/76 |
| 2014/0152619 | A1 | 6/2014 | Hotelling et al. |
| 2014/0225838 | A1 | 8/2014 | Gupta et al. |
| 2014/0264268 | A1 | 9/2014 | Tseng et al. |
| 2014/0367633 | A1 | 12/2014 | Bibi et al. |
| 2015/0070616 | A1 | 3/2015 | Ogasawara et al. |
| 2015/0072450 | A1 | 3/2015 | El-Ghoroury et al. |
| 2015/0091849 | A1 | 4/2015 | Ludden |
| 2015/0332635 | A1 | 11/2015 | Lau et al. |
| 2015/0362165 | A1 | 12/2015 | Chu et al. |
| 2016/0163765 | A1* | 6/2016 | Hu ............. H01L 51/0097 438/34 |
| 2016/0254274 | A1* | 9/2016 | Li ............. H01L 27/3272 257/72 |
| 2016/0259368 | A1 | 9/2016 | Bibl et al. |
| 2016/0284652 | A1 | 9/2016 | Kanaoka et al. |
| 2016/0299395 | A1 | 10/2016 | Kosuge et al. |
| 2016/0313848 | A1 | 10/2016 | Rhee |
| 2016/0336304 | A1 | 11/2016 | Wu et al. |
| 2017/0069611 | A1 | 3/2017 | Zhang et al. |
| 2017/0069612 | A1 | 3/2017 | Zhang et al. |
| 2017/0123529 | A1 | 5/2017 | Ho |
| 2017/0179097 | A1 | 6/2017 | Zhang et al. |
| 2017/0179192 | A1 | 6/2017 | Zhang et al. |
| 2017/0185193 | A1 | 6/2017 | Kim |
| 2017/0186778 | A1* | 6/2017 | Miyake ............. H01L 29/7786 |
| 2017/0250167 | A1 | 8/2017 | Bower et al. |
| 2017/0279019 | A1 | 9/2017 | Ueda et al. |
| 2017/0330867 | A1 | 11/2017 | Zou et al. |
| 2017/0352791 | A1 | 12/2017 | Kang |
| 2018/0102085 | A1* | 4/2018 | Pan ............. H01L 33/30 |
| 2018/0114800 | A1 | 4/2018 | Pan |
| 2018/0190615 | A1* | 7/2018 | Pan ............. G06F 3/044 |
| 2018/0190744 | A1* | 7/2018 | Oh ............. H01L 29/66765 |
| 2018/0197894 | A1 | 7/2018 | Shi |
| 2018/0308420 | A1* | 10/2018 | Shin ............. H04N 25/76 |
| 2019/0096976 | A1 | 3/2019 | Jang et al. |
| 2019/0148409 | A1* | 5/2019 | Bang ............. H01L 23/367 345/173 |
| 2019/0214529 | A1 | 7/2019 | Ahmed |
| 2019/0348588 | A1 | 11/2019 | Hsieh |
| 2019/0371856 | A1 | 12/2019 | Cha et al. |
| 2020/0395403 | A1* | 12/2020 | Ahmed ............. H01L 27/322 |

FOREIGN PATENT DOCUMENTS

| | | |
|---|---|---|
| JP | 2007-005372 | 1/2007 |
| WO | WO 2013-105347 | 7/2013 |

OTHER PUBLICATIONS

Huang et al., "Static active-matrix OLED Display without Pixel Refresh Enabled by Amorphous-silicon Non-volatile Memory," Journal of the SID, 18/11, 2010, pp. 879-883.

Setlur, "Phosphors for LED-based Solid-State Lighting," The Electrochemical Society Interface, Winter 2009, pp. 32-36.

Singh et al., "Design and Fabrication of InGaN/GaN MQWs Blue LED on Sapphire Substrate for High Voltage Operation," IRACST—Engineering Science and Technology: An International Journal (ESTIJ), ISSN: 2250-3498, 5(4):299-301, Aug. 2015.

Authorized officer Sang Bum Chin, International Search Report and Written Opinion in PCT/US2017/056378, dated Mar. 6, 2018, 17 pages.

Non-final Office Action in U.S. Appl. No. 15/291,330, dated Aug. 1, 2018, 54 pages.

Cheng et al., "Epitaxial Lift-off Process for Gallium Arsenide Substrate Reuse and Flexible Electronics," Nature Communications, published Mar. 12, 2013, 7 pages.

Hayes and Clemens, "Laser Liftoff of GaAs Thin Films," (Aug. 8, 2014) [online] (retrieved from https://arxiv.org/abs/1408.1977v1), 23 pages.

Isabel and Mathivathani, "Fabrication of GaN LED's by Wafer Bonding and Lift-off Techniques: a Review," International Journal of Latest Trends in Engineering and Technology, 2015, 5(3):232-247.

* cited by examiner

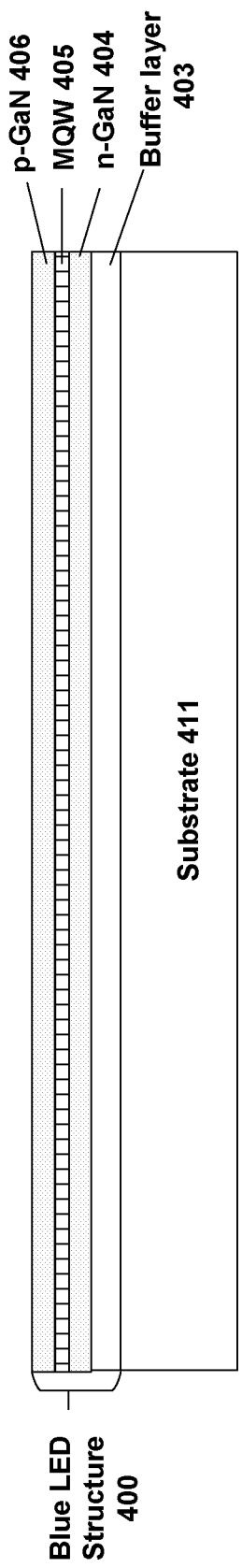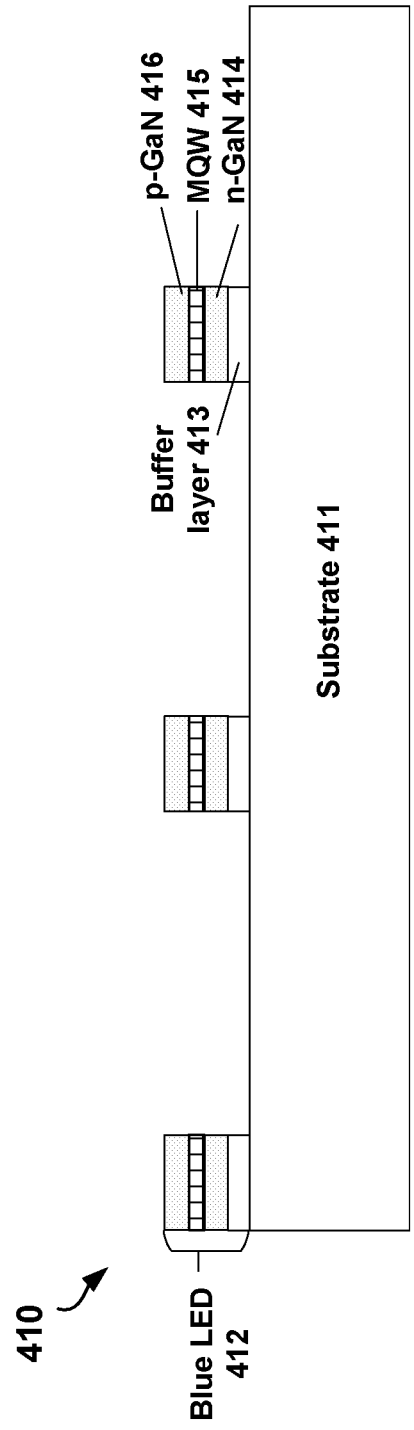
FIG. 4B-1
FIG. 4B-2

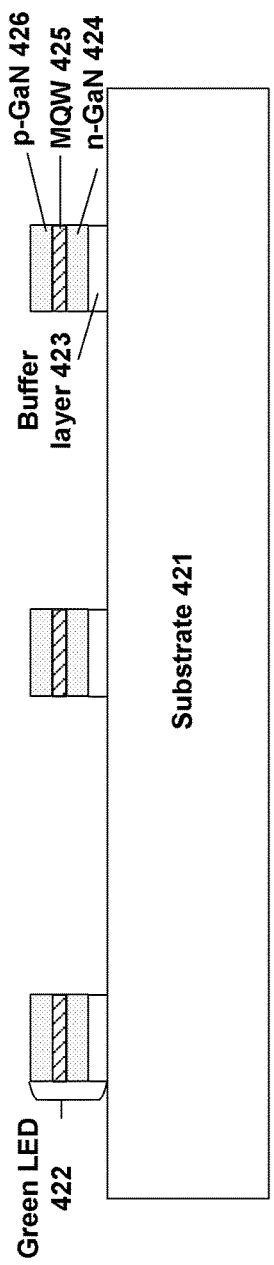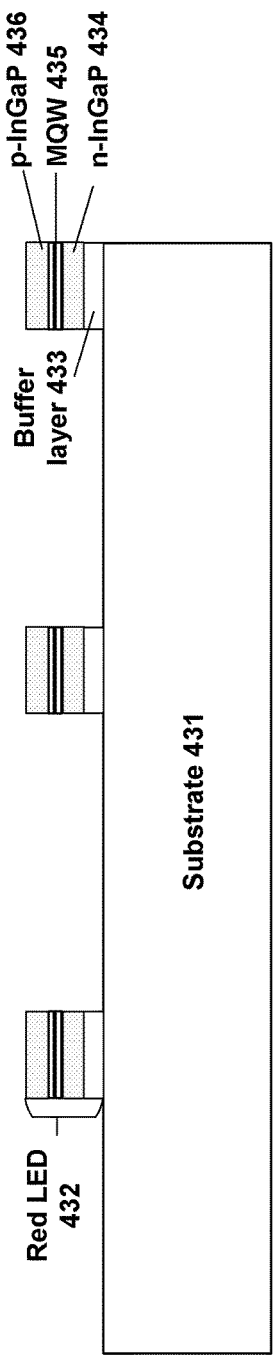
FIG. 4C-1
FIG. 4C-2

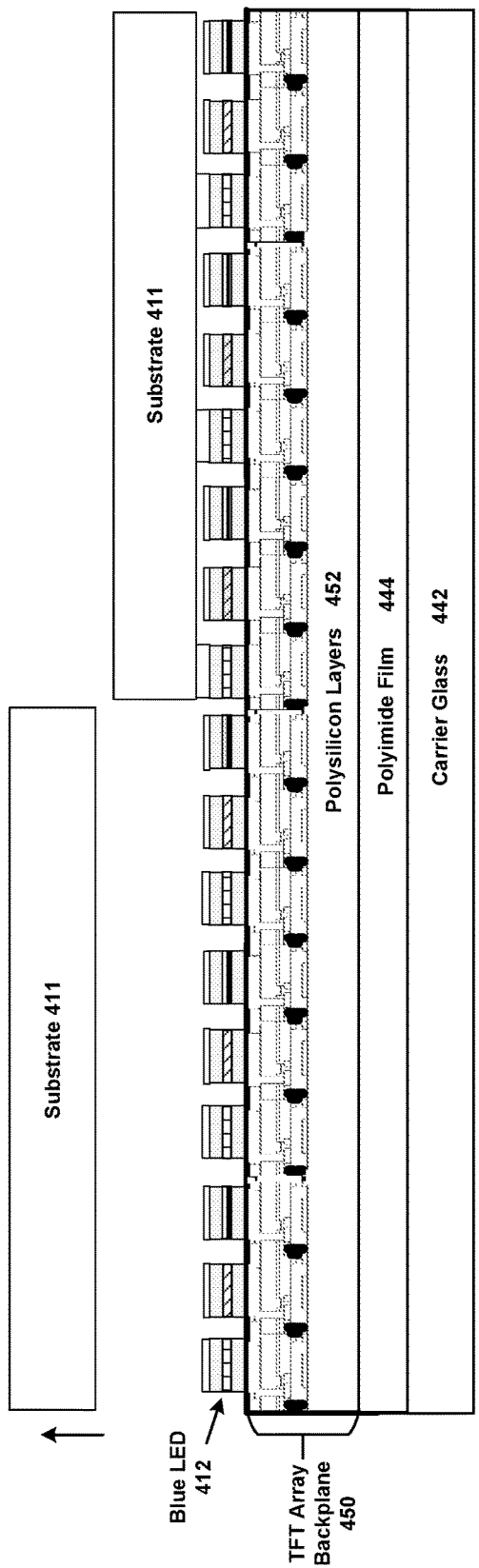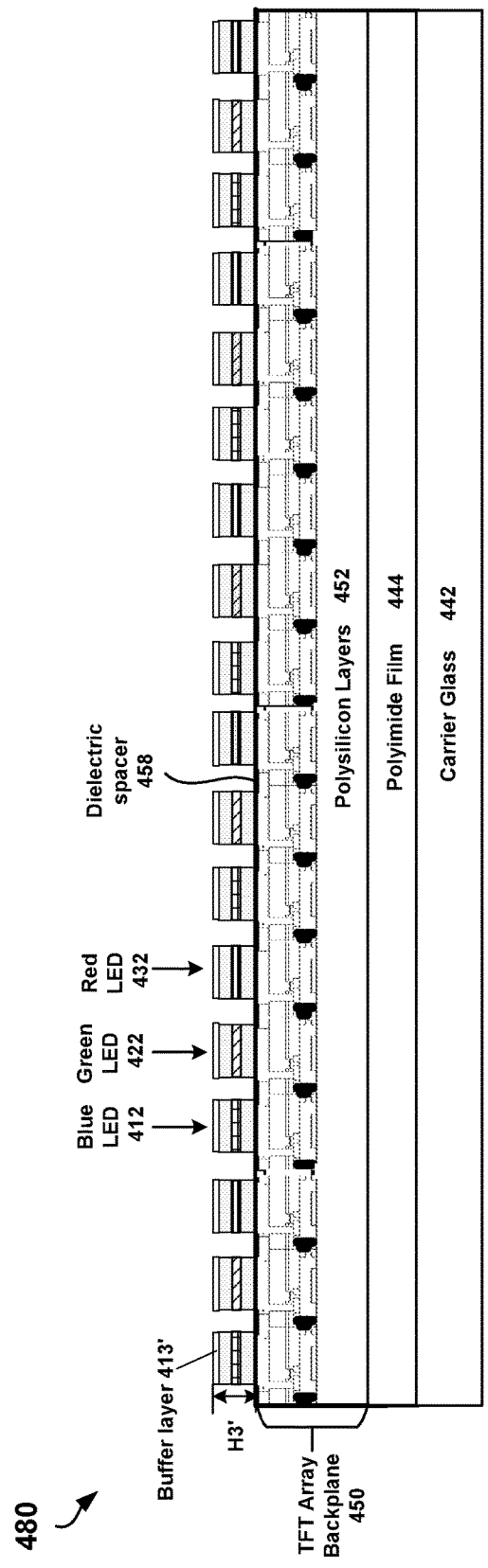

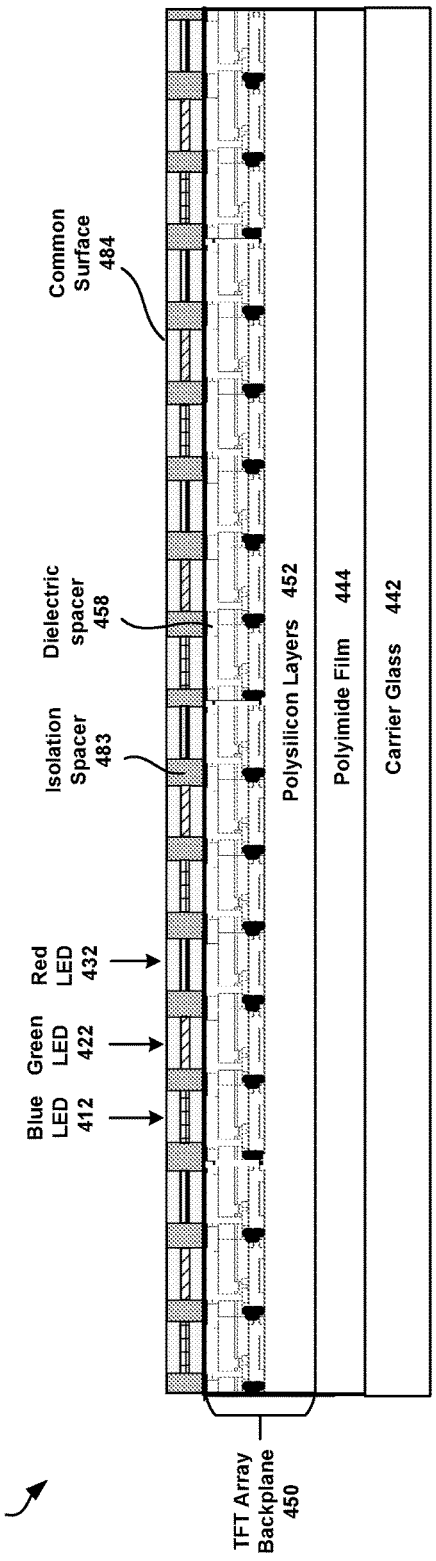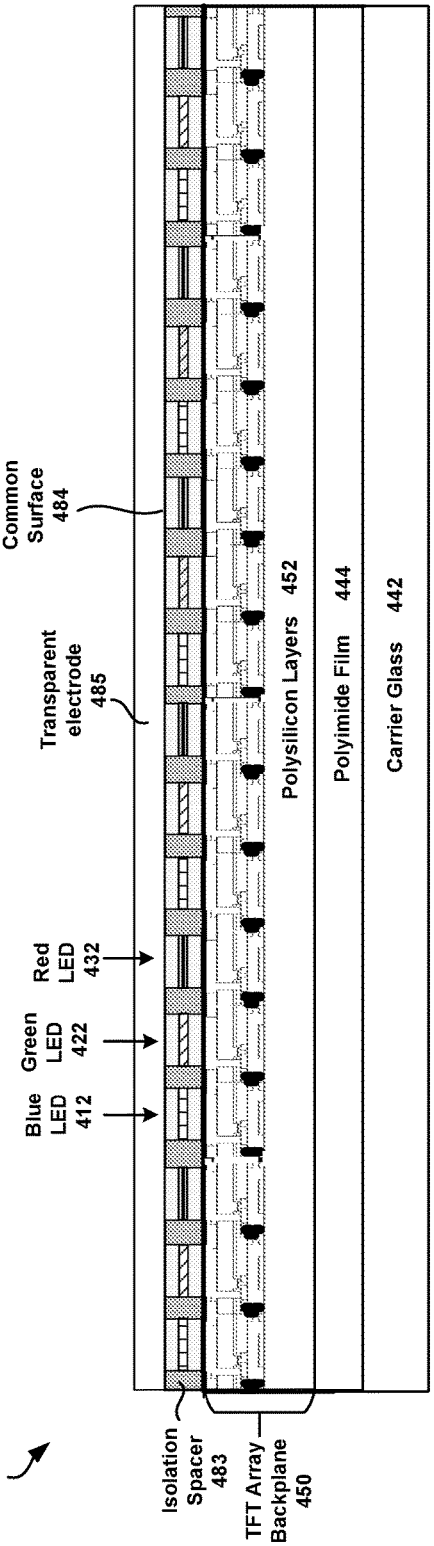

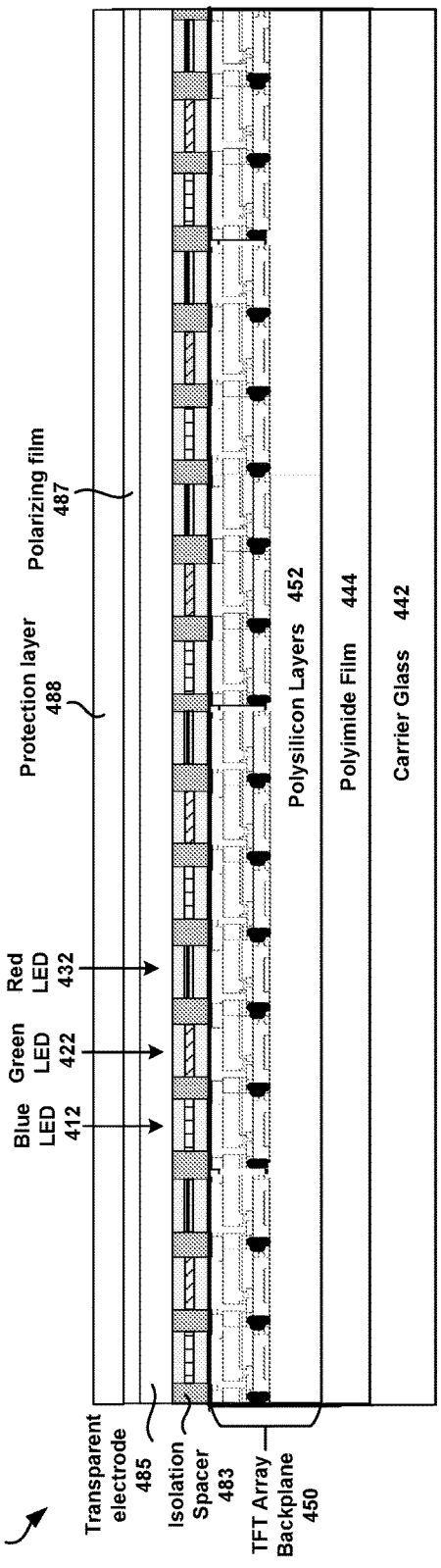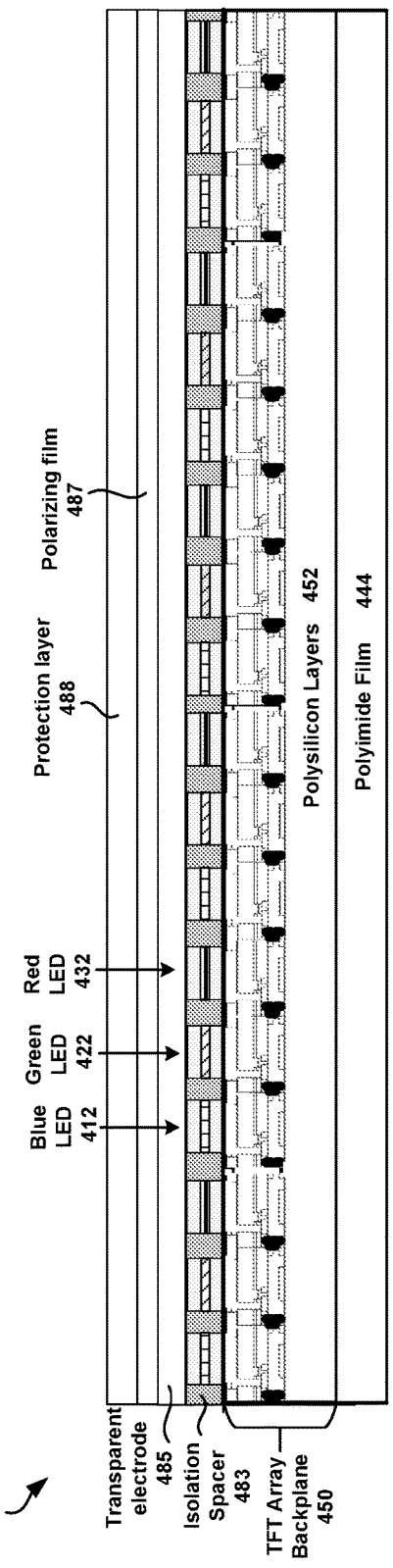
FIG. 4M
FIG. 4N

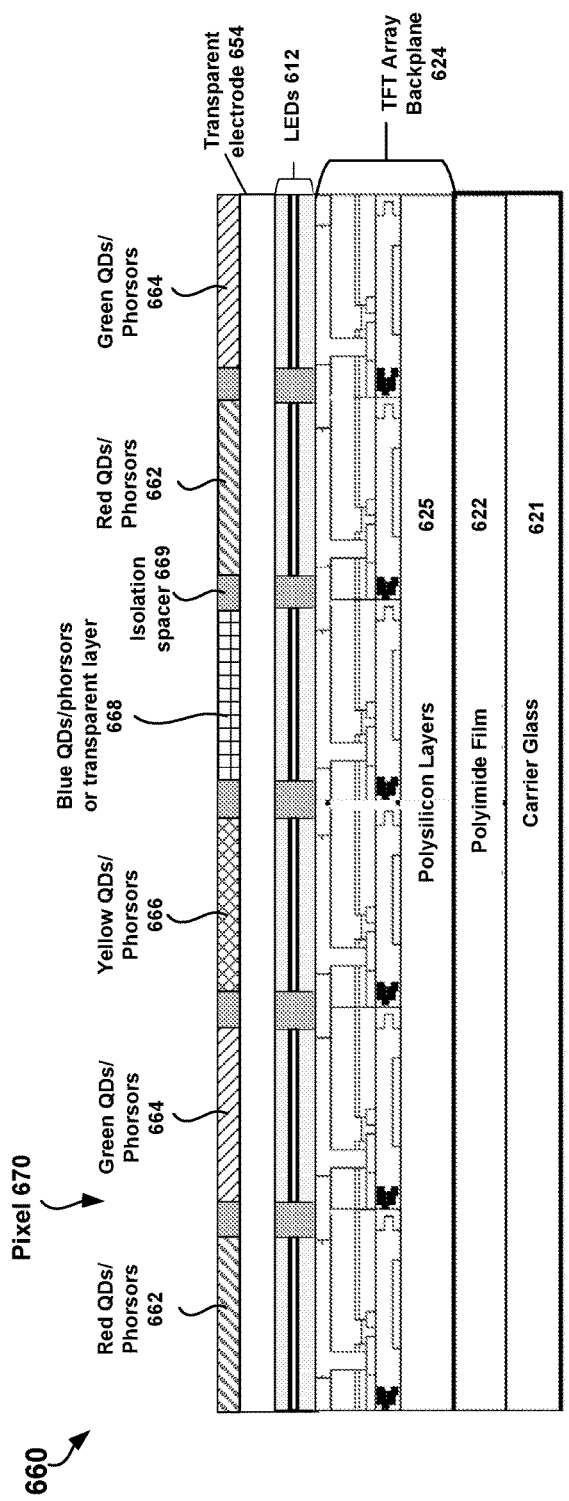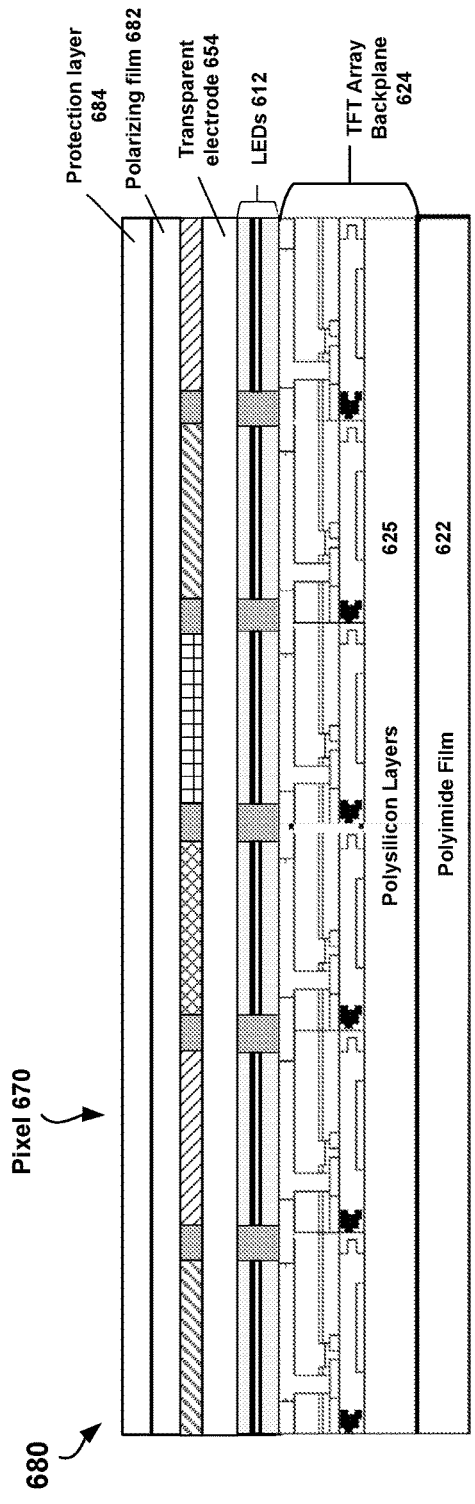
FIG. 6H
FIG. 6I

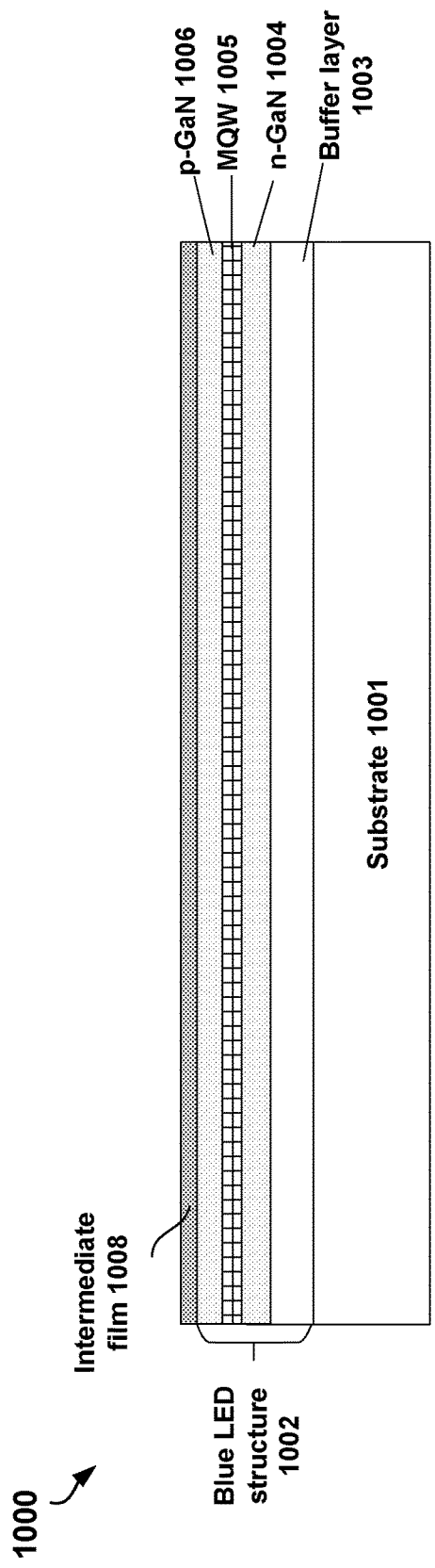
FIG. 10A
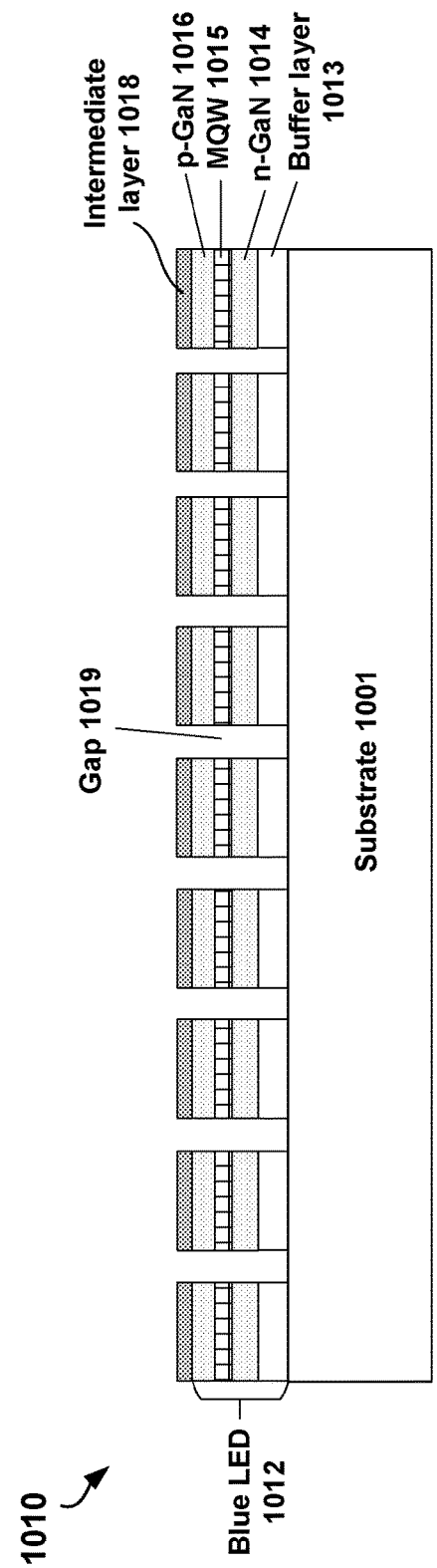
FIG. 10-B

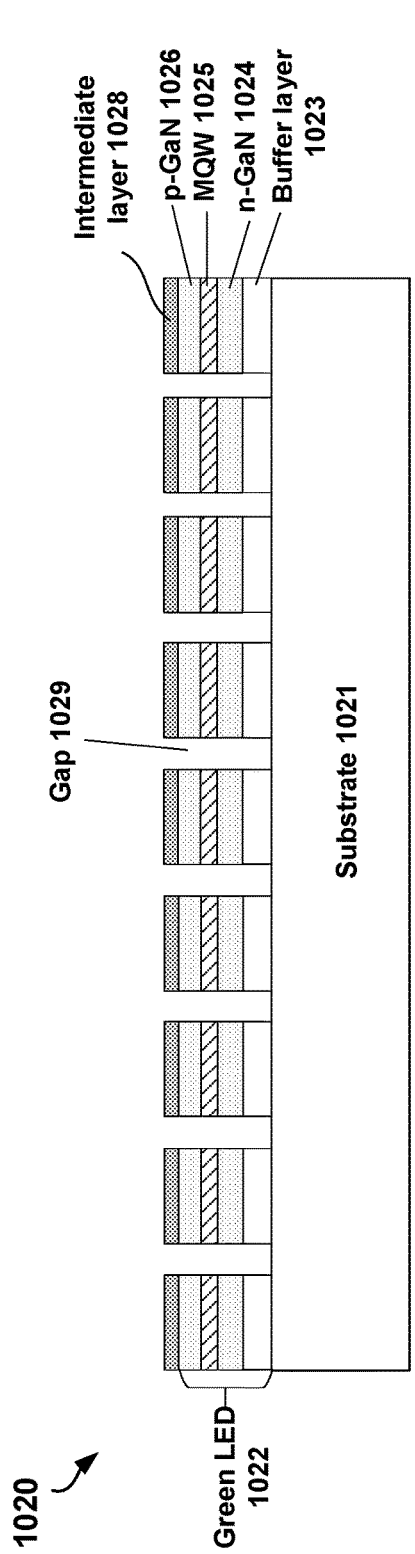
FIG. 10-C
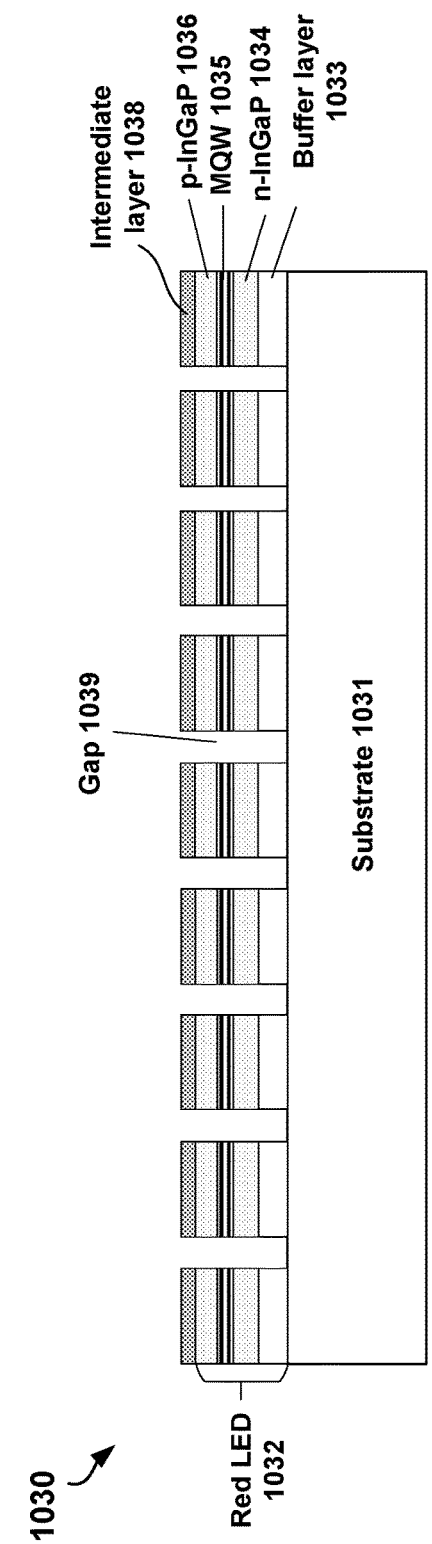
FIG. 10-D

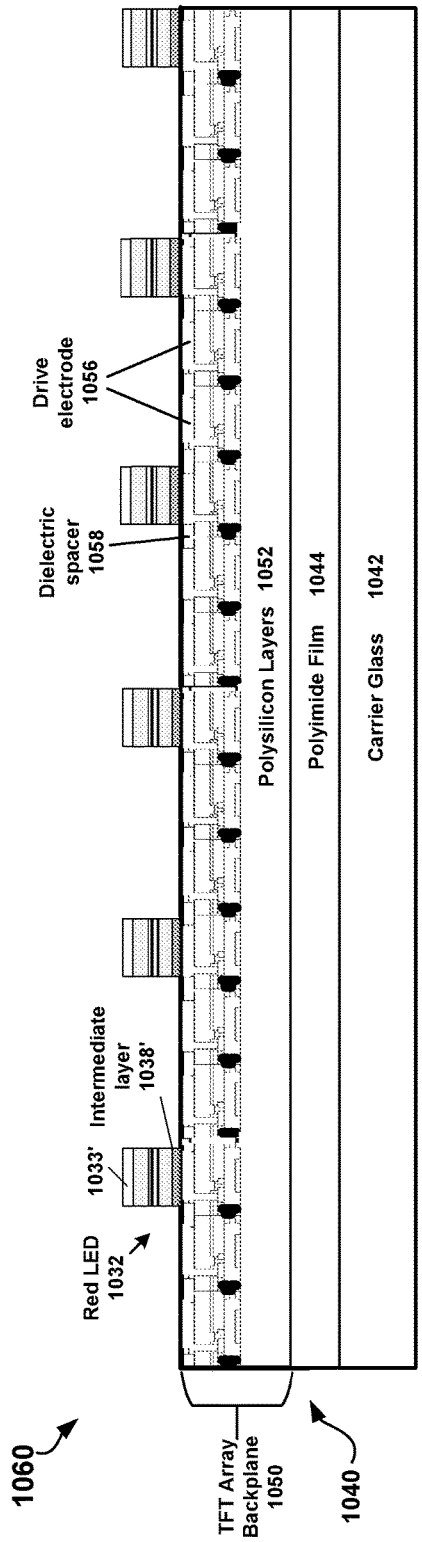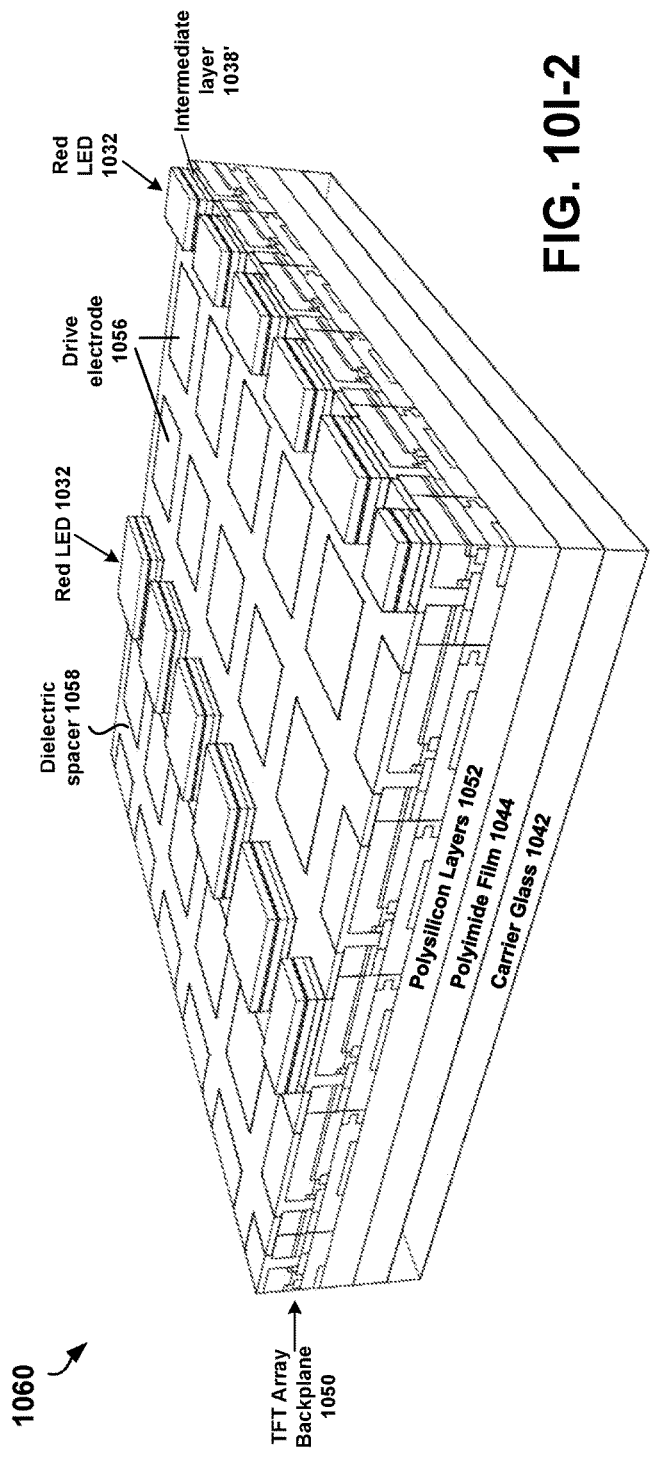

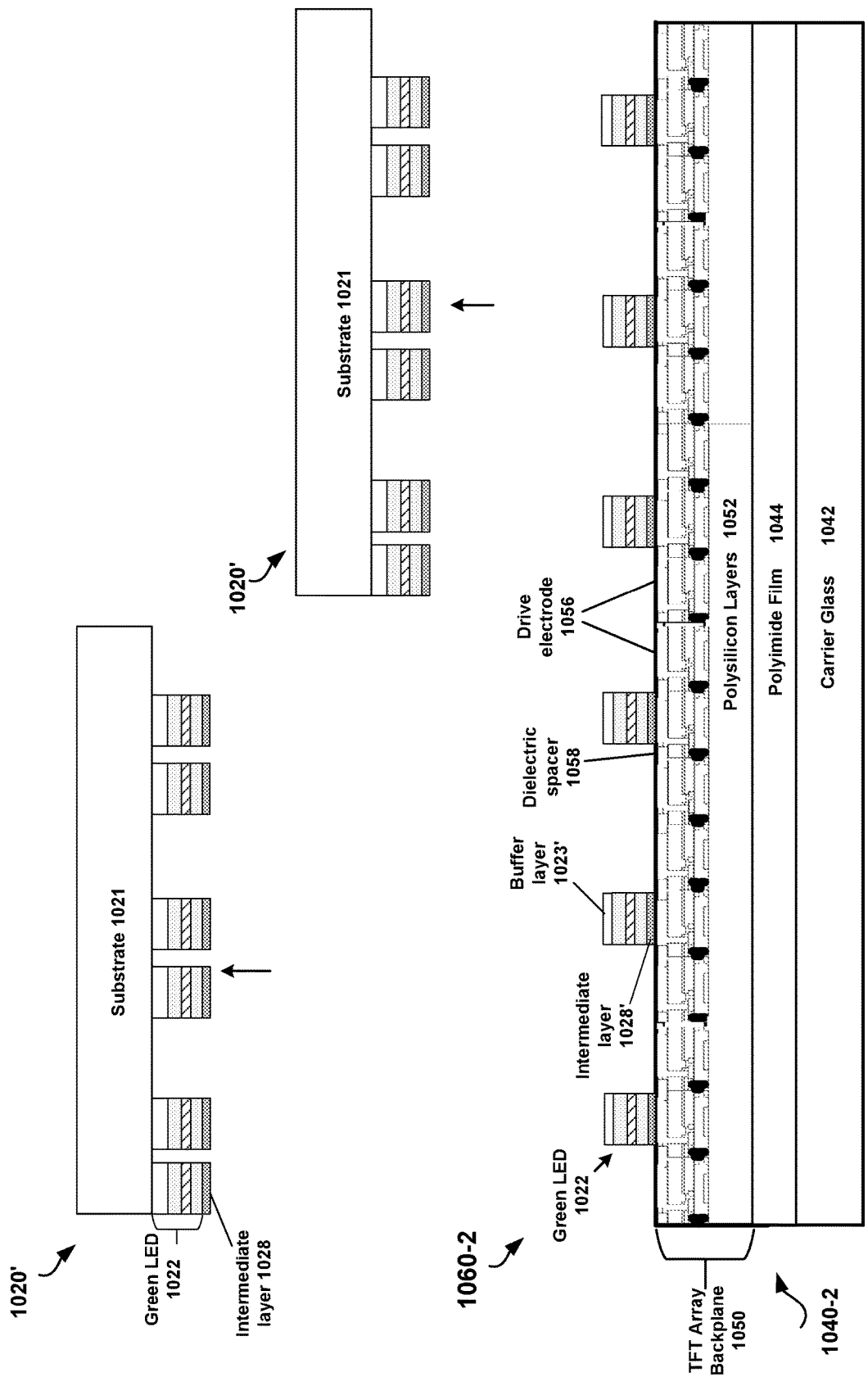

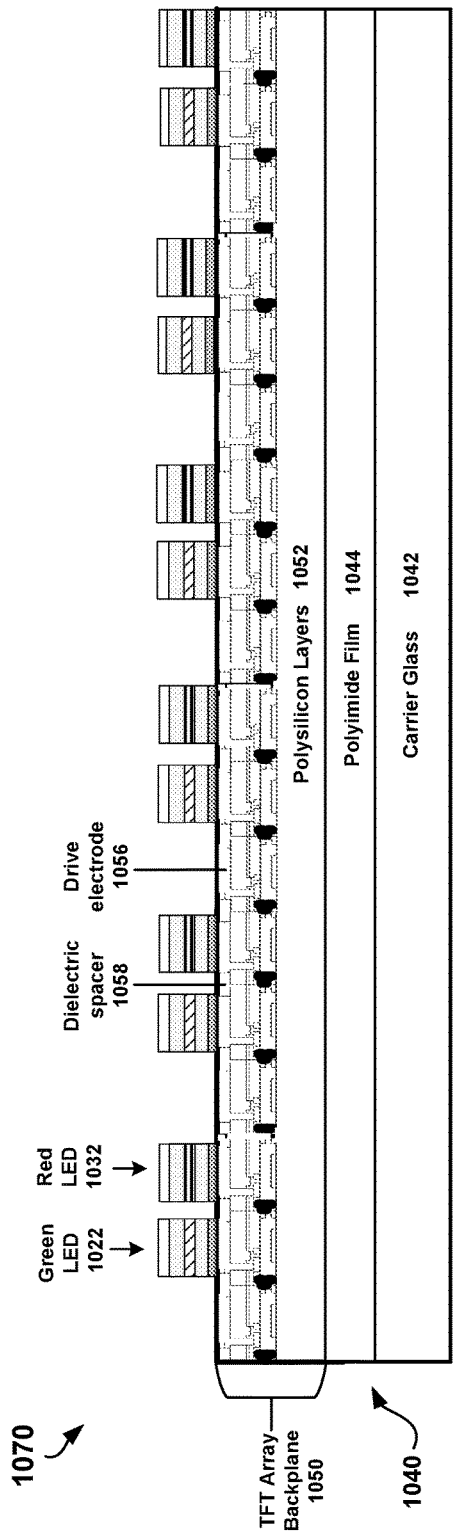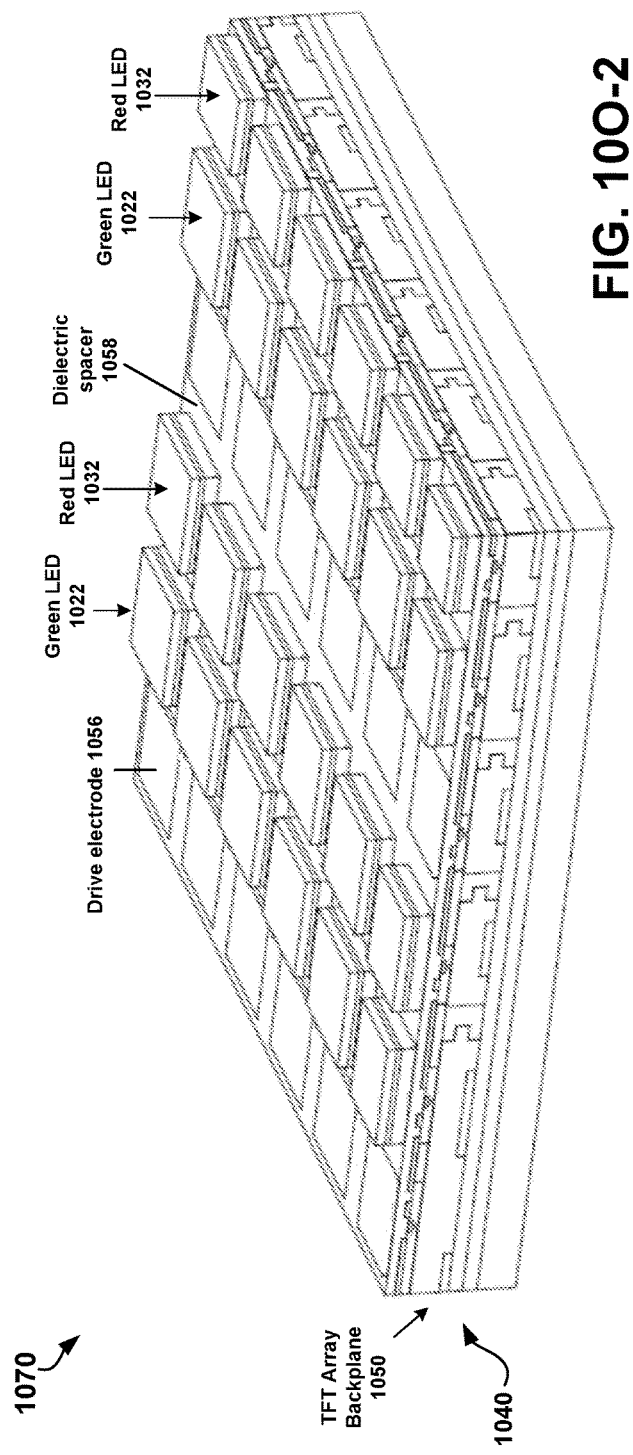

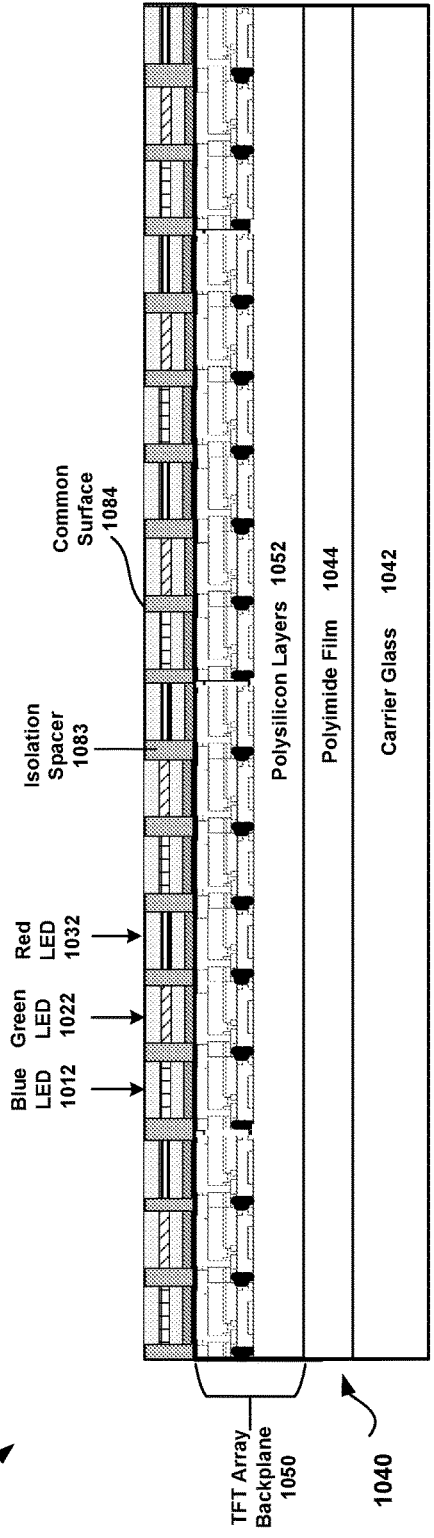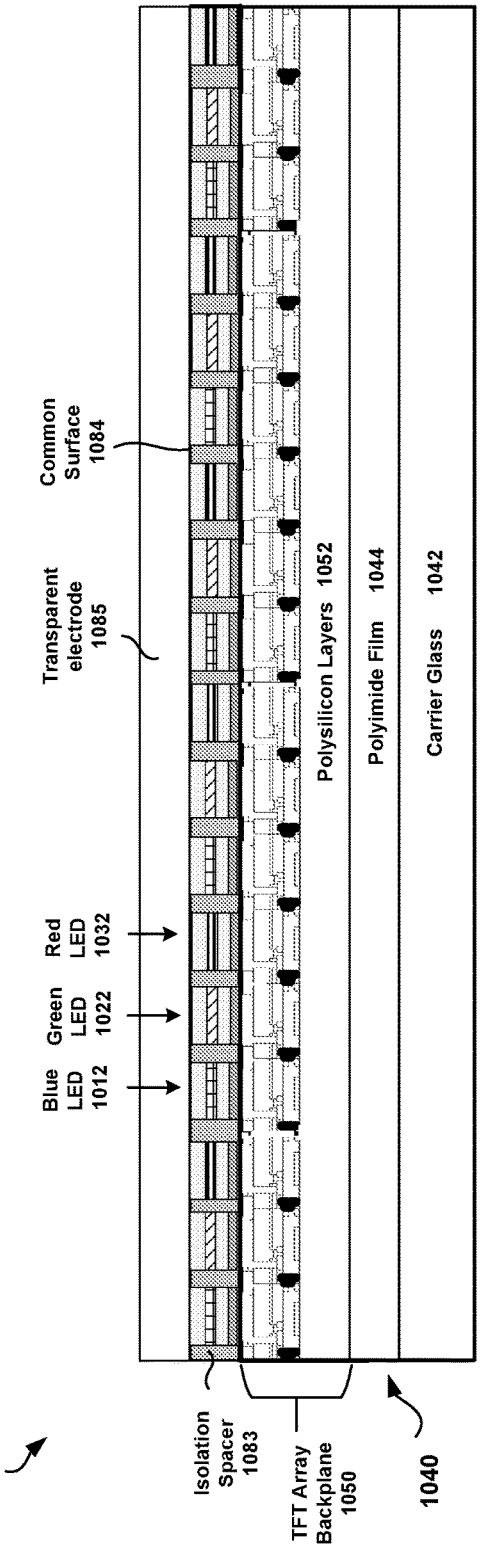
FIG. 10W
FIG. 10X

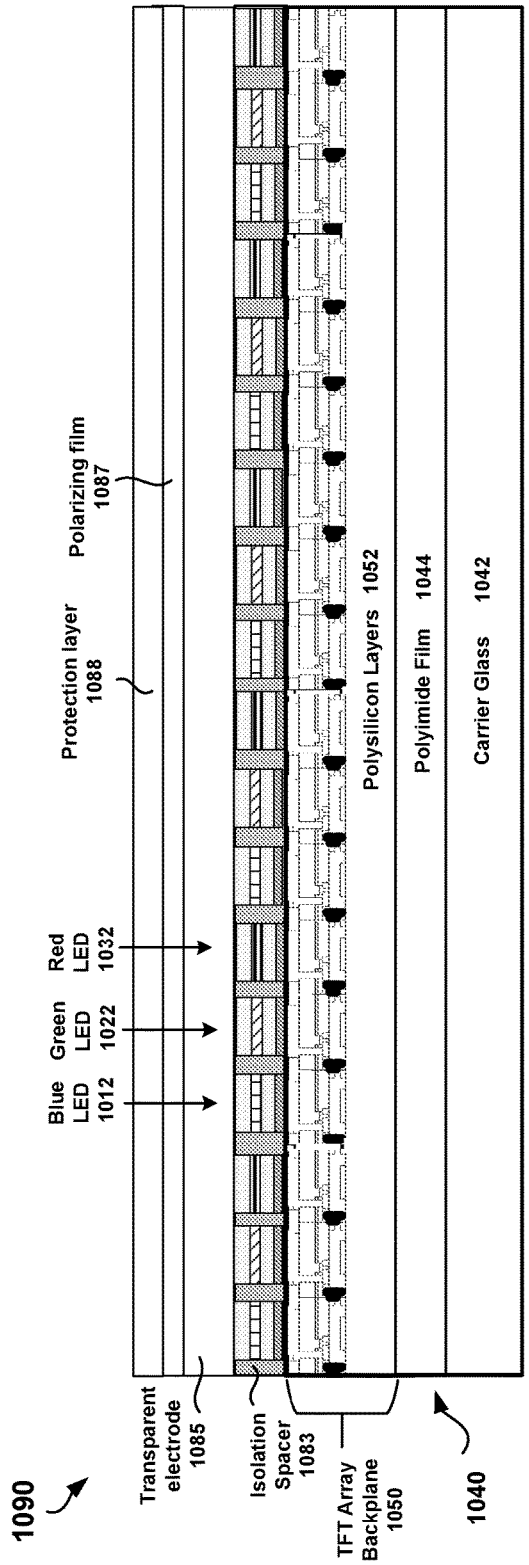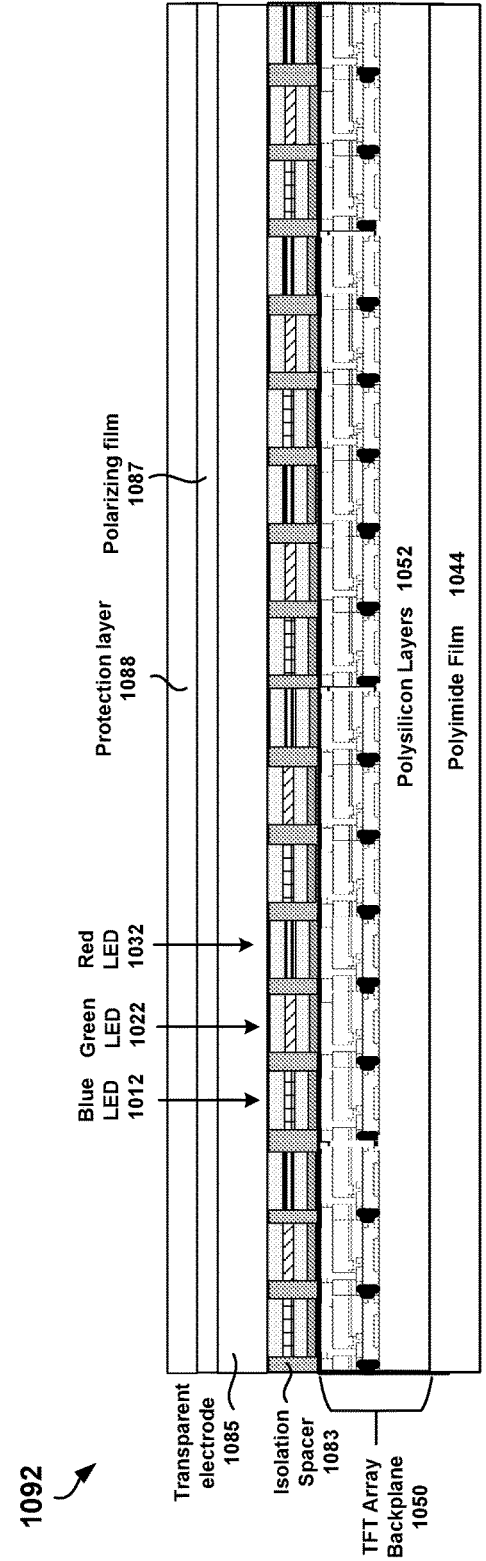

INTEGRATED ACTIVE-MATRIX LIGHT EMITTING PIXEL ARRAYS BASED DEVICES BY LASER-ASSISTED BONDING

CROSS-REFERENCE TO RELATED APPLICATIONS

This application is a divisional application of U.S. patent application Ser. No. 16/675,107, filed on Nov. 5, 2019, which is a continuation-in-part application of U.S. patent application Ser. No. 16/601,542 filed on Oct. 14, 2019. The disclosures of the prior applications are considered part of and are incorporated by reference in the disclosure of this application.

TECHNICAL FIELD

This disclosure relates generally to display devices or systems, particularly to integrated active-matrix light emitting pixel arrays based display devices or systems.

BACKGROUND

Displays utilizing arrays of light emitting pixels are popular in the electronic field and especially in portable electronic and communication devices, because large amounts of data and pictures can be transmitted rapidly and virtually to any location. Light emitting diode (LED) arrays are becoming more popular than liquid crystal displays (LCD) as an image source in both direct view and virtual image displays. One reason for this is that LEDs are capable of generating relatively high luminance, thus displays incorporating LED arrays can be used in a greater variety of ambient conditions.

Although LED arrays offer certain advantages, a major disadvantage is the complexity of their manufacturing process. In some cases, the arrays are manufactured by depositing materials on a supporting substrate and addressing/driver connections to row and column buses are made around the edges. Thus, the supporting substrate size is larger than the array size because of the necessary I/O pads or terminals. Providing very small contact pads in an effort to increase the array size greatly reduces the assembly yield. Another problem is that the driver circuitry for the LED arrays has a relatively high power consumption and adds a further manufacturing complexity.

SUMMARY

Described herein are integrated active-matrix light emitting pixel array based devices or systems and methods of making them, for example, by integrating arrays of light emitting elements formed on substrates with backplane devices followed by removal of the substrates of the light emitting elements, which can greatly simplify the manufacturing complexity and improve manufacturing efficiency and quality. Particularly, laser pulses can be used to selectively separate particular light emitting elements from the substrates, meanwhile heat generated by the laser pulses can locally bond the particular light emitting elements with a backplane device, for example, by eutectic bonding. The backplane device bonded with the particular light emitting elements can be further bonded with other different color LEDs formed on other substrates to form an active-matrix multi-color display system. Other light emitting elements without exposure of the laser pulses can be removed with the substrate and be further used to integrate with another backplane device bonded with another color LEDs. In such a way, a utilization efficiency of the light emitting elements can be greatly increased.

One aspect of the present disclosure features a method of fabricating an integrated device, including: forming a plurality of first light emitting elements on a first substrate, each of the first light emitting elements including first semiconductor layers epitaxially grown on the first substrate and being configured to emit light with a first color, the first semiconductor layers including a first conductive outer layer on a side of the first semiconductor layers further from the first substrate; integrating the first light emitting elements formed on the first substrate with a backplane device having a plurality of pixel circuits by bonding the first conductive outer layers of the first light emitting elements with conductive outer layers of first pixel circuits in the plurality of pixel circuits such that each of the first light emitting elements is bonded and conductively coupled to a first pixel circuit in the backplane device, where the plurality of pixel circuits are conductively isolated from each other; and then after integrating the first light emitting elements, removing the first substrate from the first light emitting elements that remain integrated with the backplane device.

In some implementations, integrating the first light emitting elements on the first substrate with the backplane device includes: before the bonding, pretreating with plasma activation at least one of surfaces of the first conductive outer layers of the first light emitting elements or a surface of the backplane device including surfaces of the conductive outer layers of the first pixel circuits.

In some implementations, forming a plurality of first light emitting elements on a first substrate includes: patterning a first light emitting structure formed on the first substrate to form the plurality of first light emitting elements, where the first light emitting structure includes the first semiconductor layers epitaxially grown on the first substrate. In some examples, patterning a first light emitting structure formed on the first substrate to form the plurality of first light emitting elements includes: patterning the first light emitting structure formed on the first substrate according to a pattern of the first pixel circuits in the backplane device, such that each of the first light emitting elements is aligned and bonded on top of the first pixel circuit in the backplane device.

In some implementations, integrating the first light emitting elements on the first substrate with the backplane device includes directly bonding surfaces of the first conductive outer layers of the first light emitting elements with surfaces of conductive outer layers of the first pixel circuits.

The method can further include: before the integrating, aligning the first light emitting elements with the first pixel circuits. Aligning the first light emitting elements with the first pixel circuits can include: aligning the first light emitting elements on the first substrate with the first pixel circuits in a first region of the backplane device. Integrating the first light emitting elements on the first substrate with the backplane device can include: bonding the first light emitting elements on the first substrate with the first pixel circuits in the first region of the backplane device. The method can further include: bonding another plurality of first light emitting elements on another first substrate with respective another first pixel circuits in a second region of the backplane device, the second region being adjacent to the first region; and removing the another first substrate from the another plurality of first light emitting elements that remain bonded on the backplane device.

In some implementations, removing the first substrate from the first light emitting elements includes: scanning, by using a laser, an area on the first substrate such that the first light emitting elements in the area are separated from the first substrate and bonded on the backplane device; and lifting off the first substrate from the first light emitting elements that remain bonded on the backplane device.

A size of the first light emitting element can be no smaller than a size of the first pixel circuit. Each of the pixel circuits can include a non-volatile memory including at least one transistor conductively coupled to a corresponding drive electrode that is a conductive outer layer of the pixel circuit, the corresponding drive electrodes in adjacent pixel circuits being separated by dielectric spacers, and each of the first light emitting elements can include a corresponding contact electrode as the first conductive outer layer, and each of the first light emitting elements can be conductively coupled to a non-volatile memory in the first pixel circuit through a corresponding contact electrode and a corresponding drive electrode of the first pixel circuit.

The method can further include: forming a plurality of second light emitting elements on a second substrate, each of the second light emitting elements including second semiconductor layers epitaxially grown on the second substrate an being configured to emit light with a second color different from the first color, the second semiconductor layers including a second conductive outer layer on a side of the second semiconductor layers further from the second substrate; integrating the second light emitting elements formed on the second substrate with the backplane device by bonding the second conductive outer layers of the second light emitting elements with conductive outer layers of second pixel circuits in the plurality of pixel circuits, such that each of the second light emitting elements is bonded and conductively coupled to a second pixel circuit that is adjacent to a corresponding first pixel circuit in the backplane device; and then, after integrating the second light emitting elements, removing the second substrate from the second light emitting elements that remain integrated with the backplane device, where each of the second light emitting elements is adjacent to a corresponding first light emitting element on the backplane device.

A height of each of the second light emitting elements formed on the second substrate can be larger than or identical to a height of each of the first light emitting elements formed on the first substrate. A distance between adjacent second light emitting elements on the backplane device can be substantially identical to a distance between adjacent second pixel circuits in the backplane device, and a distance between adjacent first and second light emitting elements can be smaller than or identical to a distance between adjacent pixel circuits in the backplane device.

In some implementations, the method further includes: forming a plurality of third light emitting elements on a third substrate, each of the third light emitting elements including third semiconductor layers epitaxially grown on the third substrate and being configured to emit light with a third color that is different from the first color and the second color, the third semiconductor layers including a third conductive outer layer on a side of the third semiconductor layers further from the third substrate; integrating the third light emitting elements formed on the third substrate with the backplane device by bonding the third conductive outer layers of the third light emitting elements with conductive outer layers of third pixel circuits in the plurality of pixel circuits, such that each of the third light emitting elements is bonded and conductively coupled to a third pixel circuit that is adjacent to a corresponding first pixel circuit and a corresponding second pixel circuit in the backplane device; and then, after integrating the third light emitting elements, removing the third substrate from the third light emitting elements that remain integrated with the backplane device, where each of the third light emitting elements on the backplane device is adjacent to a corresponding first light emitting element and a corresponding second light emitting element on the backplane device.

A height of each of the third light emitting elements formed on the third substrate can be larger than or identical to a height of each of the second light emitting elements formed on the second substrate that can be larger than or identical to a height of each of the first light emitting elements formed on the first substrate.

In some implementations, the first light emitting elements are conductively connected to the first pixel circuits to form first sub-pixels of active-matrix multi-color pixels, the second light emitting elements are conductively connected to the second pixel circuits to form second sub-pixels of the active-matrix multi-color pixels, and the third light emitting elements are conductively connected to the third pixel circuits to form third sub-pixels of the active-matrix multi-color pixels. Each of the active-matrix multi-color pixels can include a first sub-pixel having a first light emitting element and a first pixel circuit, a second sub-pixel having a second light emitting element and a second pixel circuit, and a third sub-pixel having a third light emitting element and a third pixel circuit. The first, second, and third light emitting elements in each of the active-matrix multi-color pixels can be adjacent and conductively isolated from each other, and the respective first, second, and third pixel circuits can be adjacent and conductively isolated from each other. Each of the active-matrix multi-color pixels includes a red light-emitting diode (LED), a green LED, and a blue LED.

The method can further include: filling an isolation material in gaps between adjacent first, second and third light emitting elements that remain integrated on the backplane device, where the isolation material includes an opaque and conductively isolated dielectric material. Each of the first, second, third light emitting elements can include a first contact electrode as a conductive outer layer of the light emitting element and a second contact electrode formed on a buffer layer that is formed on a corresponding substrate.

The method can further include: planarizing the first, second, third light emitting elements with the isolation material filled in the gaps to remove the buffer layers to form a common surface with exposure of the second contact electrodes of the first, second, third light emitting elements. The method can further include: forming a transparent conductive layer on the common surface to form a common electrode for the first, second, and third light emitting elements.

Another aspect of the present disclosure features an integrated device including: a backplane device including at least one backplane including a plurality of pixel circuits that are conductively isolated from each other; a plurality of first light emitting elements on first pixel circuits in the plurality of pixel circuits, where each of the first light emitting elements includes one or more first light emitting layers between a first contact electrode and a second contact electrode and operable to emit light with a first color, and where the first contact electrode of each of the first light emitting elements is bonded and conductively coupled to a first pixel circuit in the backplane device; a plurality of second light emitting elements on second pixel circuits in the plurality of pixel circuits, where each of the second light emitting elements includes one or more second light emitting layers between a third contact electrode and a fourth contact electrode and operable to emit light with a second color different from the first color, where the third contact electrode of each of the second light emitting elements is bonded and conductively coupled to a second pixel circuit in the backplane device, where surfaces of the second electrodes of the first light emitting elements are lower than surfaces of the fourth contact electrodes of the second light emitting elements; and a transparent conductive layer on the plurality of first light-emitting elements and the plurality of second light-emitting elements, where the transparent conductive layer is a common electrode in contact with the second contact electrodes of the first light-emitting elements and the fourth contact electrodes of the second light-emitting elements.

The integrated device can further include: a plurality of third light emitting elements on a plurality of third pixel circuits in the backplane device, where each of the third light emitting elements includes one or more third light emitting layers between a fifth contact electrode and a sixth contact electrode and operable to emit light with a third color different from the first color and the second color, and where the fifth contact electrode of each of the third light emitting elements is bonded and conductively coupled to a third pixel circuit in the backplane device, and where the transparent conductive layer is in contact with the sixth contact electrodes of the third light-emitting elements.

In some implementations, the first light emitting elements are conductively connected to the plurality of first pixel circuits to form first sub-pixels of active-matrix multi-color pixels, the second light emitting elements are conductively connected to the plurality of second pixel circuits to form second sub-pixels of the active-matrix multi-color pixels, the third light emitting elements are conductively connected to the plurality of third pixel circuits to form third sub-pixels of the active-matrix multi-color pixels. Each of the active-matrix multi-color pixels can include a first sub-pixel having a first light emitting element and a first pixel circuit, a second sub-pixel having a second light emitting element and a second pixel circuit, and a third sub-pixel having a third light emitting element and a third pixel circuit. The first, second, and third light emitting elements in each of the active-matrix multi-color pixels can be adjacent and conductively isolated from each other, and the respective first, second, and third pixel circuits can be adjacent and conductively isolated from each other.

In some implementations, the first, second, and third light emitting elements are conductively isolated from each other by an opaque dielectric material. Surfaces of the sixth electrodes of the third light emitting elements can be higher than the surfaces of the fourth contact electrodes of the second light emitting elements. The second contact electrodes of the first light emitting elements, the fourth contact electrodes of the second light emitting elements, and the sixth contact electrodes of the third light emitting elements, and the opaque dielectric material filled between the first, second, and third light emitting elements can form a continuous and non-flat surface, and the transparent conductive layer can be formed on the continuous and non-flat surface.

The transparent conductive layer can be a continuous and non-flat layer formed on the surfaces of the second electrodes and the surfaces of the fourth contact electrodes.

A third aspect of the present disclosure features a method of fabricating an integrated active-matrix multi-color pixel array based display, the method including: forming a plurality of light emitting elements on a semiconductor substrate, each of the light emitting elements includes multiple semiconductor layers epitaxially grown on the semiconductor substrate and being configured to emit light with a first color, the semiconductor layers including one or more quantum well layers having Group III-V compounds between a first doped semiconductor layer as a first contact electrode and a second doped semiconductor layer as a second contact electrode; integrating the light emitting elements on the semiconductor substrate with a backplane device to form a plurality of active-matrix light emitting pixels by conductively connecting the first contact electrode of each of the light emitting elements with a drive electrode of a respective pixel circuit in the backplane device, where the backplane device includes at least one backplane having a plurality of pixel circuits that are conductively isolated from each other, each of the pixel circuits including a non-volatile memory conductively coupled to the drive electrode of the pixel circuit, where each of the active-matrix pixels includes at least one of the light emitting element and at least one of the non-volatile memories conductively coupled to the at least one of the light emitting elements, then removing the semiconductor substrate from the light emitting elements that remain integrated on the backplane device; and forming an array of active-matrix multi-color display pixels by selectively depositing at least one phosphor film or quantum dots film on at least one light emitting element in each of the active-matrix light emitting pixels, the at least one phosphor film or quantum dots film being operable to emit a secondary light when excited by the light with the first color from the at least one light emitting element, where the secondary light has a second color different from the first color.

The method can further include: after removing the semiconductor substrate from the light emitting elements, forming first isolation spacers between adjacent light emitting elements, the first isolation spacers including an opaque conductively isolated dielectric material; planarizing the light emitting elements with the first isolation spacers to expose the second contact electrodes of the light emitting elements and to form a common surface across the second contact electrodes of the light emitting elements; depositing a transparent conductive layer on the common surface to form a common electrode for the light emitting elements integrated on the backplane device, where the at least one phosphor film or quantum dots film is selectively formed on the transparent conductive layer; forming second isolation spacers between adjacent pixel elements of the active-matrix multi-color display pixels and on the transparent conductive layer, the second isolation spacers including the opaque conductively isolated dielectric material; and forming a transparent protective layer on top of the active-matrix multi-color display pixels and the second isolation spacers.

A fourth aspect of the present disclosure features an integrated device including: a backplane including a plurality of pixel circuits each conductively coupled to respective light-emitting elements to form an array of active-matrix light-emitting pixels, where each of the light-emitting elements includes one or more quantum well semiconductor layers between a first contact electrode and a second contact electrode and is operable to emit light with a first color, each of the first contact electrodes of the light-emitting elements being respectively in contact with and conductively coupled to a drive electrode in a respective pixel circuit in the backplane; isolation spacers filled between adjacent light emitting elements, where the isolation spacers include an opaque dielectric material, and where surfaces of the second contact electrodes of the light emitting elements and surfaces of the isolation spacers form a common surface; a transparent conductive layer on the common surface, where the transparent conductive layer is a common electrode in contact with the second contact electrodes of the light-emitting elements; and for each of the active-matrix light emitting pixels, at least one phosphor film or one quantum dot film on the transparent conductive layer above at least one light emitting element in the pixel and being operable to emit a secondary light when excited by the light with the first color from the at least one light-emitting element, where the secondary light has a second color different from the first color.

Drive electrodes of two adjacent pixel circuits in the backplane can be separated by a dielectric spacer, and a size of an isolation spacer between adjacent light emitting elements respectively bonded on the drive electrodes of the two adjacent pixel circuits can be smaller than or identical to a size of the dielectric spacer.

Each of the active-matrix light emitting pixels can be configured to be an active-matrix multi-color display pixel including: a blue color light emitting element operable to provide a blue color and at least two blue color light emitting elements with two different color phosphor films or quantum dot films operable to respectively emit a red color and a green color.

A fifth aspect of the present disclosure features a method of fabricating an integrated device, including: forming an array of first light emitting elements and respective first intermediate metallic layers on a first substrate, where each of the first light emitting elements includes first semiconductor layers epitaxially grown on the first substrate and is configured to emit light with a first color, the first semiconductor layers including a first conductive outer layer on a side of the first semiconductor layers further from the first substrate, a respective first intermediate metallic layer being formed on the first conductive outer layer; integrating the array of first light emitting elements formed on the first substrate with an array of pixel circuits in a backplane device by contacting the respective first intermediate metallic layers on the first light emitting elements to conductive outer layers of the pixel circuits, the pixel circuits being conductively isolated from each other; injecting laser pulses into particular first light emitting elements from the array of first light emitting elements, such that each of the particular first light emitting elements is individually separated from the first substrate and locally bonded with a respective particular first pixel circuit of the array of pixel circuits through a respective particular first intermediate metallic layer; and removing the first substrate from the backplane device, with the particular first light emitting elements remaining bonded with and conductively coupled to the respective particular first pixel circuits in the backplane device through the respective particular first intermediate metallic layers.

The first semiconductor layers can include a first buffer layer directly formed on the first substrate, and injecting laser pulses into particular first light emitting elements can include controlling the laser pulses such that the first buffer layer is decomposed and separated from the first substrate and heat generated in the particular first light emitting elements by the laser pulses is locally transferred to the respective particular first intermediate metallic layer to cause eutectic bonding between the first conductive outer layer of the particular first light emitting element and the conductive outer layer of the respective pixel circuit through the respective particular first intermediate metallic layer.

In some implementations, adjacent particular first light emitting elements are separated from each other by one or more additional first light emitting element in the array of first light emitting elements, and removing the first substrate from the backplane device includes: removing the first substrate together with the additional first light emitting elements remaining formed on the first substrate.

In some implementations, the method further include: integrating the additional first light emitting elements remaining formed on the first substrate with an array of second pixel circuits bonded with an array of second light emitting elements, the array of second light emitting elements being bonded on respective particular second pixel circuits of the array of second pixel circuits and separated from one another by at least one additional second pixel circuit, where respective first intermediate metallic layers on the additional first light emitting elements are attached to conductive outer layers of the additional second pixel circuits, and where each of the second light emitting elements is configured to emit light with a second color different from the first color; injecting the laser pulses into second particular first light emitting elements in the additional first light emitting elements, such that each of the second particular first light emitting elements is individually separated from the first substrate and locally bonded with a respective second pixel circuit of the additional second pixel circuits through a respective second particular first intermediate metallic layer; and removing the first substrate from the array of second pixel circuits, with the second particular first light emitting elements remaining bonded with and conductively coupled to the respective second pixel circuits of the additional second pixel circuits through the respective second particular first intermediate metallic layers. The array of second pixel circuits can be in a second backplane device different from the backplane device, or in a second region of the backplane device that is different from a first region including the array of pixel circuits.

The adjacent particular first light emitting elements can be separated from each other by one of the second particular first light emitting elements and a third particular first light emitting element in the array of first light emitting elements. Removing the first substrate from the array of second pixel circuits can include removing the first substrate together with the third particular first light emitting elements that remain formed on the first substrate.

In some implementations, the method further includes: integrating the third particular first light emitting elements remaining formed on the first substrate with an array of third pixel circuits, where a second array of second light emitting elements and an array of third light emitting elements are bonded on respective particular third pixel circuits of the array of third pixel circuits, where each of the third light emitting elements is configured to emit light with a third color different from the first color and the second color, where adjacent third light emitting elements bonded on the array of third pixel circuits are separated from each other by one of the second array of second light emitting elements and an additional third pixel circuit, and where respective third particular first intermediate conductive layers on the third particular first light emitting elements are attached to conductive outer layers of the additional third pixel circuits; injecting the laser pulses into the third particular first light emitting elements, such that each of the third particular first light emitting elements is individually separated from the first substrate and locally bonded with a respective additional third pixel circuit of the additional third pixel circuits through a respective third particular first intermediate metallic layer; and removing the first substrate from the array of third pixel circuits, with the third particular first light emitting elements remaining bonded with and conductively coupled to the respective additional third pixel circuits through the respective third particular first intermediate metallic layers. On the array of third pixel circuits, each of the third particular first light emitting elements can be adjacent to a respective second light emitting element of the second array of second light emitting elements and a respective third light emitting element of the array of third light emitting elements.

The array of third pixel circuits can be in a third backplane device different from the backplane device and the second backplane device, in a third region of the backplane device that is different from the first region including the array of pixel circuits and the second region including the array of second pixel circuits, or in a fourth region of the second backplane device that is different from a fifth region including the array of second pixel circuits.

Injecting laser pulses into particular first light emitting elements of the array of first light emitting elements can include sequentially injecting the laser pulses into the particular first light emitting elements by step by step moving the laser pulses to the particular first light emitting elements.

A spot size of the laser pulses injected into the particular first light emitting element can be no smaller than a size of the particular first light emitting element and no larger than a sum of the size of the particular first light emitting element and twice of a gap between two adjacent first light emitting elements.

Two adjacent pixel circuits in the backplane device can be separated by a dielectric spacer. Adjacent first light emitting elements in the array of first light emitting elements can be separated by a gap having a size no larger than a size of the dielectric spacer. Each of the first light emitting elements can have a size no smaller than a size of each of the pixel circuits and no larger than a sum of the size of the pixel circuit and twice of the size of the dielectric spacer.

The method can further include: before the integrating, aligning the array of first light emitting elements with the array of pixel circuits in the backplane device. In some cases, integrating the first light emitting elements on the first substrate with the backplane device can include: pretreating with plasma activation at least one of surfaces of the respective first intermediate metallic layers for the first light emitting elements or surfaces of the conductive outer layers of the array of pixel circuits. In some cases, integrating the first light emitting elements on the first substrate with the backplane device can include: detachably bonding surfaces of the respective first intermediate metallic layers for the first light emitting elements with surfaces of the conductive outer layers of the pixel circuits.

In some implementations, forming an array of first light emitting elements and respective first intermediate metallic layers on a first substrate includes: epitaxially growing multiple first semiconductor films on the first substrate to form a first light emitting structure; forming a first intermediate metallic film on top of the first light emitting structure on the side further from the first substrate; and patterning the first light emitting structure and the first intermediate metallic film to form the array of first light emitting elements with the respective first intermediate metallic layers. Patterning the first light emitting structure and the first intermediate metallic film can include: patterning the first light emitting structure and the first intermediate metallic film according to a pattern of the array of pixel circuits in the backplane device, such that each of the array of first light emitting elements is integrated on a respective one of the array of pixel circuits in the backplane device.

In some implementations, integrating the array of first light emitting elements formed on the first substrate on an array of pixel circuits in a backplane device includes: integrating the array of first light emitting elements with the array of pixel circuits in a first region of the backplane device.

The method can further include: integrating another array of first light emitting elements on another first substrate with another array of pixel circuits in a second region of the backplane device, the second region being adjacent to the first region; injecting the laser pulses into particular another first light emitting elements of another array of first light emitting elements, such that each of the particular another first light emitting elements is individually separated from the another first substrate and locally bonded with a respective particular another pixel circuit of the another array of pixel circuits through a respective particular another first intermediate metallic layer; and removing the another first substrate from the backplane device, with the particular another first light emitting elements remaining bonded with and conductively coupled to the respective another particular pixel circuits in the second region of the backplane device.

Each of the pixel circuits can include a non-volatile memory including at least one transistor conductively coupled to a corresponding drive electrode that is a conductive outer layer of the pixel circuit, the corresponding drive electrodes in adjacent pixel circuits being separated by dielectric spacers. Each of the first light emitting elements can include a corresponding contact electrode as the first conductive outer layer. Each of the particular first light emitting elements can be conductively coupled to a non-volatile memory in the respective particular first pixel circuit through the corresponding contact electrode of the particular first light emitting element, the respective particular first intermediate metallic layer, and the corresponding drive electrode of the respective first particular pixel circuit. The corresponding drive electrode has a size substantially same as a size of the particular first light emitting element.

Each of the first light emitting elements can include: a buffer layer directly formed on the first substrate, a first contact electrode formed on the buffer layer, one or more quantum well layers as an active medium formed on the first contact electrode, and a second contact electrode formed on the quantum well layers, the second contact electrode being the first conductive outer layer.

The respective first intermediate metallic layer can include one or more metallic films including at least one of the group consisting of: an iridium-tin-oxide (ITO) film with a titanium (Ti) film, a cupper (Cu) film with a Tantalum (Ta) film, an aluminum (Al) film with a Tin (Sn) film, and a gold (Au) or silver (Ag) film with at least one adhesive film including chromium (Cr), Platinum (Pt), Palladium (Pd), or Titanium (Ti).

In some implementations, two adjacent particular first light emitting elements bonded on the backplane device are separated by one or more second pixel circuits of the array of pixel circuits. The method can further include: integrating an array of second light emitting elements with respective second intermediate metallic layers formed on a second substrate with the backplane device bonded with the particular first light emitting elements by contacting the respective second intermediate metallic layers to the second light emitting elements on conductive outer layers of the second pixel circuits, where each of the second light emitting elements on the second substrate is configured to emit light with a second color different from the first color and separated from each other by a space, and where the particular first light emitting elements bonded on the backplane device are enclosed within the spaces between the second light emitting elements; injecting second laser pulses into particular second light emitting elements of the array of second light emitting elements, such that each of the particular second light emitting elements is individually separated from the second substrate and locally bonded with a respective particular second pixel circuit of the second pixel circuits through a respective particular second intermediate metallic layer; and removing the second substrate from the backplane device, with the particular second light emitting elements remaining bonded with and conductively coupled to the respective particular second pixel circuits in the backplane device through the respective particular second intermediate metallic layers.

A height of each of the array of second light emitting elements formed on the second substrate can be substantially identical to a height of each of the array of first light emitting elements formed on the first substrate. Each of the particular second light emitting elements can be adjacent to a corresponding particular first light emitting element on the backplane device, and a distance between the adjacent particular second light emitting element and the corresponding particular first light emitting element can be no larger than a distance between adjacent pixel circuits in the backplane device.

In some implementations, two adjacent particular second light emitting elements bonded on the backplane device can be separated by one of the particular first light emitting elements boned on the backplane device and at least one third pixel circuit of the second pixel circuits of the array of pixel circuits.

In some implementations, the method further includes: integrating an array of third light emitting elements with respective third intermediate metallic layers formed on a third substrate with the backplane device bonded with the particular first light emitting elements and the particular second light emitting elements by contacting the respective third intermediate metallic layers to the third light emitting elements on conductive outer layers of the third pixel circuits, where each of the third light emitting elements on the third substrate is configured to emit light with a third color different from the first color and the second color and separated from each other by a second space, and where the particular first light emitting elements and the particular second light emitting elements bonded on the backplane device are enclosed within the second spaces between the third light emitting elements; injecting third laser pulses into particular third light emitting elements of the array of third light emitting elements, such that each of the particular third light emitting elements is individually separated from the third substrate and locally bonded with a respective particular third pixel circuit of the third pixel circuits through a respective particular third intermediate metallic layer; and removing the third substrate from the backplane device, with the array of third light emitting elements remaining bonded with and conductively coupled to the respective particular third pixel circuits in the backplane device through the respective particular third intermediate metallic layers.

The particular first light emitting elements can be conductively connected to the particular first pixel circuits to form first sub-pixels of active-matrix multi-color pixels; the particular second light emitting elements can be conductively connected to the particular second pixel circuits to form second sub-pixels of the active-matrix multi-color pixels; and the particular third light emitting elements can be conductively connected to the particular third pixel circuits to form third sub-pixels of the active-matrix multi-color pixels. Each of the active-matrix multi-color pixels can include a first sub-pixel having a particular first light emitting element and a particular first pixel circuit, a second sub-pixel having a particular second light emitting element and a particular second pixel circuit, and a third sub-pixel having a particular third light emitting element and a particular third pixel circuit. The particular first, second, and third light emitting elements in each of the active-matrix multi-color pixels can be adjacent and conductively isolated from each other, and the respective particular first, second, and third pixel circuits are adjacent and conductively isolated from each other.

The method can further include: filling an isolation material in gaps between adjacent particular first, second and third light emitting elements that remain integrated on the backplane device. The isolation material can include an opaque and conductively isolated dielectric material.

Each of the particular first, second, third light emitting elements can include a first contact electrode as a conductive outer layer of the light emitting element and a second contact electrode formed on a buffer layer that is formed on a corresponding substrate. The method can further include: planarizing the particular first, second, third light emitting elements with the isolation material filled in the gaps to remove the buffer layers to form a common surface with exposure of the second contact electrodes of the particular first, second, third light emitting elements. The method can further include: forming a transparent conductive layer on the common surface to form a common electrode for the particular first, second, and third light emitting elements.

A sixth aspect of the present disclosure features an integrated device including: a backplane device including at least one backplane including a plurality of pixel circuits that are conductively isolated from each other, each of the plurality of pixel circuits including a respective drive electrode in a top layer of the backplane device; a plurality of first light emitting elements on first pixel circuits in the plurality of pixel circuits, where each of the first light emitting elements includes one or more first light emitting layers between a first contact electrode and a second contact electrode and operable to emit light with a first color, and where the first contact electrode of each of the first light emitting elements is bonded and conductively coupled to a first drive electrode of a respective first pixel circuit in the backplane device through a respective first intermediate metallic layer; a plurality of second light emitting elements on second pixel circuits in the plurality of pixel circuits, where each of the second light emitting elements includes one or more second light emitting layers between a third contact electrode and a fourth contact electrode and operable to emit light with a second color different from the first color, where the third contact electrode of each of the second light emitting elements is bonded and conductively coupled to a second drive electrode of a respective second pixel circuit in the backplane device through a respective second intermediate metallic layer; and a transparent conductive layer on the plurality of first light-emitting elements and the plurality of second light-emitting elements, where the transparent conductive layer is a common electrode in contact with the second contact electrodes of the first light-emitting elements and the fourth contact electrodes of the second light-emitting elements.

In some embodiments, the integrated device further includes: a plurality of third light emitting elements on a plurality of third pixel circuits in the backplane device, where each of the third light emitting elements includes one or more third light emitting layers between a fifth contact electrode and a sixth contact electrode and operable to emit light with a third color different from the first color and the second color, and where the fifth contact electrode of each of the third light emitting elements is bonded and conductively coupled to a third drive electrode of a respective third pixel circuit in the backplane device through a respective third intermediate metallic layer. The transparent conductive layer can be in contact with the sixth contact electrodes of the third light-emitting elements.

In some embodiments, the first light emitting elements are conductively connected to the plurality of first pixel circuits to form first sub-pixels of active-matrix multi-color pixels, the second light emitting elements are conductively connected to the plurality of second pixel circuits to form second sub-pixels of the active-matrix multi-color pixels, and the third light emitting elements are conductively connected to the plurality of third pixel circuits to form third sub-pixels of the active-matrix multi-color pixels. Each of the active-matrix multi-color pixels can include a first sub-pixel having a first light emitting element and a first pixel circuit, a second sub-pixel having a second light emitting element and a second pixel circuit, and a third sub-pixel having a third light emitting element and a third pixel circuit. The first, second, and third light emitting elements in each of the active-matrix multi-color pixels can be adjacent and conductively isolated from each other, and the respective first, second, and third pixel circuits are adjacent and conductively isolated from each other.

The first, second, and third light emitting elements can be conductively isolated from each other by an opaque dielectric material. The second contact electrodes of the first light emitting elements, the fourth contact electrodes of the second light emitting elements, and the sixth contact electrodes of the third light emitting elements, and the opaque dielectric material filled between the first, second, and third light emitting elements can form a continuous surface, and the transparent conductive layer can be formed on the continuous surface.

Each of the first light-emitting elements can have a size same as the respective first intermediate conductive layer and is self-aligned with the respective first intermediate conductive layer. Each of the second light-emitting elements can have a size same as the respective second intermediate conductive layer and is self-aligned with the respective second intermediate conductive layer.

A seventh aspect of the present disclosure features a method including: forming first color light emitting diodes (LEDs) and respective intermediate metallic layers on a first substrate, integrating the first color LEDs with pixel circuits in a backplane device, injecting laser pulses into particular first color LEDs, such that each particular first color LED is individually separated from the first substrate and locally bonded with a respective pixel circuit through a respective intermediate metallic layer, and removing the first substrate from the backplane device. The backplane device bonded with the particular first color LEDs can be further bonded with other different color LEDs formed on other substrates. Other first color LEDs without exposure of the laser pulses can be removed with the first substrate and can be further used to integrate with another backplane device bonded with another color LEDs.

Particular embodiments of the subject matter described in this specification can be implemented so as to realize one or more of the following advantages. Light emitting elements (e.g., LEDs) are first formed on a first substrate (e.g., silicon or sapphire) and then integrated with a backplane (e.g., a CMOS backplane or a TFT array control backplane) formed on a second substrate (e.g., silicon, polymer or glass), e.g., by bonding. The light emitting elements can be aligned to be conductively coupled to respective pixel circuits in the backplane to thereby form an array of active-matrix light emitting pixels (e.g., LED pixels). After the integration, the first substrate can be removed, e.g., by laser peeling off, from the light emitting elements that remain integrated on the backplane. Thus, this technology enables to simultaneously integrate (or bond) a large number of light emitting elements on a backplane to form active-matrix light emitting pixels. Compared to individually transferring light emitting elements, aligning and bonding them on a backplane, this technology can greatly increase fabrication speed and fabrication accuracy. This technology also enables to fabricate high density active-matrix light emitting pixels to achieve high resolution displays and/or fabricate larger number of active-matrix light emitting pixels to achieve large area displays.

In some implementations, this technology enables to form active-matrix multi-color display pixels by sequentially integrating different color light emitting elements (e.g., blue color LEDs, green color LEDs, and red color LEDs) formed on different substrates on the same backplane with removal of the different substrates for the light emitting elements after the integration. The different color light emitting elements can be formed by patterning corresponding light emitting structures formed on the different substrates according to patterns of respective pixel circuits on the backplane, such that the different color light emitting elements can be integrated with the respective pixel circuits on the backplane. This technology enables to use commercial light emitting structures formed on substrates (e.g., multiple semiconductor layers across wafers) or arrays of light emitting elements formed on substrates, which can simplify manufacture costs and improve fabrication efficiency and quality.

In some implementations, this technology enables to form active-matrix multi-color display pixels by first integrating single color LEDs (e.g., blue color LEDs or UV LEDs) on substrates on a backplane to form active-matrix light emitting pixels and then depositing different color phosphor films or quantum dots (QDs) films on selected light-emitting elements to activate light with different colors. This technology also enables to use commercial light emitting elements formed on substrates (e.g., an array of LEDs on wafers), which can avoid dicing individual LEDs and simplify manufacture costs and improve fabrication efficiency and quality.

Moreover, before the integration, the light emitting elements can be formed by high-quality deposition at high temperatures, e.g., by Metal-Organic Chemical Vapor Deposition (MOCVD), molecular beam epitaxy (MBE), atomic layer deposition (ALD), physical vapor deposition (PVD), Chemical Vapor Deposition (CVD), or any other deposition methods in a vacuum chamber. The epitaxially grown LED wafers can be directly used without pre-packaging and without complete fabrication. The light emitting elements or corresponding light emitting structures can be also commercially available. The CMOS/TFT backplane can be fabricated by existing CMOS/TFT technologies, e.g., by an Original Equipment Manufacturer (OEM), which can greatly simplify the manufacture process.

For the integration, this technology enables to use low temperature direct bonding by pretreating surfaces of the light emitting elements and/or surfaces of backplanes, e.g., with plasma activation. This bonding between the light emitting elements and the backplanes can be further increased, secured or tightened by subsequent processes, e.g., filling isolation spacers and surface planarization. In some cases, low temperature bonding with intermediate conductive layer, e.g., eutectic bonding, can be used. The bonding can produce hermetically sealed packages and electrical interconnection within a single process and be conducted at low processing temperatures, low resultant stress induced in final assembly, high bonding strength, large fabrication yield, and a good reliability.

Additionally, as drive electrodes in pixel circuits in the CMOS/TFT backplane are formed with a predetermined mask during the CMOS/TFT manufacturing process, the predetermined mask for the drive electrodes can be used for patterning a light emitting structure to form an array of light emitting elements, such that the light emitting elements can be aligned and bonded on respective drive electrodes (or pixel circuits) in the backplane, thus enabling a high alignment accuracy.

The technology can use one or more quantum well layers of Group III-V compounds (e.g., GaN) as light emissive layers, which makes the LED arrays more energy efficient and more stable than OLED (organic LED) based arrays. For example, the LEDs can be ultraviolet (UV) or deep UV color LEDs, blue color LEDs, green color LEDs or red color LEDs, by controlling the quantum well layers such as InGaN/GaN. The technology can use different color LEDs to form multi-color displays. The technology can also use phosphor materials or quantum-dot materials deposited on the III-V compound based LED arrays to produce multi-color displays. The technology can allow p-doped electrode and n-doped electrode layers epitaxially formed on opposite sides of the quantum well layers and directly used in the integration, without connecting additional conductive electrodes to the p-doped electrode and n-doped electrode for integration and without high-precision alignment of the p-doped electrode and n-doped electrode. The technology can use isolation spacers to isolate conductive connection of adjacent LEDs and/or deposited phosphor materials or quantum dot materials on the adjacent LEDs. The isolation spacers can include an opaque dielectric material (e.g., SiNx) or a black material and can be configured to block or eliminate light propagation between the adjacent LEDs to thereby eliminate cross-talk between the adjacent LEDs. The technology can also integrate non-volatile memories, e.g., SRAM (static random-access memory), with the LEDs to form active-matrix LED pixels, enabling higher efficiency and faster response time than passive-matrix LED pixels. The technology allows integrating non-volatile memories and drivers on the CMOS/TFT backplane, which greatly simplifies processing, achieves seamless integration and reduces cost. As the LEDs are made of semiconductor layers, additional protective layers are unnecessary to protect the LEDs from external environments, unlike OLED or LCD displays. In some cases, a touch-sensitive protective film can be formed on surfaces of the LED pixel arrays to form a capacitance sensitive screen.

In some implementations, the integrated LEDs and CMOS backplane on semiconductor substrates enable the use of standard semiconductor IC (integrated circuit) manufacturing equipment, facilities, and processes, resulting in reduced cost. The integrated LED arrays on the semiconductor substrate enables fabrication of an ultra-high resolution display, e.g., 100 µm per pixel, and/or micro-LED (µ-LED) displays with extremely high efficiency to save energy. The integrated LED pixel array-based display systems, particularly micro-display systems, can achieve low power consumption (e.g., one order of magnitude lower than current display devices), high resolution (e.g., 1080p), a thin device thickness (e.g., no more than 1 mm), a large view angle (e.g., no less than 160 degrees), fast response time (e.g., ns), a high luminance contrast modulation (e.g., 100%), and/or low cost due to integration. Particularly, the response time of the integrated LED systems can be three orders of magnitude faster than that of OLED systems, and can eliminate flickering issues existing in OLED displays, when pulse-width-modulation (PWM) technology is adopted. In some implementations, CMOS backplanes based display systems can have a pixel size less than 5.0 µm, a response time faster than 0.1 µs, and/or an emitting light flux higher than 20 cd/mm^2. The display systems can have a thickness less than 1.0 mm, and/or a display area larger than 50 mm×50 mm. The display systems can be flexible.

The technology can use packaging techniques, e.g., conductive grid array packaging such as ball grid array (BGA) package, to form larger displays with multiple integrated LED pixel array micro-displays (display modules or panels), as described in U.S. Pat. No. 10,445,048, entitled "LARGER DISPLAYS FORMED BY MULTIPLE INTEGRATED LED ARRAY MICRO-DISPLAYS" and issued on Oct. 15, 2019, whose content is hereby incorporated by reference in its entirety. On one hand, the larger displays can still have the advantages of integrated LED pixel array microarrays as noted above. On the other hand, this technology can overcome the current dimensional limit of displays fabricated by using standard silicon wafers. Using multiple LED pixel arrays based micro-displays to compose and assemble a larger micro-LED display, e.g., active-matrix, enables an unlimited size display at a significantly lower cost. Moreover, the integrated LED pixel array micro-displays can form LEDs or LED pixels all over areas of the micro-displays, including edges of the micro-displays, such that adjacent micro-displays have substantially no or little gap, e.g., less than 1 mm, which makes the larger display a whole piece to seamlessly display a single image or video. In some cases, the illumination areas over the physical areas of the larger displays can be about 50% or more, e.g., 90%, substantially larger than those of LCD displays or OLED displays.

Compared to CMOS backplanes formed on a semiconductor wafer, TFT backplanes can be formed on a larger substrate (e.g., glass) to form a larger display. Also TFT backplanes can be formed and connected on a flexible substrate (e.g., a polyimide film or a stainless steel) to form a flexible device. The TFT backplane can have a larger size than a CMOS backplane formed on the semiconductor substrate. In some implementations, TFT backplanes are formed on a larger substrate without BGA packaging that is used for connecting CMOS backplanes on different smaller substrates. In some implementations, TFT backplanes based display systems can have a pixel size less than 10 µm, a respond time faster than 1.0 µs, and/or an emitting light flux higher than 10 cd/mm^2. The display systems can have a thickness less than 1.0 mm, and/or a display area larger than 100 mm×100 mm. The display systems can be flexible, rollable, and foldable.

The TFT backplanes can be low-temperature polysilicon (LTPS) active-matrix (AM) TFT control backplanes. For example, LEDs formed on multiple wafers (e.g., silicon or sapphire) can be aligned and bonded to TFT backplanes formed on a polyimide film that is formed on a carrier glass. The wafers for the LED structures can be removed, e.g., by laser lift-off to scan a whole area of the LED structures. As noted above, active-matrix LED pixel arrays can be formed by sequentially bonding different color LEDs on the TFT backplanes or by depositing different color phosphor materials or quantum-dot materials on single-color LEDs. After the integrated LED pixel arrays are formed, the carrier glass can be removed, e.g., by laser lift-off, to form a flexible device.

In some embodiments, the laser pulses can be injected (or delivered or directed) into an individual LED to locally separate the individual LED from the substrate. Meanwhile, heat is locally generated by the laser pulses and transferred to a respective intermediate metallic layer that is pre-formed on the individual LED. Due to the very short pulse rate and very small spot of focus laser pulses, the temperatures of localized heating on the bonded interfaces could be much higher than temperatures at other LEDs. Accordingly, the individual LED and a respective pixel circuit in a backplane can be bonded by eutectic bonding through the respective intermediate metallic layer. In contrast, no eutectic bonding occurs for the other LEDs. Additionally, micro forces can be generated due to the injected laser pulses and can add a pressure to the bonding interfaces, which can further increase the bonding strength between the LED and the respective pixel circuit. As the laser pulses can generate very high temperature in a very short period of time, the eutectic bonding can be very quick, e.g., less than 1 second. The bonding can be also permanent, e.g., due to fusion of the intermediate metallic layers.

The laser pulses are delivered in the form of a laser beam. The laser beam can be moved to deliver (or direct) to other particular LEDs for selective separation from the substrate and local bonding with the backplane. A high precision (e.g., <10 micrometers accuracy) X-Y stepping platform can be used to move the laser beam in two dimensions. By controlling a repetition rate, a power, and/or a stepping speed of the laser pulses, a low-temperature selective eutectic bonding of an array of particular LEDs on an array of pixel circuits can be achieved. The spot size of the laser beam can be smaller than, identical to, or slightly larger than a size of an LED with gaps between adjacent LEDs. The spot size can be smaller enough to selectively lift off the LED from the LED substrate without affecting the adjacent LEDs. The other LEDs that are not exposed to the laser beam can be lifted-off from the surface of the backplane and remain on the LED substrate for next use.

The laser pulses assisted selectively bonding and separation enables increased LED material utilization efficiency. For example, to fabricate a three-color active matrix display, three color LED arrays can be individually formed on respective substrates with the same minimum intervals as the final display. The different color LEDs formed on respective substrates can have the same height (or etched thickness). Laser pulses can be selectively injected into particular first color LEDs that are separated with two other first color LEDs. The particular first color LEDs with the injection of the laser pulses are individually separated from a first substrate and bonded on a first backplane. The other first color LEDs without injection of the laser pulses remain formed on the first substrate, which can be used to be bonded on a second backplane bonded with an array of second color LEDs. Similarly, by laser pulses assisted bonding and separation, second particular first color LEDs are bonded on the second backplane device. Then, the first substrate with the remaining first color LEDs can be used to be bonded on a third backplane bonded with an array of second color LEDs and an array of third color LEDs. Thus, the array of first color LEDs formed on the first substrate can be used for three times onto three different backplanes (or three different regions of a same backplane). That is, the laser assisted bonding and separation can increase the utilization of LEDs three times more efficiently than only using an LED substrate with adjacent single color LEDs separated by two intervals reserved for two other different color LEDs.

These integrated active-matrix multi-color LED pixel arrays based devices or systems can be widely used in many applications, including portable electronic and communication devices, such as wearable devices (e.g., eyeglasses, watches, clothes, bracelets, rings), mobile devices, virtual reality (VR)/augmented reality (AR) displays, monitors, televisions (TVs), or any lighting or display applications.

The details of one or more disclosed implementations of the subject matter described in this specification are set forth in the accompanying drawings and the description below. Other features, aspects, and advantages will become apparent from the description, the drawings and the claims.

BRIEF DESCRIPTION OF THE DRAWINGS

FIGS. 4A-1 and 4A-2 are perspective views of a multi-layered color LED structure formed on a substrate.

FIG. 4B-1 is a schematic diagram of an example multi-layered blue color LED structure formed on a substrate.

FIG. 4B-2 is a schematic diagram of an example array of blue color LEDs formed by patterning the structure of FIG. 4B-1.

FIGS. 4B-3 and 4B-4 are schematic diagrams of example multi-layered blue color LED structures on a sapphire substrate (FIG. 4B-3) and on a silicon substrate (FIG. 4B-4), respectively.

FIG. 4C-1 is a schematic diagram of an example array of green color LEDs formed on a substrate.

FIG. 4C-2 is a schematic diagram of an example array of red color LEDs formed on a substrate.

FIGS. 4D-1 and 4D-2 show schematic diagrams of an example TFT array backplane device.

FIG. 4D-3 is a cross-sectional view of the TFT array backplane device of FIGS. 4D-1 and 4D-2.

FIGS. 4E-1 and 4E-2 are schematic diagrams of an example process of bonding multiple red color LED arrays on substrates onto a TFT array backplane device and removing the substrates.

FIG. 4F-1 is a schematic diagram of a bonded device including the red color LED arrays and the TFT array backplane device.

FIG. 4F-2 is a perspective view of the bonded device of FIG. 4F-1.

FIGS. 4G-1 and 4G-2 are schematic diagrams of an example process of bonding multiple green color LED arrays on substrates onto a TFT array backplane device with integrated red color LED arrays and removing the substrates for the green color LED arrays.

FIG. 4H-1 is a schematic diagram of a bonded device including the red and green color LED arrays and the TFT array backplane device.

FIG. 4H-2 is a perspective view of the bonded device of FIG. 4H-1.

FIGS. 4I-1 and 4I-2 are schematic diagrams of an example process of bonding multiple blue color LED arrays on substrates onto a TFT array backplane device with integrated red and green color LED arrays and removing the substrates for the blue color LED arrays.

FIG. 4J-1 is a schematic diagram of a bonded device including the red, green and blue color LED arrays and the TFT array backplane device.

FIG. 4J-2 is a perspective view of the bonded device of FIG. 4J-1.

FIG. 4K is a schematic diagram of a device with dielectric spacers filled in the bonded device of FIG. 4J-1.

FIG. 4L is a schematic diagram of a device including a transparent electrode formed on a common surface of the bonded device of FIG. 4K.

FIG. 4M is a schematic diagram of a device including a transparent protective layer and a polarizing film formed on the device of FIG. 4L.

FIG. 4N is a schematic diagram of an integrated device after removing a carrier glass from the device of FIG. 4M.

FIG. 6H is a schematic diagram of a device with multiple color phosphor films formed on the device of FIG. 6G.

FIG. 6I is a schematic diagram of a flexible integrated device after forming a protection layer and a polarizing film on the device of FIG. 6H and removing the carrier glass of the TFT array backplane device.

FIG. 10A is a schematic diagram of an example multi-layered blue color LED structure with an intermediate metallic film formed on a first substrate.

FIG. 10B is a schematic diagram of an example array of blue color LEDs with respective intermediate metallic layers formed by patterning the structure of FIG. 10A.

FIG. 10C is a schematic diagram of an example array of green color LEDs with respective intermediate metallic layers formed on a second substrate.

FIG. 10D is a schematic diagram of an example array of red color LEDs with respective intermediate metallic layers formed on a third substrate.

FIG. 10I-1 is a schematic diagram of a bonded device including the first array of red color LEDs and the first TFT array backplane device.

FIG. 10I-2 is a perspective view of the bonded device of FIG. 10I-1.

FIG. 10J-1 is a schematic diagram showing bonding multiple first arrays of green color LEDs formed on second substrates onto a second TFT backplane device and removing the second substrates with the remaining green color LEDs from the second TFT backplane device.

FIG. 10J-2 is a schematic diagram showing bonding multiple arrays of blue color LEDs formed on first substrates onto a third TFT backplane device and removing the third substrates with the remaining blue color LEDs from the third TFT backplane device.

FIG. 10O-1 is a schematic diagram of a bonded device including the first array of red color LEDs and the second array of green color LEDs bonded on the first TFT array backplane device.

FIG. 10O-2 is a perspective view of the bonded device of FIG. 10I-1.

FIG. 10P-1 is a schematic diagram showing bonding second arrays of blue color LEDs formed on first substrates of FIG. 10J-2 onto the second TFT backplane device bonded with the first array of green color LEDs and removing the first substrates with the remaining third array of blue color LEDs from the second TFT backplane device.

FIG. 10P-2 is a schematic diagram showing bonding second arrays of red color LEDs formed on third substrates of FIG. 10H onto the third TFT backplane device bonded with the first array of blue color LEDs and removing the third substrates with the remaining third array of red color LEDs from the third TFT backplane device.

FIG. 10U-1 is a schematic diagram of a bonded device including the first array of red color LEDs, the second array of green color LEDs, and the third array of blue color LEDs bonded on the first TFT array backplane device.

FIG. 10U-2 is a perspective view of the bonded device of FIG. 10U-1.

FIG. 10V-1 is a schematic diagram showing bonding third arrays of red color LEDs formed on third substrates of FIG. 10P-2 onto the second TFT backplane device bonded with the first array of green color LEDs and the second array of blue color LEDs and removing the third substrates from the second TFT backplane device.

FIG. 10V-2 is a schematic diagram showing bonding third arrays of green color LEDs formed on second substrates of FIG. 10P-2 onto the third TFT backplane device bonded with the first array of blue color LEDs and the second array of red color LEDs and removing the second substrates from the third TFT backplane device.

FIG. 10W is a schematic diagram of a device with dielectric spacers filled in the bonded device of FIG. 10U-1.

FIG. 10X is a schematic diagram of a device including a transparent electrode formed on a common surface of the bonded device of FIG. 10W.

FIG. 10Y is a schematic diagram of a device including a transparent protective layer and a polarizing film formed on the device of FIG. 10X.

FIG. 10Z is a schematic diagram of an integrated device after removing a carrier glass from the device of FIG. 10Y.

DETAILED DESCRIPTIONS

The following descriptions are example display devices or systems that include integrated active-matrix light-emitting diode (LED) pixel arrays on rigid substrates or flexible substrates. However, the disclosed implementations can be adopted to any suitable system that needs forming integration of two separate components, e.g., arrays of light-emitting elements and backplanes including integrated circuits, e.g., non-volatile memories and/or drivers. For example, the substrates can be made of any suitable material, e.g., rigid substrates such as silicon, silicon oxide, silicon carbide, gallium nitride, sapphire, glass, or spinel, or flexible substrates such as a polyimide film or a stainless steel. The light-emitting elements can include any suitable light sources, e.g., semiconductor based LEDs, OLEDs, laser diodes, or lasers such as vertical-cavity surface-emitting laser (VCSELs). The backplane can be a CMOS backplane or a TFT array control backplane.

Figure 1:
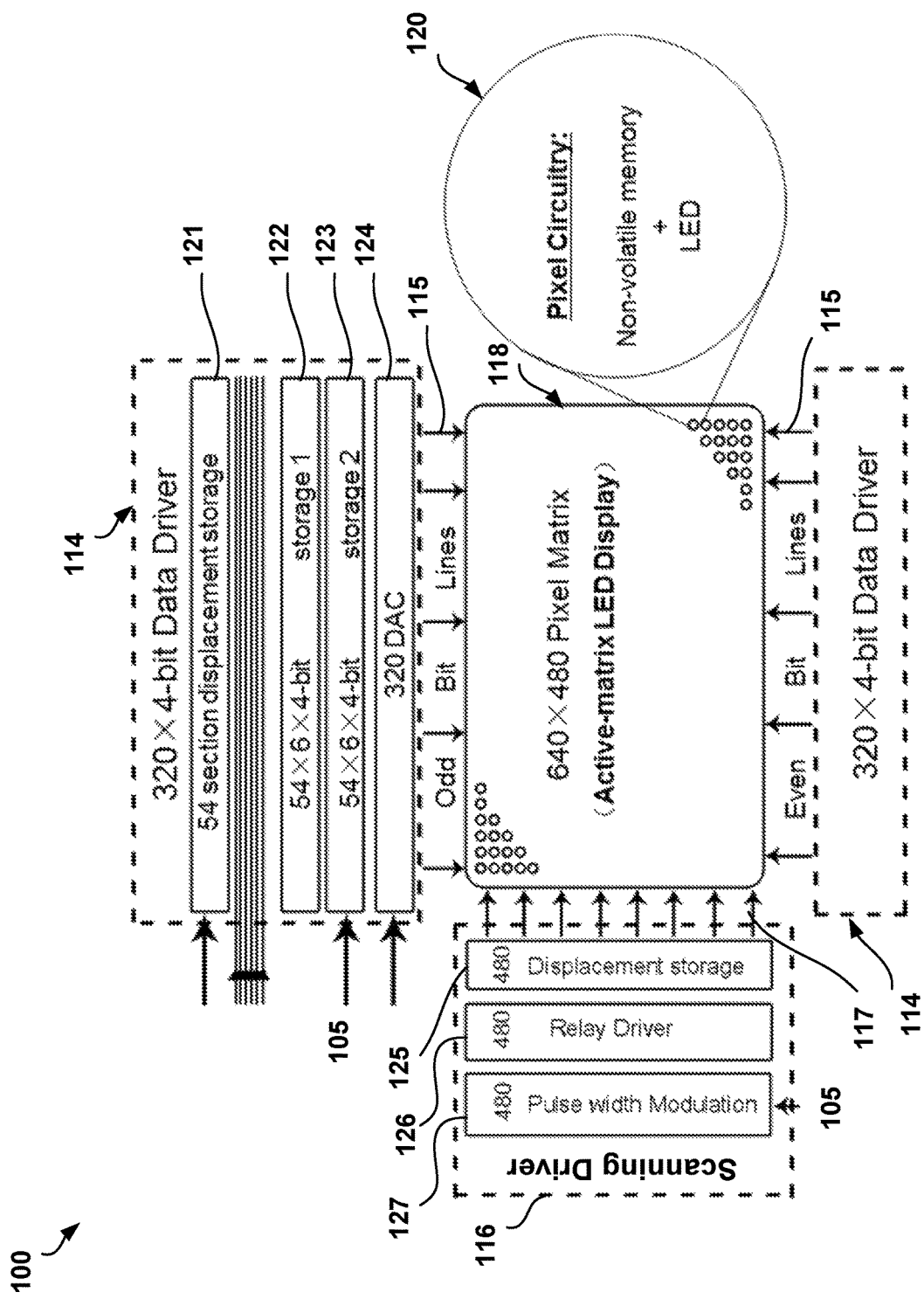
FIG. 1 is a schematic diagram of an example integrated active-matrix LED pixel array based display system, according to one or more implementations of the present disclosure.
Figure 2B:
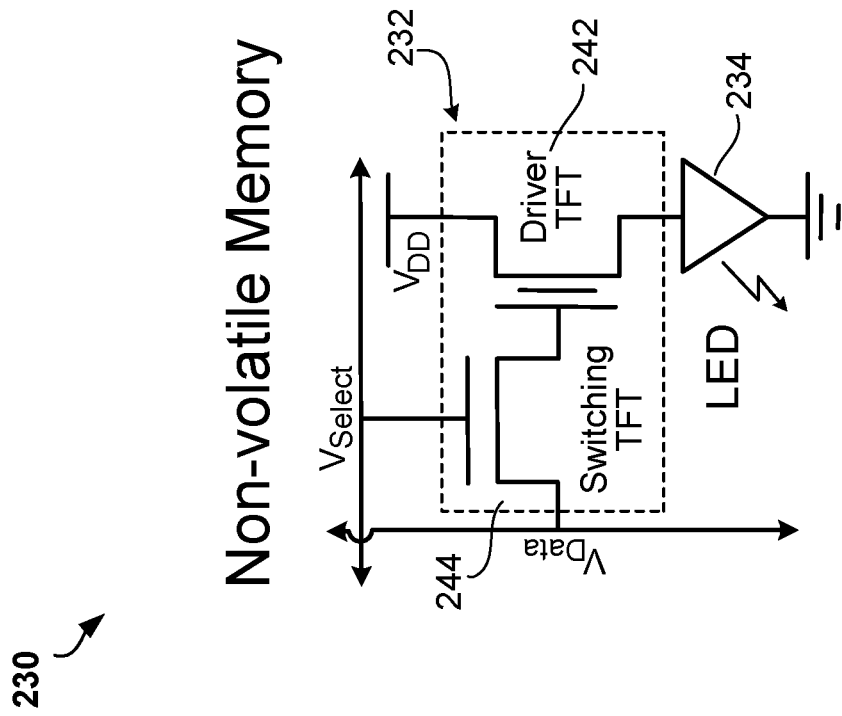
FIGS. 2A-2B are schematic diagrams of example active-matrix LED pixels, according to one or more implementations of the present disclosure.
Figure 2A:
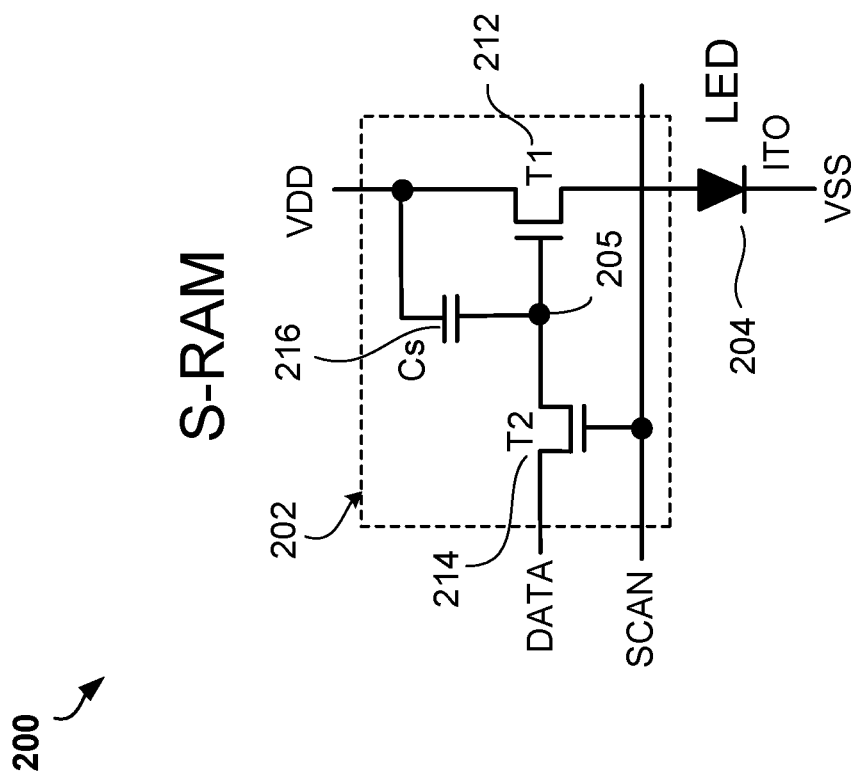
Figure 2C:
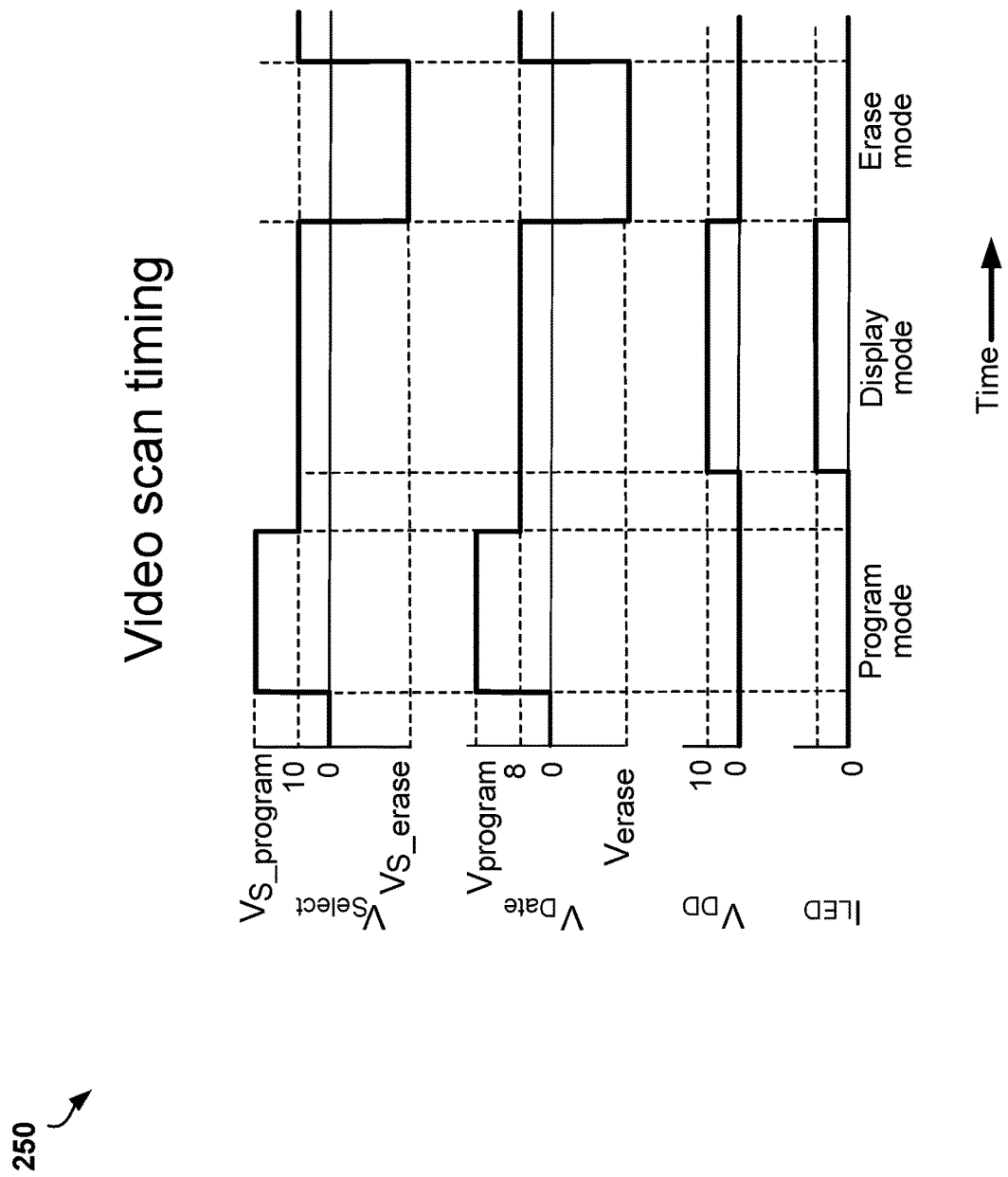
FIG. 2C shows an example timing diagram using active-matrix LED pixels for a video display, according to one or more implementations of the present disclosure.
Figure 3A:
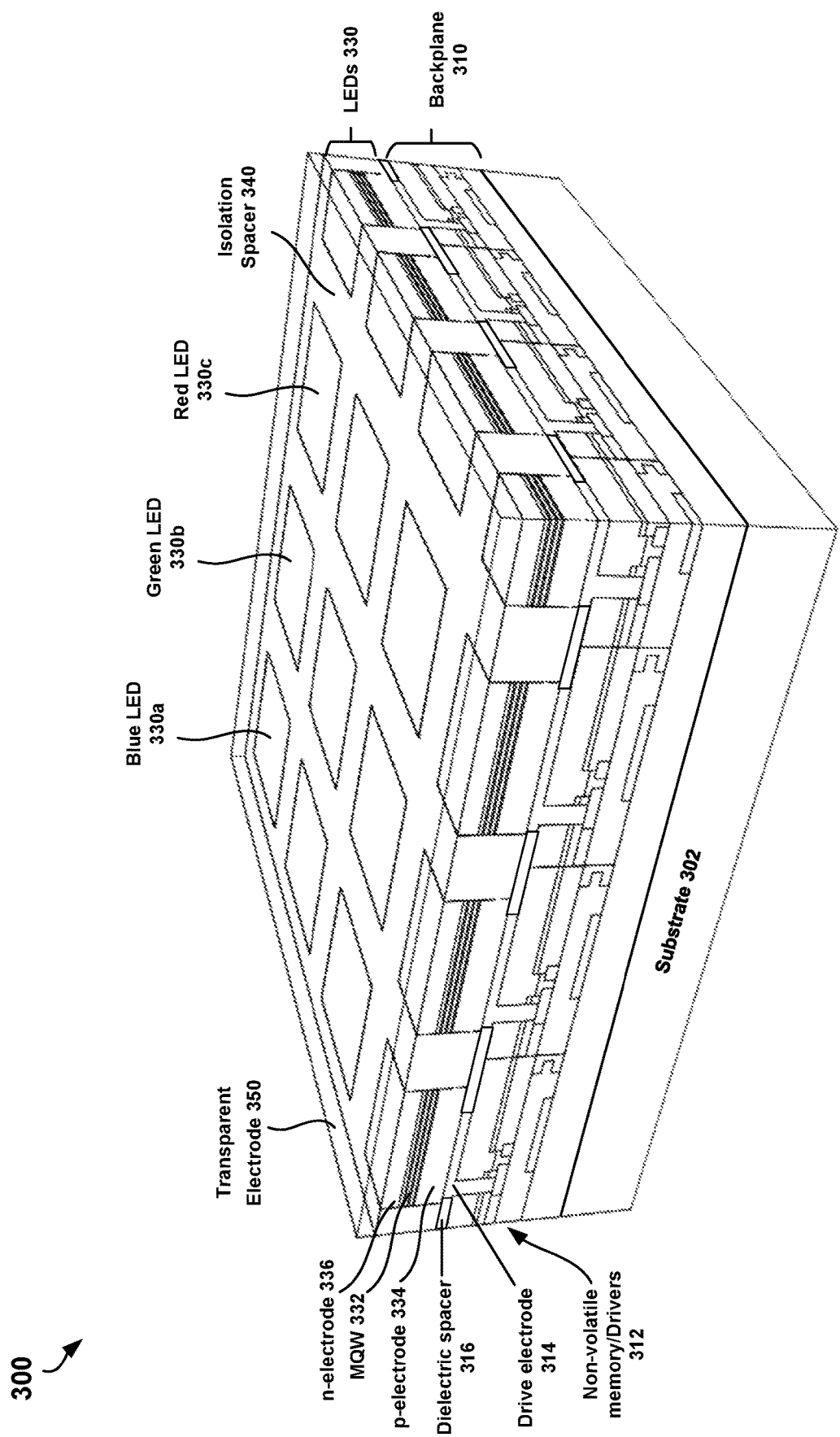
FIG. 3A is a perspective view of an example integrated active-matrix multi-color pixel array based display system using different color LEDs bonded on a backplane, according to one or more implementations of the present disclosure.
Figure 3B:
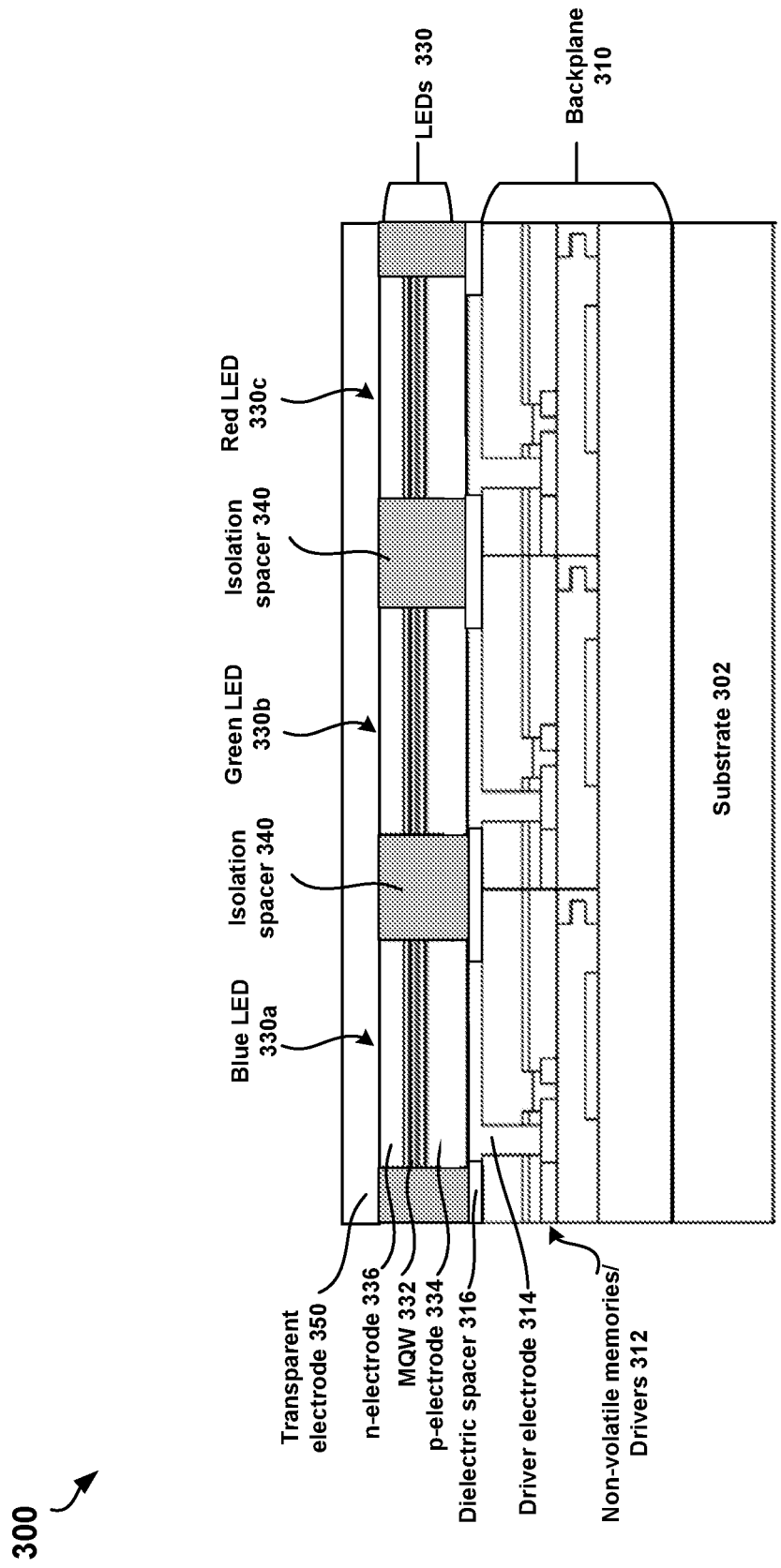
FIG. 3B is a cross-sectional view of the integrated display system of FIG. 3A.
Figure 3C:
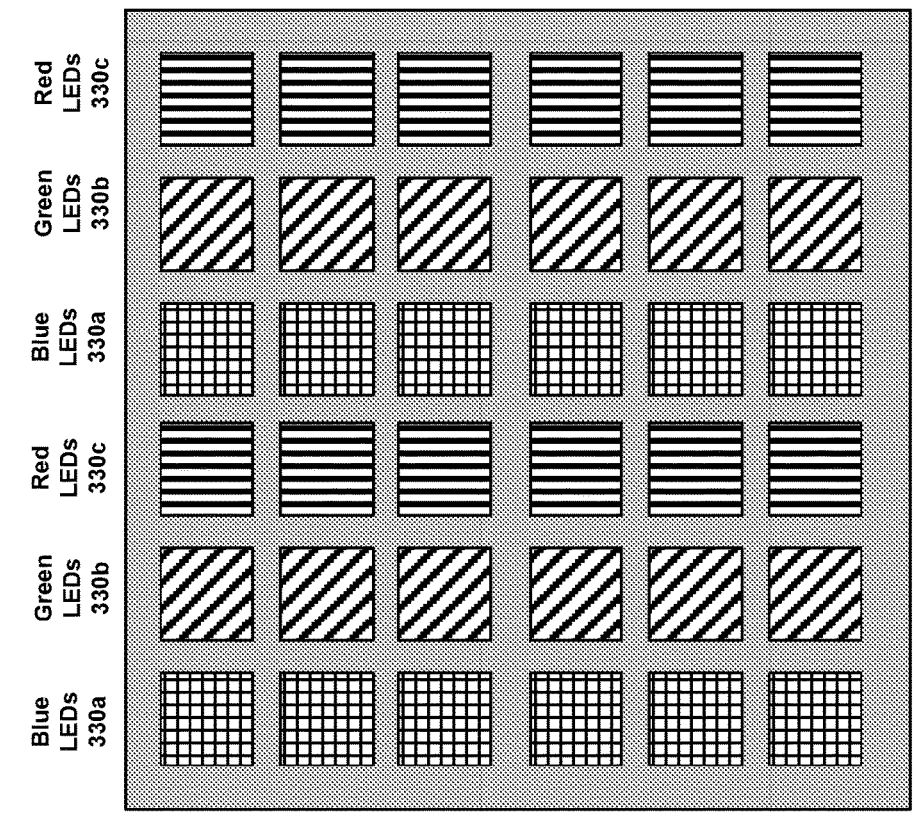
FIG. 3C is a top view of the integrated display system of FIG. 3A.
Figures 2, 4A:
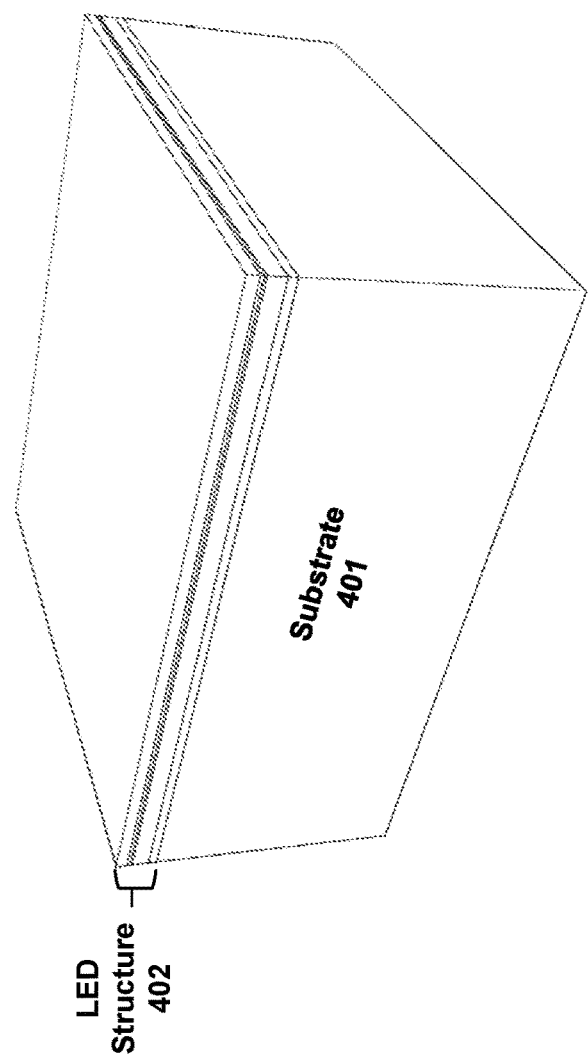
Figures 1, 4A:
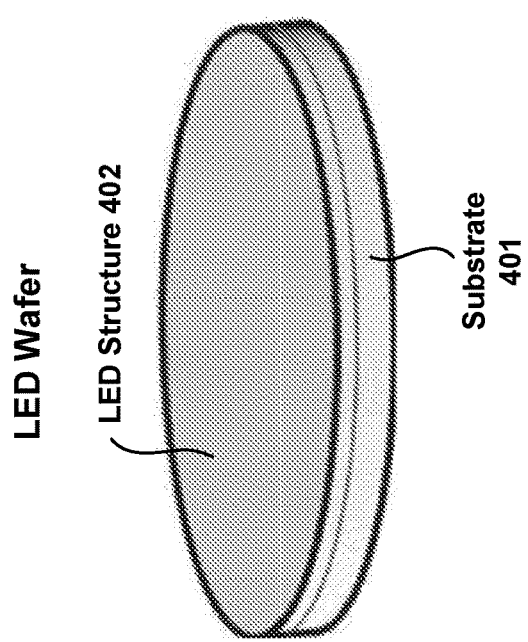
Figure 5A:
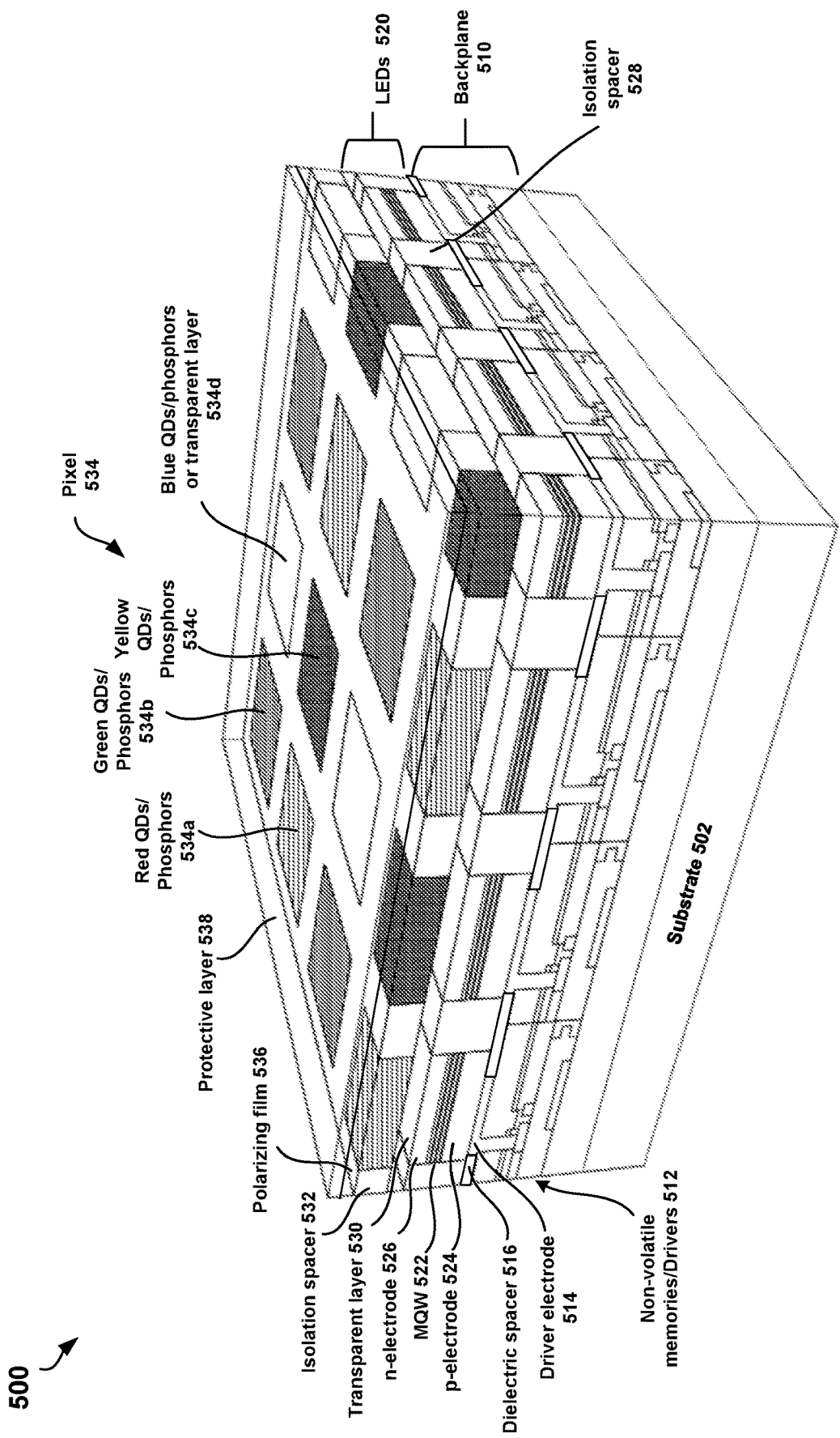
FIG. 5A is a perspective view of an example integrated display system with active-matrix multi-color LED pixel arrays fabricated by single color LEDs bonded on a backplane with multiple color phosphors or quantum dot (QDs), according to one or more implementations of the present disclosure.
Figure 5B:
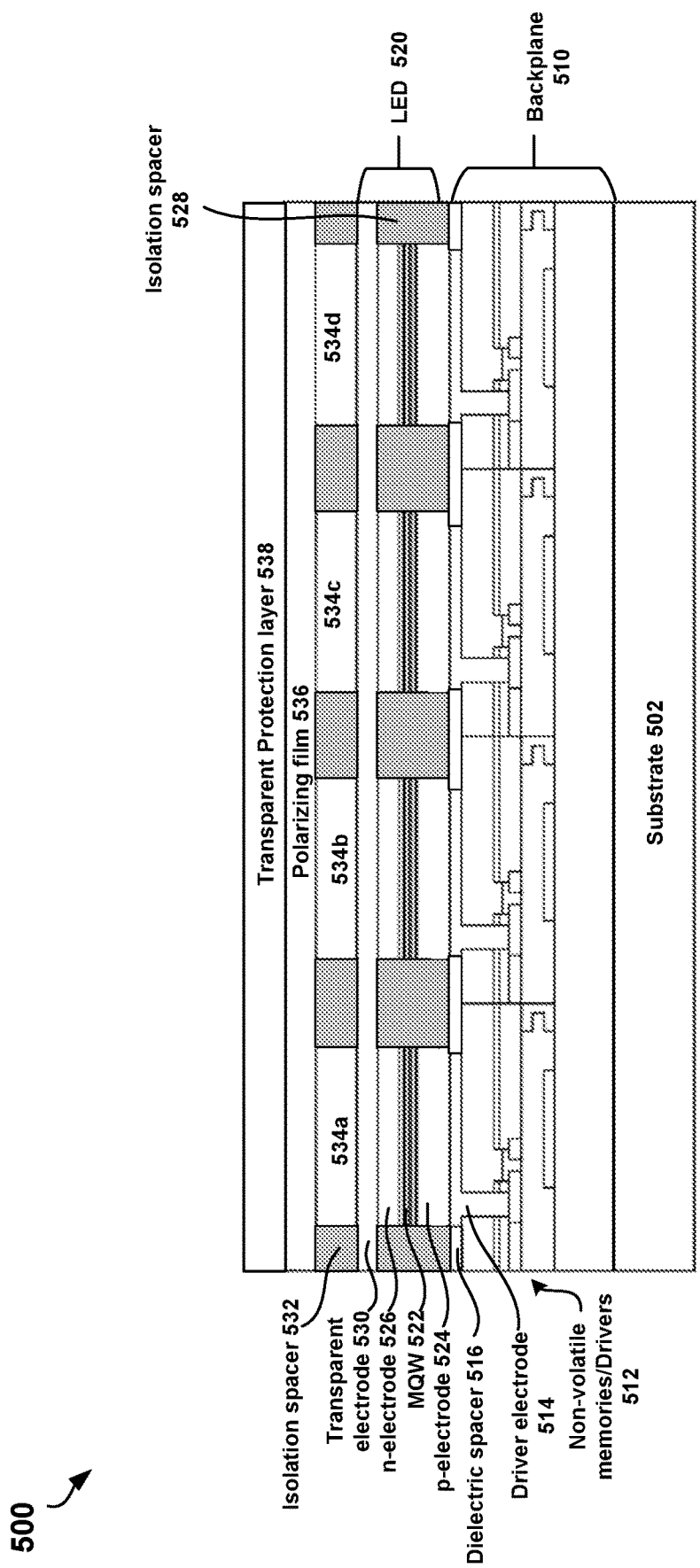
FIG. 5B is a cross-sectional view of the integrated display system of FIG. 5A.
Figure 7:
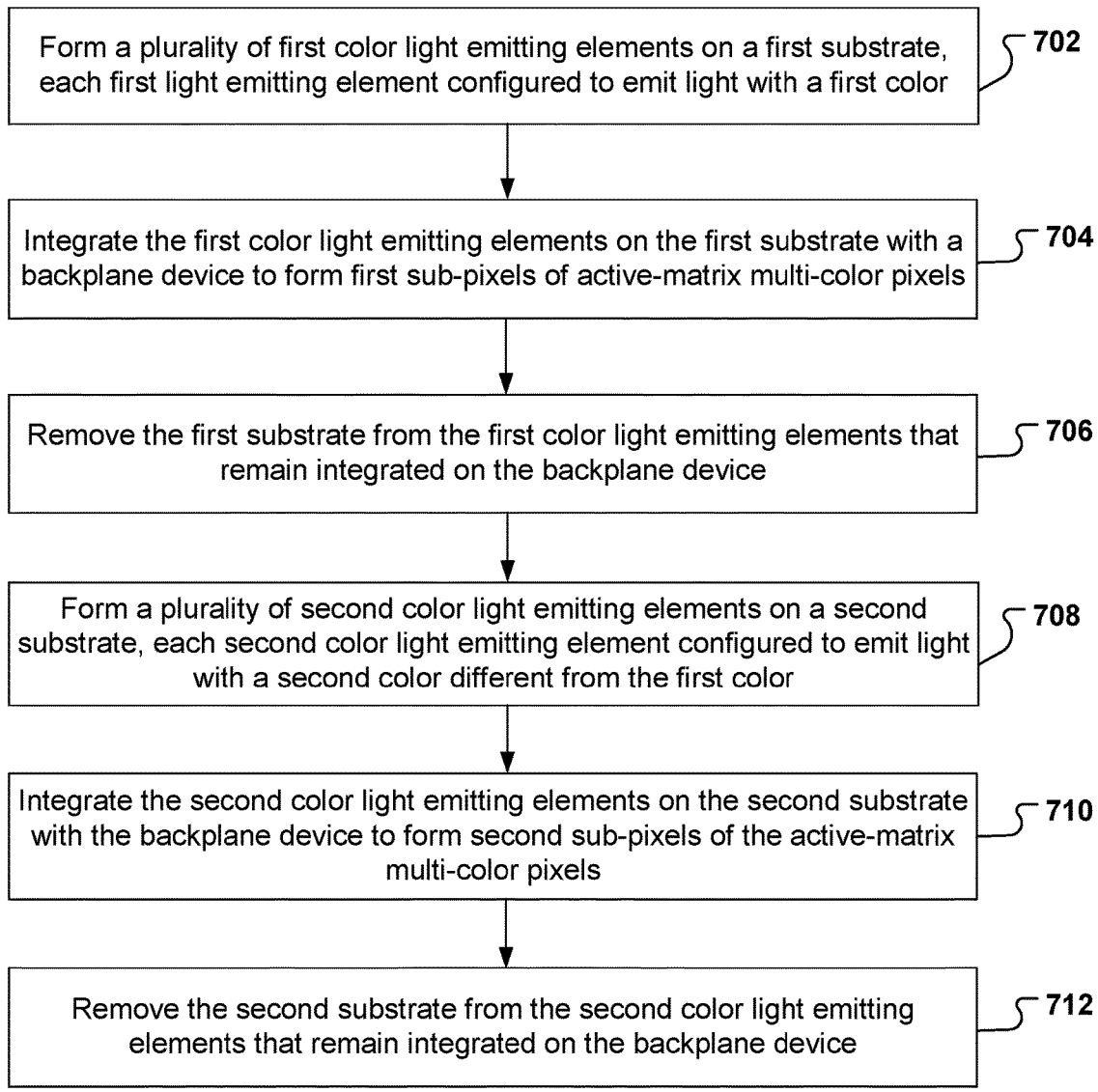
FIG. 7 is a flow diagram of an example process of forming an integrated active-matrix multi-color pixel display system by sequentially bonding different color light emitting elements onto a backplane device.
Figure 8:
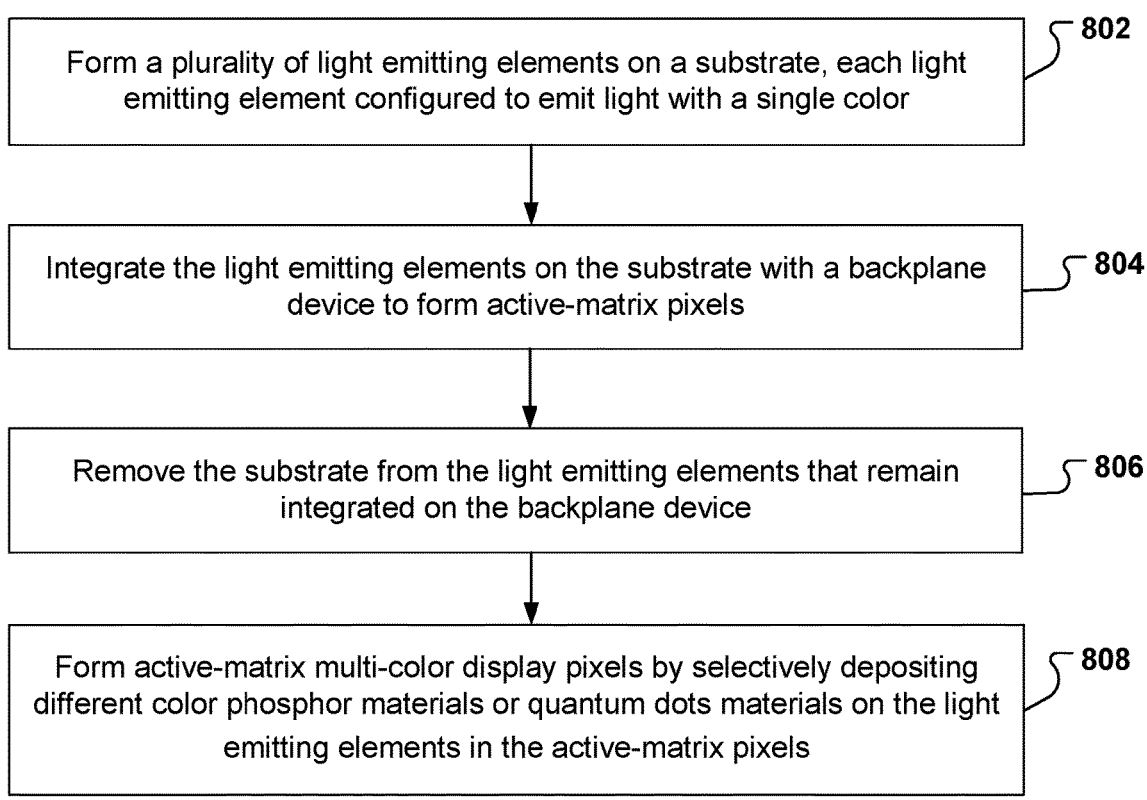
FIG. 8 is a flow diagram of an example process of forming an integrated active-matrix multi-color pixel display system by first bonding single color light emitting elements onto a backplane device and then depositing multiple color phosphors or QDs films.
Figure 9A:
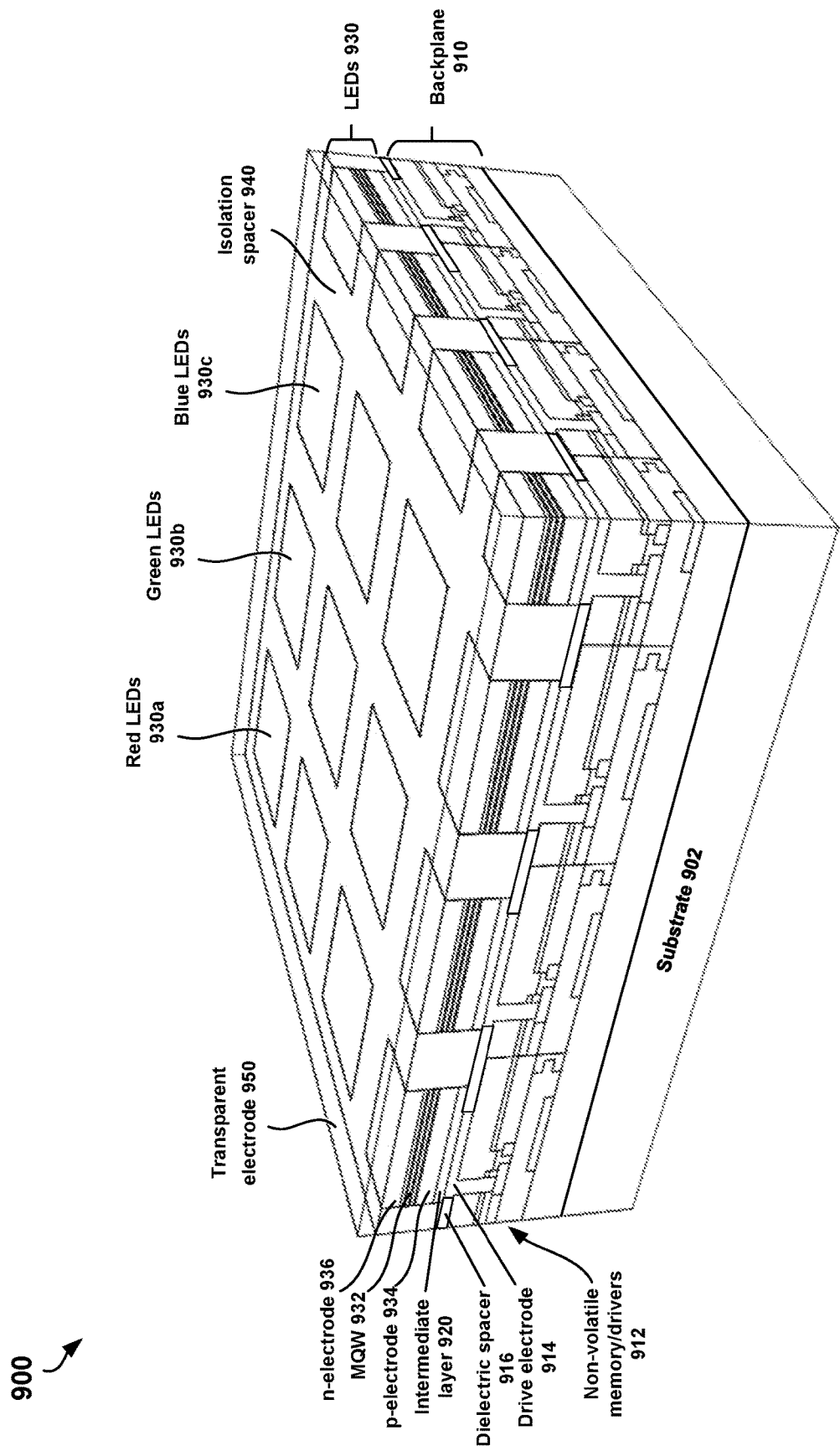
FIG. 9A is a perspective view of an example integrated active-matrix multi-color pixel array based display system using different color LEDs bonded on a backplane through intermediate metallic layers, according to one or more implementations of the present disclosure.
Figure 9B:
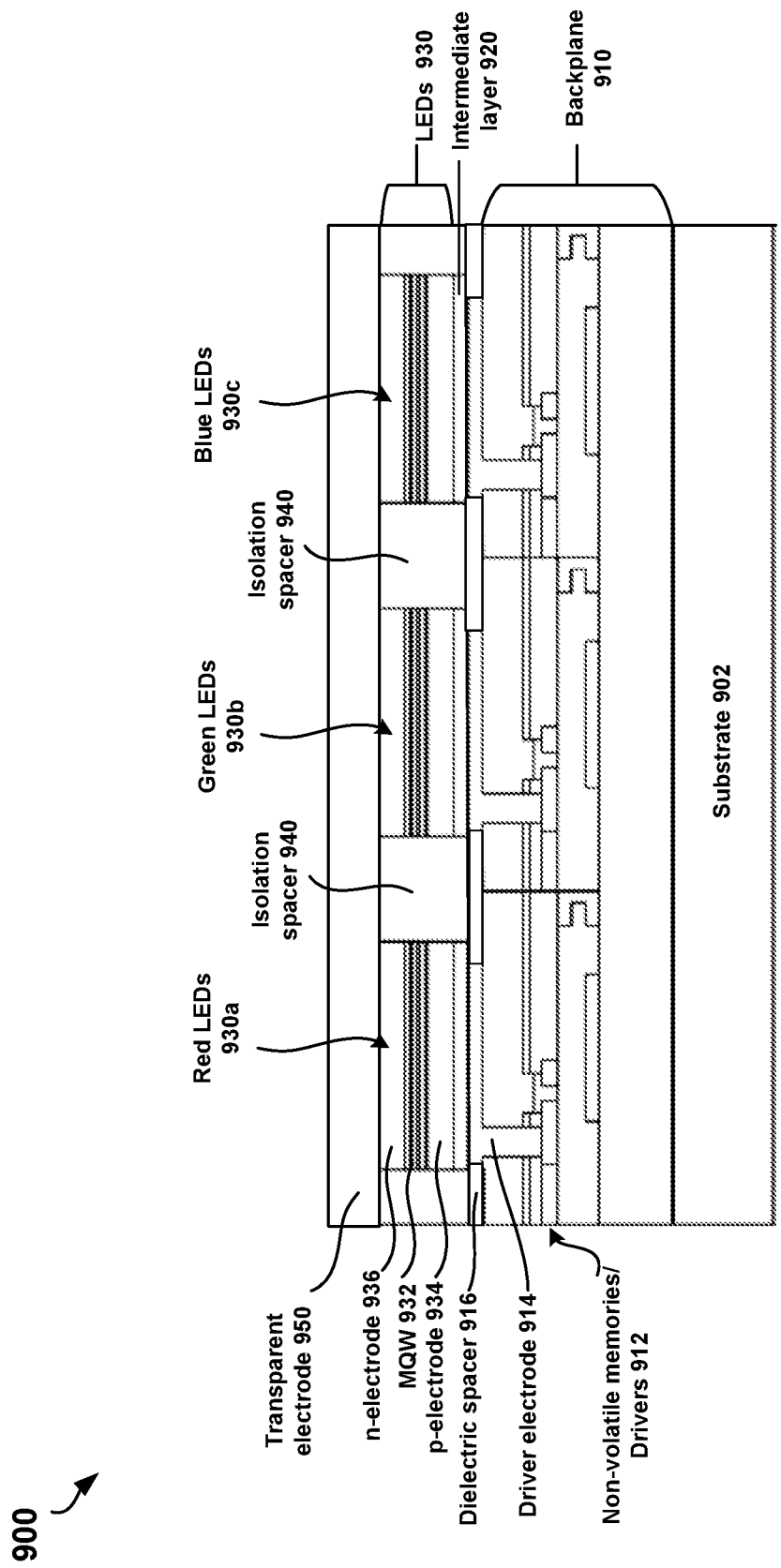
FIG. 9B is a cross-sectional view of the integrated display system of FIG. 9A.

For illustration purposes only, in the following, FIG. 1 shows an example integrated active-matrix LED pixel array based display system; FIGS. 2A-2B show example active-matrix LED pixels; FIG. 2C shows an example timing diagram using active-matrix LED pixels for a video display; FIGS. 3A-3C show an example integrated active-matrix multi-color pixel array based display system by bonding three different color LED arrays on a backplane device; FIGS. 4A-1 to 4N show an example process of fabricating a display system of FIGS. 3A-3C; FIGS. 5A-5B show an example integrated active-matrix multi-color pixel array based display system by bonding single color LED arrays on a backplane device and forming different color phosphors or QDs on the LEDs; FIGS. 6A to 6K show an example process of fabricating a display system of FIGS. 5A-5B; FIG. 7 is an example process of fabricating an integrated display system of FIGS. 3A-3C; FIG. 8 is an example process of fabricating an integrated display system of FIGS. 5A-5B; FIGS. 9A-9B show another example integrated active-matrix multi-color pixel array based display system by bonding three different color LED arrays on a backplane device through respective intermediate metallic layers; FIGS. 10A-10Z illustrates different steps of an example process of fabricating an integrated display system of FIGS. 9A-9B; and FIGS. 11A-11C show example processes of fabricating integrated display systems of FIGS. 9A-9B.

Example Display System

FIG. 1 is a schematic diagram of an example integrated active-matrix LED pixel array based display system 100, according to one or more implementations of the present disclosure. The display system 100 can be a display module including LED pixel arrays and display drivers such as scanning drivers and data drivers. The display system 100 can be coupled to a control system, e.g., via a wired or wireless connection. The control system can control the display system 100 to operate to display images/videos.

In some implementations, the control system includes one or more processors and/or controllers, e.g., a central processing unit (CPU), a microcontroller unit (MCU), and/or integrated circuits (ICs), e.g., sensors, analog/digital converters (ADCs), digital/analog converters (DACs), amplifiers, drivers, and/or timers. The control system can also include a memory, e.g., a read-only memory (ROM) and/or a random-access memory (RAM). The processors and/or controllers can be coupled to the memory via connections, e.g., internal bus, conductive electrodes, wired connections, or wireless connections. The processors and/or controllers are configured to read data from or store data into the memory. For example, the processors and/or controllers can receive image or video data to be displayed, e.g., from external network or devices, process the image or video data, and/or store the processed image or video data in the memory. The memory can also store instructions to cause the processors and/or controllers to execute operations. Components of the control system can be monolithically manufactured on a semiconductor substrate.

In some implementations, the control system includes one or more digital signal processors including: a digital signal analyzer, a digital processor, an image processor, a volatile memory, a non-volatile memory, and/or a touch screen processor. The control system can also include one or more analog signal processors including a light signal sensor, an electrical signal sensor, a sound signal sensor, a sound signal processor, an analog signal amplifier, an ADC, a DAC, a touch screen signal processor, and/or any other associated electronic components. The analog signal processors are connected to and communicate with the digital signal processors through an ADC and/or a DAC. In operation, the analog signal processors can receive and process image or video signals from external devices or network or from the internal memory. The image or video signals may be analog signals which can be processed and converted into digital signals by an ADC. The digital signals are further processed and analyzed by the digital signal processors. Then the processed digital data can be further transmitted from the digital signal processors to particular data drivers and scanning drivers which then select particular LEDs and control the selected LEDs for display.

The display system 100 includes an active-matrix LED pixel array 118, a data driver 114 and a scanning driver 116. As illustrated in FIG. 1, the LED pixel array 118 is composed of 640 (columns)×480 (rows) pixel matrix arranged in columns and rows, respectively. Each pixel 120 is an active-matrix LED pixel. As illustrated in FIGS. 2A-2B below, an active-matrix LED pixel includes at least one LED and at least one non-volatile memory coupled to the at least one LED. Upon receiving the data instructions from the scanning driver 116 and/or the data driver 114, the non-voltage memory can enable each pixel to operate continuously and independently without waiting for the next instruction coming after a full scan.

The number of LEDs in the LED pixel array 118 is equal to n times of the number of pixels, where n is an integer. If each pixel includes one LED, n is 1; if each pixel includes two LEDs, n is 2; if each pixel includes three LEDs, n is 3; if each pixel includes four LEDs, n is 4.

In some examples, an LED pixel includes a plurality of LEDs, e.g., blue, red, and green color LEDs, and a plurality of corresponding non-volatile memories. Each LED is coupled to a respective non-volatile memory. In some examples, the LED pixel includes a white LED. In some examples, the LED pixel includes four LEDs including three LEDs emitting basic light such as red, blue, and green, and a white LED emitting white light. In some examples, one non-volatile memory is coupled to one LED. In some example, one non-volatile memory is coupled to two or more LEDs emitting the same color, and the two or more LEDs can be in two or more different pixels.

In some implementations, the scanning driver 116 includes 480 displacement storages 125, 480 relay drivers 126, and 480 pulse width modulators 127. Each row of LED pixels is coupled to a respective displacement storage 125, a respective relay driver 126, and a respective pulse width modulator 127 through a respective word line (or scanning line) 117. The scanning driver 116 can receive instructions from the control system, e.g., the processors/controllers, and select one or more particular LED pixels based on those instructions.

In some implementations, the data driver 114 is divided into two sub-drivers positioned on top and bottom of the array 118 of LED pixels, respectively. Each sub-driver can be a 320×4-bit data driver and include 54 section displacement storage 121, 54×6×4-bit storages 122 and 123, and/or 320 digital-to-analog converters (DACs) 124. Each sub-driver is coupled to 320 columns of LED pixels through respective column bit lines. Particularly, the top sub-driver is coupled to 320 columns of LED pixels through odd column bit lines, and the bottom sub-driver is coupled to another 320 columns of LED pixels through even column bit lines. An intersection of an individual bit line 115 and an individual word line 117 is coupled to a respective LED pixel. That is, selecting the individual bit line 115 and the individual word line 117 can uniquely select the respective LED pixel. The sub-data drivers can receive instructions and/or data from the control system, e.g., the processors/controllers, and select one or more particular LED pixels with the scanning driver 116 based on the instructions and/or data and transmit data to the selected particular LED pixels through respective bit lines 115.

In some implementations, the active-matrix LED pixel array 118 is covered by a protective layer. The protective layer can be transparent. In some examples, the protective layer is made of glass coated with a conductive material like indium tin oxide (ITO). The protective layer defines an array of spots corresponding to the array of LEDs. Each spot covers an LED underneath and is coupled to a corresponding non-volatile memory coupled to the LED. The spot and the surface of the LED may form a capacitor, and/or one or more additional capacitors may be formed between the spot and the LED. When the spot is touched, e.g., by a fingertip on top of the spot or moving towards the spot, a capacitance of the capacitors can change. The capacitance change can be detected by a touch screen detector/processor in the control system through the non-volatile memory and a corresponding data driver 114/scanning driver 116 coupled to the non-volatile memory. Thus, the protective layer, the LED array, and the corresponding non-volatile memories can form a touch screen position sensor, which, together with the touch screen detector/processor in the control system, enables the LED pixel display system 100 to function as a touch screen display. Additional implementations of the touch screen sensor on the LEDs are also possible, e.g., using other technologies like resistive sensing, surface acoustic wave, infrared grid, infrared acrylic projection acoustic pulse recognition, or dispersive signal technology.

In some implementations, as discussed in further details below, the display system 100 is formed by integrating an array of LEDs formed on a first substrate and a backplane device formed on a second substrate and then removing the first substrate from the LEDs that remain bonded on the backplane device. The data drivers, the scanning drivers, the non-volatile memories, and the connection lines including the bit lines and the word lines can be integrated in the backplane device. Each of the LEDs can be conductively coupled to a respective non-volatile memory in the backplane device to form an active-matrix LED pixel. In some implementations, different color LED arrays can be sequentially integrated on the backplane device to form active-matrix multi-color LED pixels. In some cases, the integration can be implemented by directly bonding, e.g., by surface pre-activation, pressure, and temperature. In some cases, the integration can be implemented by eutectic bonding, e.g., by laser pulses selectively injecting into particular LEDs to achieve localized bonding. In some implementations, single color LED arrays can be integrated on the backplane device and then different color phosphor materials or quantum dots materials can be selectively deposited on surfaces of the LEDs to form active-matrix multi-color display pixels. The backplane device can be configured to drive, e.g., transmit display data to, the active-matrix multi-color display pixels by pulse-width-modulation (PWM) technology. Due to fast response time (e.g., nanoseconds) of the LEDs, flickering issues can be eliminated and the display system 100 can be flicker free.

Example Active Matrix LED Pixels

FIG. 2A shows an example active-matrix LED pixel 200 with non-volatile memory. The LED pixel 200 includes an S-RAM (static-random access memory) 202 and an LED 204. The S-RAM 202 includes a driver transistor (T1) 212, a switching transistor (T2) 214, and a storage capacitor (Cs) 216. During display operation, a word line (scanning line or select line) can be pulled high to allow a voltage on a bit line to propagate through the switching transistor 214 to a storage node 205, charging the storage capacitor 216 and setting a high voltage on a gate of the driver transistor 212. This allows a current to pass through the driver transistor 212 and the LED 204 is consequently lighted.

FIG. 2B shows another example active-matrix LED pixel 230 with non-volatile memory 232 and an LED 234. The non-volatile memory 232 includes a driver transistor 242 and a switching transistor 244, that can be thin-film transistors (TFTs). In some implementations, different from the LED pixel 200 in FIG. 2A, the brightness of the LED 234 is not controlled by varying $V_{Data}$ applied to a gate of the driver transistor 242 through the switching transistor 244. Instead, a constant $V_{Data}$ is applied to the gate of the driver transistor 242. The current through the driver transistor that causes the LED 234 to illuminate is controlled by changing a threshold voltage $V_T$ of the driver transistor 242, e.g., through programming. If low brightness is desired, the driver transistor 242 can be set to a high threshold voltage by programming with a large positive gate pulse. If high brightness is desired, the driver transistor 242 can be set to a low threshold voltage by programming with a small positive gate pulse, or not programming at all, the leaving it with the initial threshold voltage. Thus, an image or video can be displayed by controlling the brightness or on/off status of the LEDs of an array.

FIG. 2C shows an example video scan timing 250 of a display using the active-matrix LED pixel 230 of FIG. 2B. After programming (i.e., programming mode), the display is activated by setting a supply voltage $V_{DD}$ to 10 V, $V_{Data}$ to 8 V on all the bit lines, and $V_{Select}$ to 10 V on all the word lines (select lines). The LED current and therefore brightness of the pixel 230 is determined by the programmed threshold voltage of the driver transistor 242. Both $V_{Data}$ and $V_{Select}$ are DC voltages in the display mode because a pixel refresh is not necessary to maintain a static image. The image information remains stored in the threshold voltage of the driver transistor 242 even if the power is turned off. To change the programmed image, the pixels can be first erased and then reprogrammed. Erase mode in FIG. 2C is identical to the program operation. The only difference is that the applied voltage pulse has a larger negative amplitude, instead of a positive one. This negative voltage forces the trapped electrons in the driver transistor 242 to tunnel back out, causing the threshold voltage to shift towards its original un-programmed value. For example, to erase a single pixel in the active matrix (instead of an entire column), all other select lines can be held at −30 V to prevent the erase pulse from propagating to the undesired pixel drivers.

Example Systems and Fabricating Processes Using Multiple Color LED Arrays

FIGS. 3A-3C show an example integrated display system 300 using three different color LED arrays and a backplane device. The integrated display system 300 can be the display system 100 of FIG. 1. This integrated display system 300 can be formed according to an example process described with further details in FIGS. 4A-1 to 4N.

As illustrated in FIGS. 3A-3C, the integrated display system 300 includes a backplane 310 on a first side of a substrate 302. In some implementations, the backplane 310 can be a CMOS backplane formed in a CMOS backplane device. The CMOS backplane device can include one or more CMOS backplanes and can be manufactured by existing CMOS manufacturing technologies. The substrate 302 can be a silicon substrate, e.g., a silicon wafer. In some implementations, the backplane 310 can be a TFT array control backplane formed in a TFT backplane device. The TFT backplane device can include one or more TFT backplanes and can be manufactured by existing TFT manufacturing technologies, e.g., by OEMs. The TFT array backplane can be a low temperature polysilicon (LTPS) thin-film transistors (TFT) array control backplane.

The backplane 310 includes integrated circuits having non-volatile memories and display drivers 312. In some implementations, the backplane 310 includes a number of pixel circuits. Each pixel circuit includes a non-volatile memory that has at least one transistor conductively coupled to a corresponding drive electrode 314 in a top layer of the pixel circuits or a top layer of the backplane 310. Adjacent drive electrodes 314 are conductively isolated from each other by dielectric spacers 316. The display drivers include scanning drivers and data drivers, and each of the non-volatile memories is coupled to one of the scanning drivers through at least one word line and to one of the data drivers through at least one bit line.

The integrated display system 300 includes arrays of light-emitting elements such as LEDs 330. The LEDs 330 are separated (or isolated) by isolation spacers 340, e.g., dielectric spacers. The isolation spacers 340 are configured to isolate the LEDs 330 such that the LEDs 330 are not conductively connected. The isolation spacers 340 can include an opaque dielectric material or a dielectric material with a light-absorbing material such as a black material, such that light from an LED is blocked or eliminated from propagating to an adjacent LED and thus there is no or little cross-talk between the adjacent LEDs. The opaque dielectric material can include silicon nitride (SiNx). SiNx has a hexagonal crystal structure at an ambient pressure and sintered ceramic of this phase is opaque. Each LED 330 can include a first contact electrode such as p-electrode 334 (e.g., p-GaN layer), a second contact electrode such as n-electrode 336 (e.g., n-GaN layer), and multiple quantum well (MQW) semiconductor layers 332 between the p-electrode 334 and the n-electrode 336. The MQW layers 332 can include group III-V nitrides (e.g., GaN) and each of the LEDs 330 is operable to emit light with a single color, e.g., blue, green, or red.

The emitted wavelength of an LED is dependent on the MQW materials' band gap and can be controlled by a thickness of InGaN layer (e.g., in a range of 2-3 nm) and GaN/InN ratio, from near ultraviolet (UV) for 0.02In/0.98Ga through 390 nm for 0.1In/0.9Ga, violet-blue 420 nm for 0.2In/0.8Ga, blue 440 nm for 0.3In/0.7Ga, green 532 nm for 0.5In/0.5Ga, to red for higher ratios In/Ga.

The LEDs 330 include three different color LED arrays: blue color LEDs 330a, green color LEDs 330b, and red color LEDs 330c. Each blue color LED 330a is operable to emit light with a blue color, and the MQW layers can include multiple pairs of In(0.3)Ga(0.7)N/GaN layers. Each green color LED 330b is operable to emit light with a green color, and the MQW layers can include multiple pairs of In(0.5)Ga(0.5)N/GaN layers. Each red color LED 330c is operable to emit light with a red color, and the MQW layers can include multiple pairs of InN/GaN layers. In some cases, a display pixel can include one blue color LED 330a, one green color LED 330b, and one red color LED 330c. In some cases, a display pixel can include three blue color LEDs 330a, three green color LEDs 330b, and three red color LEDs 330c that can be arranged as a square or rectangular unit. The arrays of blue color LEDs 330a, green color LEDs 330b, and red color LEDs 330c can be periodically arranged on the backplane 310.

FIG. 3C shows an example arrangement of the three LED arrays, where adjacent single color LEDs are separated by two other color LEDs along a row and same color LEDs are arranged along a column. Other arrangements of different color LED arrays are also possible, which can be determined based on a design of display pixels.

Each LED 330, e.g., blue color LED 330a, green color LED 330b, or red color LED 330c, is coupled to a respective pixel circuit that includes a non-volatile memory in the backplane 310 by conductively connecting the p-electrode 324 to a drive electrode 314 of the pixel circuit. In such a way, the array of LEDs 320 is coupled to respective pixel circuits in the backplane 310 to form an array of active-matrix LED pixels. As discussed with further details below, the p-electrode 324 and the drive electrode 314 can be bonded together. The bonding technique can include, but is not limited to: direct bonding such as low temperature direct bonding with or without an intermediate conductive layer, fusion bonding, diffusion bonding, eutectic bonding with an intermediate conductive layer, and/or transient liquid phase bonding. The direct bonding can be plasma assisted, e.g., by using plasma to activate one or more to-be-bonded surfaces before bonding.

In an active-matrix LED pixel, a non-volatile memory includes at least one transistor. The transistor has a drain node made of metal material, which is conductively connected to the drive electrode 314 through conductive via, e.g., made of metal material. The drive electrode 314 can have a larger area than the drain node of the transistor. The drive electrode 314 can be also made of metal material, e.g., indium tin oxide (ITO). Thus, in the pixel, the non-volatile memory is conductively connected to an LED through multiple metal contacts including the drain node, the conductive via, and the drive electrode 314.

Each LED 330 can be aligned with the respective drive electrode 314. In some cases, the LED 330 has a smaller area size than the drive electrode 314 and within an area of the drive electrode 314. In some cases, the LED 330 has a same area size as the drive electrode 314 and can be overlapped on the area of the drive electrode 314. In some cases, the LED 330 has a larger area size than the drive electrode 314 but smaller than the drive electrode 314 and adjacent dielectric spacer 316, such that the LED 330 can have a larger area (for a higher pixel filling coefficient) but be conductively isolated from each other.

A transparent conductive layer 350, e.g., an indium tin oxide (ITO) layer, is on top of the arrays of LEDs 330. The transparent conductive layer 350 is in contact with the n-electrodes 326 of the LEDs 330 to form a common transparent electrode of the LEDs 330. As the LEDs 330 are made of semiconductor materials, in some examples, there is no an additional protective layer added on top of the LEDs 330.

In some implementations, a transparent protective layer is deposited on top of the transparent conductive layer 350. The protective layer can be a touch-sensitive transparent layer and can form, together with the transparent conductive layer 350 (as the common electrode), a capacitive touch screen position sensor.

In some cases, a polarizing film can be deposited between the transparent conductive layer 350 and the transparent protective layer. The polarizing film can be configured to allow light from the LEDs 330 to propagate through along a polarization direction to become a polarized light.

In some implementations, an intermediate conductive layer, e.g., a metal layer, can be formed on top of each LED, e.g., on a contact electrode such as p-GaN electrode 334. The intermediate conductive layer can have a smoother surface than that of the contact electrode, which can increase adhesion between the LED and the backplane during direct bonding. A surface of the intermediate conductive layer can be plasma activated before bonding. In some cases, the intermediate conductive layer can be used for low temperature eutectic bonding or fusion bonding. In some cases, each of the intermediate conductive layers can form a highly-reflective mirror for a corresponding LED 330 bonded with the intermediate conductive layer. The mirror can have a reflectivity higher than 80% for the wavelengths of light emitted by the LED 330. The intermediate conductive layer can have a same area size as the corresponding LED 330. The contact electrode p-GaN 334 can include a metal film with a high reflectivity and can be configured to enhance a brightness of light emitted from the LED 330. Each of the active-matrix light-emitting pixels is operable to output a light flux in one direction that is larger than 80% of light flux in two directions output from each of the at least one LED 330 in the pixel.

Referring now to FIGS. 4A-1 to 4N, steps of fabricating a display system, e.g., the display system 300 of FIGS. 3A-3C, are illustrated. For illustration purposes only, in the following, a TFT control array backplane device is used for fabricating the display system.

FIGS. 4A-1 and 4A-2 show an LED device 400 (e.g., an LED wafer) having a multi-layered LED structure 402 formed on a substrate 401 (e.g., a wafer). The substrate 401 can be pre-treated, e.g., by cleaning a top surface of the substrate 401. Then the multi-layered LED structure 402 is formed by directly depositing (e.g., epitaxially growing) multiple layers on the top surface of the substrate 401. The multiple layers can include a buffer (and/or sacrificial) layer, a first contact electrode, light-emitting layers, and a second contact electrode that are sequentially formed on the substrate 401. The multiple layers can be deposited by Metal-Organic Chemical Vapor Deposition (MOCVD), molecular beam epitaxy (MBE), atomic layer deposition (ALD), physical vapor deposition (PVD), Chemical Vapor Deposition (CVD), or any other suitable deposition methods in a vacuum chamber with a certain temperature. The light-emitting layers can include one or more quantum well layers of group III-V compounds for emitting light with a specified color. Note that LED structures formed on substrates can be commercially prepared, e.g., through OEM.

Figures 3, 4, 4B:
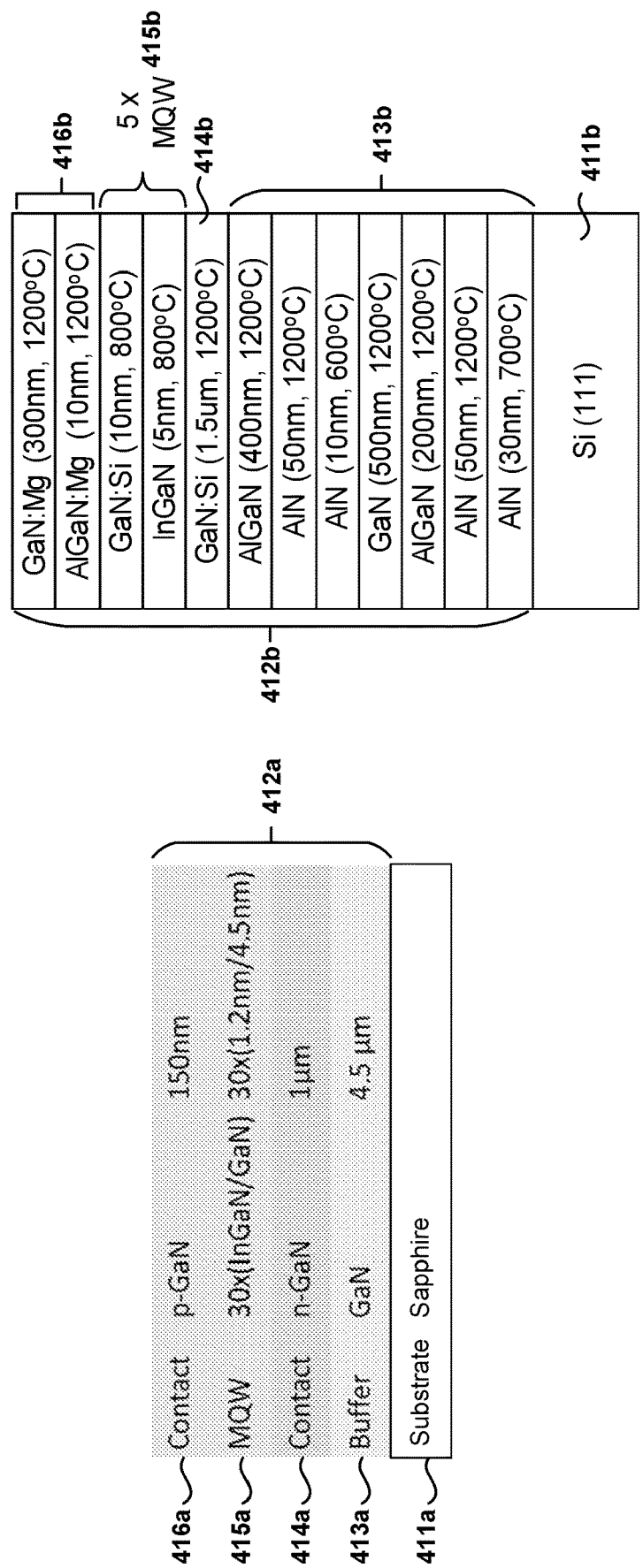

FIG. 4B-1 is a schematic diagram of an example multi-layered blue color LED structure 400 formed on the substrate 411. The substrate 411 can be a sapphire substrate, a silicon substrate, or a silicon carbide (SiC) substrate. The blue color LED structure 400 can include a buffer layer 403 (e.g., AlGaN layer and GaN layer), an n-electrode layer 404 (e.g., n-GaN layer) as a first contact electrode, MQW layers 405, and a p-electrode layer 406 (e.g., p-GaN layer) as a second contact electrode that are sequentially formed on the substrate 401.

FIG. 4B-2 is a schematic diagram of a structure 410 including an array of blue color LEDs 412 formed after patterning the blue color LED structure 400 of FIG. 4B-1. Each of the blue color LEDs 412 can be operable to emit light with a wavelength of about 460 nm.

The patterning can be performed according to different designs or configurations. For example, in an integrated device such as the integrated device 300 of FIG. 3C, adjacent same color LEDs are separated by two other different color LEDs along rows and same color LEDs are along columns. That is, along each row, two adjacent blue color LEDs are separated by a green color LED and a red color LED; two adjacent green color LEDs are separated by a red color LED and a blue color LED; and two adjacent red color LEDs are separated by a blue color LED and a green color LED. Each LED is bonded with a corresponding drive electrode of a respective pixel circuit in a backplane. Thus, patterning the blue color LED structure 400 can be based on a pattern of the corresponding drive electrodes of pixel circuits for the blue color LEDs 412. Adjacent drive electrodes are separated by one dielectric spacer, while a distance between adjacent blue color LEDs 412 within a row is substantially identical to a distance between corresponding pixel circuits for the blue color LEDs 412 in the backplane, that is, about two drive electrodes and dielectric spacers between the drive electrodes and the blue color LEDs.

A protective mask can be obtained based on information for fabricating the drive electrodes in the backplane. For example, the drive electrodes are fabricated by forming a protective mask (e.g., photoresist or hard mask), depositing materials of the drive electrodes, and removing the protective mask layer. The pattern of the protective mask for patterning the LED structure 400 can be determined based on the protective mask for fabricating the drive electrodes, but with different spacings for LEDs, such that the LED structure 400 can be selectively etched away during the patterning. The patterning can be performed with the following steps: 1) patterning a hard mask layer, e.g., SiNx such as $Si_3N_4$, on top of the LED structure 400, e.g., on the p-electrode layer 406 (e.g., p-GaN) of the LED structure 400; 2) etching through the layers of the LED structure 400, to the substrate 411; 3) removing the remaining hard mask layer.

As illustrated in FIG. 4B-2, the LED structure 400 is patterned to form an array of blue color LEDs 412. Adjacent blue color LEDs 412 are separated from each other by spaces reserved for other color LEDs. In some cases, the formed blue color LED 412 has a smaller area size than a drive electrode of the backplane and within an area of the drive electrode. In some cases, a formed LED 412 has a same area size as the drive electrode and can be overlapped on the area of the drive electrode. In some cases, a formed LED 412 has a larger area size than the drive electrode but smaller than the drive electrode and adjacent dielectric spacer, such that the LED 412 can have a larger area but be conductively isolated from each other.

FIG. 4B-3 shows an example III-V blue color LED 412a formed on a sapphire substrate 411a. The III-V blue light LED 412a includes multiple sequentially grown epitaxial layers, including a buffer layer 413a, e.g., 4.5 μm-GaN layer, a n-type contact electrode 414a, e.g., 1 μm n doped GaN layer, MQW 415a, e.g., 30 pairs of 1.2 nm-InGaN/4.5 nm-GaN layers, and a p-type contact electrode, e.g., 150-nm p doped GaN layer, that are directly formed on a surface of the sapphire substrate 411a.

FIG. 4B-4 shows an example III-V blue color LED 412b formed on a silicon substrate 411b. The silicon substrate 411b can be a silicon (111) substrate, where a surface of the silicon substrate can be parallel to a (111) crystalline plane. The III-V blue light LED 412b is formed on the silicon substrate 411b by using alternating pairs of an InGaN layer and a GaN:Si layer as the quantum well (MQW) layers 415b. The LED 412b can include one or more buffer layers 413b deposited on the silicon substrate 411b, one or more lower Group III-V compound layers 414b as a first contact electrode on the buffer layers 413b, MQW layers 415b on the lower Group III-V compound layers 414b, and one or more upper Group III-V compound layers 416b as a second contact electrode.

In a particular example, the blue light LED 412b includes sequentially epitaxially grown layers with MOCVD (or MBE or ALD): 30 nm-AlN layer under 700° C., 50 nm-AlN layer under 1200° C., 200 nm-AlGaN layer under 1200° C., 500 nm-GaN layer under 1200° C., 10 nm-AlN layer under 600° C., 50 nm-AlN layer under 1200° C., 400 nm-AlGaN layer under 1200° C., 1.5 μm-GaN:Si layer under 1200° C., 5 pairs of 5-nm InGaN layer and 10 nm-GaN:Si layer under 800° C., 10 nm-AlGaN:Mg layer under 1200° C., and 300 nm-GaN:Mg layer under 1200° C.

FIG. 4C-1 shows an example 420 of an array of green color LEDs 422 fabricated on a substrate 421. The substrate 421 can be c-plane sapphire wafer, m-plane GaN wafer, silicon wafer, or SiC wafer. A III-V green color LED structure can be first formed on the substrate 421 and patterned to form the green color LEDs 422. The patterning can be performed according to a pattern of corresponding pixel circuits in a backplane. Similar to the array of blue color LEDs 412, two adjacent green color LEDs 422 within a row are separated by the space needed for two corresponding pixel circuits and dielectric spacers.

The III-V green color LED 422 can include sequentially grown epitaxial layers, including a buffer layer 423, e.g., GaN/AlGaN layer, a n-type contact electrode 426, e.g., n doped GaN layer, MQW layers 427, e.g., InGaN/GaN layers, and a p-type contact electrode, e.g., p doped GaN layer, on the substrate 421. In a particular example, the green color LED 422 can include 20~40 nm AlGaN layer, 3 to 4.5 µm GaN layer, 1.5 to 3 µm n-GaN contact electrode layer, 250 nm to 400 nm MQW layers, and 100 to 250 nm p-GaN contact electrode layer, on a c-plane sapphire wafer or a m-plane GaN wafer. Each of the III-V green color LEDs 420 can be operable to emit light with a wavelength of about 520 nm.

FIG. 4C-2 shows an example red color LED device 430 including an array of red color LEDs 432 fabricated on a substrate 431. The substrate 431 can be transparent GaP (or InGaP) wafer or opaque GaAs wafer. A III-V red color LED structure can be first formed on the substrate 431 and then patterned to form the array of red color LEDs 432. The patterning can be performed according to a pattern of corresponding pixel circuits in a backplane. Similar to the array of blue color LEDs 412, two adjacent red color LEDs 432 within a row are separated by the space need for two corresponding pixel circuits and dielectric spacers.

The III-V red color LED 432 can include multiple sequentially grown epitaxial layers including a buffer layer 433 (or a sacrificial light absorption epitaxy layer), a n-type contact electrode 434, e.g., n doped InGaP layer, MQW layers 435, e.g., InN/GaN layers, AlGaAs or InAlGaP layers, and a p-type contact electrode 436, e.g., p doped InGaP layer. The sacrificial layer can be made of InGaAsN or AlGaInP material. In a particular example, the red color LED 432 can include an AlGaInP sacrificial layer of 300~400 nm, a n-GaN contact electrode layer of 50 nm to 100 nm, a n-AlGaInP current spreading layer of 2 µm to 4 µm, MQW layers of 400 nm to 500 nm, and a p-GaP contact electrode layer of 2.5 µm to 3.2 µm, on a GaAs wafer. The III-V red color LED 432 can be operable to emit light with a wavelength of about 650 nm.

Figures 1, 4D:
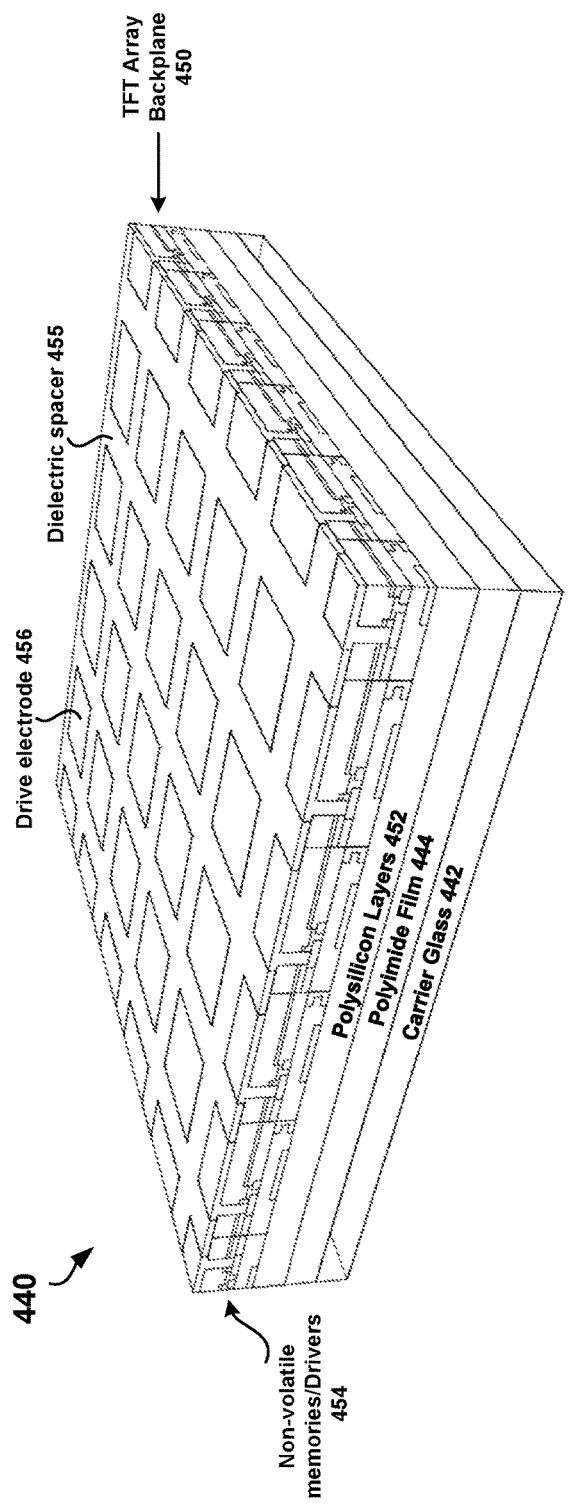
Figures 2, 4D:
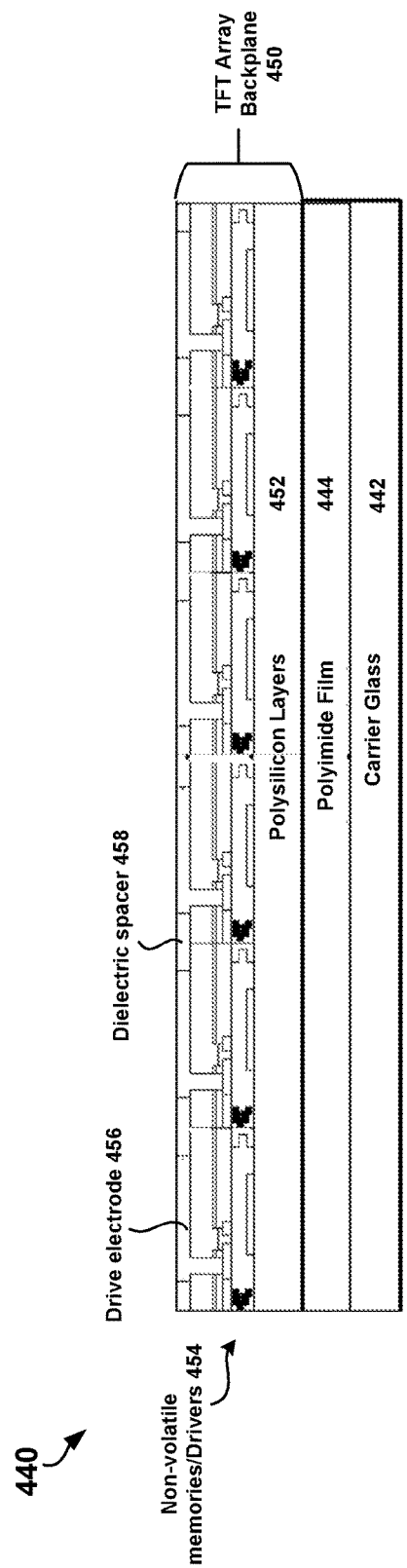
Figures 3, 4D:
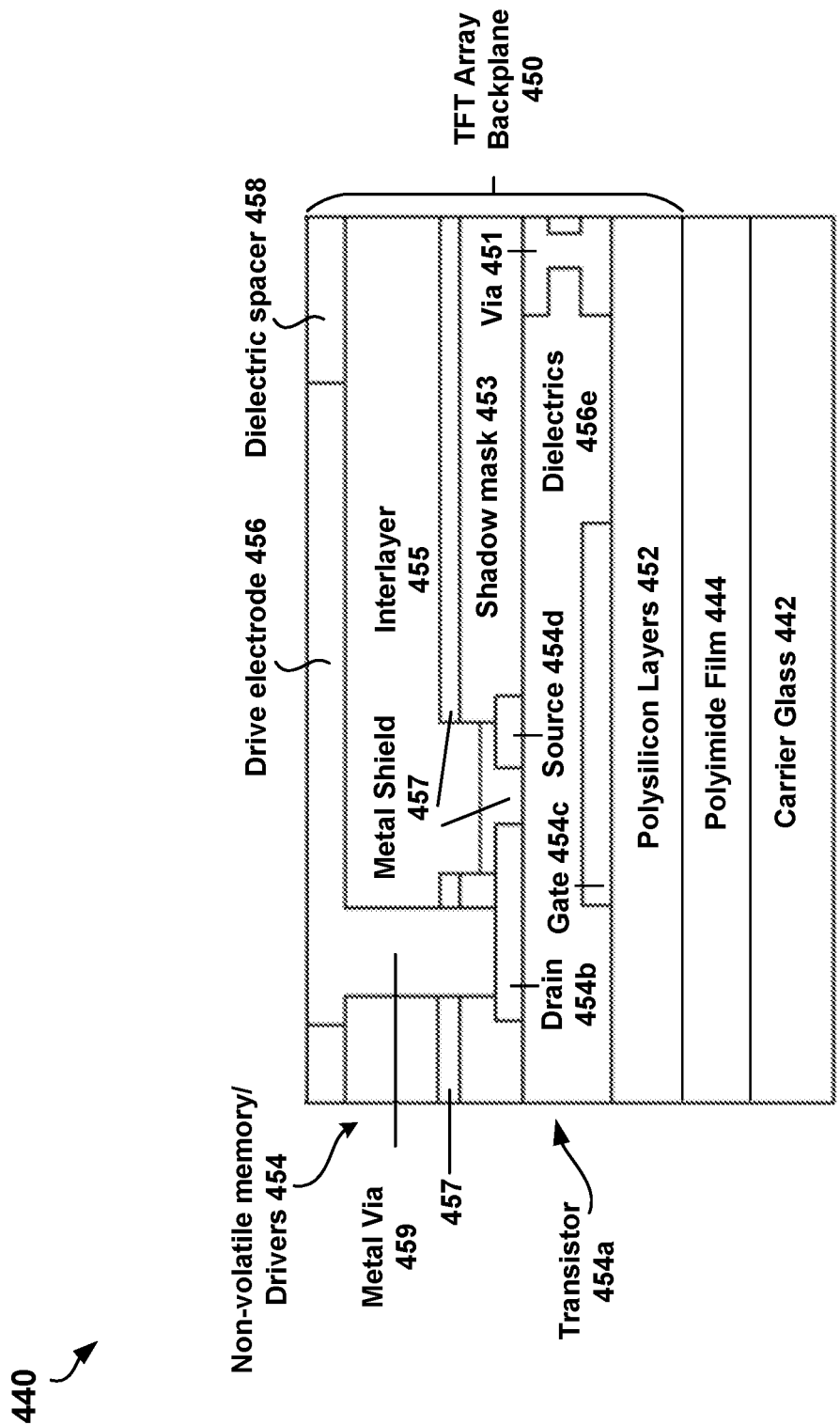

FIGS. 4D-1 to 4D-3 show schematic diagrams of an example TFT array backplane device 440. The TFT array backplane device 440 can be fabricated on a polyimide film 444 on a carrier glass 442, using standard TFT manufacturing processes, e.g., by OEMs. The TFT backplane device 440 can include one or more TFT backplanes 450 on top of the polyimide film 444.

Each TFT backplane 450 can include one or more polysilicon layers 452 and integrated circuits (including a number of non-volatile memories and drivers 454) formed on the polysilicon layers 452. The drivers include scanning drivers, e.g., the scanning drivers 116 of FIG. 1, and data drivers, e.g., the data drivers 114 of FIG. 1. Each non-volatile memory is coupled to one of the scanning drivers through at least one word line, e.g., the word line 117 of FIG. 1, and to one of the data drivers through at least one bit line, e.g., the bit line 115 of FIG. 1. Each non-volatile memory includes at least one transistor coupled to a respective drive electrode 456 on top of the TFT backplane 450. Adjacent drive electrodes 456 are isolated from each other by dielectric spacers 458.

FIG. 4D-3 is an expanded cross-sectional view of the TFT backplane device 440. Each non-volatile memory includes at least one transistor 454a. The transistor 454a has drain 454b, gate 454c, and source 454d, which are separated by dielectrics 454e. The transistor 454a is coupled to a respective drive electrode 456 in a top layer of the TFT backplane 450 through metal via 459. Via 451 can be formed between adjacent transistors 454a. A shadow mask 453 is formed on top of the transistor 454a. Then a metal shield 457 is formed on the shadow mask 453. An interlayer 455 including dielectric material is formed between the metal shield 457 and the drive electrodes 456 for isolation.

Multiple implementations can be realized to integrate LED arrays on a backplane device. The bonding techniques can include but not limited to: direct bonding such as low temperature direct bonding with or without an intermediate conductive layer, fusion bonding, diffusion bonding, eutectic bonding with an intermediate conductive layer, and transient liquid phase bonding.

In some implementations, the LED array can be bonded onto the backplane device using low temperature bonding, e.g., eutectic bonding. An intermediate conductive layer can be deposited on top of an LED structure, e.g., the blue color LED structure 400 of FIG. 4B-1, formed on a substrate, and then the LED structure and the intermediate conductive layer can be patterned together to form an array of LEDs with an intermediate conductive sub-layer on top of each LED. Accordingly, the intermediate conductive sub-layer has a same area size as a corresponding LED underneath. The intermediate conductive layer can include one or more intermediate metallic layers, for example, an iridium-tin-oxide (ITO) film with a titanium (Ti) film, a cupper (Cu) film with a Tantalum (Ta) film, an aluminum (Al) film with a Tin (Sn) film, and/or a gold (Au) or silver (Ag) film with at least one adhesive film including chromium (Cr), Platinum (Pt), Palladium (Pd), or Titanium (Ti).

In some implementations, an LED array can be directly bonded onto the backplane device, e.g., by pretreating at least one of surfaces of the LEDs or a surface of the backplane device, for example, with plasma activation. For illustration purposes only, direct bonding between an LED device including LEDs formed on a substrate and a backplane device is described in the following steps.

To achieve good bonding, one or two bonding surfaces can be pre-treated to remove any contamination and/or oxide film that can hamper adhesion of the bonding surfaces. The bonding surfaces can be pre-treated to be smooth and uniform. In some examples, the pre-treatment includes: I) treating the bonding surfaces by a 10 min piranha ($H_2O_2$:$H_2SO_4$=1:3 by volume) solution pre-clean followed by deionized water rinse and spin-dry prior to metallization; II) treating the bonding surfaces with an ultraviolet (UV)-ozone pre-clean to remove the organic surface contamination; and III) before bonding, applying a low energy plasma activation of the bonding surfaces of the LED device and the backplane device.

A direct bonding process can be described as follows: first, both the LED device and the backplane device are placed in a vacuum chamber with pressures, e.g., near $1\times10^{-3}$ Torr, or in an atmosphere pressure nitrogen (N2) environment; second, the LED device is flipped over with the LEDs' contact electrodes facing to a top layer of the backplane device, aligned and clamped together on a bonding chuck; third, a pressure, e.g., 30 psi, is applied on both sides of the bonded devices when the devices are in a full contact at a predetermined temperature, e.g., 300° C., for a predetermined period, e.g., 1 hour. Optionally, the bonded devices can be further annealed with a temperature, e.g., near 400° C., for an additional predetermined time period, e.g., about 1 hour.

The LED device can be aligned to the backplane device for bonding by, for example, optically aligning marks on an LED substrate with marks on the backplane device, such that each LED is aligned to a corresponding pixel circuit of the backplane device, and a contact electrode of the LED is aligned to a drive electrode of the corresponding pixel circuit in the top layer of the backplane device.

After the bonding, the substrate of the LED device can be removed from the LEDs that remain bonded with the backplane device, that is, the conduct electrodes of the LEDs are bonded with the corresponding drive electrodes (or pixel circuits) of the backplane device. The removing of the LED substrate can be performed by a peeling-off process, a lift-off process, a splitting process, a detaching process, or a laser scribing process. Techniques of ion implantation, laser annealing, thermal annealing, and mechanical clipping can be used individually or in combination to weaken interfaces of the separation. For illustration purposes only, in the following, laser lift-off is described for removing substrates of LED devices.

The backplane device can have a large area and multiple same color LED devices are to be bonded onto the whole area of the backplane device. The same color LED devices can be sequentially bonded onto different areas of the backplane device followed with removal of their LED substrates, such that a previous bonded LED device will not obstruct a following LED device to be bonded onto the backplane device. In some implementations, a step and scan lift-off method can be adopted. After an LED device is bonded to the backplane device, a laser scanning and lift-off process is performed on an area, e.g., a rectangular area, of the LED device, so that the LEDs in the area scanned by the laser are separated from the LED substrate and remain bonded to the backplane device. The LEDs in the non-scanned area of the LED device remain with the LED substrate and can be moved away (or lifted off) from the backplane device. Thus, an array of LEDs is bonded on the backplane device. The LED substrate can be cleaned and reused.

As discussed with further details below, different color LED devices, e.g., blue color LED devices 410, green color LED devices 420, and red color LED devices 430, can be sequentially bonded with a backplane device. The bonding sequence of the different color LED devices can be in any desired order. For example, it can be a sequence of blue, green, and red, a sequence of blue, red, and green, a sequence of red, green, and blue, a sequence of red, blue, and green, a sequence of green, red, and blue, or a sequence of green, blue, and red. For illustration purposes only, the sequence of red, green, and blue is described in the following.

Figures 1, 4E:
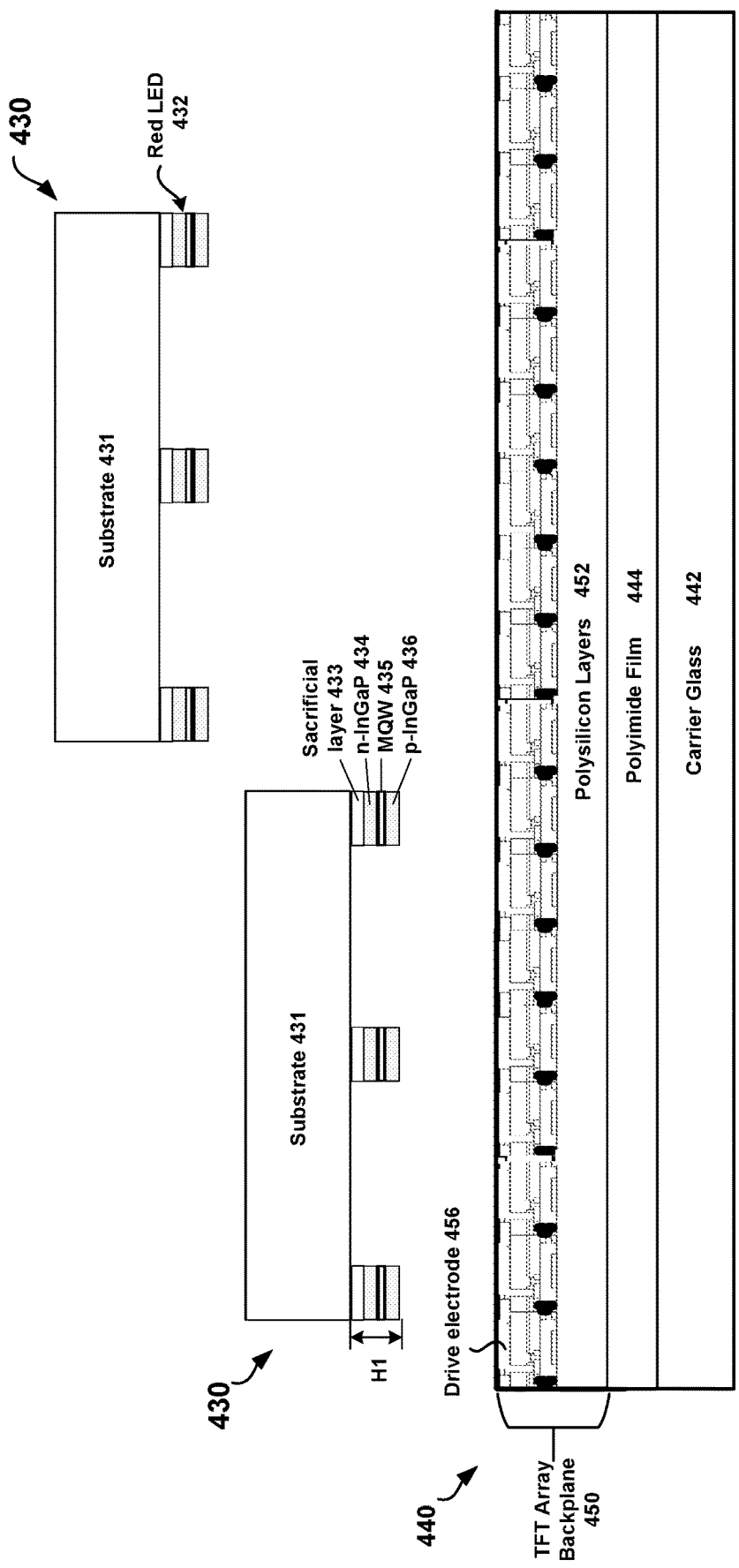
Figures 2, 4E:
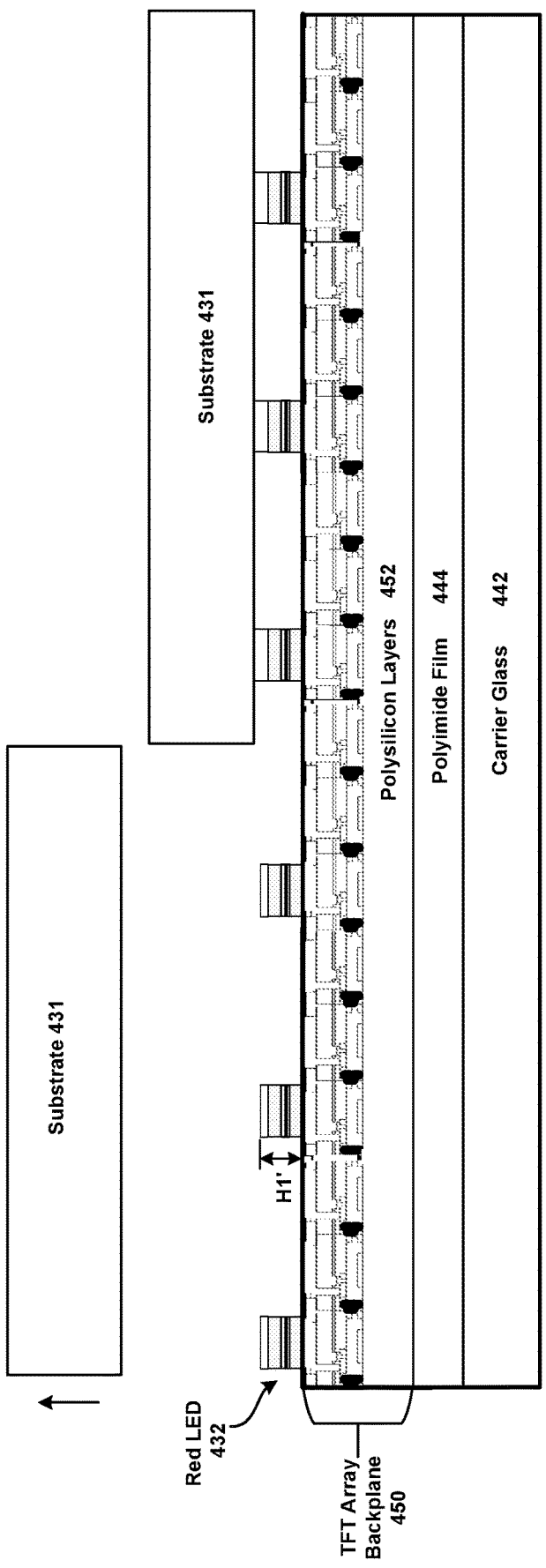

FIGS. 4E-1 and 4E-2 are schematic diagrams of an example process of bonding multiple red color LED device 430 onto a TFT array backplane device 440 and removing LED substrates after the bonding. The TFT array backplane device 440 includes at least one TFT array control backplane 450 including a plurality of pixel circuits. Each of the pixel circuits includes a drive electrode 456 in the top layer of the backplane 450. Each red color LED device 430 includes an array of LEDs 432 formed on an LED substrate 431. Each red color LED 432 can have a height H1, from the sacrificial layer 433 to a top p-InGaP contact electrode 436. Adjacent red color LEDs 432 are separated to reserve a space for a blue color LED and a green color LED.

As noted above, the multiple red color LED devices 430 are bonded onto the TFT array backplane device 440. As illustrated in FIG. 4E-1, a first red color LED device 430 is flipped over with the p-electrode 436 facing to drive electrodes 456 of pixel circuits of the TFT backplane 450. The first red color LED device 430 is aligned, e.g., by optically aligning marks, and bonded on drive electrodes 456 in a first area of the backplane device 440, e.g., by low temperature direct bonding as described above. Then, as illustrated in FIG. 4E-2, the substrate 431 of the first red color LED device 430 is removed, e.g., by laser lift-off, from the red color LEDs 432 that remain bonded on a first area of the backplane device 440, and then a second red color LED device 430 is aligned and bonded onto a second area of the backplane device 440, the second area being adjacent to the first area.

In some cases, the red color LEDs 432 is formed on a GaP substrate 431, which can be delaminated by UV Excimer Laser (with a wavelength at 248 nm or 308 nm) lift-off. The epitaxial layer-selective delamination is achieved by photochemical decomposition of the sacrificial layer 433, e.g., an intermediate opaque layer, next to the transparent GaP substrate 431. The GaP substrate 431 can be cleaned and reused.

In some cases, the red color LEDs 432 is formed on a GaAs substrate 431. The GaAs substrate can be delaminated by Nd:YAG Laser (with a wavelength of 1064 nm) lift-off. The epitaxial layer of InGaAsN can be used as an intermediate sacrificial layer for selective photodecomposition and substrates lift off. By tuning the composition of the InGaAsN layer such that its bandgap is lower than 1.165 eV (energy of a 1064 nm photon), the InGaAsN layer strongly absorbs 1064 nm laser light to which the GaAs substrate is effectively transparent. Upon absorption of the laser pulse, ablation occurs along the InGaAsN layer, separating the GaAs film from its GaAs growth substrate, producing a crack-free GaAs layer adhered to a flexible polymer substrate. In a particular example, a Q-switched Nd:YAG laser with a pulse duration (full width at half maximum—FWHM) of 8-9 ns, GaAs substrate wafer lift-off is achieved over a large range of average fluences from ~0.6 J/cm^2 to ~3.5 J/cm^2. In some cases, the GaAs substrate 431 can be also delaminated by Chemical Lift-Offs (CLO). Since GaAs is opaque, an intermediate sacrificial layer of AlAs or InAlP can be grown on the GaAs substrates before AlGaAs or InAlGaP multiple quantum wells. By selective etching AlAs intermediate sacrificial layers using HF, the GaAs substrate can be lifted off and by selective etching InAlP intermediate sacrificial layers using HCl, the GaAs substrate can be lifted off. The GaAs substrate can be cleaned and reused.

In some implementations, one or more red color LED devices 430 can be first bonded onto the TFT backplane device 440 and then be removed the LED substrates 431 together. For example, the red color LED devices 430 can have a rectangular (or square) shape and can be bonded onto the backplane device 440 without or with little gaps therebetween. Then the LED substrates 431 can be laser lift-offs or chemical lift-offs.

Figures 1, 4F:
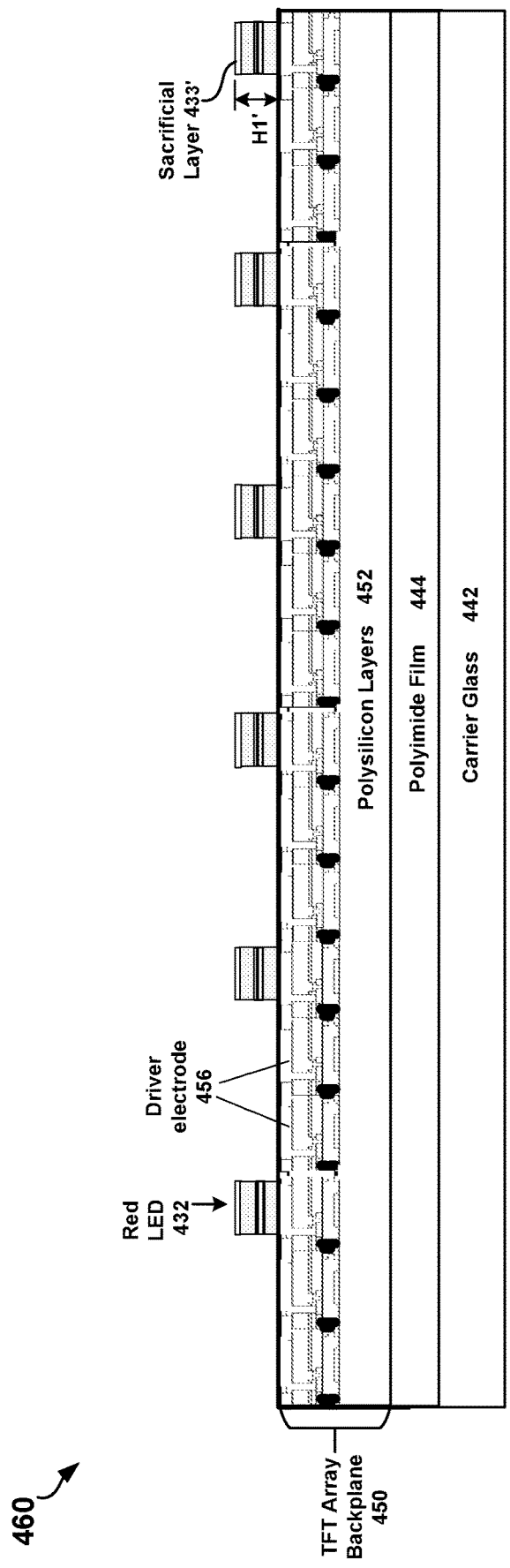
Figures 2, 4F:
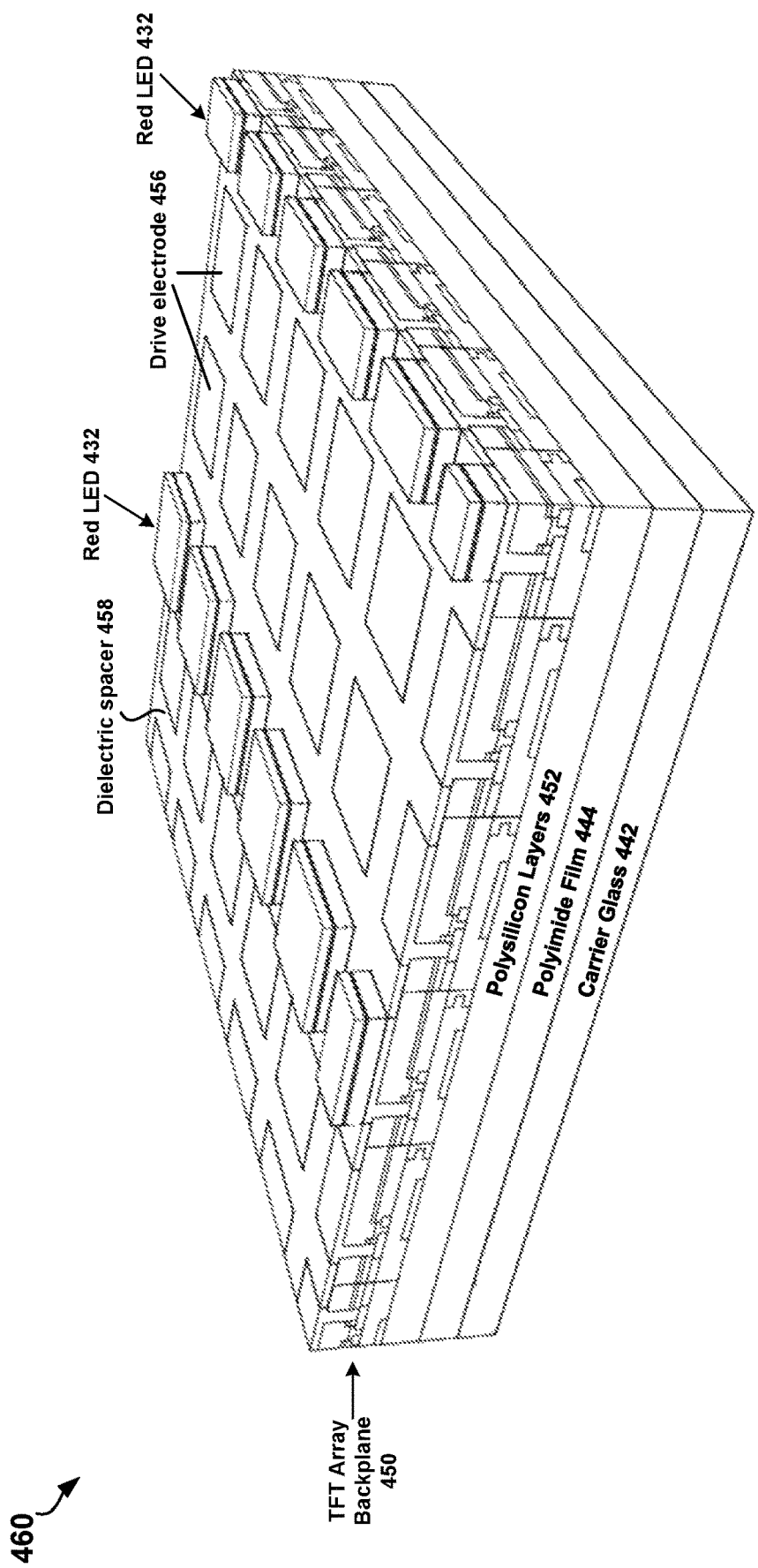

FIGS. 4F-1 and 4F-2 show a bonded device 460 obtained by bonding multiple red color LED devices 430 onto the TFT array backplane device 440 and then removing the LED substrates 431 from the red color LEDs 432 that remain (or are left) bonded on the drive electrode. The remaining red color LED 432 has a height H1'. As the laser lift-off of the LED substrate 431 can remove part of the sacrificial layer 433, the height H1' of the remaining red color LED 432 is smaller than the height H1 of the original red color LED 432. Two adjacent red color LEDs 432 along a row are separated by a space reserved for two other color LEDs, and the space has a distance of two driver electrodes 456 and dielectric spacers 458 therebetween.

Similarly, as discussed with further details below, green color LED arrays and blue color LED arrays can be sequentially bonded onto the backplane device 440.

Figures 1, 4G:
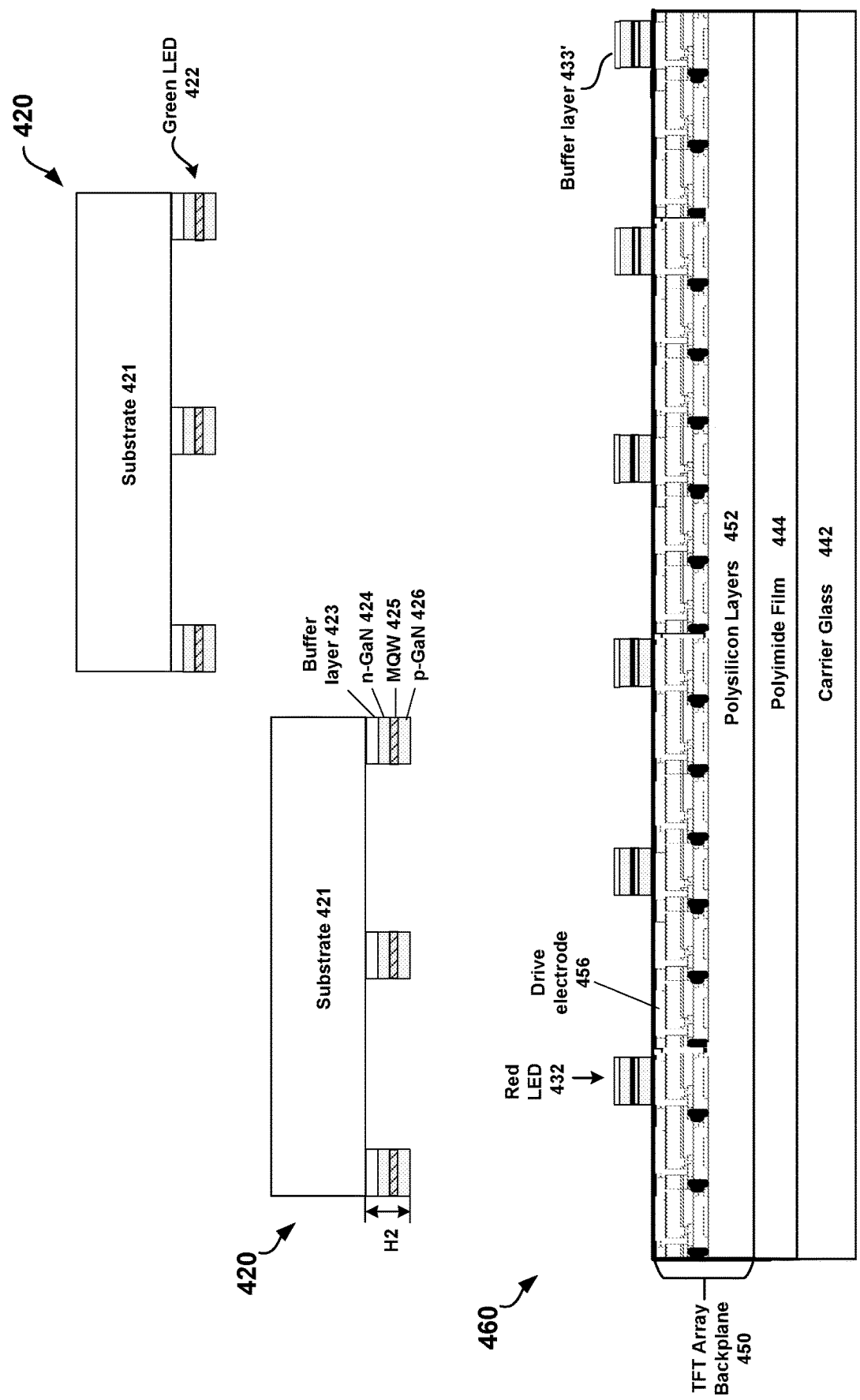
Figures 2, 4G:
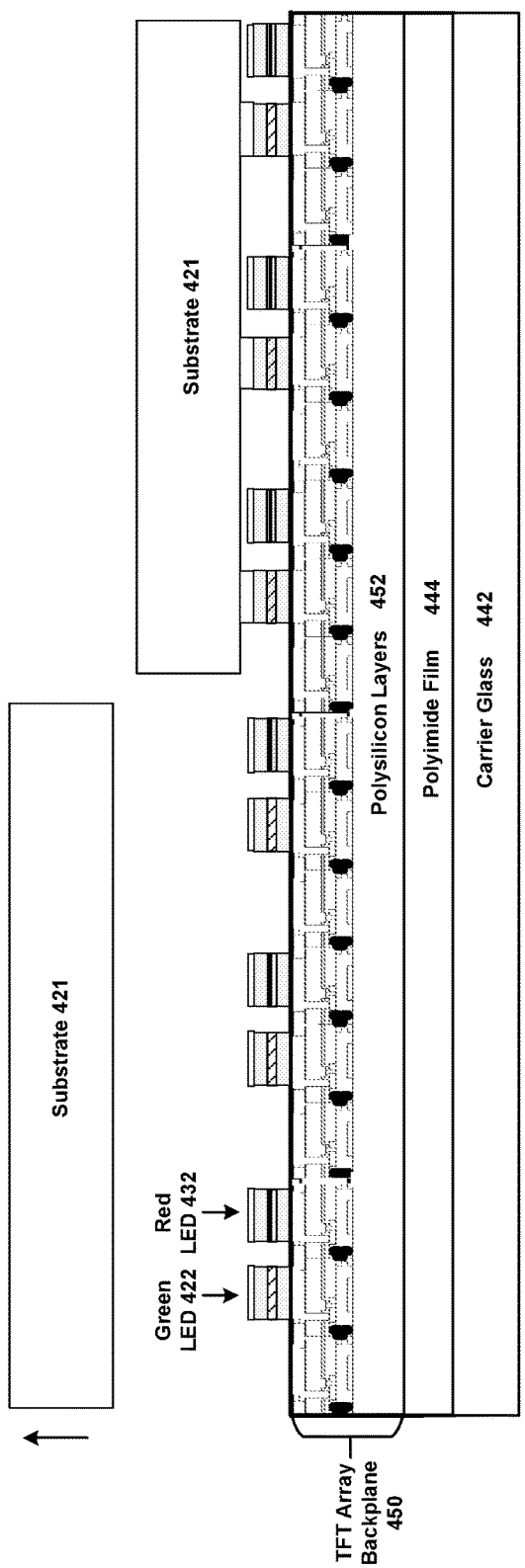

FIGS. 4G-1 and 4G-2 are schematic diagrams of an example process of bonding multiple green color LED arrays formed on substrates onto the bonded device 460 and removing the LED substrates after the bonding. The bonded device 460 includes the TFT array backplane device 440 with integrated arrays of red color LEDs 432, and the adjacent red color LEDs 432 are separated by two drive electrodes 456 and dielectric spacers 458 therebetween.

Multiple green color LED devices 420 are bonded onto the bonded device 460. Each green color LED device 420 includes an array of LEDs 422 formed on an LED substrate 421. Adjacent green color LEDs 422 are separated to reserve a space for a blue color LED and a red color LED. Each green color LED 422 can have a height H2, from the buffer layer 423 to the top p-GaN contact electrode 426. The height H2 of the green color LED 422 needs to be larger than the height H1' of the remaining red color LED 432 on the TFT backplane 450, such that the green color LED device 420 touch the surface of the TFT backplane 450 without movement of the substrate 421 being obstructed by the red color LEDs 432 that are already bonded on the TFT backplane 450. As the height H1' may vary over a range and be not known, the height H2 can be configured to be identical to or higher than the height H1 of the original red color LEDs 432 formed on the LED substrate 431. As the height H1 is larger than the height H1', the height H2 of the original green color LED 422 formed on the LED substrate 422 is larger than the height H1'. In some implementations, the buffer layer 423 of the green color LED 422 can be configured to have a larger thickness than the buffer layer 433 of the red color LED 422, such that the height H2 is higher than the height H1.

As illustrated in FIG. 4G-1, a first green color LED device 420 is flipped over with the p-electrode 426 facing to drive electrodes 456 of pixel circuits of the TFT backplane 450. The first green color LED device 420 is aligned, e.g., by optically aligning marks, and bonded on drive electrodes 456 in a first area of the bonded device 460, e.g., by low temperature direct bonding as described above. The green color LEDs 422 can be bonded to drive electrodes 456 adjacent to red color LEDs 432 bonded on the TFT backplane 450.

After the bonding, as illustrated in FIG. 4G-2, the substrate 421 of the first green color LED device 420 is removed from the green color LEDs 422 that remain bonded on the first area of the bonded device 460. Then a second green color LED device 420 is aligned and bonded onto a second area of the bonded device 460, the second area being adjacent to the first area. As illustrated in FIG. 4G-2, as the height H2 is larger than the height H1', the top p-electrodes 426 of the green color LEDs 422 formed on the second green color LED device 420 can contact with the corresponding drive electrodes 456 in the top layer of the TFT backplane 450, without obstruction of the red color LEDs 432 bonded in the second area of the bonded device 460.

The substrate 421 of the green color LED device 420 can be removed by a scan and lift-off process with a laser. In some examples, the substrate 421 is a sapphire substrate. Since sapphire is transparent and GaN (the material of the buffer layer 423) is opaque (which absorbs light), a GaN film can be lifted off from the sapphire substrate by a short pulse KrF UV excimer laser with a wavelength of 248 nm or 308 nm, e.g., in a power range of 0.4-0.8 J/cm$^2$. The sapphire substrate 421 can be cleaned and reused.

In some implementations, one or more green color LED devices 420 can be first bonded onto the bonded device 460 and then be removed from the LED substrates 421 together. For example, the green color LED devices 410 can have a rectangular (or square) shape and can be bonded onto the bonded device 460 without or with little gaps therebetween. Then the LED substrates 421 can be lifted off by a short pulse laser.

Figures 1, 4H:
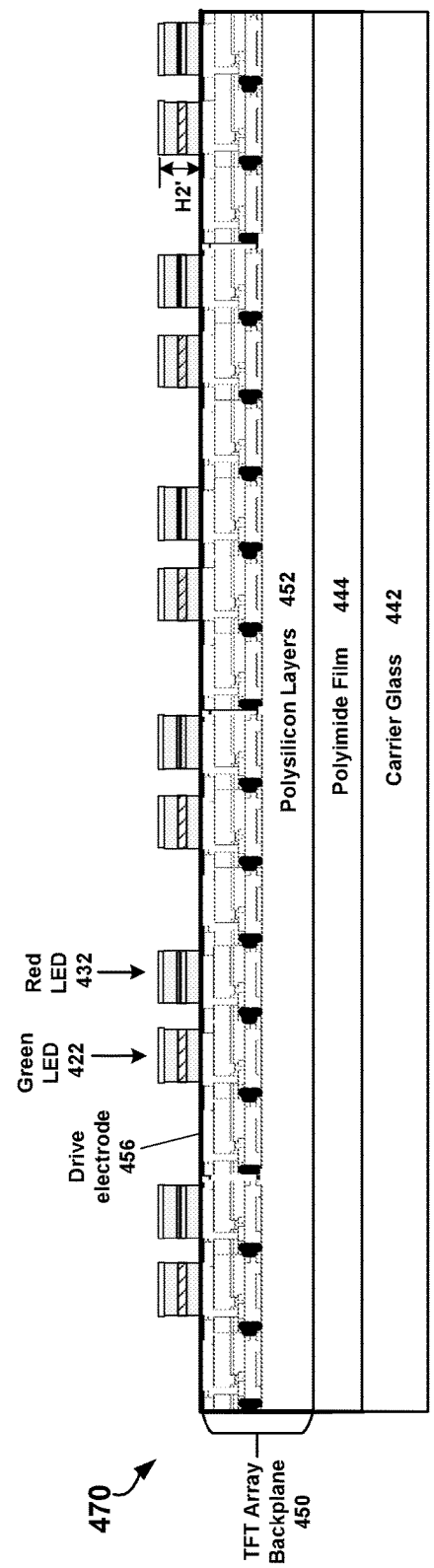
Figures 2, 4H:
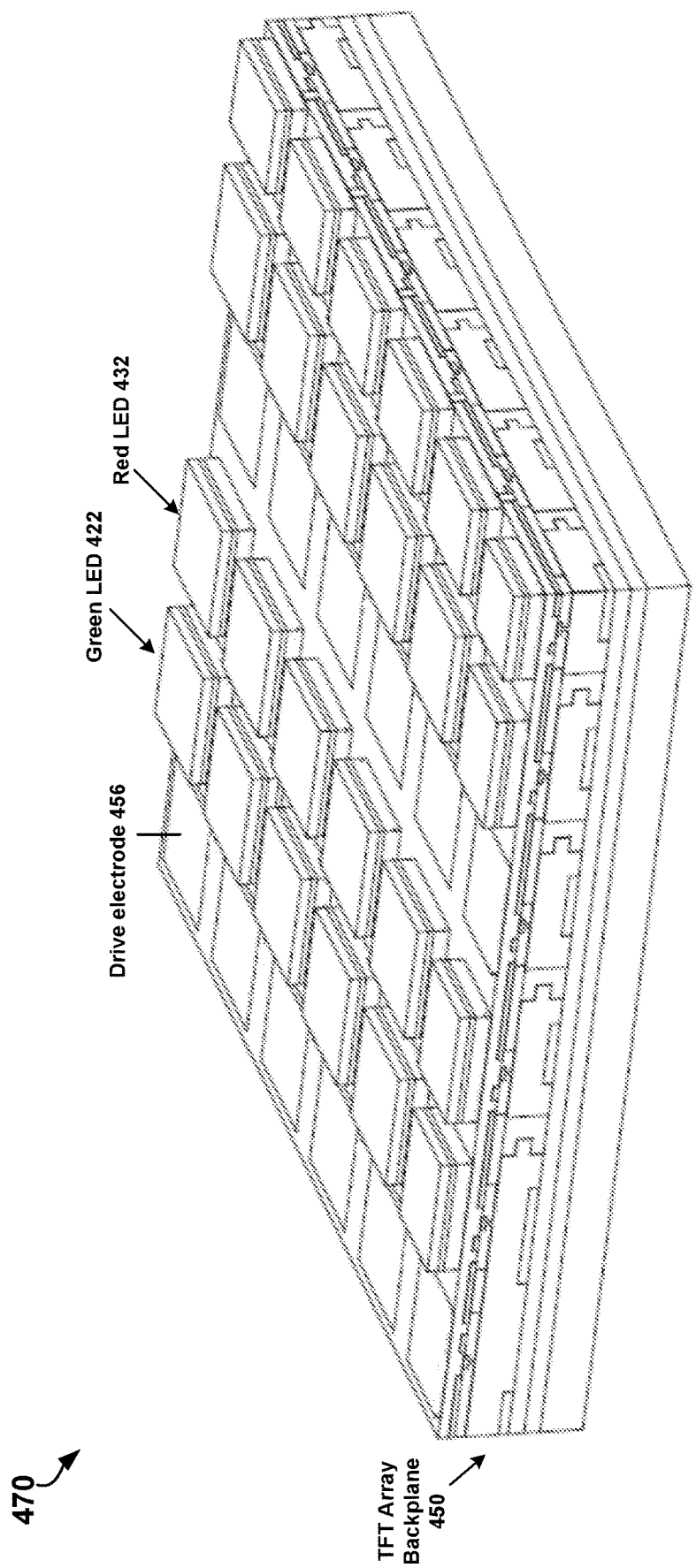

FIGS. 4H-1 and 4H-2 show a bonded device 470 obtained by bonding multiple green color LED devices 420 onto the bonded device 460 (including red color LEDs 432 bonded on TFT array backplane device 450) and then removing the LED substrates 421 from the green color LEDs 422 that remain bonded on the TFT array backplane 450. The remaining green color LED 422 has a height H2'. As the laser lift-off of the LED substrate 421 can remove part of the buffer layer 423, the height H2' of the remaining green color LED 422 is smaller than the height H2 of the original green color LED 422. Two adjacent green color LEDs 422 along a row are separated by a bonded red color LED 432 and a space reserved for a blue color LED, and the space has a distance of one driver electrode 456 and dielectric spacers 458 therebetween.

Figures 1, 4I:
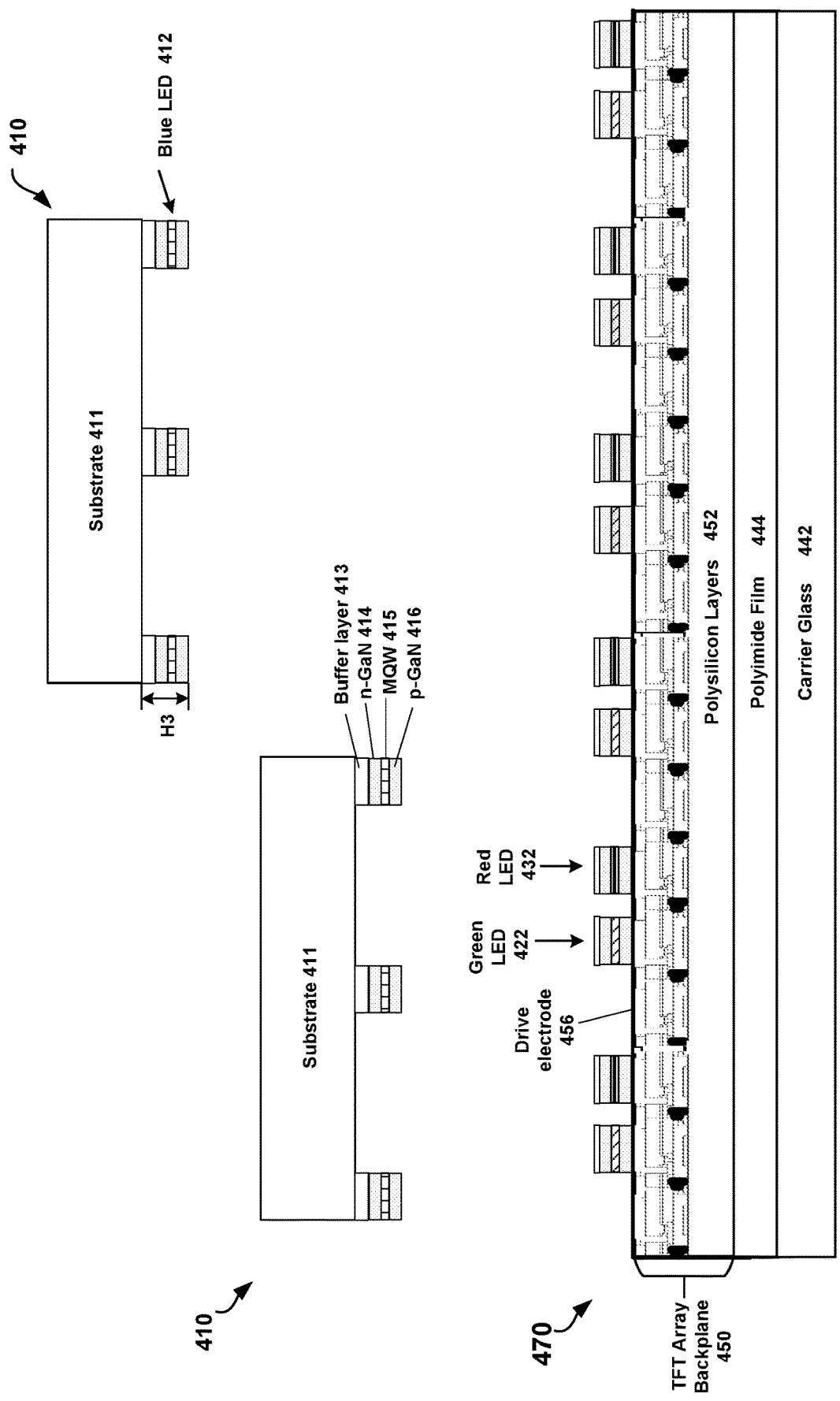

FIGS. 4I-1 and 4I-2 are schematic diagrams of an example process of bonding multiple blue color LED arrays on LED substrates onto the bonded device 470 and removing the LED substrates after the bonding. The bonded device 470 includes the TFT array backplane device 440 with integrated arrays of red color LEDs 432 and arrays of green color LEDs 422. The bonded device 470 includes spaces reserved for blue color LEDs and separated by a green color LED 422 and a red color LED 432.

Multiple blue color LED devices 410 are bonded onto the bonded device 470. Each blue color LED device 410 includes an array of blue color LEDs 412 formed on a LED substrate 411. Adjacent blue color LEDs 412 are separated to reserve a space for a green color LED and a red color LED. Each blue color LED 412 can have a height H3, from the buffer layer 413 to the top p-GaN contact electrode 416. The height H3 of the green color LED 422 needs to be larger than the height H1' of the remaining red color LED 432 and the height H2' of the remaining green color LED 422 on the TFT backplane 450, such that the blue color LED device 410 can touch the surfaces of TFT backplane 450 without movement of the substrate 411 being obstructed by the red color LEDs 432 and the green color LEDs 422 that are already bonded on the TFT backplane 450. As the height H2' may vary over a range and be not available, the height H3 can be configured to be identical to or larger than the height H2 of the original green color LEDs 422 formed on the LED substrate 421. As the height H2 is larger than the height H2' and larger than the height H1, the height H3 of the original green color LED 422 formed on the LED substrate 422 is larger than the heights H2' and H1'. In some implementations, the thickness of the buffer layer 413 of the blue color LED 412 is configured to be larger than the thickness of the buffer layer 423 of the green color LED 422 and the thickness of the buffer layer 433 of the red color LED 432, such that the height H3 is larger than the height H1 and the height H2.

As illustrated in FIG. 4I-1, a first blue color LED device 410 is flipped over with the p-electrode 416 facing to drive electrodes 456 of pixel circuits of the TFT backplane 450. The first blue color LED device 410 is aligned, e.g., by optically aligning marks, and bonded on drive electrodes 456 in a first area of the bonded device 470, e.g., by low temperature direct bonding as described above. The blue color LEDs 412 can be bonded to drive electrodes 456 between red color LEDs 432 and green color LEDs 422 that remain bonded on the TFT backplane 450.

After the bonding, as illustrated in FIG. 4I-2, the substrate 411 of the first blue color LED device 410 is removed from the blue color LEDs 412 that remain bonded on the first area of the bonded device 470. Then a second blue color LED device 410 is aligned and bonded onto a second area of the bonded device 470, the second area being adjacent to the first area. As illustrated in FIG. 4I-2, as the height H3 is larger than the heights H1' and H2', the top p-electrodes 416 of the blue color LEDs 412 formed on the second blue color LED device 410 can contact with the corresponding drive electrodes 456 in the top layer of the TFT backplane 450, without the obstruction of the red color LEDs 432 and the green color LEDs 422 that remain bonded in the second area of the bonded device 470.

The substrate 411 of each blue color LED device 410 can be removed by a scan and lift-off process with a laser. In some examples, the substrate 411 is a sapphire substrate. Since sapphire is transparent and GaN (the material of the buffer layer 413) is opaque (which absorbs light), a GaN film can be lifted off from the sapphire substrate by a short pulse KrF UV excimer laser with a wavelength of 248 nm or 308 nm, e.g., in a power range of 0.4-0.8 J/cm$^2$. The short pulse laser is absorbed by the GaN film to generate a high temperature, e.g., more than 1000° C. Even a brief heating of an interface between the sapphire substrate and the GaN film to >1000° C. can result in decomposition of GaN into Ga, a low melting-point metal, and nitrogen which remains trapped at the interface. The sapphire substrate can be cleaned and reused.

In some implementations, one or more blue color LED devices 410 can be first bonded onto the bonded device 470 and then be removed the LED substrates 411 together. For example, the blue color LED devices 410 can have a rectangular (or square) shape and can be bonded onto the bonded device 470 without or with little gaps therebetween. In some examples, the LED substrate 411 is a silicon substrate, e.g., a silicon wafer. The LED substrates 411 of the bonded blue color LED devices can be removed by chemical wet etching or Chemical Lift-Offs (CLO).

Figures 2, 4J:
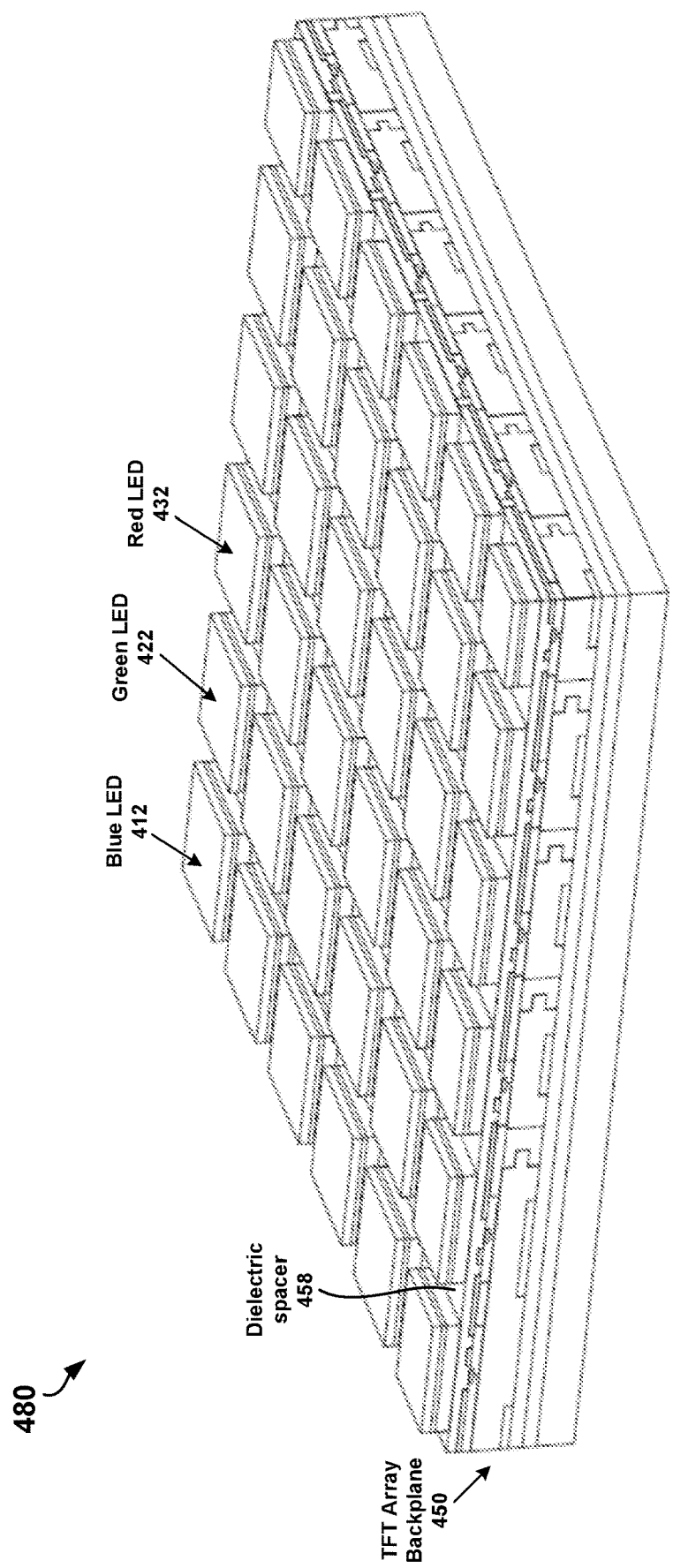

FIGS. 4J-1 and 4J-2 show a bonded device 480 obtained by bonding multiple blue color LED devices 410 onto the bonded device 470 (including arrays of red color LEDs 432 and arrays of green color LEDs 422 bonded on TFT array backplane device 440) and then removing the LED substrates 411 from the blue color LEDs 412 that remain bonded on the TFT array backplane device 440, together with the red color LEDs 432 and the green color LEDs 422. The remaining blue color LED 412 has a height H3'. As the laser lift-off of the LED substrate 411 can remove part of the buffer layer 413, the height H3' of the remaining blue color LED 412 is smaller than the height H3 of the original blue color LED 412. In some implementations, the height H3 is higher than the height H2 that is higher than the height H1, and the height H3' is also higher than the height H2' that is higher than the height H1'. That is, in the bonded device 480, the blue color LEDs 412 can have a higher height than the green color LEDs 422 that are higher than the red color LEDs 432.

In the bonded device 480, adjacent LEDs are separated by gaps and are conductively isolated by dielectric spacers 458 in the gaps. On one hand, to increase a pixel filling coefficient that is defined as a ratio between a light-emitting area in a single pixel and a pixel physical surface area, the gaps between adjacent LEDs should be minimized. On the other hand, the adjacent LEDs should be conductively isolated from each other. The adjacent LEDs are bonded on drive electrodes 456 of respective pixel circuits that are conductively isolated by dielectric spacers 458. Thus, a size of an LED (in both row and column) can be configured to be larger than a size of a drive electrode 456 but smaller than a size of a drive electrode 456 and a dielectric spacer 458.

FIG. 4K is a schematic diagram of a device 482 with isolation spacers 483 filled in the bonded device 480 of FIG. 4J-1. After the bonded device 480 is formed, a conductively isolated material can be deposited to fill into gaps between adjacent LEDs in the bonded device 480 to form the isolation spacers 483. The isolated material can be an opaque dielectric material or a dielectric material with a light-absorbing material such as a black material, such that light from an LED is blocked or eliminated from propagating to an adjacent LED and thus there is no or little cross-talk between the adjacent LEDs. The opaque dielectric material can include silicon nitride (SiNx). SiNx has a hexagonal crystal structure at an ambient pressure and sintered ceramic of this phase is opaque. SiNx can be deposited in the gaps by chemical vapor deposition (CVD).

Then, topology planarization is performed to remove the buffer layers of the LEDs to form a common surface 484 with exposure of n-contact electrodes of the LEDs, e.g., n-InGaP electrodes 434 of red color LEDs 432, n-GaN electrodes 424 of green color LEDs 422, and n-GaN electrodes 414 of blue color LEDs 412. The common surface 484 is a surface after the topology planarization and can be flat or non-flat.

For TFT backplane device formed on the carrier glass 442, an etch-back planarization can be carried out by isotropic inductive-coupled plasma etching to remove the isolation material and the epitaxial buffer layers or sacrificial layers to expose the n-contact electrodes (e.g., n-GaN layers or n-InGaP layers). The isotropic inductive-coupled plasma etching can be reactive-ion etching with inert gases, such as Argon or xenon. In some cases, etch-back can be further used for thinning the n-contact electrodes by etching a portion of the n-contact electrodes. In some cases, as noted above, in the bonded device 480, the blue color LEDs 412 can have a higher height than the green color LEDs 422 that are higher than the red color LEDs 432. After the etch-back process, surfaces of the n-GaN electrodes 414 of the blue color LEDs 412 may be higher than surfaces of the n-GaN electrodes 424 of the green color LEDs 422 that are higher than surfaces of the n-InGaP electrodes 434 of the red color LEDs 432. That is, the surfaces of the n-contact electrodes and the surfaces of isolation spacers 483 therebetween form a continuous and non-flat surface.

In some implementations, a CMOS backplane device is used. After the multiple color LEDs are integrated on the CMOS backplane device and isolation spacers are filled into gaps between adjacent LEDs, a CMP (Chemical-Mechanical-Polishing) planarization can be carried out to remove the isolation material and the epitaxial buffer layers and sacrificial layers to expose n-contact electrodes of the LEDs. The CMP planarization can form a continuous and flat surface across the n-contact electrodes of the LEDs and the isolation spacers therebetween. The CMP process can be further used for thinning the n-contact electrodes of the LEDs by removing a portion of the n-contact electrodes. In some cases, an etch-back planarization can be carried out on the CMOS backplane device, and the etch-back planarization can form a continuous and non-flat surface across the n-contact electrodes of the LEDs and the isolation spacers therebetween.

FIG. 4L is a schematic diagram of a device 486 including a transparent conductive layer (or a transparent electrode) 485 formed on the common surface 484 of the device 482 of FIG. 4K. The transparent conductive layer 485, e.g., an ITO layer, is deposited on top of the common surface 484 including the surfaces of the n-contact electrodes of the LEDs 412, 422, and 432 to form a common electrode, e.g., an electrical common ground.

FIG. 4M is a schematic diagram of a device 490 including a transparent protective layer 488 and a polarizing film 487 formed on the device 486 of FIG. 4L. The polarizer film 487 can be deposited on the transparent conductive layer 485. The polarizer film 687 is configured to allow light from the LEDs to propagate through along a polarization direction to become a polarized light, which can also reduce scattering and get more uniform light. The transparent protective layer 488 can be then formed on the polarizer film 487. The transparent protective layer 488 can be a touch-sensitive transparent layer and can form, together with the transparent conductive layer 485, a capacitive touch screen position sensor. The transparent protective layer 488 can be made of transparent material, e.g., glass or plastic, coated with a conductive material, e.g., indium tin oxide (ITO).

FIG. 4N shows a schematic diagram of a device 492 after removing the carrier glass 442 from the device 490 of FIG. 4M. The integrated device 490 has the polyimide film 444 on the carrier glass 442 as the substrate. To form a flexible device, the carrier glass 442 can be removed from the integrated device 490, e.g., by laser lift-off. For example, the polyimide-coated carrier glass 442 can be delaminated via UV excimer laser lift-off, e.g., at 308 nm, with an ablation threshold, e.g., at 235 mJ/cm^2.

Example Systems and Fabricating Processes Using Single Color LED Arrays and Multiple Color Phosphor or Quantum Dots (QDs) Materials FIGS. 5A and 5B show an example integrated display system 500 with active-matrix multi-color LED pixel arrays fabricated by single color LEDs 520 bonded on a backplane 510 with multiple color phosphor or quantum dots (QDs) materials, according to one or more implementations of the present disclosure. The integrated display system 500 can be the display system 100 of FIG. 1. This integrated display system 500 can be formed according to steps described with further details in FIGS. 6A to 6I.

As illustrated in FIGS. 5A-5B, the integrated display system 500 includes a backplane 510 on a first side of a substrate 502. In some implementations, the backplane 510 can be a CMOS backplane formed in a CMOS backplane device. The CMOS backplane device can include one or more CMOS backplanes and can be manufactured by existing CMOS manufacturing technologies. The substrate 502 can be a silicon substrate, e.g., a silicon wafer. In some implementations, the backplane 510 can be a TFT array control backplane formed in a TFT backplane device. The TFT backplane device can include one or more TFT backplanes and can be manufactured by existing TFT manufacturing technologies, e.g., by OEMs. The TFT array backplane can be a low temperature polysilicon (LTPS) thin-film transistors (TFT) array control backplane.

The backplane 510 includes integrated circuits having non-volatile memories and display drivers 512. In some implementations, the backplane 510 includes a number of pixel circuits. Each pixel circuit includes a non-volatile memory that has at least one transistor conductively coupled to a corresponding drive electrode 514 in a top layer of the pixel circuits or a top layer of the backplane 510. Adjacent drive electrodes 514 are conductively isolated from each other by dielectric spacers 516. The display drivers include scanning drivers and data drivers, and each of the non-volatile memories is coupled to one of the scanning drivers through at least one word line and to one of the data drivers through at least one bit line.

The integrated display system 500 includes an array of light-emitting elements such as LEDs 520. The LEDs 520 are separated (or isolated) by isolation spacers 528. The isolation spacers 528 can include an opaque dielectric material or a dielectric material with a light-absorbing material such as a black material, such that light from an LED is blocked or eliminated from propagating to an adjacent LED and thus there is no or little cross-talk between the adjacent LEDs. The opaque dielectric material can include silicon nitride (SiNx).

Each LED 520 can include a first contact electrode p-electrode 524, e.g., p-GaN layer, a second contact electrode n-electrode 526, e.g., n-GaN layer, and multiple quantum well (MQW) semiconductor layers 522 between the p-electrode 524 and the n-electrode 526. The MQW layers 522 can include group III-V compounds and each of the LEDs 520 is operable to emit light with a single color.

In some implementations, the LEDs 520 are blue color LEDs operable to emit light with a blue color. The MQW layers can include multiple pairs of In(0.3)Ga(0.7)N/GaN layers. In some other implementations, the LEDs can be a UV or deep UV LED. The MQW layers can include multiple pairs of AlGaN/GaN layers. In some other implementations, the LEDs can be green color LEDs operable to emit light with a green color. The MQW layers can include multiple pairs of In(0.5)Ga(0.5)N/GaN layers. In some other implementations, the LEDs can be red color LEDs operable to emit light with a red color. The MQW layers can include multiple pairs of InN/GaN layers.

Each LED 520 is coupled to a respective pixel circuit, e.g., a non-volatile memory, in the backplane 510 by conductively connecting the p-electrode 524 to a drive electrode 514 of the pixel circuit. In such a way, the array of LEDs 520 is coupled to respective pixel circuits in the backplane 510 to form an array of active-matrix LED pixels 534. As discussed above, the bonding technique can include but not limited to: direct bonding such as low temperature direct bonding with or without an intermediate conductive layer, fusion bonding, diffusion bonding, eutectic bonding with an intermediate conductive layer, and/or transient liquid phase bonding. The direct bonding can be plasma assisted, e.g., by using plasma to activate one or more to-be-bonded surfaces before bonding.

Each LED 520 can be aligned, e.g., by optical alignment of marks, with the respective drive electrode 514. In some cases, the LED 520 has a smaller area size than the drive electrode 514 and within an area of the drive electrode 514. In some cases, the LED 520 has a same area size as the drive electrode 514 and can be overlapped on the area of the drive electrode 514. In some cases, the LED 520 has a larger area size than the drive electrode 514 but smaller than the drive electrode 514 and adjacent dielectric spacer 516, such that the LED 520 can have a larger area (for a higher pixel filling coefficient) but be conductively isolated from each other, e.g., by isolation spacers 528. On one hand, to increase a pixel filling coefficient, gaps between adjacent LEDs 520 should be minimized. On the other hand, the adjacent LEDs 520 should be conductively isolated from each other and have no light cross-talk. The adjacent LEDs 520 are bonded on drive electrodes 514 of respective pixel circuits that are conductively isolated by dielectric spacers 516. Thus, a size of an LED 520 (in both row and column) can be configured to be larger than a size of a drive electrode 516 but smaller than a sum of a size of the drive electrode 514 and a size of a dielectric spacer 516.

A transparent conductive layer 530, e.g., an indium tin oxide (ITO) layer, is on top of the array of LEDs 520. The transparent conductive layer 530 is in contact with the n-electrodes 526 of the LEDs 520 to form a common electrode of the LEDs 520.

A phosphor material or a quantum dot material can be deposited on the transparent conductive layer 530 above at least one LED 520 and operable to emit a secondary light when excited by the light emitted from the LED 520. The secondary light can have a secondary color different from a single color from the LED 520. As illustrated in FIGS. 5A-5B, red color quantum dot (QD) materials or phosphor materials 534a, green color QDs/phosphors 534b, and yellow color QDs/phosphors 534c can be deposited on the blue color LEDs 520 and operable to emit light with red, green, and white colors, respectively.

As an example, the LED 520 is a blue color LED, and each LED pixel 534 in FIGS. 5A-5B includes a blue color LED sub-pixel with a transparent layer or blue QDs or phosphors 534d on a blue color LED 520, a red color LED sub-pixel with the red QDs/phosphor 534a on a blue color LED 520, a green color LED sub-pixel with green QDs/phosphors 534b on a blue color LED 320, and a white LED sub-pixel with yellow QDs/phosphors 534c on a blue color LED 520. Each sub-pixel includes a non-volatile memory in the backplane 510 coupled to the blue color LED 520 via the drive electrode 514 and the p-electrode 524. The red QDs/phosphors 534a, green QDs/phosphors 534b, yellow QDs/phosphors 534c, and transparent layers (or blue QDs/phosphors) 534d are isolated from each other by opaque dielectric spacers 532, e.g., SiNx. The four LED sub-pixels can be arranged in a rectangular shape or a square shape. Each LED sub-pixel can have a size of about 30 μm or less. Each LED pixel can have a size of about 100 μm or less. In some implementations, a ratio between an area of light emission from the pixels and a physical area of the pixels is higher than 50%. In some other implementations, each LED pixel can also include three LED sub-pixels including a blue color LED sub-pixel, a red color LED sub-pixel, and a green color LED sub-pixel.

In the system 500, a number of the LEDs 520 is larger than a number of the LEDs covered with the phosphor materials or quantum dots materials, and the number of the LEDs 520 is equal to at least two times of a number of the LED pixels 534. For example, each LED is operable as a light-emitting diode (LED) to emit light with a blue color, e.g., with a wavelength between 450 nm and 500 nm, and, for each of the active-matrix light emitting pixels, at least two blue color LEDs are configured to optically excite at least two other colors, e.g., green and red, by secondary light emission of the phosphor materials or quantum dots materials on the at least two blue color LEDs. Thus, each of the active-matrix light emitting pixels is configured to be a multi-color display pixel including one blue color LED operable to provide a blue color and the at least two blue color LEDs with the phosphor materials or quantum dots materials operable to respectively provide a red color and a green color.

In some other implementations, each of the LEDs is operable as a UV or deep UV LED operable to emit light with a wavelength between 100 nm and 450 nm, and, for each of the active-matrix light emitting pixels, at least three UV or deep UV LEDs are configured to optically excite at least three colors, e.g., red, green, and blue, by secondary light emission of the phosphor materials or quantum dots materials on the at least three UV or deep UV LEDs. The pixel can also include a UV or deep UV LED deposited with yellow color phosphor materials or quantum dots materials to emit a white color.

Differences between different light conversion efficiencies among different pixel elements in each display pixel can be compensated by controlling pixel area ratios among the different pixel elements in the display pixel, or controlling different drive currents for the different pixel elements in the display pixel, or both. For example, the pixel areas ratios among the different pixel elements can be designed for a larger compensation, and the drive currents for the different pixel elements can be designed for a smaller compensation, e.g., for fine tuning.

A polarizer film 536 can be deposited on surfaces of the pixels 534 and the opaque dielectric spacers 532. The polarizer film 536 is configured to allow light from the pixels 534 to propagate through along a polarization direction to become a polarized light.

A protective layer 538 can be formed on the polarizer film 536. The protective layer can be a touch-sensitive transparent layer and can form, together with the transparent conducive layer 530 (as the common electrode), a capacitive touch screen position sensor.

In some implementations, an intermediate conductive layer, e.g., a metal layer, can be formed on top of each LED, e.g., on a contact electrode such as p-GaN electrode. The intermediate conductive layer can have a smoother surface than that of the contact electrode, which enables to increase adhesion between the LED and the backplane during direct bonding. A surface of the intermediate conductive layer can be plasma activated before bonding. In some cases, the intermediate conductive layer can be used for low temperature eutectic bonding or fusion bonding. In some cases, each of the intermediate conductive layers can form a highly-reflective mirror for a corresponding LED bonded with the intermediate conductive layer. The mirror can have a reflectivity higher than 80%. The intermediate conductive layer can have a same area size as the corresponding LED. The contact electrode p-GaN can include a metal film with a high reflectivity and can be configured to enhance a brightness of light emitted from the LED. Each of the active-matrix light-emitting pixels is operable to output a light flux in one direction that is larger than 80% of light flux in two directions output from each of the at least one LED in the pixel.

Referring now to FIGS. 6A to 6I, steps of fabricating an integrated display system, e.g., the display system 500 of FIGS. 5A-5B, are illustrated. For illustration purposes only, a TFT control array backplane device and blue color LEDs are used for fabricating the integrated display system.

Figure 6A:
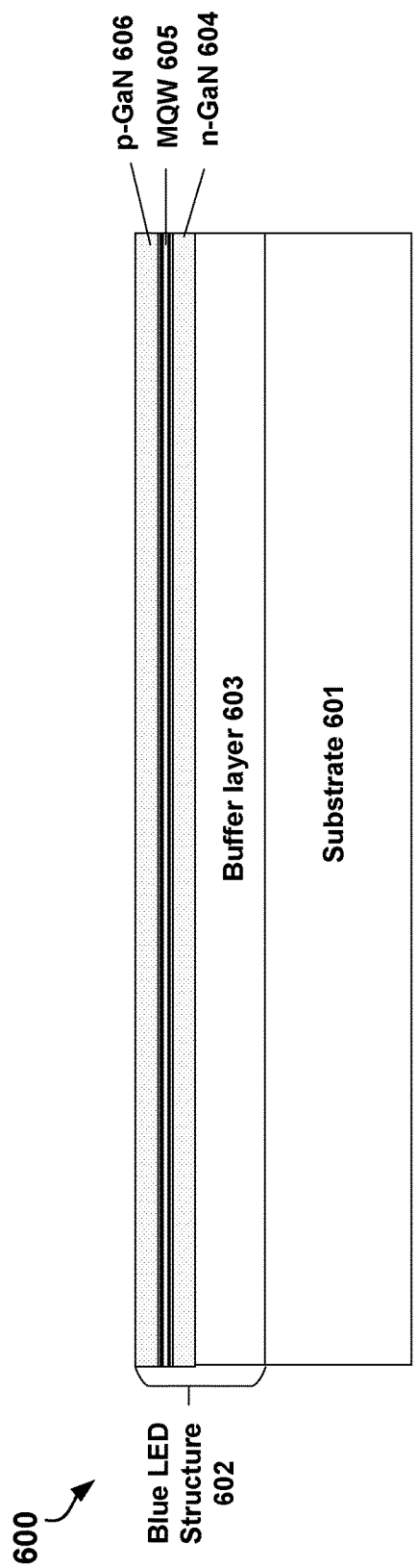
FIG. 6A is a schematic diagram of a multi-layered LED structure formed on a substrate.

FIG. 6A shows a blue color LED device 600 (e.g., an LED wafer) having a multi-layered blue color LED structure 602 formed on a substrate 601 (e.g., a wafer). The substrate 601 can be a sapphire substrate, a silicon substrate, or a silicon carbide (SiC) substrate. The substrate 601 can be pre-treated, e.g., by cleaning a top surface of the substrate 601. Then the multi-layered blue color LED structure 602 is formed by depositing multiple layers on the top surface of the substrate 601. The multiple layers can include a buffer layer 603, a first contact electrode, e.g., n-GaN electrode 604, light-emitting layers, e.g., MQW 605, and a second contact electrode, e.g., p-GaN electrode 606, that are sequentially formed on the substrate 601. The multiple layers can be deposited (or epitaxially grown) by Metal-Organic Chemical Vapor Deposition (MOCVD), molecular beam epitaxy (MBE), atomic layer deposition (ALD), physical vapor deposition (PVD), Chemical Vapor Deposition (CVD), or any other suitable deposition methods in a vacuum chamber with a certain temperature.

Figure 6B:
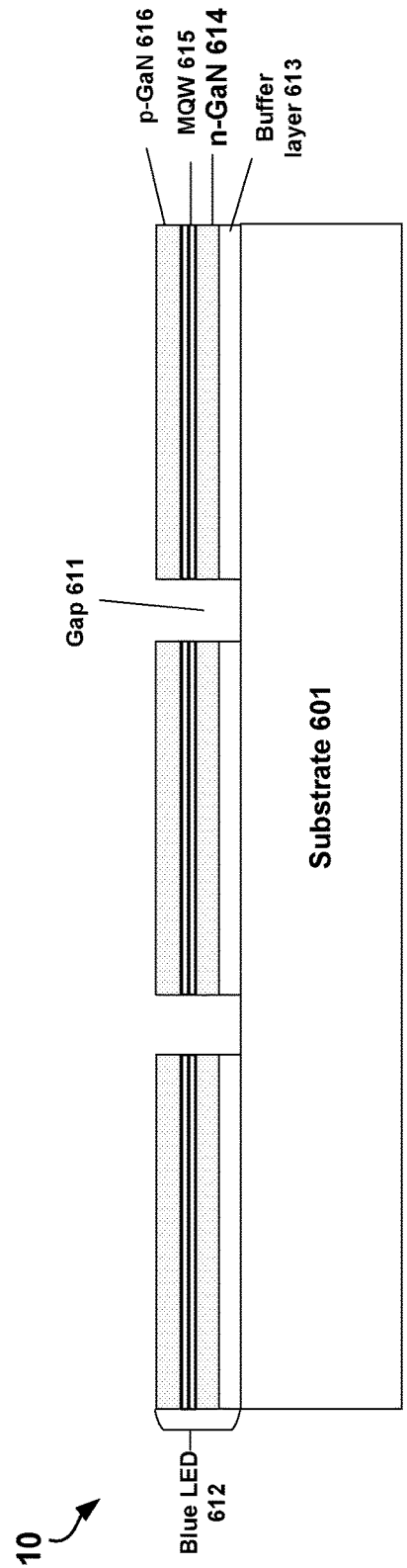
FIG. 6B is a schematic diagram of an LED array formed by patterning the structure of FIG. 6A.

FIG. 6B is a schematic diagram of a structure 610 including an array of blue color LEDs 612 formed by patterning the blue color LED structure 600 of FIG. 6A. Each of the blue color LEDs 612 can be operable to emit light with a wavelength of about 460 nm.

The patterning in FIG. 6B can be different from the patterning in FIG. 4C-2. In FIG. 4C-2, adjacent blue color LEDs are separated with a space reserved for other color LEDs, and the space has a distance identical to two drive electrodes with dielectric spacers therebetween on a backplane device. Here, it is unnecessary to leave the space for other color LEDs. The blue color LED structure 600 is patterned to form the array of blue color LEDs 612 corresponding to pixel circuits of the backplane device. Adjacent blue color LEDs 612 are separated by a gap having a distance identical to or smaller than a dielectric spacer. As noted above, the gap should be minimized to increase a pixel filling coefficient while remaining large enough for isolation spacers to block light cross-talk between adjacent LEDs and conductively isolate the adjacent LEDs. A size of the gap can be designed to be smaller than and within a dielectric spacer between adjacent drive electrodes in the backplane device. Thus, the patterning of the blue color LED structure 600 can be based on a pattern of drive electrodes in the backplane device (or a pattern of the dielectric spacers).

For example, a protective mask can be obtained based on information fabricating the drive electrodes in the backplane. The drive electrodes can be fabricated by forming a protective mask (e.g., photoresist or hard mask), depositing materials of the drive electrodes, and removing the protective mask layer. The protective mask for patterning the LED structure 600 can be determined based on the protective mask for fabricating the drive electrodes, but with different spacings for LEDs (e.g., even smaller than the drive electrodes), such that the LED structure 600 can be selectively etched away during the patterning. The patterning can be performed with the following steps: 1) patterning a hard mask layer, e.g., SiNx such as $Si_3N_4$, on top of the LED structure 600, e.g., on the p-electrode layer 606 (e.g., p-GaN) of the LED structure 600; 2) etching through the layers of the LED structure 600, to the substrate 601; 3) removing the remaining hard mask layer.

In some implementations, as noted above, differences between different light conversion efficiencies among different pixel elements in each display pixel can be compensated by controlling pixel area ratios among the different pixel elements in the display pixel. The LED structure 600 can be first patterned to form a plurality of first LEDs to be used as blue sub-pixels for emitting a blue color, then patterned to form a plurality of second LEDs to be used as green sub-pixels for emitting a green color, and then patterned to form a plurality of third LEDs to be used as red sub-pixels for emitting a red color. An area ratio between the first LED, the second LED, and the third LEDs can be based on a ratio of different light conversion efficiencies of the sub-pixels.

As illustrated in FIG. 6B, the LED structure 600 is patterned to form a blue color LED device 610 including an array of blue color LEDs 612. Adjacent blue color LEDs 612 are separated from each other by a gap 611. As noted above, the size of the gap 611 can be predetermined to be smaller than or identical to a size of a dielectric spacer between adjacent drive electrodes in a backplane. Each blue color LED 612 includes multiple semiconductor layers that include a buffer layer 613, a first contact electrode, e.g., n-GaN electrode 614, light-emitting layers, e.g., MQW 615, and a second contact electrode, e.g., p-GaN electrode 616. In some examples, the substrate 601 is a sapphire substrate. The LED 612 can have a III-V blue light LED structure, e.g., the LED structure 412a in FIG. 4B-3. In some examples, the substrate 601 is a silicon substrate. The LED 612 can have a III-V blue light LED structure, e.g., the LED structure 412b in FIG. 4B-4.

Figure 6C:
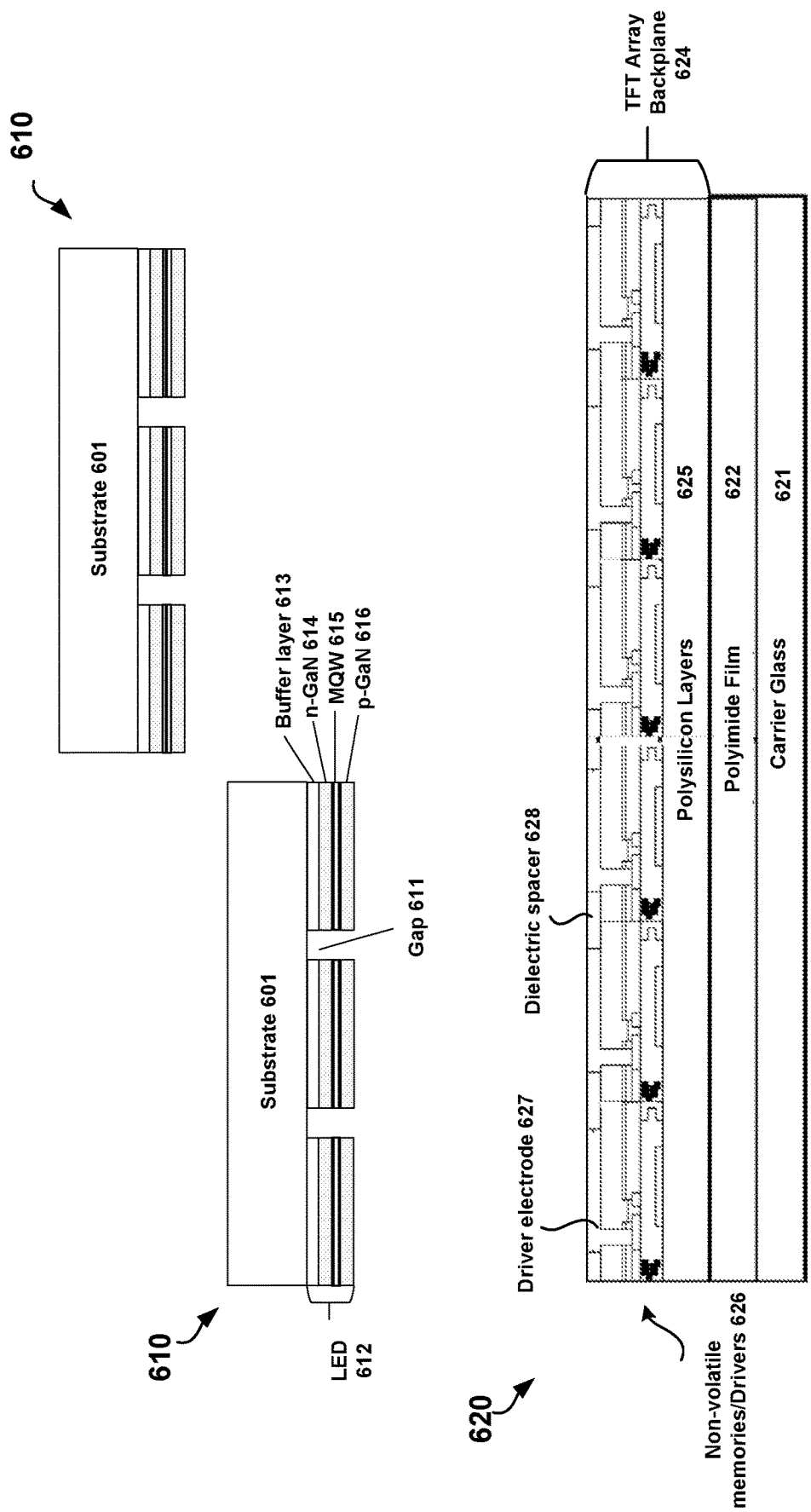
FIGS. 6C and 6D are schematic diagrams of an example process of bonding multiple LED arrays on substrates onto a TFT array backplane device and removing the substrates for the LED arrays.
Figure 6D:
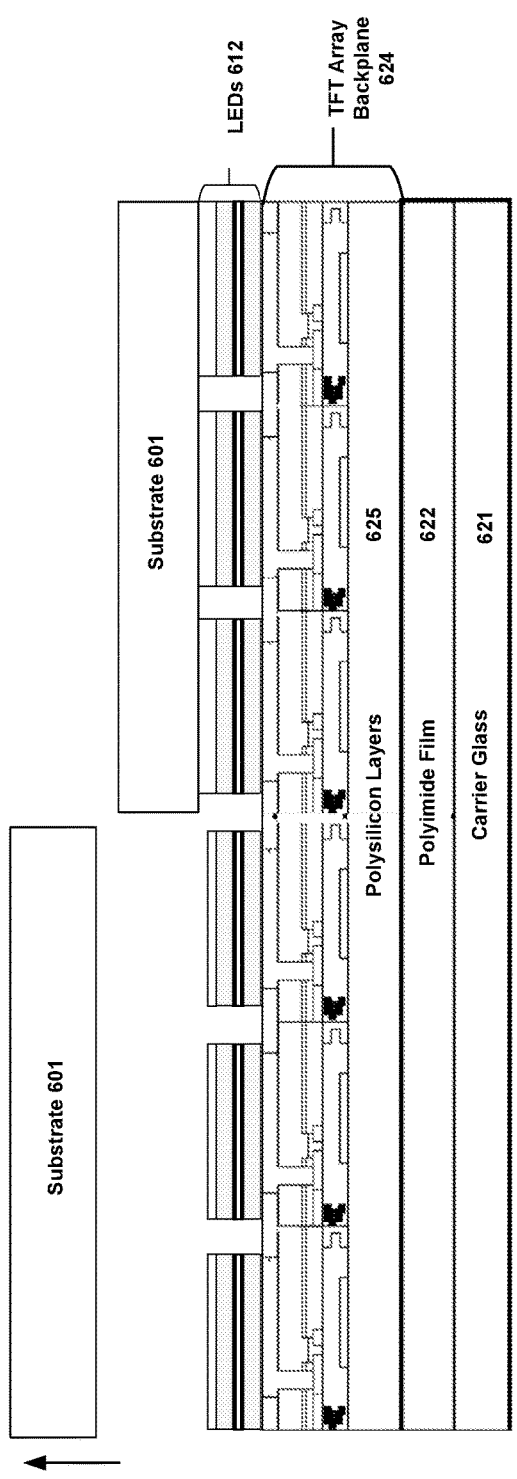

FIGS. 6C and 6D are schematic diagrams of an example process of bonding multiple blue color LED device 610 onto a TFT array backplane device 620 and removing LED substrates after the bonding.

The TFT array backplane device 620 can be fabricated on a polyimide film 622 on a carrier glass 621, using standard TFT manufacturing processes, e.g., by OEMs. The TFT backplane device 620 can include one or more TFT backplanes 624 on a top side of the polyimide film 622. Each TFT array backplane 624 can include polysilicon layer 625 and integrated circuits (including a number of non-volatile memories and drivers 626) formed on the polysilicon layers 625. The drivers include scanning drivers, e.g., the scanning drivers 116 of FIG. 1, and data drivers, e.g., the data drivers 114 of FIG. 1. Each non-volatile memory is coupled to one of the scanning drivers through at least one word line, e.g., the word line 117 of FIG. 1, and to one of the data drivers through at least one bit line, e.g., the bit line 115 of FIG. 1. Each non-volatile memory includes at least one transistor coupled to a respective drive electrode 627 on top of the TFT array backplane 624. The transistor can have a structure similar to that of the transistor 454a of FIG. 4D-3. Adjacent drive electrodes 627 are isolated from each other by dielectric spacers 628.

Similar to what discussed above in FIGS. 4I-1 and 4I-2, multiple blue color LED devices 600 can be bonded onto the TFT backplane device 620. Each blue color LED device 610 includes an array of blue color LEDs 612 formed on an LED substrate 601.

As illustrated in FIG. 6C, a first blue color LED device 610 is flipped over with the p-electrode 616 facing to drive electrodes 627 of pixel circuits of the TFT backplane 624. The first blue color LED device 610 is aligned, e.g., by optically aligning marks, and bonded on drive electrodes 627 in a first area of the TFT backplane device 620, e.g., by low temperature direct bonding as described above. The blue color LEDs 612 can be bonded to the drive electrodes 627 in the TFT backplane device 620.

After the bonding, as illustrated in FIG. 6D, the substrate 601 of the first blue color LED device 610 is removed from the blue color LEDs 612 that remain bonded on the first area of the backplane device 620. Then a second blue color LED device 610 is aligned and bonded onto a second area of the backplane device 620, the second area being adjacent to the first area.

In some examples, the substrate 601 is a sapphire substrate. The substrate 601 of each blue color LED device 610 can be removed by a scan and lift-off process with a laser. Since sapphire is transparent and GaN (the material of the buffer layer 613) is opaque (which absorbs light), a GaN film can be lifted off from the sapphire substrate by a short pulse KrF UV excimer laser with a wavelength of 248 nm or 308 nm, e.g., in a power range of 0.4-0.8 J/cm². The short pulse laser is absorbed by the GaN film to generate a high temperature, e.g., more than 1000° C. Even a brief heating of an interface between the sapphire substrate and the GaN film to >1000° C. can result in decomposition of GaN into Ga, a low melting-point metal, and nitrogen which remains trapped at the interface. The sapphire substrate can be cleaned and reused.

In some implementations, one or more blue color LED devices 610 can be first bonded onto the TFT backplane device 620 and then be removed the LED substrates 601 together. For example, the blue color LED devices 610 can have a rectangular (or square) shape and can be bonded onto the backplane device 620 without or with little gaps therebetween. In some examples, the LED substrate 601 is a silicon substrate, e.g., a silicon wafer. The LED substrates 601 of the bonded blue color LED devices 610 can be removed by chemical wet etching or Chemical Lift-Offs (CLO).

Figure 6E:
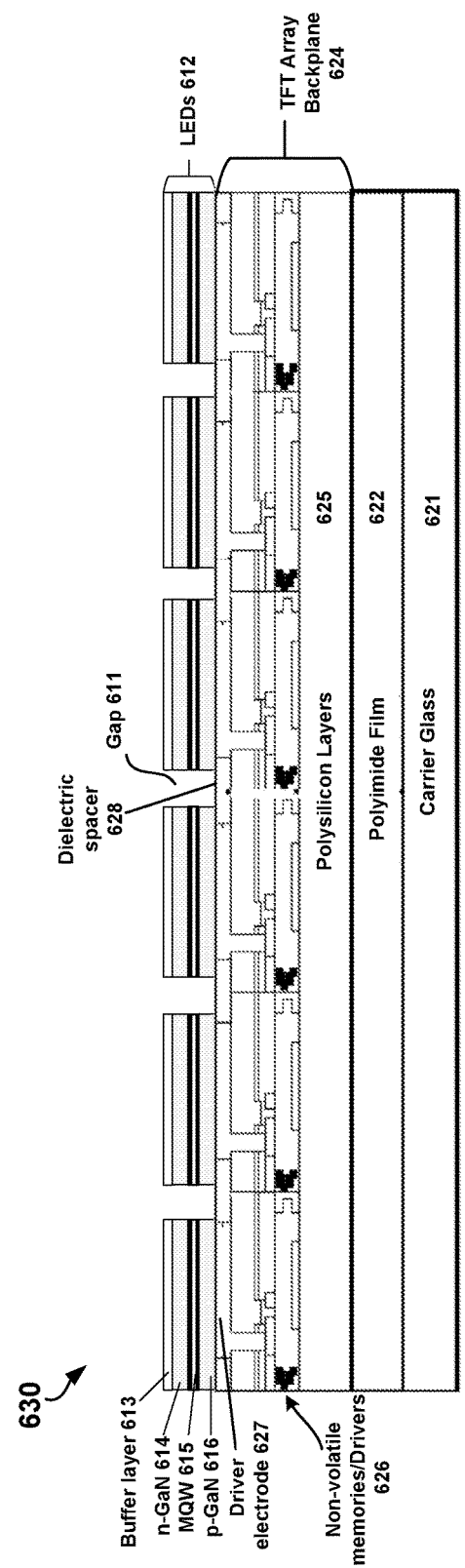
FIG. 6E is a schematic diagram of a bonded device including the LED arrays and the TFT array backplane device.

FIG. 6E shows a bonded device 630 obtained by bonding multiple blue color LED devices 610 onto the TFT backplane device 620 and then removing the LED substrates 601 from the blue color LEDs 612 that remain bonded on the TFT array backplane device 620. Adjacent LEDs 612 are separated by gaps 611 that can be within the dielectric spacers 628. The p-GaN contact electrode 616 of each LED 612 is bonded and conductively coupled to a respective drive electrode 627 that is conductively coupled to a non-volatile memory 626 of a respective pixel circuit of the backplane device 620. Thus, each LED 612 is conductively coupled to a corresponding non-volatile memory 626 to form an active-matrix light emitting sub-pixel.

Figure 6F:
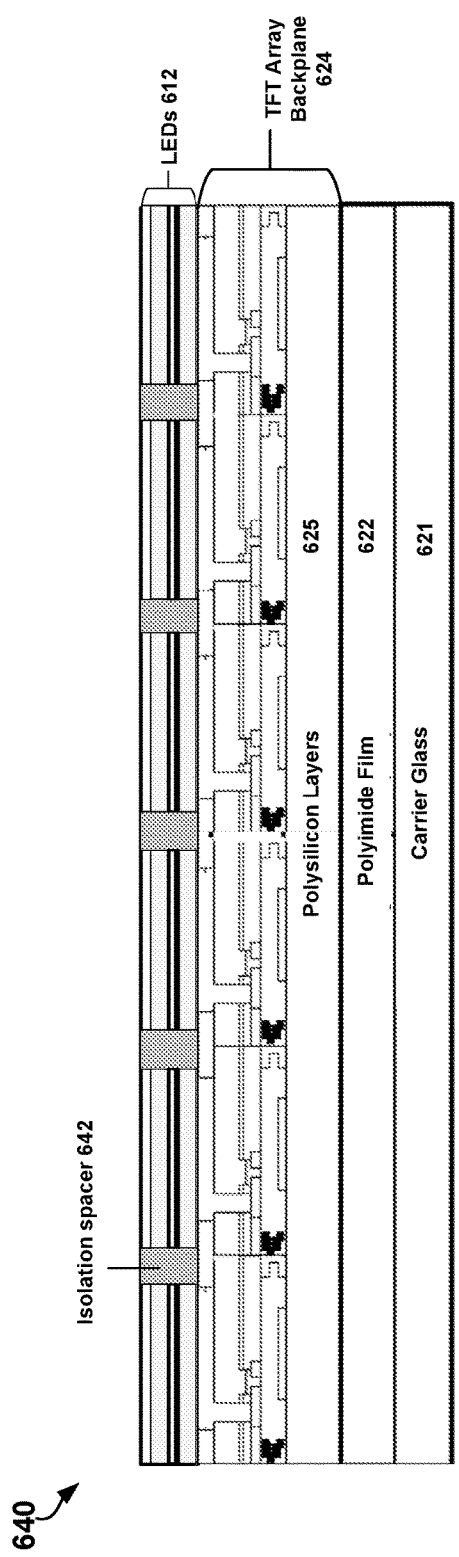
FIG. 6F is a schematic diagram of a device with isolation spacers filled in the bonded device of FIG. 6E.

FIG. 6F is a schematic diagram of a device 640 with isolation spacers 642 filled in the bonded device 630 of FIG. 6E. After the bonded device 630 is formed, a conductively isolated material can be deposited to fill into gaps 611 between adjacent LEDs 612 in the bonded device 630 to form the isolation spacers 642. The isolated material can be an opaque dielectric material or a dielectric material with a light-absorbing material such as a black material, such that light from an LED is blocked or eliminated from propagating to an adjacent LED and thus there is no or little cross-talk between the adjacent LEDs. The opaque dielectric material can include silicon nitride (SiNx). SiNx can be deposited in the gaps by chemical vapor deposition (CVD).

Figure 6G:
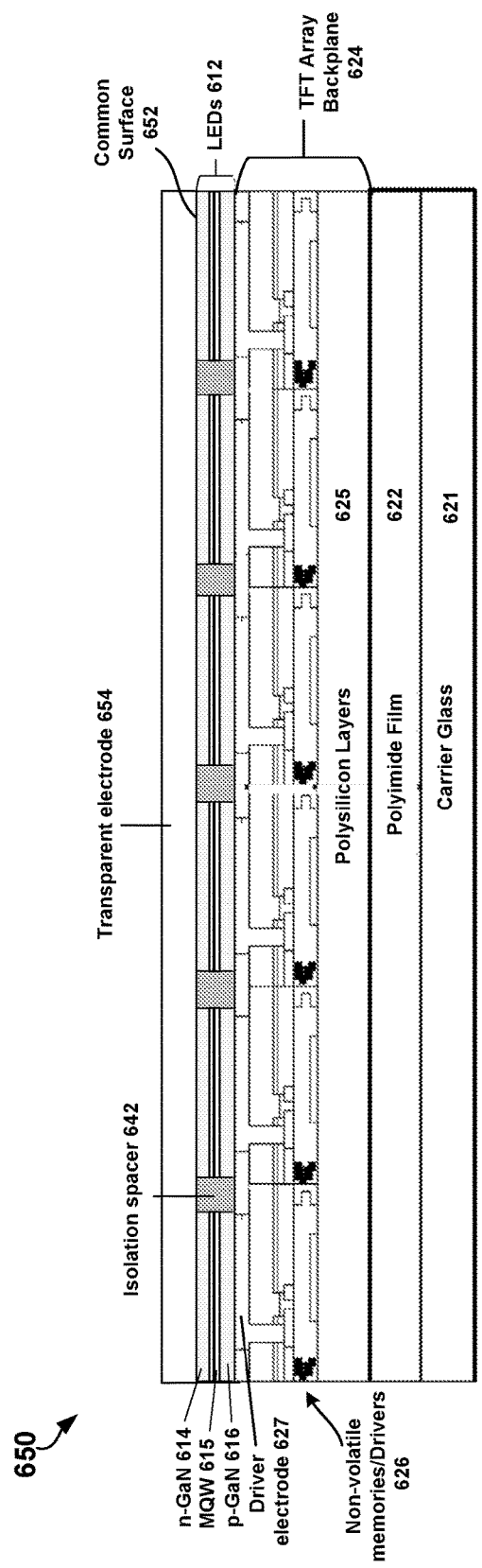
FIG. 6G is a schematic diagram of a device with a transparent electrode formed on a common surface of the device of FIG. 6F.

Then, topology planarization is performed to remove the buffer layers 613 of the LEDs 612 to form a common surface 652 (as illustrated in FIG. 6G) with exposure of n-contact electrodes of the LEDs, e.g., n-GaN electrodes 614 of blue color LEDs 612. For TFT backplane device formed on the carrier glass 621, an etch-back planarization can be carried out by isotropic inductive-coupled plasma etching to remove the isolation material and the epitaxial buffer layers or sacrificial layers to expose the n-contact electrodes (e.g., n-GaN layers or n-InGaP layers). In some cases, etch-back can be further used for thinning the n-contact electrodes 614 by etching a portion of the n-contact electrodes 614. The common surface 652 is a surface after the topology planarization and can be a continuous and flat surface.

FIG. 6G is a schematic diagram of a device 650 including a transparent conductive layer (or a transparent electrode) 654 formed on the common surface 652. The transparent conductive layer 654, e.g., an ITO layer, is deposited on top of the common surface 652 including the surfaces of the n-contact electrodes of the LEDs 612 to form a common electrode, e.g., an electrical common ground.

FIG. 6H is a schematic diagram of a device 660 with multiple color phosphor films formed on the device 650 of FIG. 6G. As shown in FIG. 6H, secondary color LEDs, e.g., red color LEDs, green color LEDs, white color LEDs, and/or blue color LEDs can be formed based on the previously-formed LEDs, e.g., blue color LEDs 612. The different color LEDs and corresponding pixel circuits (or non-volatile memories) coupled to the different color LEDs can form multi-color LED pixels 670. Each pixel 670 can include a blue color LED, a red color LED, a green color LED, and a white color LED. As discussed above, the secondary color LEDs can be formed on surface of the LEDs 612 by using different color phosphor materials or different size quantum-dot (QD) materials.

In some implementations, an array of the multi-color LED pixels 670 is formed by the following processes: 1) patterning using photoresist for specific color LEDs, e.g., red color LEDs; 2) depositing, e.g., by ink-jet printing, specific color phosphor films or specific size QD thin-films for the specific color, e.g., red QDs/phosphors 662 (red phosphor films or red QD thin-films); 3) lifting off to remove the photoresist to form specific color phosphors/Quantum-dot arrays thus to form the specific color LED arrays, e.g., red color LED arrays; 4) repeating the same processes above to form another specific color LED arrays, e.g., green color LED arrays, but with another specific color phosphor films or another specific size QD thin-films, e.g., green QDs/phosphors 664 (green phosphor films or green QD thin-films); and 5) repeating the same processes above to form another specific color LED arrays, e.g., white LED arrays, but with another specific color phosphor films or another specific size QD thin-films, e.g., yellow QDs/phosphors 666 (yellow phosphor films or yellow QD thin-films). In some examples, blue color LEDs in the pixels 670 can be also formed by depositing corresponding blue color phosphor film or corresponding size QD thin film 668 on the formed blue color LEDs 612. In some examples, transparent layers 668 are formed on the blue color LEDs 612 in the pixels 670.

Dielectric spacers 669 are formed between the deposited phosphors or QDs for different color LEDs. The dielectric spacers 669 can include an opaque dielectric material such as SiNx. For example, after depositing the red QDs/Phosphors 662, green QDs/Phosphors 664, yellow QDs/Phosphors 666, and blue QDs/Phosphors or transparent layers 668 on the LEDs 612, the dielectric material is deposited on top of the bonded device. Topology planarization can be performed to form a flat surface across the array of pixels 670.

FIG. 6I is a schematic diagram of a flexible integrated device 680 made from the device 660 of FIG. 6H. A polarizer film 682 can be deposited on the flat surface across the array of pixels 670 and the dielectric spacers 669. The polarizer film 682 is configured to allow light from the pixels 670 to propagate through along a polarization direction to become a polarized light, which can also reduce scattering and get more uniform light. A protective layer 684 can be then formed on the polarizer film 682. As noted above, the protective layer 684 can be a touch-sensitive transparent layer and can form, together with the transparent layer 654 (as the common electrode), a capacitive touch screen position sensor. The protective layer 684 can be made of transparent material, e.g., glass or plastic, coated with a conductive material, e.g., indium tin oxide (ITO). To form a flexible device, the carrier glass 621 can be removed from the backplane device 620, e.g., by laser lift-off. For example, the polyimide-coated carrier glass 621 can be delaminated via UV excimer laser lift-off, e.g., at 308 nm, with an ablation threshold, e.g., at 235 mJ/cm^2.

Example Processes

FIG. 7 is a flow diagram of an example process of forming an integrated active-matrix multi-color pixel display system by sequentially bonding different color light emitting elements onto a backplane device. The integrated system can be the integrated LED pixel array based display system 100 of FIG. 1, or 300 of FIGS. 3A-3C. The example process 700 can be similar to the processes described according to the processes described according to FIGS. 4A-1 to 4N.

A plurality of first color light emitting elements is formed on a first substrate (702). Each of the first color light emitting elements is configured to emit light with a first color. The plurality of first color light emitting elements can be formed by patterning a first color light emitting structure formed on the first substrate. The first color light emitting structure can include multiple semiconductor layers epitaxially grown on the first substrate. The plurality of semiconductor layers can be epitaxial semiconductor layers grown on the substrate, e.g., by MOCVD. For example, the first light emitting structure can include a buffer layer, a first contact electrode, e.g., an n-GaN electrode, multiple quantum well (MQW) semiconductor layers, and a second contact electrode, e.g., a p-GaN electrode. The MQW layers can include Group III-V compounds and be configured to be activated to emit light with the single color.

In some examples, the MQW layers include pairs of In0.3Ga0.7N/GaN layers, and the first color light emitting element is a blue color LED, and the first substrate can be a sapphire substrate or a silicon substrate. In some examples, the MQW layers include pairs of In(0.5)Ga(0.5)N/GaN layers, and the first color light emitting element is a green color LED, and the first substrate can be a sapphire wafer or a GaN wafer. In some examples, the MQW layers include pairs of InN/GaN layers, and the first color light emitting element is a red color LED, and the first substrate can be a GaP wafer or a GaN wafer. As noted above, different color LED arrays can be sequentially boned on the backplane device. A sequence of the different color LED arrays can be in any suitable order.

The first color light emitting structure can be patterned according to information of drive electrodes of pixel circuits on a backplane to be integrated. Each of the pixel circuits includes a drive electrode in a top layer of the pixel circuit that is in a top layer of the backplane. Adjacent drive electrodes are separated by dielectric spacers. The drive electrodes can be formed on the backplane by patterning with a protective mask. The first color light emitting structure can be patterned based on the protective mask for the drive electrodes.

In some implementations, in the integrated system, adjacent same color light emitting elements are separated by two or more other different color light emitting elements along rows and/or columns. Along each row or column, a distance between adjacent first light emitting elements formed on the first substrate can be separated by two or more other different color light emitting elements. Each light emitting element is to be boned with a respective drive electrode on the top layer of the backplane. Adjacent drive electrodes are separated by one dielectric spacer, thus a distance between adjacent first color light emitting elements can be substantially identical to a distance between corresponding pixel circuits for the adjacent first color light emitting elements in the backplane, that is, about two drive electrodes and dielectric spacers therebetween.

During patterning, adjacent first color light emitting elements are separated from each other by spaces reserved for two or more other color light emitting elements. In some cases, the formed first color light emitting element has a smaller area size than a drive electrode of the backplane and within an area of the drive electrode. In some cases, a formed first color light emitting element has a same area size as the drive electrode and can be overlapped on the area of the drive electrode. In some cases, a formed first color light emitting element has a larger area size than the drive electrode but smaller than the drive electrode and adjacent dielectric spacer, such that the first color light emitting element can have a larger area but be conductively isolated from each other. To increase a pixel filling coefficient of the integrated system, a gap between adjacent light emitting elements can be configured to be smaller than or identical to a size of a dielectric spacer between the adjacent drive electrode. Thus, it is preferable for the first color light emitting element to have a larger area size than the drive electrode.

The plurality of first color light emitting elements formed on the first substrate is integrated with the backplane device to form first sub-pixels of active-matrix multi-color pixels (704). The backplane device includes at least one backplane having a plurality of pixel circuits. Each of the pixel circuits can include a non-volatile memory including at least one transistor conductively coupled to a corresponding drive electrode in a top layer of the backplane device. The plurality of first color light emitting elements can be integrated with the backplane device by connecting top layers of the first color light emitting elements, e.g., the p-contact electrodes, with drive electrodes in top layers of respective pixel circuits of the backplane device, e.g., by low temperature direct bonding. In such a way, each of the first color light emitting elements can be conductively coupled to a respective non-volatile memory via the p-contact electrode and the drive electrode to form a first sub-pixel of an active-matrix multi-color pixel.

To achieve good bonding, one or more to-be-bonded surfaces can be pre-treated to remove any contamination and to increase adhesion between the surfaces. For example, surfaces of the p-contact electrodes of the first color light emitting elements and/or surfaces of the drive electrodes in the top layer of the backplane device can be pretreated with plasma activation.

Before bonding, the plurality of first color light emitting elements formed on the first substrate are aligned with drive electrodes in the top layers of the respective pixel circuits in the backplane device, for example, by optically aligning marks on the substrate and marks on the backplane device. After the alignment, the two devices are clamped together on a bonding chuck, and a pressure is applied on both sides of the devices when the devices are in a full contact at a low temperature for a period of time. Then the bonded devices can be optionally annealed to another low temperature for another period of time.

The first substrate is removed from the first color light emitting elements that remain integrated on the backplane device (706). The first substrate can be removed by laser lift-off, laser scrubbing, or chemical lift-off.

In some examples, the first color light emitting elements are blue color LEDs. In some cases, the first substrate can be a sapphire substrate that can be laser lifted-off by a laser, e.g., a short pulse KrF UV excimer laser, scanning an area over the substrate, e.g., by delamination of buffer layers (such as GaN layers) of the light-emitting elements from the sapphire substrate transparent for the UV laser. In some cases, the first substrate is a silicon substrate that can be removed by chemical lift-off.

In some examples, the first color light emitting elements are green color LEDs. The first substrate can be a sapphire substrate that can be removed by laser lift-off, e.g., by using a short pulse KrF UV excimer laser.

In some examples, the first color light emitting elements are red color LEDs. In some cases, the first substrate is a GaP substrate that can be removed by laser lift-off, e.g., by UV Excimer laser. In some cases, the first substrate is a GaAs substrate that can be removed by laser lift-off, e.g., by Nd:YAG Laser, or by chemical lift-off.

In some implementations, the backplane device has a large area and multiple devices each including first color light emitting elements formed on first substrates can be bonded onto the backplane device. First color light emitting elements formed on a first substrate can be aligned with respective pixel circuits in a first region of the backplane device, and then top layers of the first light emitting elements formed on the first substrate are bonded with top layers of the respective pixel circuits that include corresponding drive electrodes. After the bonding, the first substrate can removed by a scan and lift-off process with a laser. Then another first light emitting elements formed on another first substrate can be aligned and bonded on a second region of the backplane device followed by removal of the another first substrate. The second region can be adjacent to the first region.

A plurality of second color light emitting elements is formed on a second substrate (708). Each of the second color light emitting elements is configured to emit light with a second color different from the first color. The plurality of second color light emitting elements can be formed in a similar way to the plurality of first color light emitting elements. In some examples, a second color light emitting structure is formed on the second substrate and then is patterned according to information of drive electrodes of respective pixel circuits to be bonded. Adjacent second color light emitting elements are also separated by spacers reserved for two or more other light emitting elements.

Each of the second color light emitting elements includes multiple semiconductor layers epitaxially grown on the second substrate, including a buffer layer, a first contact electrode, e.g., n-contact electrode, MQW layers, and a second contact electrode, e.g., p-contact electrode, as a top layer. The second color light emitting element can have a height, from the buffer layer to the p-contact electrode. The height of the second color light emitting element can be configured to be higher than the height of the first color light emitting element, such that the second color light emitting elements formed on the second substrate can be touched with surfaces of the backplane device without obstruction of the first color light emitting elements that remain bonded on the backplane device.

The plurality of second color light emitting elements formed on the second substrate is integrated with the backplane device to form second sub-pixels of the active-matrix multi-color pixels (710). The plurality of second color light emitting elements can be integrated with the backplane device by connecting top layers of the second color light emitting elements, e.g., the p-contact electrodes, with drive electrodes in top layers of respective pixel circuits of the backplane device, e.g., by low temperature direct bonding. In such a way, each of the second color light emitting elements can be conductively coupled to a respective non-volatile memory of the respective pixel circuit via the p-contact electrode and the drive electrode to form a second sub-pixel of the active-matrix multi-color pixel. The bonded second color light emitting element is adjacent to a corresponding bonded first color light emitting element on the backplane device. A gap between the adjacent first and second color light emitting elements can be smaller than or identical to a dielectric spacer between adjacent drive electrodes in the top layer of the backplane device.

To achieve good bonding, one or more to-be-bonded surfaces can be pre-treated to remove any contamination. For example, surfaces of the p-contact electrodes of the second color light emitting elements and/or surfaces of the drive electrodes in the top layer of the backplane device can be pretreated with plasma activation. Before bonding, the plurality of second color light emitting elements formed on the second substrate are aligned with drive electrodes in the top layers of the respective pixel circuits in the backplane device, for example, by optically aligning marks on the second substrate and marks on the backplane device. After the alignment, the two devices are clamped together on a bonding chuck, and a pressure is applied on both sides of the devices when the devices are in a full contact at a low temperature for a period of time. Then the bonded devices can be optionally annealed to another low temperature for another period of time.

The second substrate is removed from the second color light emitting elements that remain integrated on the backplane device (712). Similar to the removal of the first substrate, the second substrate can be removed by laser lift-off, laser scrubbing, or chemical lift-off.

As noted above, the backplane device has a large area and multiple devices each including second color light emitting elements formed on second substrates can be bonded onto the backplane device and then the second substrate are removed.

In some implementations, a plurality of third color light emitting elements is formed on a third substrate, e.g., similar to the forming of the plurality of first color light emitting elements. Adjacent third color light emitting elements can be separated by spacers reserved for two or more other color light emitting elements. Each of the third color light emitting elements is configured to emit light with a third color that is different from the first color and the second color. The third color light emitting element can have a height, from the buffer layer to the p-contact electrode. The height of the third color light emitting element can be configured to be higher than the height of the first color light emitting element and the height of the second color light emitting element, such that the third color light emitting elements formed on the third substrate can be touched with surfaces of the backplane device without obstruction of the first and second color light emitting elements that remain bonded on the backplane device.

Then the plurality of third color light emitting elements formed on the third substrate is integrated with the backplane device that is bonded with the first color light emitting elements and the second color light emitting elements to form third sub-pixels of the active-matrix multi-color pixels. Each of the third color light emitting elements is conductively coupled to a non-volatile memory of a respective pixel circuit to form a third sub-pixel by bonding a top layer, e.g., a p-contact electrode, of the third color light emitting element with a drive electrode of the respective pixel circuit. Each of the third color light emitting elements bonded on the backplane device is adjacent to a corresponding first color light emitting element and a corresponding second light emitting element that are bonded on the backplane device.

Then the third substrate is removed from the third color light emitting elements that remain integrated on the backplane device. Similar to the removal of the first substrate, the third substrate can be removed by laser lift-off, laser scrubbing, or chemical lift-off. As noted above, the backplane device has a large area and multiple devices each including third color light emitting elements formed on third substrates can be bonded onto the backplane device and then the third substrate are removed.

In some implementations, one or more other color light emitting elements can be integrated with the backplane device to form one or more other sub-pixels of the active-matrix multi-color pixels.

In some implementations, each of the active-matrix multi-color pixels includes a first sub-pixel having a first light emitting element and a respective first pixel circuit, a second sub-pixel having a second light emitting element and a respective second pixel circuit, and a third sub-pixel having a third light emitting element and a respective third pixel circuit. In a particular example, each of the active-matrix multi-color pixels includes a red light-emitting diode (LED), a green LED, and a blue LED. The first, second, and third light emitting elements in each of the active-matrix multi-color pixels can be adjacent and conductively isolated from each other, and the respective first, second, and third pixel circuits can be adjacent and conductively isolated from each other. Adjacent drive electrodes in the top layer of the backplane device can be isolated by dielectric spacers. Adjacent light emitting elements, e.g., first and second, second and third, and third and first, are separated by gaps. A size of a gap can be smaller than a size of the dielectric spacer.

After the bonding, an isolation material, e.g., an opaque dielectric material such as SiNx, is filled in the gaps between the adjacent light emitting elements. Then, topology planarization is performed on the light emitting elements filled with the isolation material to form a common surface with exposure of first contact electrodes of the first, second, and third light emitting elements, e.g., to the n-contact electrodes such as n-GaN electrodes.

In some implementations, the backplane includes a low temperature polysilicon (LTPS) active-matrix (AM) thin-film transistors (TFT) array control backplane formed on a flexible film, e.g., a polyimide film or a stainless steel, that is formed on a carrier substrate, e.g., a carrier glass. An etch-back planarization can be carried out by isotropic inductive-coupled plasma etching to remove the isolation material and the epitaxial buffer layers to expose the n-contact electrodes. In some cases, etch-back can be further used for thinning the n-contact electrodes by etching a portion of the n-contact electrodes.

In some cases, as noted above, in the bonded device, the third color light emitting elements can have a higher height than the second color light emitting elements that are higher than the first color light emitting elements. After the etch-back process, surfaces of the n-contact electrodes of the third color light emitting elements may be higher than surfaces of the n-contact electrodes of the second color light emitting elements that are higher than surfaces of the n-contact electrodes of the first color light emitting elements. That is, the common surface including the surfaces of the n-contact electrodes of the first, second, and third light emitting elements can be a continuous and non-flat surface.

In some implementations, the backplane includes a complementary metal-oxide-semiconductor (CMOS) backplane formed on a silicon semiconductor wafer. A CMP (Chemical-Mechanical-Polishing) planarization can be carried out to remove the isolation material and the epitaxial buffer layers to expose n-contact electrodes of the light emitting elements. The CMP planarization can form a continuous and flat surface across the n-contact electrodes of the light emitting elements. The CMP process can be further used for thinning the n-contact electrodes of the light emitting elements by removing a portion of the n-contact electrodes.

In some implementations, a transparent conductive layer, e.g., an ITO layer, can be deposited on top of the common surface including the surfaces of the n-contact electrodes to form a common electrode, e.g., an electrical common ground, for the first, second, and third light emitting elements.

In some implementations, a polarizer film can be deposited on the transparent conductive layer. The polarizer film is configured to allow light from the light emitting elements to propagate through along a polarization direction to become a polarized light, which can also reduce scattering and get more uniform light. A transparent protective layer can be then formed on the polarizer film. The transparent protective layer can be a touch-sensitive transparent layer and can form, together with the transparent conductive layer, a capacitive touch screen position sensor. The transparent protective layer can be made of transparent material, e.g., glass or plastic, coated with a conductive material such as ITO.

In some implementations, the backplane device is a TFT array control backplane formed on a flexible film on a carrier glass. After the multi-color active matrix display pixels is formed, the carrier glass can be removed, e.g., by laser lift-off. For example, the polyimide-coated carrier glass can be delaminated via UV excimer laser lift-off at 308 nm. In such a way, the formed integrated device on the flexible film can be flexible.

FIG. 8 is a flow diagram of an example process 800 of forming an integrated active-matrix multi-color pixel display system by first bonding single color light emitting elements onto a backplane device and then depositing multiple color phosphors or quantum dots (QDs) materials. The integrated system can be the integrated LED pixel array based display system 100 of FIG. 1, or 500 of FIGS. 5A-5B. The example process 800 can be similar to the processes described according to the processes described according to FIGS. 6A-6I.

A plurality of light emitting elements is formed on a substrate (802). Each of the light emitting elements is operable to emit light with a single color. The plurality of light emitting elements can be formed by patterning a light emitting structure formed on the substrate. The light emitting structure can include multiple semiconductor layers epitaxially grown on the substrate. For example, the light emitting structure can include multiple quantum well (MQW) semiconductor layers between a first contact electrode, e.g., a p-GaN electrode, and a second contact electrode, e.g., an n-GaN electrode. The MQW layers can include Group III-V compounds and be configured to be activated to emit light with the single color. In some examples, the MQW layers include pairs of In0.3Ga0.7N/GaN layers, and the light emitting structure is a blue color LED structure, and the substrate can be a sapphire substrate or a silicon substrate. In some examples, the MQW layers include pairs of AlGaN/GaN layers, and the light emitting structure can be a UV or deep UV LED structure formed on a sapphire substrate. The plurality of layers can be epitaxial semiconductor layers grown on the substrate, e.g., by MOCVD.

The light emitting structure can be patterned according to information of drive electrodes of pixel circuits on a backplane to be integrated. Each of the pixel circuits includes a drive electrode in a top layer of the pixel circuit that is in a top layer of the backplane. Adjacent drive electrodes are separated by dielectric spacers. The drive electrodes can be formed on the backplane by patterning with a protective mask. The light emitting structure can be patterned according to the protective mask for the drive electrodes. A distance between adjacent light emitting elements on the substrate can be substantially identical to a distance between adjacent drive electrodes in the backplane. Also, to increase a pixel filling coefficient of the integrated system, a gap between adjacent light emitting elements can be configured to be smaller than or identical to a size of a dielectric spacer between the adjacent drive electrode.

The plurality of light emitting elements formed on the substrate is integrated with the backplane device to form a plurality of active-matrix light emitting pixels (804). The backplane device includes at least one backplane having a plurality of pixel circuits. Each of the pixel circuits can include a non-volatile memory including at least one transistor conductively coupled to a corresponding drive electrode in a top layer of the backplane device. The plurality of light emitting elements can be integrated with the backplane device by connecting top layers of the light emitting elements, e.g., the first contact electrodes, with drive electrodes in top layers of respective pixel circuits of the backplane device, e.g., by low temperature direct bonding. In such a way, each of the light emitting elements can be conductively coupled to a respective non-volatile memory via the first contact electrode and the drive electrode.

To achieve good bonding, one or more to-be bonded surfaces can be pre-treated to remove any contamination. For example, surfaces of the first contact electrodes of the light emitting elements and/or surfaces of the drive electrodes in the top layer of the backplane device can be pretreated with plasma activation.

Before bonding, the plurality of light emitting elements formed on the substrate are aligned with drive electrodes in the top layers of the respective pixel circuits in the backplane device, for example, by optically aligning marks on the substrate and marks on the backplane device. After the alignment, the two devices are clamped together on a bonding chuck, and a pressure is applied on both sides of the devices when the devices are in a full contact at a low temperature for a period of time. Then the bonded devices can be optionally annealed to another low temperature for another period of time.

The substrate is removed from the light emitting elements that remain integrated on the backplane device (806). In some examples, the substrate is a sapphire substrate that can be laser lifted-off by a laser, e.g., a short pulse KrF UV excimer laser, scanning an area over the substrate, e.g., by delamination of buffer layers (such as GaN layers) of the light-emitting elements from the sapphire substrate transparent for the UV laser. In some examples, the substrate is a silicon substrate that can be removed by chemical lift-off.

In some implementations, the backplane device has a large area and multiple devices each including light emitting elements formed on substrates can be bonded onto the backplane device. Light emitting elements formed on a first substrate can be aligned with respective pixel circuits in a first region of the backplane device, and then top layers of the light emitting elements formed on the first substrate are bonded with top layers of the respective pixel circuits that include corresponding drive electrodes. After the bonding, the first substrate can removed by scanning by using a laser an area on the first substrate such that the light emitting elements in the area are separated from the first substrate and remain bonded on the backplane device and lifting off the first substrate from the light emitting elements that remain bonded on the backplane device. Then light emitting elements formed on a second substrate can be aligned and bonded on a second region of the backplane device followed by removal of the second substrate. The second region can be adjacent to the first region, and the light emitting elements bonded on the second region are adjacent to the light emitting elements bonded on the first region.

After the bonding, an isolation material, e.g., an opaque dielectric material such as SiNx, is filled in gaps between the adjacent light emitting elements. Then, topology planarization is performed on the light emitting elements filled with the isolation material to form a common surface across the light emitting elements with exposure of second contact electrodes of the light emitting elements, e.g., to the second contact electrodes such as n-GaN electrodes. The common surface can be a continuous and flat surface.

In some implementations, the backplane includes a low temperature polysilicon (LTPS) active-matrix (AM) thin-film transistors (TFT) array control backplane formed on a flexible film, e.g., a polyimide film or a stainless steel, that is formed on a carrier substrate, e.g., a carrier glass. An etch-back planarization can be carried out by isotropic inductive-coupled plasma etching to remove the isolation material and the epitaxial buffer layers to expose the n-contact electrodes. In some cases, etch-back can be further used for thinning the n-contact electrodes by etching a portion of the n-contact electrodes.

In some implementations, the backplane includes a complementary metal-oxide-semiconductor (CMOS) backplane formed on a silicon semiconductor wafer. A CMP (Chemical-Mechanical-Polishing) planarization can be carried out to remove the isolation material and the epitaxial buffer layers to expose n-contact electrodes of the light emitting elements. The CMP planarization can form a continuous and flat surface across the n-contact electrodes of the light emitting elements. The CMP process can be further used for thinning the n-contact electrodes of the light emitting elements by removing a portion of the n-contact electrodes.

A transparent conductive layer, e.g., an ITO layer, can be deposited on top of the common surface including the surfaces of the second contact electrodes to form a common electrode, e.g., an electrical common ground, for the light emitting elements.

An array of active-matrix multi-color display pixels is formed by selectively depositing different color phosphor or different size quantum-dot materials on the light emitting elements (808). Each light emitting element is operable to emit light with a single color. The phosphor material or the quantum-dot material is operable to emit a secondary color when excited by light from the light-emitting element. The secondary color can be different from the single color.

In some implementations, each light emitting element is operable as a blue color LED, e.g., with an emission wavelength between 450 nm and 500 nm. In each display pixel, at least two blue color LEDs are configured to optically excite at least two other colors by secondary light emission of the phosphor materials or quantum dots materials on the at least two blue color LEDs. Each of the active-matrix light emitting pixels is configured to be a multi-color display pixel including one blue color LED operable to provide a blue color and the at least two blue color LEDs with the phosphor materials or quantum dots materials operable to respectively provide a red color and a green color.

In some implementations, each of the light-emitting elements is operable as a light-emitting diode (LED) to emit UV or deep UV light with a wavelength between 100 nm and 450 nm. For each of the active-matrix light emitting pixels, at least three UV or deep UV LEDs are configured to optically excite at least three colors, e.g., red, green, and blue, by secondary light emission of the phosphor materials or quantum dots materials on the at least three UV or deep UV LEDs. The pixel can also include a UV or deep UV LED configured to emit a white color by secondary light emission of yellow color phosphor material or quantum dot material on the UV or deep UV LED.

A transparent protective layer can be formed on top of the array of active-matrix multi-color display pixels. The protective layer can be a touch-sensitive protective layer and can form, together with the transparent conductive layer (as the common electrode), a capacitive touch screen position sensor. The protective layer can be made of transparent material, e.g., glass or plastic, coated with a conductive material, e.g., indium tin oxide (ITO). A polarizer film can be deposited between the protective layer and the array of display pixels.

In some implementations, the backplane device is a TFT array control backplane formed on a flexible film on a carrier glass. After the multi-color active matrix display pixels is formed, the carrier glass can be removed, e.g., by laser lift-off. For example, the polyimide-coated carrier glass can be delaminated via UV excimer laser lift-off at 308 nm. In such a way, the formed integrated device on the flexible film can be flexible.

Example Systems and Fabricating Processes Using Laser Assisted Bonding Multiple Color LEDs on TFT Backplane Devices FIGS. 9A-9B show an example integrated active-matrix multi-color pixel array based display system 900 using different color LED arrays bonded on a backplane device through respective intermediate metallic layers. This integrated display system 900 can be formed according to an example process described with further details in FIGS. 10A to 10Z. The integrated display system 900 can be the display system 100 of FIG. 1. The system 900 is similar to the system 300 of FIGS. 3A-3C. However, different from the system 300, the system 900 includes the intermediate metallic layers bonded between different color LEDs and pixel circuits of the backplane device. The intermediate metallic layers are pre-formed on surfaces of the different color LEDs and are used to locally bond the different color LEDs and the pixel circuits of the backplane devices by low temperature bonding, e.g., eutectic bonding.

As illustrated in FIGS. 9A-9B, the integrated display system 900 includes a backplane 910 on a first side of a substrate 902. In some implementations, the backplane 910 can be a CMOS backplane formed in a CMOS backplane device. The CMOS backplane device can include one or more CMOS backplanes and can be manufactured by existing CMOS manufacturing technologies. The substrate 902 can be a silicon substrate, e.g., a silicon wafer. In some implementations, the backplane 910 can be a TFT array control backplane formed in a TFT backplane device. The TFT backplane device can include one or more TFT backplanes and can be manufactured by existing TFT manufacturing technologies, e.g., by OEMs. The TFT array backplane can be a low temperature polysilicon (LTPS) thin-film transistors (TFT) array control backplane. The substrate 902 can be a carrier glass or a flexible film such as polyimide film. The TFT backplane device can be the TFT backplane device 440 as illustrated in FIGS. 4D-1 to 4D-3.

The backplane 910 includes integrated circuits having non-volatile memories and display drivers 912. In some implementations, the backplane 910 includes a number of pixel circuits. Each pixel circuit includes a non-volatile memory that has at least one transistor conductively coupled to a corresponding drive electrode 914 in a top layer of the pixel circuits or a top layer of the backplane 910. Adjacent drive electrodes 914 are conductively isolated from each other by dielectric spacers 916. The display drivers include scanning drivers and data drivers, and each of the non-volatile memories is coupled to one of the scanning drivers through at least one word line and to one of the data drivers through at least one bit line.

The integrated display system 900 includes arrays of light-emitting elements such as LEDs 930. The LEDs 930 are separated (or isolated) by isolation spacers 940, e.g., dielectric spacers. The isolation spacers 940 are configured to isolate the LEDs 330 such that the LEDs 930 are not conductively connected. The isolation spacers 940 can include an opaque dielectric material or a dielectric material with a light-absorbing material such as a black material, such that light from an LED is blocked or eliminated from propagating to an adjacent LED and thus there is no or little cross-talk between the adjacent LEDs. The opaque dielectric material can include silicon nitride (SiNx). SiNx has a hexagonal crystal structure at an ambient pressure and sintered ceramic of this phase is opaque. Each LED 930 can include a first contact electrode such as p-electrode 934 (e.g., p-GaN layer), a second contact electrode such as n-electrode 936 (e.g., n-GaN layer), and multiple quantum well (MQW) semiconductor layers 932 between the p-electrode 934 and the n-electrode 936. The MQW layers 932 can include group III-V nitrides (e.g., GaN) and each of the LEDs 930 is operable to emit light with a single color, e.g., blue, green, or red.

The emitted wavelength of an LED is dependent on the MQW materials' band gap and can be controlled by a thickness of InGaN layer (e.g., in a range of 2-3 nm) and GaN/InN ratio, from near ultraviolet (UV) for 0.02In/0.98Ga through 390 nm for 0.1In/0.9Ga, violet-blue 420 nm for 0.21n/0.8Ga, blue 440 nm for 0.3In/0.7Ga, green 532 nm for 0.5In/0.5Ga, to red for higher ratios In/Ga.

For illustration purposes only, the LEDs 930 include three different color LED arrays: blue color LEDs 930a, green color LEDs 930b, and red color LEDs 930c. Each blue color LED 930a is operable to emit light with a blue color, and the MQW layers can include multiple pairs of In(0.3)Ga(0.7)N/GaN layers. Each green color LED 930b is operable to emit light with a green color, and the MQW layers can include multiple pairs of In(0.5)Ga(0.5)N/GaN layers. Each red color LED 930c is operable to emit light with a red color, and the MQW layers can include multiple pairs of InN/GaN layers. In some cases, a display pixel can include one blue color LED 930a, one green color LED 930b, and one red color LED 930c. In some cases, a display pixel can include three blue color LEDs 330a, three green color LEDs 930b, and three red color LEDs 930c that can be arranged as a square or rectangular unit. The arrays of blue color LEDs 930a, green color LEDs 930b, and red color LEDs 930c can be periodically arranged on the backplane 910.

In some embodiments, adjacent single color LEDs are separated by two other color LEDs along a row and same color LEDs are arranged along a column. Other arrangements of different color LED arrays are also possible, which can be determined based on a design of display pixels.

Each LED 930, e.g., blue color LED 930a, green color LED 930b, or red color LED 930c, is coupled to a respective pixel circuit that includes a non-volatile memory in the backplane 910 by conductively connecting the p-electrode 924 to a drive electrode 914 of the pixel circuit, e.g., through a respective intermediate metallic layer 920. In such a way, the array of LEDs 930 is coupled to respective pixel circuits in the backplane 910 to form an array of active-matrix LED pixels.

As discussed with further details below, the p-electrode 924 and the drive electrode 914 can be bonded together, e.g., by low temperature bonding such as eutectic bonding, through the intermediate metallic layer 920, e.g., a metallic layer formed of a metallic mixture such as ITO/Ti, Cu/Ta, Al/Sn, or Au/Cr.

The intermediate metallic layer 920 can produce an eutectic system. Those eutectic metals can be alloys or bilayer films that transform directly from solid to liquid state, or vice versa from liquid to solid state, at a specific composition and temperature without passing a two-phase equilibrium, e.g., liquid and solid state. Thus, the eutectic temperature can be much lower than the melting temperature of the two or more pure elements in eutectic bonding. Eutectic bonding can produce hermetically sealed packages and electrical interconnection within a single process. Eutectic bonding can be conducted at low processing temperatures, low resultant stress induced in final assembly, high bonding strength, large fabrication yield and a good reliability. For example, as illustrated in FIG. 10G, laser pulses can be selectively injected on particular LEDs, which can increase a local temperature to or above the eutectic temperature for the intermediate metallic layer 920, such that eutectic bonding occurs between the LEDs and the pixel circuits through the intermediate metallic layer 920. When the laser pulses are removed, the intermediate metallic layers 920 can resolidify.

The intermediate metallic layer 920 can be formed on top of each LED 930, e.g., on a contact electrode such as p-GaN electrode 934, for example, by sputtering, dual source evaporation or electroplating. Each LED 930 can be self-aligned with its respective intermediate metallic layer 920 and have a same area size as the respective intermediate conductive layer 920, due to simultaneous patterning, e.g., as illustrated in FIGS. 10A-10B. The intermediate conductive layer 920 can have a smoother surface than that of the contact electrode 934, which can increase adhesion between the LED and the backplane during bonding. A surface of the intermediate metallic layer 920 can be plasma activated before bonding.

In some cases, each intermediate metallic layer 920 can form a highly-reflective mirror for a corresponding LED 930 bonded with the intermediate metallic layer 920. The mirror can have a reflectivity higher than 80% for the wavelengths of light emitted by the LED 930. The contact electrode p-GaN 934 can include a metal film with a high reflectivity and can be configured to enhance a brightness of light emitted from the LED 930. Each of the active-matrix light-emitting pixels is operable to output a light flux in one direction that is larger than 80% of light flux in two directions output from each of the at least one LED 930 in the pixel.

In an active-matrix LED pixel, a non-volatile memory includes at least one transistor. The transistor has a drain node made of metal material, which is conductively connected to the drive electrode 914 through a conductive via, e.g., made of a metal material. The drive electrode 914 can have a larger area than the drain node of the transistor. The drive electrode 914 can be also made of a metal material, e.g., indium tin oxide (ITO). Thus, in the pixel, the non-volatile memory is conductively connected to an LED through multiple metal contacts including the drain node, the conductive via, and the drive electrode 914.

Each LED 930 can be aligned with the respective drive electrode 914. In some cases, the LED 930 has a smaller area size than the drive electrode 914 and is positioned entirely within an area of the drive electrode 914. In some cases, the LED 930 has a same area size as the drive electrode 914 and can be overlapped on the area of the drive electrode 914. In some cases, the LED 930 has a larger area size than the drive electrode 914 but smaller than the drive electrode 914 and adjacent dielectric spacer 916, such that the LED 930 can have a larger area (for a higher pixel filling coefficient) but be conductively isolated from each other.

A transparent conductive layer 950, e.g., an indium tin oxide (ITO) layer, is on top of the arrays of LEDs 930. The transparent conductive layer 950 is in contact with the n-electrodes 926 of the LEDs 930 to form a common transparent electrode of the LEDs 930. The transparent conductive layer 950 can be a formed on a flat surface across surfaces of the LEDs 930 and adjacent isolation spacers 940. As the LEDs 930 are made of semiconductor materials, in some examples, there is no an additional protective layer added on top of the LEDs 930.

In some implementations, a transparent protective layer is deposited on top of the transparent conductive layer 950. The protective layer can be a touch-sensitive transparent layer and can form, together with the transparent conductive layer 950 (as the common electrode), a capacitive touch screen position sensor. In some cases, a polarizing film can be deposited between the transparent conductive layer 950 and the transparent protective layer. The polarizing film can be configured to allow light from the LEDs 930 to propagate through along a polarization direction to become a polarized light.

Referring now to FIGS. 10A to 10Z, steps of fabricating a display system, e.g., the display system 900 of FIGS. 9A-9B, are illustrated. For illustration purposes only, in the following, a TFT control array backplane device is used for fabricating the display system. As noted above, different color LED arrays can be sequentially boned on the backplane device. A sequence of the different color LED arrays can be in any suitable order.

FIG. 10A is a schematic diagram of an example structure 1000 including a multi-layered blue color LED structure 1002 and an intermediate metallic film 1008, both of which are formed on a first substrate 1001. The blue color LED structure 1002 can be first formed on the first substrate 1001. The blue color LED structure 1002 can be the blue color LED structure 400 of FIG. 4B-1 or 602 of FIG. 6A. The first substrate 1001 can be a sapphire substrate, a silicon substrate, or a silicon carbide (SiC) substrate. The blue color LED structure 1002 can include a buffer layer 1003 (e.g., AlGaN layer and GaN layer), an n-electrode layer 1004 (e.g., n-GaN layer) as a first contact electrode, MQW layers 1005, and a p-electrode layer 1006 (e.g., p-GaN layer) as a second contact electrode that are sequentially formed on the first substrate 1001.

The first substrate 1001 can be pre-treated, e.g., by cleaning a top surface of the substrate 1001. Then the multi-layered blue color LED structure 1002 can be formed by directly depositing (e.g., epitaxially growing) multiple layers on the top surface of the first substrate 1001. The multiple layers can be deposited by Metal-Organic Chemical Vapor Deposition (MOCVD), molecular beam epitaxy (MBE), atomic layer deposition (ALD), physical vapor deposition (PVD), Chemical Vapor Deposition (CVD), or any other suitable deposition methods in a vacuum chamber with a certain temperature.

The intermediate metallic film 1008 can be deposited on top of the blue color LED structure 1002, e.g., on the p-electrode layer 1006, for example, by sputtering, dual source evaporation or electroplating. The intermediate metallic film 1008 can be a multi-layer film, e.g., a bi-layer film. The intermediate metallic film 1008 can include one of: an iridium-tin-oxide (ITO) film with a titanium (Ti) film, a cupper (Cu) film with a Tantalum (Ta) film, an aluminum (Al) film with a Tin (Sn) film, or a gold (Au) or silver (Ag) film with at least one adhesive film including chromium (Cr), Platinum (Pt), Palladium (Pd), or Titanium (Ti). Alternatively, the intermediate metallic film 1008 can be a single layer of an alloy, e.g., an alloy of cupper (Cu) and Tantalum (Ta), or an alloy of aluminum (Al) and Tin (Sn).

In some example, the intermediate metallic film 1008 is a multilayer film that includes a copper (Cu) film and a thin Tantalum (Ta) film. An example fabrication process of the intermediate metallic film 1008 can include: a 50-nm Ta thin-film can be deposited onto the top surface of the blue color LED structure 1002 and then a 300-nm Cu thin-film is deposited on top of the Ta film in a vacuum chamber with pressures lower than $1\times10^{-6}$ Torr.

In some examples, the intermediate metallic film 1008 is a multilayer film that includes an Aluminum (Al) film and a thin Tin (Sn) film. An example fabrication process of the intermediate metallic film 1008 can include: a 50-nm Sn thin-film is deposited onto the top surface of the blue color LED structure 1002 and then a 300-nm Al thin-film is deposited on top of the Sn film in a vacuum chamber with pressures lower than $1\times10^{-6}$ Torr.

In some examples, the intermediate metallic film 1008 is a multilayer film that includes a gold (Au) or silver (Ag) layer and an adhesive layer. An example fabrication process of the intermediate metallic film 1008 can include: approximately 1-μm thick Au film with a suitable adhesion layer of (Cr, Pt, Pd) can be deposited on the top surface of the blue color LED structure 1002, or a 300 Angstroms of Ti adhesive layer, an optional diffusion barrier layer, and 1400 Angstroms of Au (Au—Pt—Ti) or (Au—Ti) can be subsequently electron-beam (E-beam) evaporated onto the surface of the blue color LED structure 1002.

FIG. 10B is a schematic diagram of a blue color LED device 1010 including an array of blue color LEDs 1012 with respective intermediate metallic layers 1018 formed by patterning the structure 1000 of FIG. 10A.

The patterning in FIG. 10B can be same as the patterning in FIG. 6B, but be different from the patterning in FIG. 4C-2. In FIG. 4C-2, adjacent blue color LEDs are separated with a space reserved for other color LEDs, and the space has a distance identical to two drive electrodes with dielectric spacers therebetween on a backplane device. Here, as discussed further with details below, it is unnecessary to leave the space for other color LEDs, because LEDs on a substrate can be selectively separated from the substrate and locally bonded to the backplane device. The remaining LEDs on the substrate will automatically have a space for other color LEDs and can be reused to integrate with the other color LEDs on a different backplane device, which can increase LED utilization efficiency.

The blue color LED structure 1002 is patterned to form the array of blue color LEDs 1012 corresponding to pixel circuits of the backplane device. Adjacent blue color LEDs 1012 are separated by a gap 1019 having a distance identical to or smaller than a dielectric spacer. The distance between adjacent blue color LEDs 1012 is the same as that of adjacent LEDs in a display system to be formed with the blue color LEDs 1012, e.g., a size of the isolation spacer 940 between adjacent LEDs 930 in the display system 900. As noted above, the gap 1019 can be minimized to increase a pixel filling coefficient while remaining large enough for isolation spacers to block light cross-talk between adjacent LEDs 1012 and conductively isolate the adjacent LEDs 1012. A size of the gap 1019 can be designed to be smaller than and within a dielectric spacer between adjacent drive electrodes in the backplane device. Thus, the patterning of the blue color LED structure 1002 can be based on a pattern of drive electrodes in the backplane device (or a pattern of the dielectric spacers).

For example, a protective mask can be obtained based on information fabricating the drive electrodes in the backplane. The drive electrodes can be fabricated by forming a protective mask (e.g., photoresist or hard mask), depositing materials of the drive electrodes, and removing the protective mask layer. The protective mask for patterning the LED structure 1002 can be determined based on the protective mask for fabricating the drive electrodes, but with different spacings for LEDs (e.g., even smaller than the drive electrodes), such that the LED structure 1002 can be selectively etched away during the patterning. The intermediate metallic film 1008 formed on the LED structure 1002 can be simultaneously patterned in one patterning process.

The patterning can be performed with the following steps: 1) patterning a hard mask layer, e.g., SiNx such as $Si_3N_4$, on top of the structure 1000, e.g., on the intermediate metallic film 1008; 2) etching through the intermediate metallic film 1008 and layers of the LED structure 1002, to the substrate 1001; 3) removing the remaining hard mask layer.

As illustrated in FIG. 10B, the structure 1000 is patterned to form a blue color LED device 1010 including an array of blue color LEDs 1012 with respective intermediate metallic layers 1018. Due to simultaneous patterning, the blue color LED 1012 and the respective intermediate layer 1018 can have the same size and are self-signed with each other.

Adjacent blue color LEDs 1012 are separated from each other by a gap 1019. As noted above, the size of the gap 1019 can be predetermined to be smaller than or identical to a size of a dielectric spacer between adjacent drive electrodes in a backplane. Each blue color LED 1012 includes multiple semiconductor layers that include a buffer layer 1013, a first contact electrode, e.g., n-GaN electrode 1014, light-emitting layers, e.g., MQW 1015, and a second contact electrode, e.g., p-GaN electrode 1016. The respective intermediate metallic layer 1018 is on the second contact electrode 1016. In some examples, the substrate 1001 is a sapphire substrate. The LED 1012 can have a III-V blue light LED structure, e.g., the LED structure 412a in FIG. 4B-3. In some examples, the substrate 1001 is a silicon substrate. The LED 1012 can have a III-V blue light LED structure, e.g., the LED structure 412b in FIG. 4B-4. Each of the blue color LEDs 1012 can be operable to emit light with a wavelength of about 460 nm.

FIG. 10C is a schematic diagram of an example green color LED device 1020 including an array of green color LEDs 1022 and respective intermediate metallic layers 1028 that are all formed on a second substrate 1021. The green color LED device 1020 can be formed by a procedure same as the procedure of forming the blue color LED device 1010 as illustrated in FIGS. 10A-10B, that is, first forming an intermediate metallic film on a green color LED structure that includes multiple epitaxially grown semiconductor layers and then simultaneously patterning the green color LED structure and the intermediate metallic film. The patterning can be performed according to a pattern of corresponding pixel circuits in a backplane or a pattern of the array of blue color LEDs 1012 formed by the patterning in FIG. 10B. Similar to the array of blue color LEDs 1012, the array of green color LEDs 1022 can have gaps 1029 having a distance identical to or smaller than a dielectric spacer. The distance between adjacent green color LEDs 1022 is the same as that of adjacent LEDs in a display system to be formed with the green color LEDs 1022, e.g., a size of the isolation spacer 940 between adjacent LEDs 930 in the display system 900. The gap 1029 between the adjacent green color LEDs 1022 can have the same size as the gap 1019 between the adjacent blue color LEDs 1012. Due to simultaneous patterning, the green color LED 1022 and the respective intermediate layer 1028 can have the same size and are self-signed with each other.

The green color LED 1022 can be the same as the green color LED 422 of FIG. C-1. The substrate 1021 can be c-plane sapphire wafer, m-plane GaN wafer, silicon wafer, or SiC wafer. The III-V green color LED 1022 can include sequentially grown epitaxial layers, including a buffer layer 1023, e.g., GaN/AlGaN layer, a n-type contact electrode 1024, e.g., n doped GaN layer, MQW layers 1025, e.g., InGaN/GaN layers, and a p-type contact electrode 1026, e.g., p doped GaN layer, on the substrate 1021. In a particular example, the green color LED 1022 can include 20~40 nm AlGaN layer, 3 to 4.5 μm GaN layer, 1.5 to 3 μm n-GaN contact electrode layer, 250 nm to 400 nm MQW layers, and 100 to 250 nm p-GaN contact electrode layer, on a c-plane sapphire wafer or a m-plane GaN wafer. Each of the III-V green color LEDs 1022 can be operable to emit light with a wavelength of about 520 nm. Each green color LED 1022 can have a height substantially identical to a height of each blue color LED 1012. The height can be include a thickness of the buffer layer, the n-electrode layer, the MQW layers, and the p-electrode layer. In some embodiments, the intermediate metallic layers for different color LEDs can have the same thickness. The intermediate metallic layers can also have same composite metal films.

FIG. 10D is a schematic diagram of an example red color LED device 1030 including an array of red color LEDs 1032 and respective intermediate metallic layers 1038 that are both formed on a second substrate 1031. The red color LED device 1030 can be formed by a procedure same as the procedure of forming the blue color LED device 1010 as illustrated in FIGS. 10A-10B, that is, first forming an intermediate metallic film on a red color LED structure that includes multiple epitaxially grown semiconductor layers and then simultaneously patterning the red color LED structure and the intermediate metallic film. The patterning can be performed according to a pattern of corresponding pixel circuits in a backplane or a pattern of the array of blue color LEDs 1012 formed by the patterning in FIG. 10B. Similar to the array of blue color LEDs 1012, the array of red color LEDs 1032 can have gaps 1039 having a distance identical to or smaller than a dielectric spacer. The distance between adjacent red color LEDs 1032 is the same as that of adjacent LEDs in a display system to be formed with the red color LEDs 1032, e.g., a size of the isolation spacer 940 between adjacent LEDs 930 in the display system 900. The gap 1039 between the adjacent red color LEDs 1032 can have the same size as the gap 1019 between the adjacent blue color LEDs 1012. Due to simultaneous patterning, the red color LED 1032 and the respective intermediate layer 1038 can have the same size and are self-signed with each other.

The red color LED 1032 can be the same as the red color LED 432 of FIG. C-2. The III-V red color LED 1032 can include multiple sequentially grown epitaxial layers including a buffer layer 1033 (or a sacrificial light absorption epitaxy layer), a n-type contact electrode 1034, e.g., n doped InGaP layer, MQW layers 1035, e.g., InN/GaN layers, AlGaAs or InAlGaP layers, and a p-type contact electrode 1036, e.g., p doped InGaP layer. The buffer layer can be made of InGaAsN or AlGaInP material. In a particular example, the red color LED 1032 can include an AlGaInP sacrificial layer of 300~400 nm, a n-GaN contact electrode layer of 50 nm to 100 nm, a n-AlGaInP current spreading layer of 2 μm to 4 μm, MQW layers of 400 nm to 500 nm, and a p-GaP contact electrode layer of 2.5 μm to 3.2 μm, on a GaAs wafer. The III-V red color LED 1032 can be operable to emit light with a wavelength of about 650 nm.

Each red color LED 1032 originally formed on the substrate 1031 can have a height substantially identical to a height of each blue color LED 1012 originally formed on the substrate 1001 and a height of each green color LED 1022 originally formed on the substrate 1021. The height can be include a thickness of the buffer layer, the n-electrode layer, the MQW layers, and the p-electrode layer. In some embodiments, the intermediate metallic layers for different color LEDs can have the same thickness. The intermediate metallic layers can also have same composite metal films.

Figure 10E:
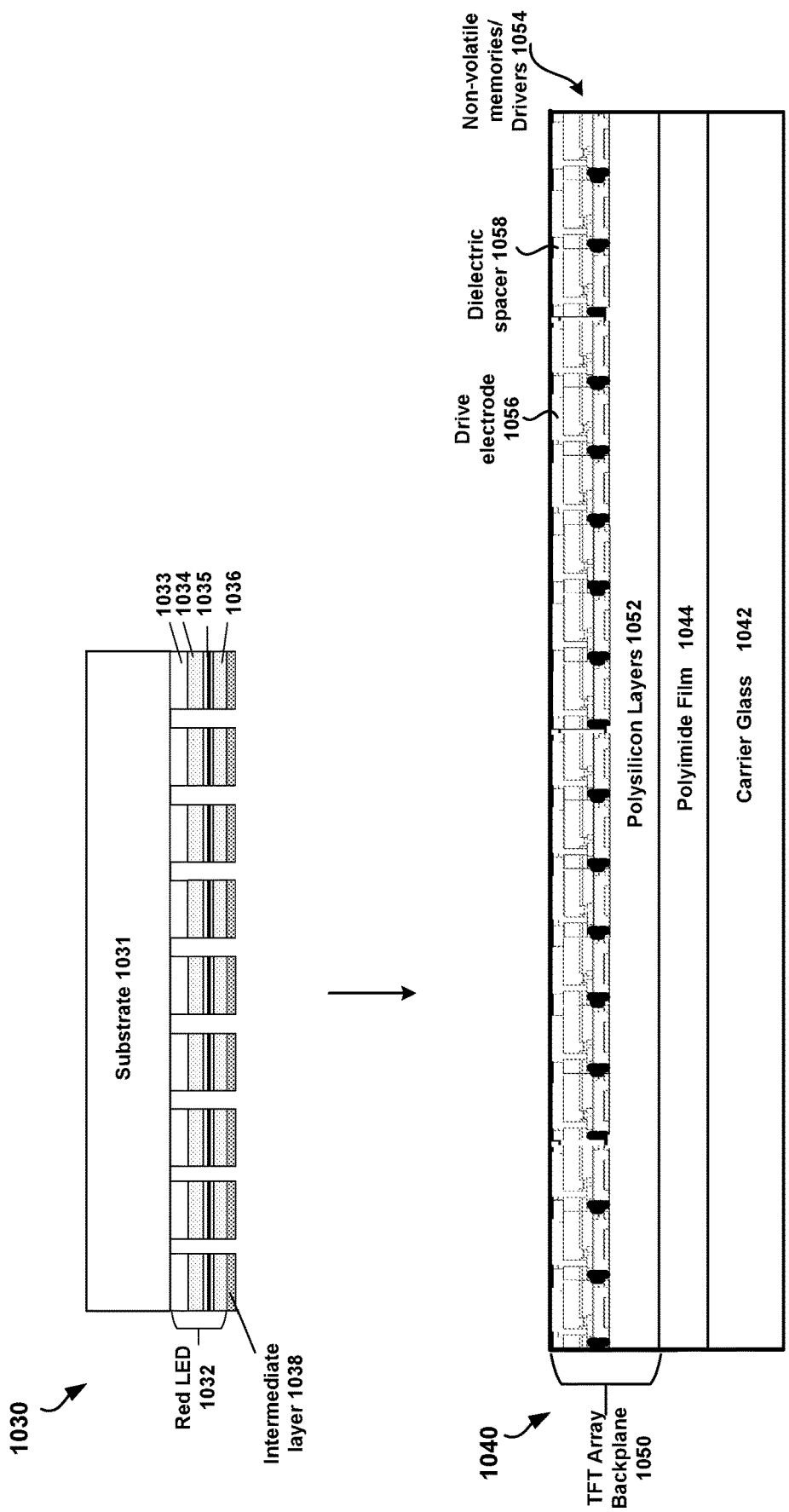
FIG. 10E is a schematic diagram showing aligning the array of red color LED arrays of FIG. 10D onto a first TFT array backplane device.
Figure 11A:
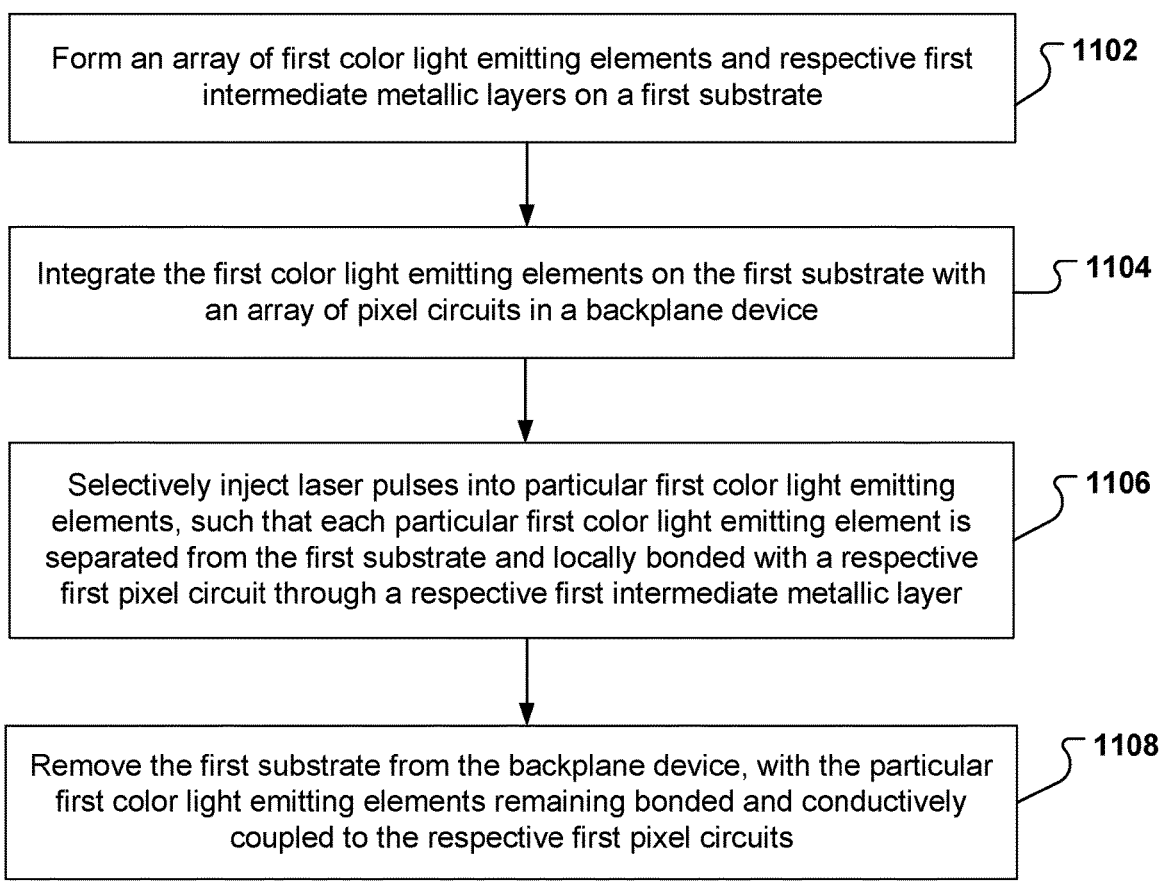
FIG. 11A is a flow diagram of an example process of forming an integrated device by laser-assisted bonding first color light emitting elements formed on a first substrate onto a backplane device.
Figure 11B:
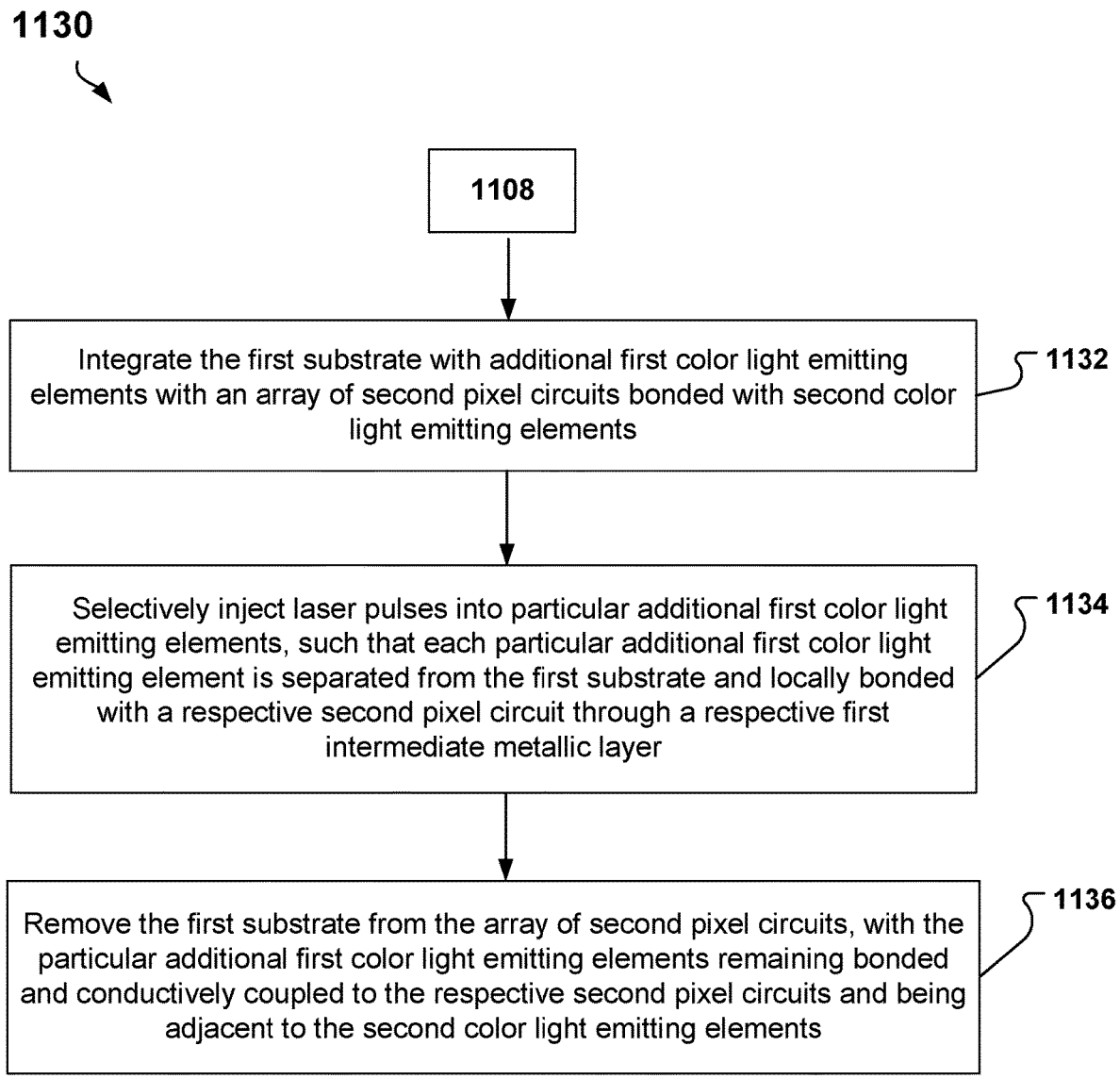
FIG. 11B is a flow diagram of an example process of reusing the remaining first color light emitting elements on the first substrate onto a second backplane device bonded with second color light emitting elements.
Figure 11C:
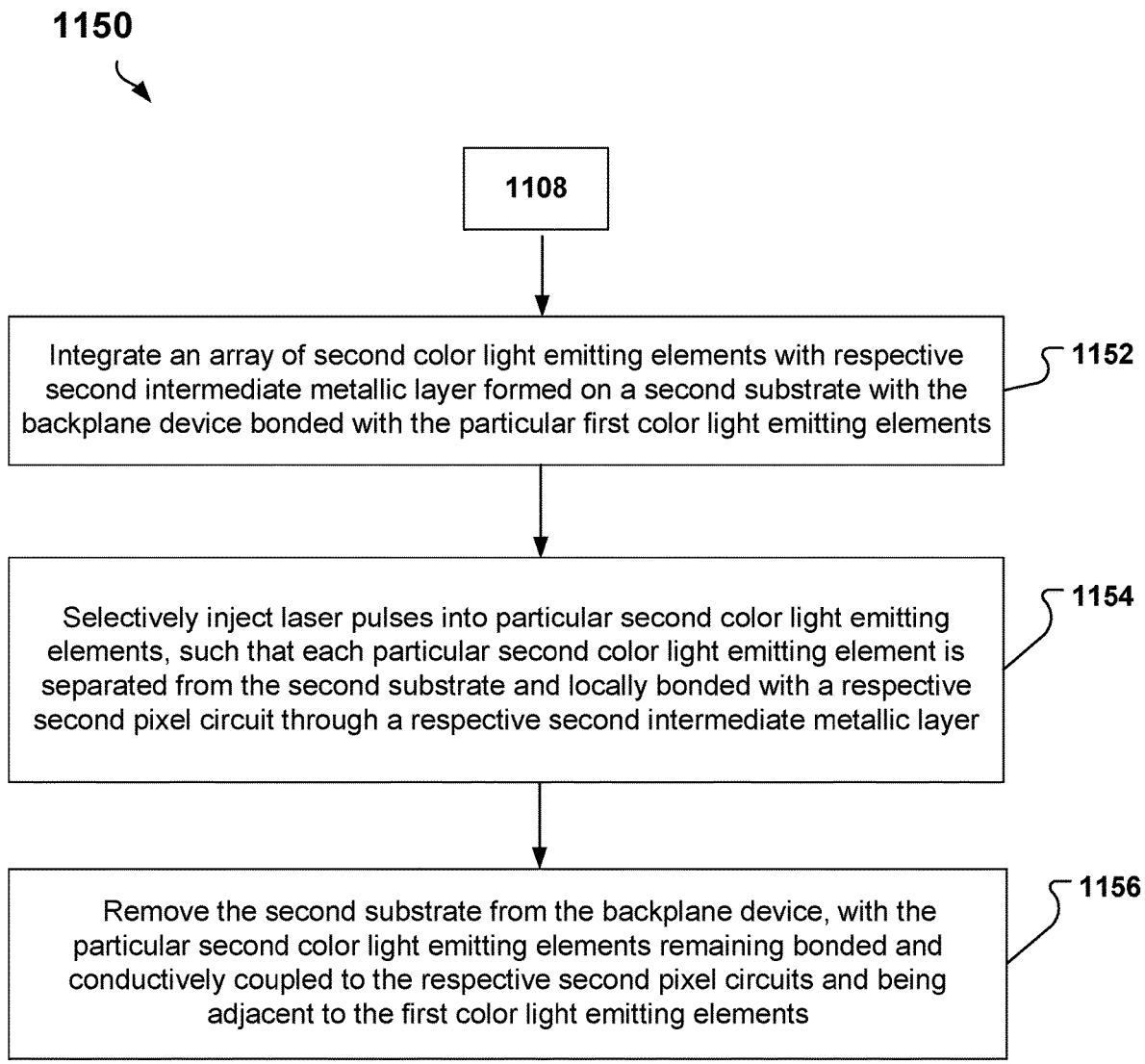
FIG. 11C is a flow diagram of an example process of laser-assisted selectively bonding second color light emitting elements formed on a second substrate onto the backplane device bonded with the first color light emitting elements.

FIG. 10E is a schematic diagram showing aligning a red color LED device 1030 including the array of red color LED arrays 1032 and respective intermediate metallic layers 1038 of FIG. 10D onto a first TFT array backplane device 1040.

The TFT array backplane device 1040 can be the TFT array backplane device 440 of FIGS. 4D-1 to 4D-3. The TFT array backplane device 1040 can be fabricated on a polyimide film 1044 on a carrier glass 1042, using standard TFT manufacturing processes, e.g., by OEMs. The TFT backplane device 1040 can include one or more TFT backplanes 1050 on top of the polyimide film 1044. Each TFT backplane 1050 can include one or more polysilicon layers 1052 and integrated circuits (including a number of non-volatile memories and drivers 1054) formed on the polysilicon layers 1052. The drivers include scanning drivers, e.g., the scanning drivers 116 of FIG. 1, and data drivers, e.g., the data drivers 114 of FIG. 1. Each non-volatile memory is coupled to one of the scanning drivers through at least one word line, e.g., the word line 117 of FIG. 1, and to one of the data drivers through at least one bit line, e.g., the bit line 115 of FIG. 1. Each non-volatile memory includes at least one transistor coupled to a respective drive electrode 1056 on top of the TFT backplane 1050. Adjacent drive electrodes 1056 are isolated from each other by dielectric spacers 1058.

The red color LED device 1030 can be flipped with the intermediate metallic layer 1038 facing to a top layer of the backplane device 1040. The LED device 1030 can be aligned to the backplane device 1040 by, for example, optically aligning marks on an LED substrate 1031 with marks on the backplane device 1040, such that each LED 1032 is aligned to a corresponding pixel circuit of the backplane device 1040, e.g., to a drive electrode 1056 of the corresponding pixel circuit in the top layer of the backplane device 1040.

Figure 10F:
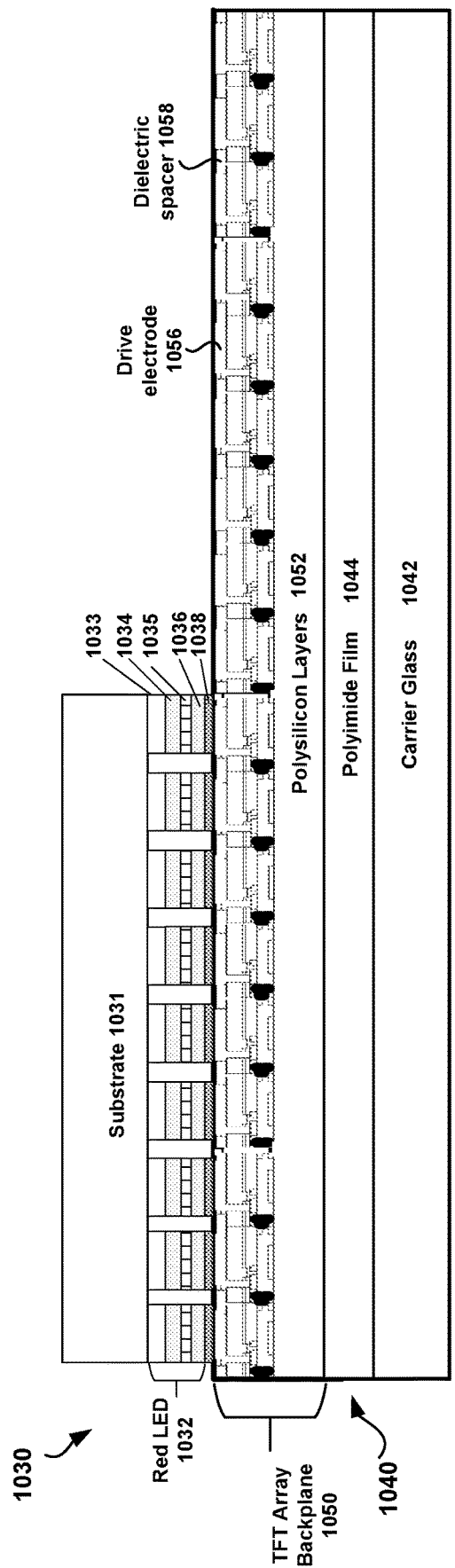
FIG. 10F is a schematic diagram showing integrating the array of red color LED arrays on the first TFT array backplane device.
Figure 10G:
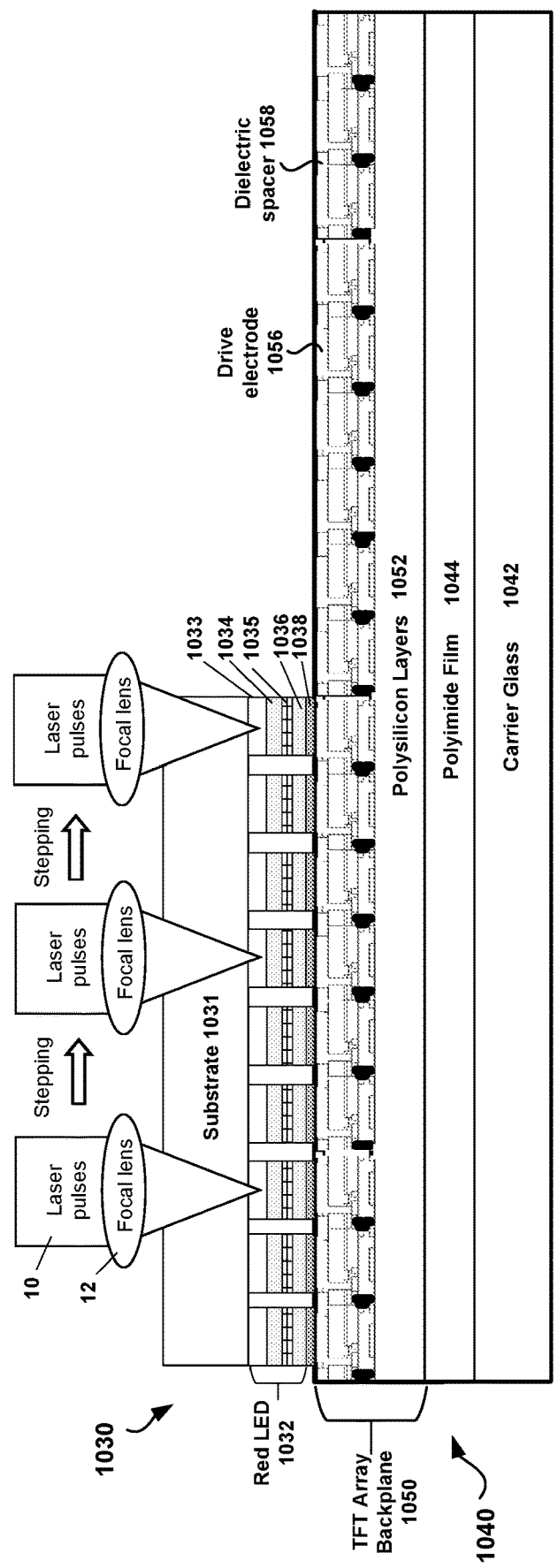
FIG. 10G is a schematic diagram showing an example process of using laser pulses to individually separate a first array of red color LEDs from the third substrate and bond the first array of red color LEDs on the first TFT array backplane device.

FIG. 10F is a schematic diagram showing integrating the red color LED device 1030 including the array of red color LED arrays 1032 with respective intermediate metallic layer 1038 on the first TFT array backplane device 1040.

Multiple implementations can be realized to integrate LED arrays on a backplane device. The integrating techniques can include but not limited to: direct bonding such as low temperature direct bonding with or without an intermediate conductive layer, fusion bonding, diffusion bonding, eutectic bonding with an intermediate conductive layer, and transient liquid phase bonding.

As discussed with further details in FIG. 10G, laser pulses can be used to locally and selectively bond particular red color LEDs on the backplane device 1040 by eutectic bonding through the respective intermediate metallic layers 1038. The bonding can be quick and permanent. The other red color LEDs that are not exposed to the laser pulses can be removed together with the removal of the substrate 1031.

On one hand, it can be beneficial for the subsequent eutectic bonding if the integration between the array of red LEDs 1032 and the backplane device 1040 in FIG. 10F has a certain degree of adhesion strength. In some implementations, the integration can include direct bonding of the intermediate layer 1008 to the drive electrode 914 at room temperature. This can help heat conduction and thus improve eutectic bonding caused by the laser pulses. However, in some implementations, the integration simply includes just bringing the intermediate layer 1008 and the drive electrode 914 into contact, with any adhesion provided just by surface adhesion. This can help ensure there is no gap between the intermediate layer 1008 and the drive electrode 914, which again can help heat conduction and thus improve the eutectic bonding by the laser pulses.

On the other hand, the integration between the array of red LEDs 1032 and the backplane device 1040 needs to be sufficiently weak such that the other red color LEDs that are not exposed to the laser pulses can be detached from the backplane device 1040 when the substrate 1031 is removed. In particular, the adhesion between the red LEDs 1032 and the substrate 1031 needs to be stronger than the adhesion between the intermediate layer 1008 and the drive electrode 914 without the eutectic bonding.

In some implementations, detachable bonding can be used to integrate the red color LED device 1030 and the backplane device 1040 in FIG. 10F. Before the integration, one or two bonding surfaces can be pre-treated to remove any contamination and/or oxide film that can hamper adhesion of the bonding surfaces. The bonding surfaces can be surfaces of the red color LED device 1030, i.e., surfaces of the intermediate metallic layers 1038, and/or a top surface of the backplane device, i.e., a top surface including surfaces of the drive electrodes 1056 and the dielectric spacers 1058. The bonding surfaces can be pre-treated to be smooth and uniform. In some examples, the pre-treatment includes: I) treating the bonding surfaces by a 10 min piranha ($H_2O_2$: $H_2SO_4$=1:3 by volume) solution pre-clean followed by deionized water rinse and spin-dry prior to metallization; II) treating the bonding surfaces with an ultraviolet (UV)-ozone pre-clean to remove the organic surface contamination; and III) before bonding, applying a low energy plasma activation of the bonding surfaces of the LED device and the backplane device.

After the pre-treatment of the bonding surfaces, the red color LED device 1030 is aligned and integrated with the backplane device 1040 by attaching surfaces of the respective intermediate metallic layers 1038 to surfaces of the drive electrodes 1056 of the pixel circuits in the backplane device 1040. The attachment is detachable, e.g., by an external force, but with a certain strength to eliminate gap or misalignment.

In some embodiments, the attachment can be achieved by surface adhesion between the surfaces of the respective intermediate metallic layers 1038 and the surfaces of the drive electrodes 1056. In some embodiments, a process with a stronger bonding strength can be performed. For example, a room temperature direct bonding process can be performed as follows: first, both the LED device and the backplane device are placed in a vacuum chamber with pressures, e.g., near $1 \times 10^{-3}$ Torr, or in an atmosphere pressure nitrogen (N2) environment; second, the LED device is flipped over with the LEDs' contact electrodes facing to a top layer of the backplane device, aligned and clamped together on a bonding chuck; third, a pressure is applied on both sides of the bonded devices when the devices are in a full contact at a room temperature for a predetermined period.

The array of red color LEDs 1032 formed on the substrate 1031 can be divided into three sub-arrays of red color LEDs 1032. In each of the three sub-arrays, red color LEDs 1032 are separated by two LEDs in the other two sub-arrays. For example, the first sub-array can include 1st, 4th, and 7th LEDs, the second sub-array can include 2nd, 5th, and 8th LEDs, and the third sub-array can include 3rd, 6th, and 9th LEDs. As illustrated below, the three sub-arrays of red color LEDs 1032 can be bonded on three different regions of a same backplane device or on three different backplane devices in different steps. In such a way, all the red color LEDs 1032 formed on the substrate 1031 in FIG. 10-D can be utilized for forming display systems.

FIG. 10G is a schematic diagram showing an example process of using laser pulses 10 to individually separate the third sub-array of red color LEDs 1032 from the substrate 1031 and bond the third sub-array of red color LEDs 1032 on a first TFT array backplane device 1040.

Different from using laser pulses to scan a whole area to separate the whole array of LEDs formed on an LED substrate from the LED substrate, e.g., as illustrated in FIG. 6D, here, the laser pulses 10 are selectively injected into particular red color LEDs 1032 in the third sub-array, such that only the third sub-array of red color LEDs 1032 is separated from the third substrate 1031 by the laser pulses 10, while the other sub-arrays of red color LEDs 1032 without the injection of the laser pulses 10 remain formed on the substrate 1031.

The laser pulses 10 can transmit through the transparent substrate 1031 onto the buffer layer (or sacrificial layer) 1033 of the particular red color LED 1032 to decompose the buffer layer 1033, such that the particular red color LED 1032 is separable from the transparent substrate 1031.

In some cases, the red color LEDs 1032 is formed on a GaP substrate, which can be delaminated by UV Excimer laser pulses (with a wavelength at 248 nm or 308 nm). The epitaxial layer-selective delamination is achieved by photochemical decomposition of the buffer or sacrificial layer 1033, e.g., an intermediate opaque layer, next to the GaP substrate 1031. In some cases, the red color LEDs 1032 is formed on a GaAs substrate. The GaAs substrate can be delaminated by Nd:YAG laser pulses (with a wavelength of 1064 nm). An epitaxial layer of InGaAsN can be used as an intermediate sacrificial layer for selective photodecomposition and substrates lift off. By tuning the composition of the InGaAsN layer such that its bandgap is lower than 1.165 eV (energy of a 1064 nm photon), the InGaAsN layer strongly absorbs 1064 nm laser light to which the GaAs substrate is effectively transparent. Upon absorption of the laser pulses, ablation occurs along the InGaAsN layer, separating the GaAs film from its GaAs growth substrate, producing a crack-free GaAs layer adhered to a flexible polymer substrate. In a particular example, a Q-switched Nd:YAG laser with a pulse duration (full width at half maximum—

FWHM) of 8-9 ns, GaAs substrate wafer lift-off is achieved over a large range of average fluences from ~0.6 J/cm^2 to ~3.5 J/cm^2.

A spot size of a laser beam including the laser pulses 10 on the buffer layer 1033 can be smaller than, identical to, or slighter larger than a sum of a size of an LED 1032 and adjacent gaps 1039, such that the laser pulses 10 are not incident on adjacent LEDs 1032. In some cases, the laser beam from a laser source has a small spot size that can be directly used. In some cases, the laser beam from the laser source has a large spot size that can be focused using a focal lens 12 to a smaller spot size onto an individual red color LED 1032. The spot size of the laser pulses 10 on the buffer layer 1033 can be smaller than 10 μm.

The layers of the red color LED 1032, including the n-type electrode 1034, the MQW layers 1035, and the p-type electrode 1036, can be non-transparent or opaque, and the laser pulses 10 cannot penetrate through the layers. Due to high energy of the laser pulses, e.g., due to a short pulse width with a high repetition rate and a small spot size, the laser pulses 10 generates heat that can be locally transferred through the layers of the red color LED 1032 to the intermediate metallic layer 1038, without transferring to adjacent red color LEDs 1032. Thus, the temperature of the particular red color LED 1032 due to the localized heat with the injection of the laser pulses 10 can be substantially higher than the temperature of other LEDs without the injection of the laser pulses 10. Additionally, micro forces can be generated due to the injected laser pulses 10 and can add a pressure to the bonding interfaces between the particular red color LED 1032 and a corresponding drive electrode 1056.

In some embodiments, by controlling the laser pulses 10, e.g., a power, a repetition rate, a spot size, and/or an injection period, low temperature eutectic bonding can occur between the red color LED 1032 and the drive electrode 1056 in the backplane 1050 through the respective intermediate metallic layer 1038. The intermediate metallic layer 1038 can be melted or fused to bond surfaces of the p-electrode 1036 of red color LEDs 1032 and surfaces of the drive electrode 1056 of the backplane 1050. As the laser pulses have a short pulse width with high repetition rate, the bonding can be instant and permanent. As noted above, the laser pulses 10 also causes decomposition of the buffer layer 1033 such that the res color LED 1032 can be separated from the substrate 1031. In contrast, eutectic bonding does not occur on other red color LEDs 1032 without exposure of the laser pulses 10, because of low temperatures and/or little or no pressure. Also, the buffer layers of the other red color LEDs 1032 are not decomposed or affected by the laser pulses 10, and the other red color LEDs 1032 remain formed on the substrate 1031. Thus, the laser pulses 10 can be used to selectively separate an individual red color LED 1032 from the substrate 1031 and bond the selected individual red color LED 1032 on a corresponding drive electrode 1056 of the backplane 1050, without affecting the other red color LEDs 1032.

The laser pulses 10 can be moved to other particular red color LEDs for selective separation from the substrate 1031 and local bonding with the backplane 1050. For example, to fabricate 3-color LED display system as illustrated in FIGS. 9A-9B, the laser pulses 10 can be selectively injected into red color LEDs 1032 in one of the three sub-arrays. Thus, as illustrated in FIG. 10H, the particular red color LEDs 1032 in the third sub-array are bonded on the backplane 1050 and are separated by a space reserved for other two color LEDs, e.g., a green color LED and a blue color LED.

A high precision (e.g., <10 μm accuracy) X-Y stepping platform can be used to move a laser beam including the laser pulses 10 in two dimensions. For example, the laser beam can be moved to a position of a first LED and the laser beam can be delivered (directed or focused) on a first LED for a period of time such that a first set of laser pulses are injected into the first LED. Then the stepping platform can move the laser beam to a position of a second LED and the laser beam can be delivered (directed or focused) on the second LED for another period of time such that a second set of laser pulses are injected into the second LED. The laser pulses 10 can step by step inject into the particular red color LEDs 1032. By controlling a repetition rate, a power, and/or a stepping speed of the laser pulses 10, low-temperature selective eutectic bonding of the third sub-array of particular LEDs 1032 on an array of pixel circuits can be achieved.

Then, the substrate 1031 can be removed from the first TFT array backplane device 1040. As the third sub-array of red color LEDs 1032 is bonded on corresponding drive electrodes 1056 of the backplane device 1040 through the respective intermediate metallic layers 1038 by eutectic bonding, the third sub-array of particular LEDs 1032 remains bonded on the backplane device 1040 when the substrate 1031 is removed. The first and second sub-arrays of red color LEDs 1032 without the injection of the laser pulses 10 remain formed on the substrate 1031 and can be detachably removed from the backplane device 1040, together with the substrate 1031.

Figure 10H:
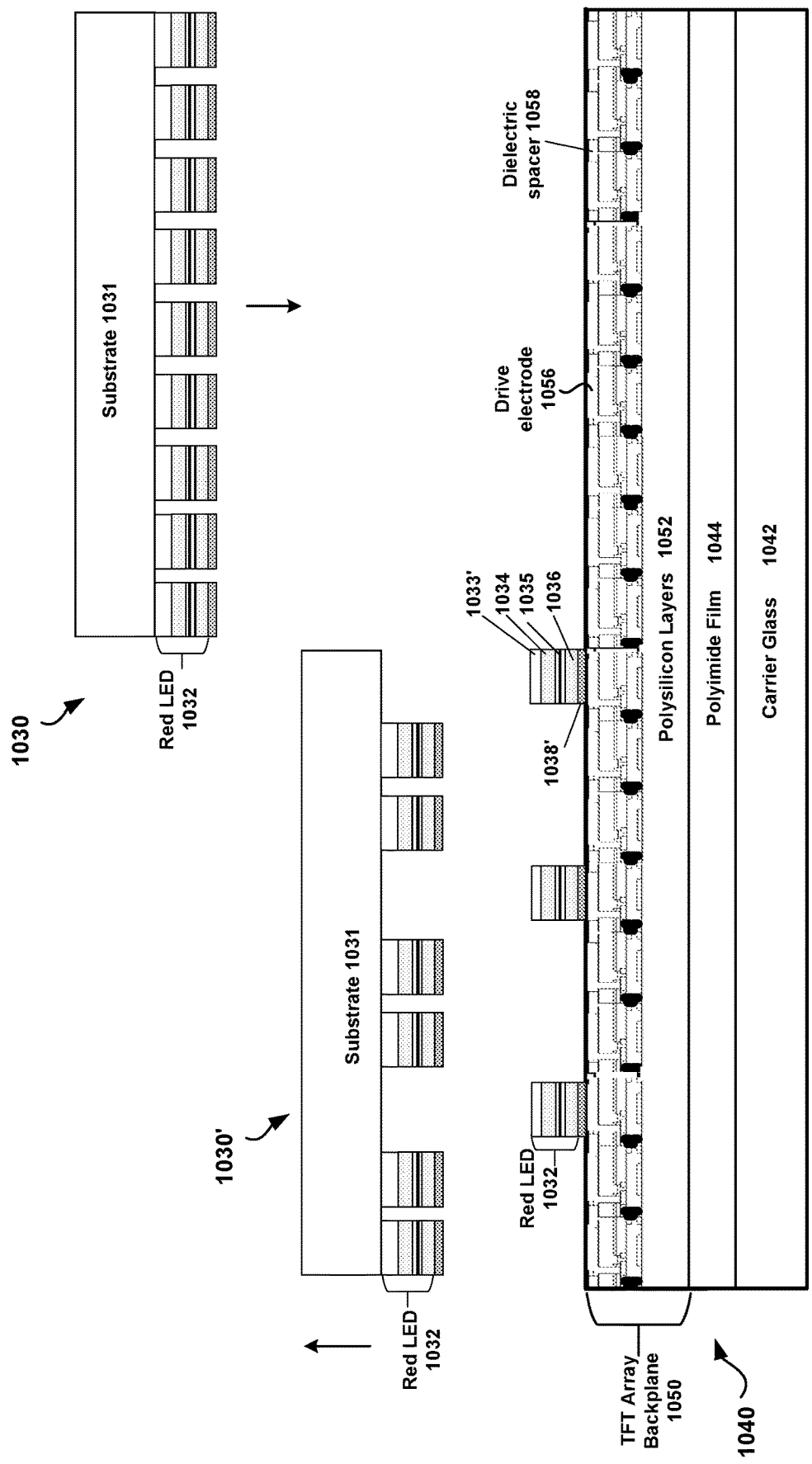
FIG. 10H is a schematic diagram showing removing the third substrate with the remaining red color LEDs from the first TFT array backplane device and integrating another array of red color LEDs formed on another third substrate on a different region of the first TFT array backplane device.

As illustrated in FIG. 10H, after the removing, the red color LED device 1030' includes the substrate 1031 and the remaining first and second sub-arrays of red color LEDs 1032. Adjacent red color LEDs 1032 that remain on the substrate 1031 are separated by a space caused by the separation of the third sub-array of red color LED 1032 by the laser pulses 10 in FIG. 10G. The red color LED device 1030' can be reused to bond on another backplane device bonded with (or without) an array of different color LEDs, for example, in FIG. 10P-2. In such a way, the utilization efficiency of the red color LEDs can be increased.

Also as illustrated in FIG. 10H, after the removing, the third sub-array of red color LEDs 1032 remains bonded on the backplane device 1040. Due to the eutectic bonding, the respective intermediate metallic layer 1038 between the particular red color LED 1032 and the drive electrode 1056 may be changed to an intermediate metallic layer 1038'. Due to decomposition by the laser pulses 10, part of the buffer layer 1033 of each particular red color LED 1032 may be removed, and the buffer layer 1033 may be changed to the buffer layer 1033' that has a smaller thickness than the buffer layer 1033.

In some implementations, the TFT backplane device 1040 can have a large area to accommodate multiple LED wafers. Multiple red color LED devices 1030 can be sequentially bonded on different regions of the backplane device 1040. For example, as illustrated in FIG. 10H, after a first red color LED device 1030' is removed from the TFT backplane device 1040, with a third sub-array of red color LEDs 1032 remaining bonded on a first region of the backplane device 1040, a second red color LED device 1030 is aligned and bonded onto a second region of the backplane device 1040, the second region being adjacent to the first region. The second red color LED device 1030 can be processed in the same way as the first red color LED device 1030 as illustrated in FIGS. 10E to 10G.

FIGS. 10I-1 and 10I-2 show a bonded device 1060 obtained by laser-assisted bonding multiple red color LED devices 1030 onto the first TFT array backplane device 1040 and then removing the substrates 1031 with the remaining sub-arrays of red color LEDs 1032 from the first backplane device 1040. The third sub-arrays of red color LEDs 1032 are separated from the substrates 1031 and bonded on the first backplane device 1040.

The bonded device 1060 can be similar to the bonded device 460 of FIGS. 4F-1 and 4F-2, except that, each red color LED 1032 is bonded to and conductively coupled to a respective drive electrode 1056 of a respective pixel circuit of the backplane 1050 through a respective intermediate metallic layer 1038'. Each red color LED 1032 has a buffer layer 1033' that has a smaller thickness than the original red color LED 1032, which can be beneficial to integrate with other color LED arrays, as illustrated below in FIG. 10L. Adjacent red color LEDs 1032 that remain bonded on the backplane device 1040 are separated from each other by a space including two drive electrodes 1056 with dielectric spacers 1058 therebetween, which can be used for bonding with two other different color LEDs, as illustrated with further details below.

FIGS. 10E to 10H illustrate: 1) multiple red color LED devices 1030 with a full array of red color LEDs 1032 can be integrated on the first backplane device 1040, 2) third sub-arrays of red color LEDs 1032 can be selectively separated from the substrates 1031 and bonded on the first backplane device 1040 by laser pulses, and 3) the remaining two other arrays of red color LEDs 1032 can remain formed on the substrates 1031 can be removed from the first backplane device 1040, which can be further used, for example, in bonding with other backplane devices.

Figures 2, 10J:
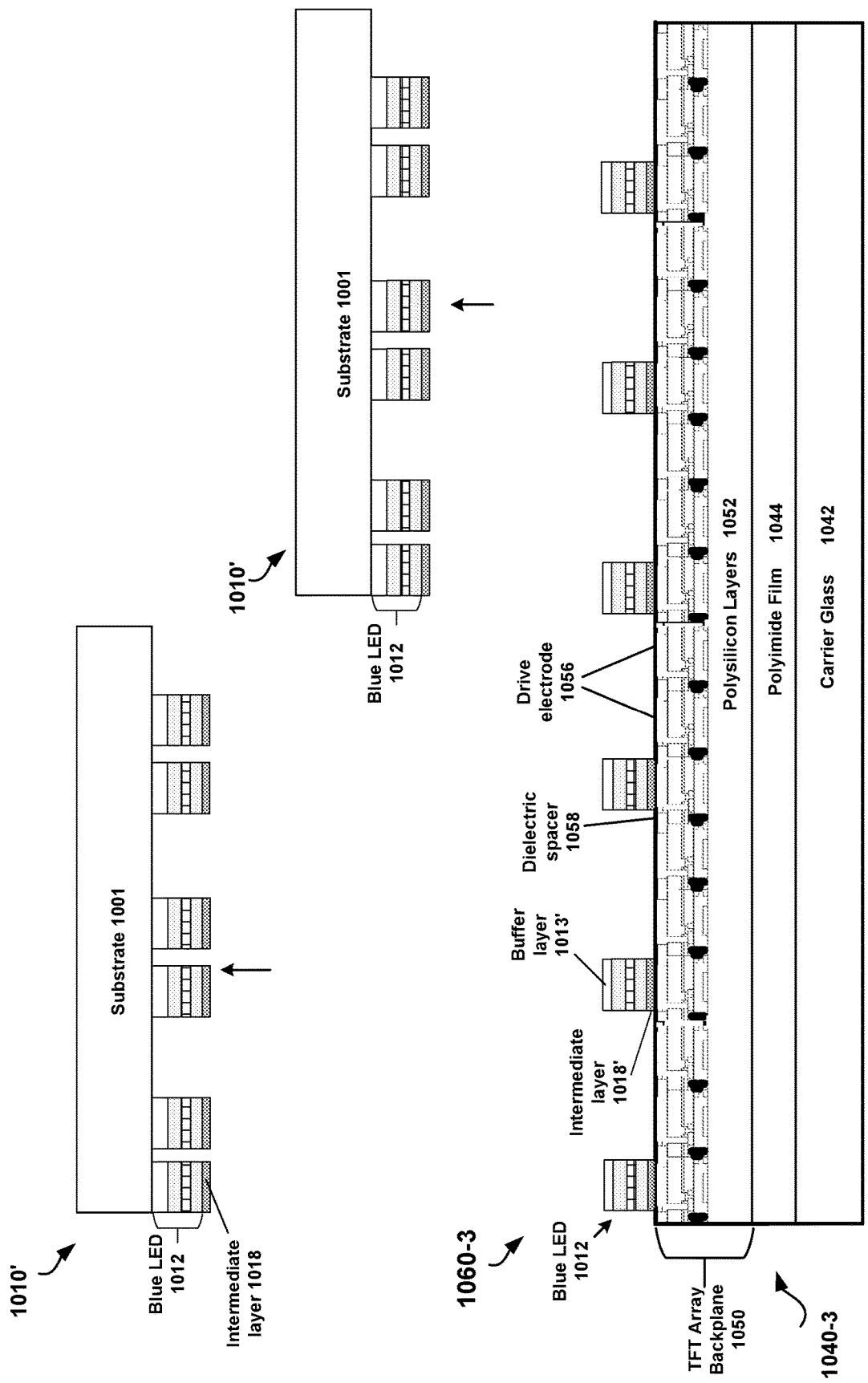

Similarly, as illustrated in FIG. 10J-1, multiple green color LED devices 1020 with a full array of green color LEDs 1022 (formed in FIG. 10C) can be processed according to the procedures described in FIGS. 10E to 10H for multiple red color LED devices 1030. In some implementations, the green color LED devices 1020 can be integrated on a different region of the first TFT array backplane device 1040 that is bonded with the sub-arrays of red color LEDs 1032. In some implementations, the green color LED devices 1020 can be integrated on a second TFT array backplane device 1040-2, different from the first TFT array backplane device 1040, as illustrated in FIG. 10J-1. Similarly, the array of green color LEDs 1022 formed on the substrate 1021 can be divided into three sub-arrays. Adjacent green color LEDs 1022 in one sub-array are separated by two other green color LEDs 1022 in the other two sub-arrays on the substrate 1021.

A third sub-array of green color LEDs 1022 can be selectively separated from the substrate 1021 and locally bonded on the second TFT backplane device 1040-2, for example, by laser pulses. In some examples, the substrate 1021 is a sapphire substrate. Since sapphire is transparent and GaN (the material of the buffer layer 1023) is opaque (which absorbs light), a GaN film can be photochemical decomposed from the sapphire substrate by a short pulse KrF UV excimer laser with a wavelength of 248 nm or 308 nm, e.g., in a power range of 0.4-0.8 J/cm². By controlling the KrF UV excimer laser pulses, the third sub-array of green color LEDs 1022 can be locally bonded on the second TFT backplane device 1040-2 through respective intermediate metallic layers 1028 by eutectic bonding. For each green color LED 1022 injected by the laser pulses, its buffer layer 1023 can become the buffer layer 1023' with a smaller thickness, and the intermediate metallic layer 1028 can become the layer 1028' after the eutectic bonding.

As illustrated in FIG. 10J-1, the other sub-arrays of green color LEDs 1022 remain formed on the substrate 1021 and can be removed together with the substrate 1021. After the removing, the green color LED device 1020 becomes the green color LED device 1020' that includes the first and second sub-arrays of green color LEDs 1022 on the substrate 1021. Similar to the red color LED device 1030', the green color LED device 1020' can be reused to bond on another backplane device bonded with (or without) an array of different color LEDs, for example, in FIG. 10K. In such a way, the utilization efficiency of the green color LEDs can be increased.

As illustrated in FIG. 10J-1, the third sub-arrays of green color LEDs 1022 remain bonded with the second backplane device 1040-2 to form a bonded device 1060-2. Each green color LED 1022 is bonded to and conductively coupled to a respective drive electrode 1056 of a respective pixel circuit of the second backplane device 1040-2 through a respective intermediate metallic layer 1028'. Adjacent green color LEDs 1022 that remain bonded on the second backplane device 1040-2 are separated from each other by a space including two drive electrodes 1056 with dielectric spacers 1058 therebetween, which can be used for bonding with two other different color LEDs, as illustrated with further details in FIGS. 10P-1 and 10V-1.

Similarly, as illustrated in FIG. 10J-2, multiple blue color LED devices 1010 with a full array of blue color LEDs 1012 (formed in FIG. 10B) can be processed according to the procedures described in FIGS. 10E to 10H for multiple red color LED devices 1030. In some implementations, the blue color LED devices 1010 can be integrated on a different region of the first TFT array backplane device 1040 that is bonded with the sub-arrays of red color LEDs 1032, or on a different region of the second TFT array backplane device 1040-2 bonded with the sub-arrays of green color LEDs 1022. In some implementations, the blue color LED devices 1010 can be integrated on a third TFT array backplane device 1040-3, different from the first TFT array backplane device 1040 and the second TFT array backplane device 1040-2, as illustrated in FIG. 10J-2. Similarly, the array of blue color LEDs 1012 formed on the substrate 1001 can be divided into three sub-arrays. Adjacent blue color LEDs 1012 in one sub-array are separated by two other blue color LEDs 1012 in the other two sub-arrays on the substrate 1001.

A third sub-array of blue color LEDs 1012 can be selectively separated from the substrate 1001 and locally bonded on the third TFT backplane device 1040-3, for example, by laser pulses. In some examples, the substrate 1001 is a sapphire substrate. Since sapphire is transparent and GaN (the material of the buffer layer 1013) is opaque (which absorbs light), a GaN film can be photochemically decomposed from the sapphire substrate by a short pulse KrF UV excimer laser with a wavelength of 248 nm or 308 nm, e.g., in a power range of 0.4-0.8 J/cm². The short pulse laser is absorbed by the GaN film to generate a high temperature, e.g., more than 1000° C. Even a brief heating of an interface between the sapphire substrate and the GaN film to >1000° C. can result in decomposition of GaN into Ga, a low melting-point metal, and nitrogen which remains trapped at the interface. By controlling the KrF UV excimer laser pulses, the third sub-array of blue color LEDs 1012 can be locally bonded on the third TFT backplane device 1040-3 through respective intermediate metallic layers 1018 by eutectic bonding. For each blue color LED 1012 injected by the laser pulses, its buffer layer 1013 can become the buffer layer 1013' with a smaller thickness, and the intermediate metallic layer 1018 can become the layer 1018' after the eutectic bonding.

As illustrated in FIG. 10J-2, the other sub-arrays of blue color LEDs 1012 remain formed on the substrate 1001 and can be removed together with the substrate 1001. After the removing, the blue color LED device 1010 becomes the blue color LED device 1010' that includes the first and second sub-arrays of blue color LEDs 1012 on the substrate 1001. Similar to the red color LED device 1030', the blue color LED device 1010' can be reused to bond on another backplane device bonded with (or without) an array of different color LEDs, for example, in FIG. 10P-2. In such a way, the utilization efficiency of the blue color LEDs can be increased.

As illustrated in FIG. 10J-2, the third sub-arrays of blue color LEDs 1012 remain bonded with the third backplane device 1040-3 to form a bonded device 1060-3. Each blue color LED 1012 is bonded to and conductively coupled to a respective drive electrode 1056 of a respective pixel circuit of the third backplane device 1040-3 through a respective intermediate metallic layer 1018'. Adjacent blue color LEDs 1012 that remain bonded on the third backplane device 1040-3 are separated from each other by a space including two drive electrodes 1056 with dielectric spacers 1058 therebetween, which can be used for bonding with two other different color LEDs, as illustrated with further details in FIGS. 10P-2 and 10V-2.

FIGS. 10K to 10N illustrate procedures similar to the procedures in FIGS. 10E to 10H, except that green color LED devices 1020' including remaining first and second sub-arrays of green color LEDs 1022 on the substrates 1021 are used to integrate with the bonded device 1060 including the first backplane device 1040 bonded with the third sub-arrays of red color LEDs 1032.

Figure 10K:
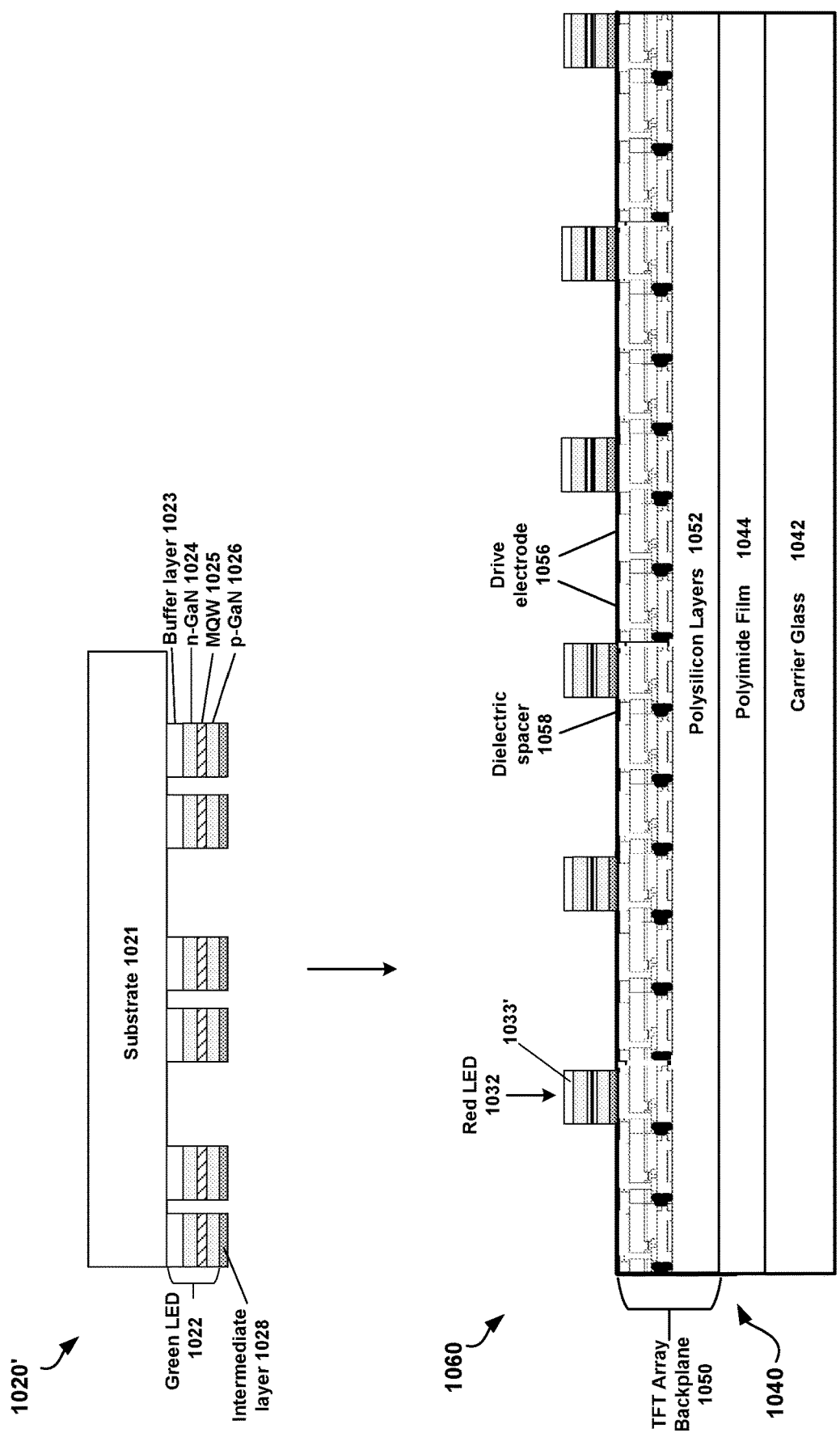
FIG. 10K is a schematic diagram showing aligning the remaining green color LEDs on the second substrate of FIG. 10J-1 onto the first TFT array backplane device bonded with the first array of red color LEDs.

As illustrated in FIG. 10K, a green color LED device 1020', for example, obtained in FIG. 10J-1, is aligned with the bonded device 1060. As discussed above in FIGS. 10I-1 and 10I-2, an array of red color LEDs 1032 are bonded on respective drive electrodes 1056 of the backplane device 1040. Adjacent red color LEDs 1032 are separated by two drive electrodes 1056 and dielectric spacers 1058 therebetween. As discussed above in FIG. 10J-1, the green color LED device 1020' includes an array of green color LEDs 1022 formed on the substrate 1021. Adjacent green color LEDs 1022 are separated by a space that is larger than a size of a green color LED 1022. The red color LED 1032 and the green color LED 1022 can have a substantially same size. Thus, the space between the adjacent green color LEDs 1022 can accommodate to enclose a red color LED 1032.

During the alignment, the green color LED device 1020' can be aligned with the backplane device 1040, for example, optically aligning marks on the substrate 1021 with marks on the backplane device 1040, such that each green color LED 1022 is aligned to a corresponding pixel circuit of the backplane device 1040 between adjacent red color LEDs 1032, e.g., to a drive electrode 1056 of the corresponding pixel circuit in the top layer of the backplane device 1040. The alignment can be similar to the alignment illustrated in FIG. 10E.

As noted above, before the alignment, bonding surfaces, e.g., the respective intermediate metallic layers 1028 of the green color LEDs 1022 and/or the surfaces of the drive electrodes 1056 and the dielectric spacers 1058, can be pre-treated, e.g., by plasma activation.

Figure 10L:
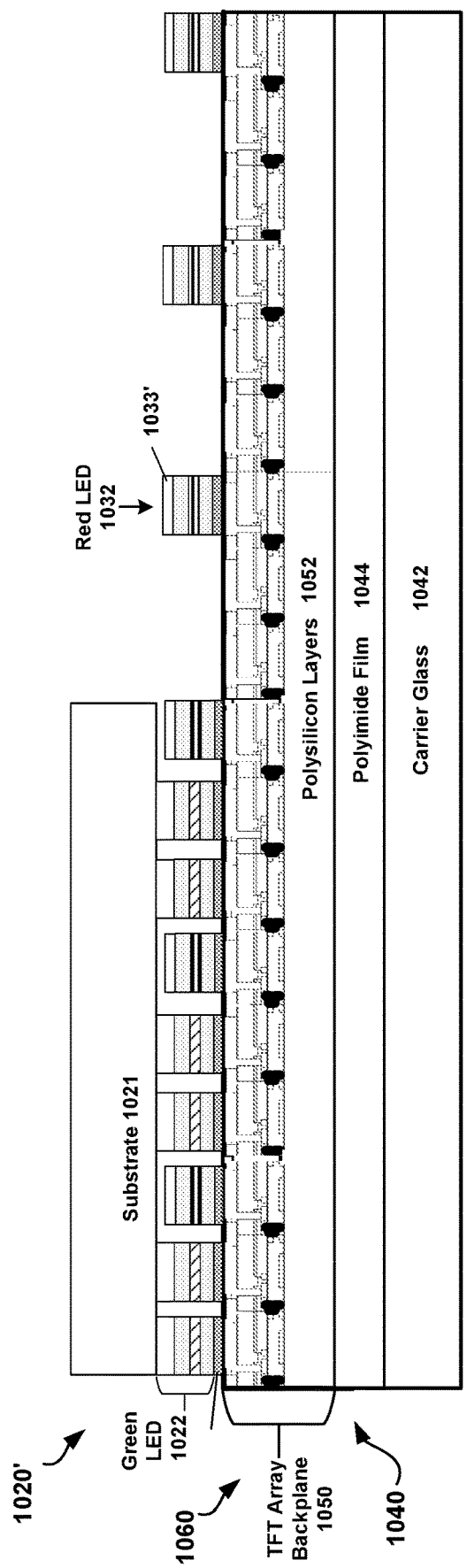
FIG. 10L is a schematic diagram showing integrating the remaining green color LEDs of FIG. 10J-1 on the first TFT array backplane device bonded with the first array of red color LEDs.

After the alignment, as illustrated in FIG. 10L, the green color LED device 1020' can be integrated with the bonded device 1060 by attaching the surfaces of the respective intermediate metallic layers 1028 to the surfaces of the drive electrodes 1056 and/or the dielectric spacers 1058, e.g., by surface adhesion and/or room temperature direct bonding.

As noted above, the red color LED 1032 can have a buffer layer 1033' that has a thickness smaller than the buffer layer 1033 of an original red color LED 1032. That is, the red color LED 1032 bonded on the backplane device 1040 can be lower than the original red color LED 1032. The original green color LED 1022 formed on the substrate 1021 can have the same height as the original red color LED 1032 formed on the substrate 1031. Thus, the red color LED 1032 has a height lower than the height of the green color LED 1022 on the substrate 1021. Accordingly, during the integration, the red color LEDs 1032 bonded on the backplane device 1040 will not obstruct the green color LEDs 1022 attaching to the surfaces of the drive electrodes 1056. After the integration, as illustrated in FIG. 10L, the intermediate metallic layers 1028 on the green color LEDs 1022 are attached to the surfaces of the drive electrodes 1056, while the buffer layers 1033' of the red color LEDs 1032 do not touch the surface of the substrate 1021.

Figure 10M:
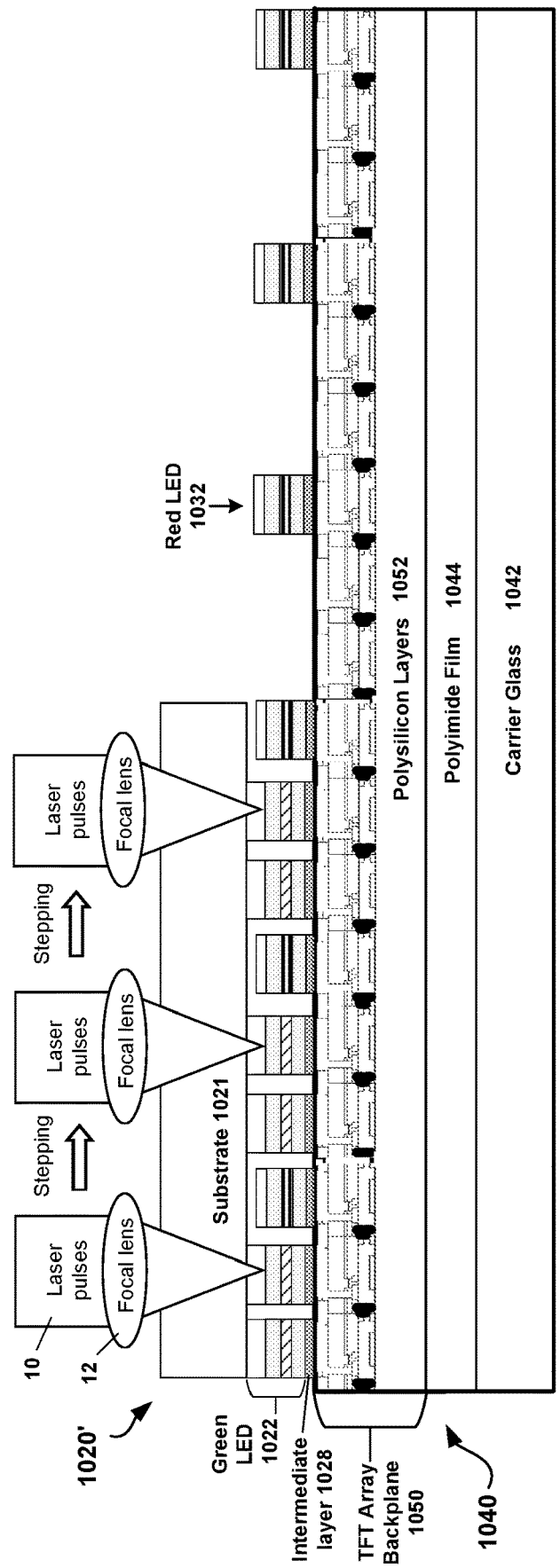
FIG. 10M is a schematic diagram showing an example process of using laser pulses to individually separate a second array of green color LEDs from the second substrate and bond the second array of green color LEDs on the first TFT array backplane device.

FIG. 10M is a schematic diagram showing an example process of using laser pulses 10 to individually separate a second sub-array of green color LEDs 1022 from the second substrate 1021 and bond the second array of green color LEDs 1022 on the first TFT array backplane device 1040. The process of FIG. 10M can be similar to the process of FIG. 10G. Also as discussed above in FIG. J-1, the substrate 1021 can be a sapphire substrate. Since sapphire is transparent and GaN (the material of the buffer layer 1023) is opaque (which absorbs light), a GaN film can be photochemical decomposed from the sapphire substrate by a short pulse KrF UV excimer laser with a wavelength of 248 nm or 308 nm, e.g., in a power range of 0.4-0.8 J/cm$^2$. By controlling the KrF UV excimer laser pulses, the second sub-array of green color LEDs 1022 can be locally bonded on the first TFT backplane device 1040 through respective intermediate metallic layers 1028 by eutectic bonding.

Then, the substrate 1021 can be removed from the first TFT array backplane device 1040. As the second sub-array of green color LEDs 1022 is bonded on corresponding drive electrodes 1056 of the backplane device 1040 through the respective intermediate metallic layers 1028 by eutectic bonding, the second sub-array of LEDs 1022 remains bonded on the backplane device 1040 when the substrate 1021 is removed. The remaining first sub-array of green color LEDs 1022 without the injection of the laser pulses 10 remain formed on the substrate 1021 and can be detachably removed from the backplane device 1040, together with the substrate 1021.

Figure 10N:
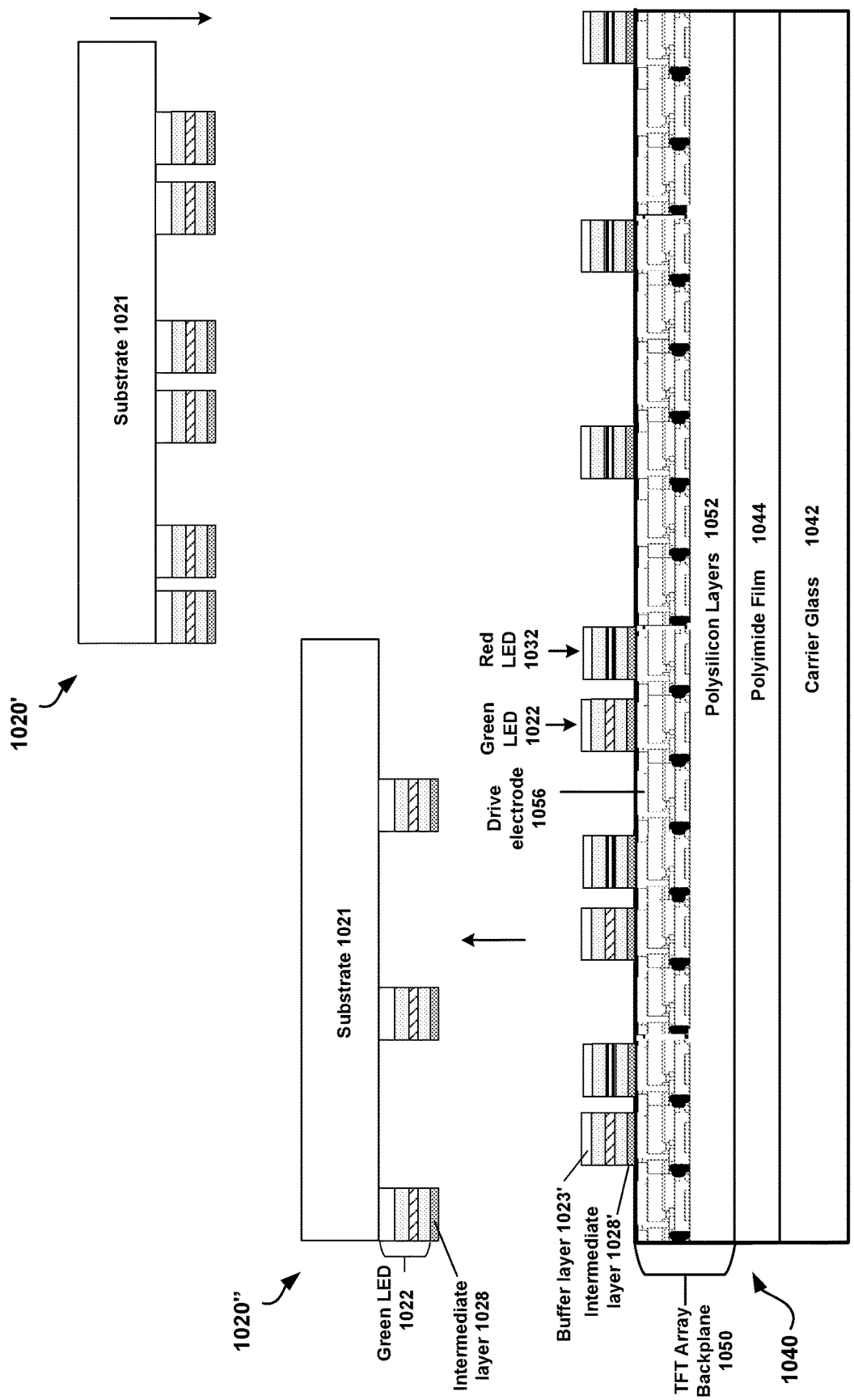
FIG. 10N is a schematic diagram showing removing the second substrate with the remaining third array of green color LEDs from the first TFT array backplane device and integrating another remaining green color LEDs formed on another second substrate on a different region of the first TFT array backplane device.

As illustrated in FIG. 10N, after the removing, the green color LED device 1020' becomes the green color LED device 1020" that includes the substrate 1021 and the remaining first sub-array of green color LEDs 1022. Adjacent green color LEDs 1022 in the first sub-array that remain on the substrate 1021 are separated by a space caused by the separation of the second and third sub-arrays of green color LED 1022 by the laser pulses 10. The green color LED device 1020" can be similar to the green color LED device 420 of FIG. 4C-1 and can be reused to bond on another backplane device bonded with (or without) an array of different color LEDs, for example, in FIG. 10V-2. In such a way, the utilization efficiency of the green color LEDs can be further increased.

Also as illustrated in FIG. 10N, after the removing, the second sub-array of green color LEDs 1022 remains bonded on the backplane device 1040. Due to the eutectic bonding, the respective intermediate metallic layer 1028 between the particular green color LED 1022 and the drive electrode 1056 may be changed to an intermediate metallic layer 1028'. Due to decomposition by the laser pulses 10, part of the buffer layer 1023 of each particular green color LED 1022 may be removed, and the buffer layer 1023 may be changed to the buffer layer 1023' that has a smaller thickness than the buffer layer 1023.

Similar to FIG. 10H, FIG. 10 N illustrates that multiple green color LED devices 1020' can be sequentially bonded on different regions of the backplane device 1040. After a first blue color LED device 1020' is removed from the TFT backplane device 1040, with a second sub-array of green color LEDs 1022 remaining bonded on a first region of the backplane device 1040, a second green color LED device 1020' is aligned and bonded onto a second region of the backplane device 1040, the second region being adjacent to the first region. The second green color LED device 1020' can be processed in the same way as the first green color LED device 1020' as illustrated in FIGS. 10K to 10N.

FIGS. 10O-1 and 10O-2 show a bonded device 1070 obtained by laser-assisted bonding multiple green color LED devices 1020' onto the bonded device 1060 including the first TFT array backplane device 1040 bonded with the third sub-arrays of red color LEDs 1032 and then removing the substrates 1021 with the remaining first sub-array of green color LEDs 1022 from the first backplane device 1040. The second sub-arrays of green color LEDs 1022 are separated from the substrates 1021 and remain bonded on the first backplane device 1040.

The bonded device 1070 can be similar to the bonded device 470 of FIGS. 4H-1 and 4H-2, except that, each green color LED 1022 is bonded to and conductively coupled to a respective drive electrode 1056 of a respective pixel circuit of the backplane device 1040 through a respective intermediate metallic layer 1028'. Each green color LED 1022 has a buffer layer 1023' that has a smaller thickness than the original green color LED 1022, which can be beneficial to integrate with other color LED arrays, as illustrated below in FIG. 10R. On the backplane device 1040, each green color LED 1022 is adjacent to a corresponding red color LED 1032. Adjacent green color LEDs 1022 are separated by an adjacent red color LED 1032 and a drive electrode 1056 that can be further bonded with a blue color 1012, as discussed further in FIG. 10S.

Figures 1, 10P:
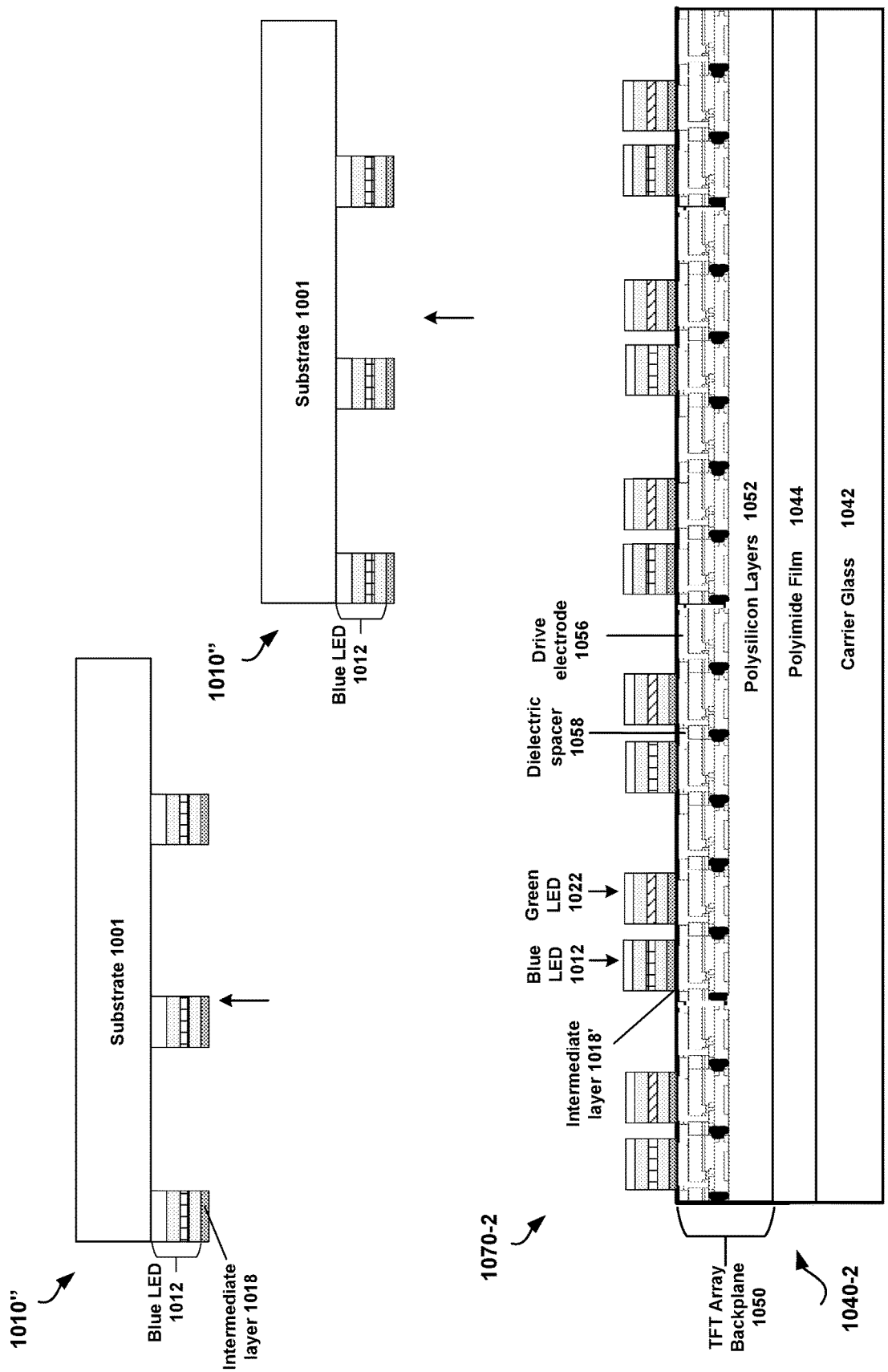
Figures 2, 10P:
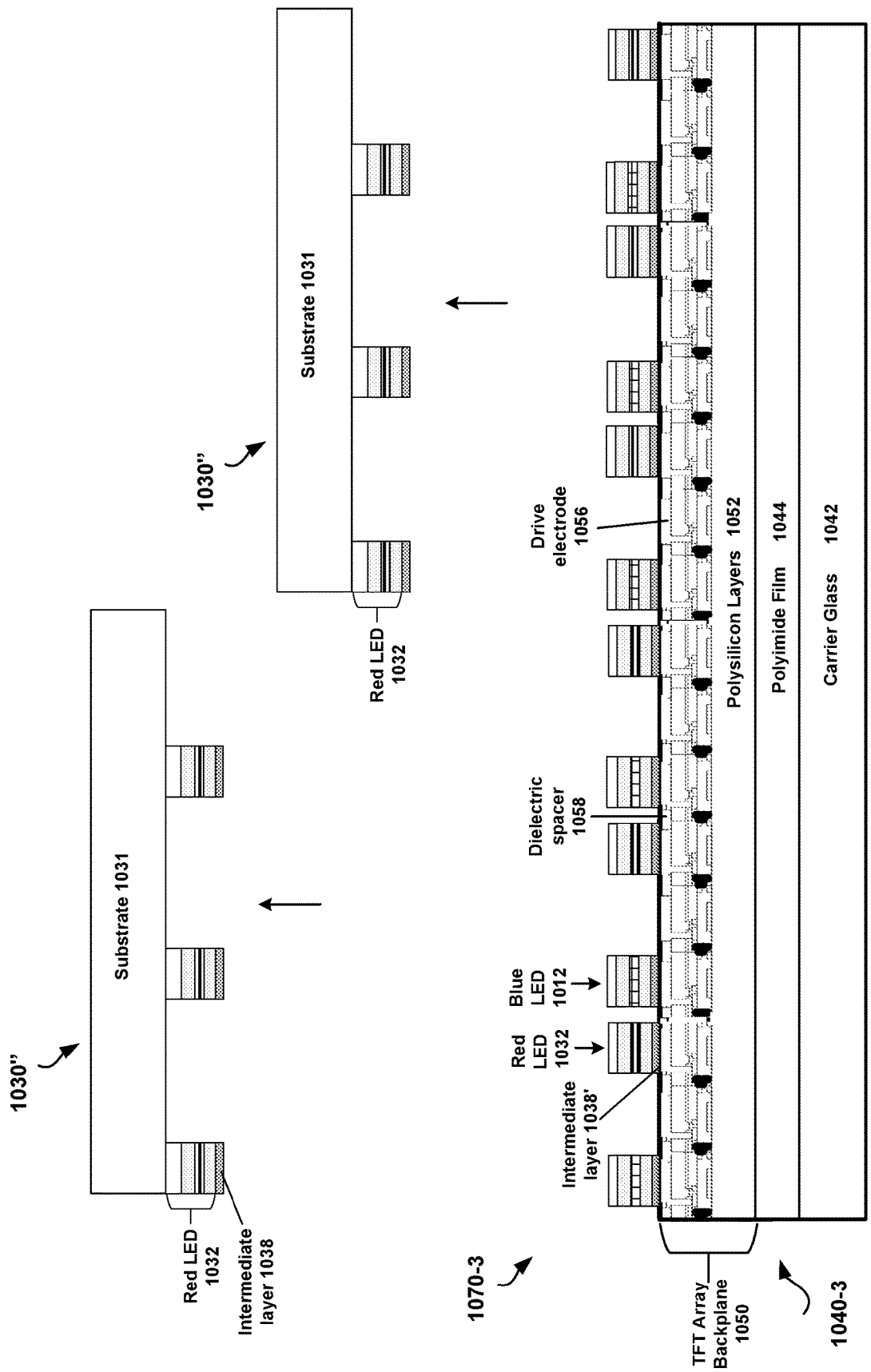

Similarly, as illustrated in FIG. 10P-1, multiple blue color LED devices 1010' with first and second sub-arrays of blue color LEDs 1012 (formed in FIG. 10J-2) can be processed according to the procedures described in FIGS. 10K to 10N for multiple green color LED devices 1020'. The blue color LED devices 1010' can be integrated on the bonded device 1060-2 (formed in FIG. 10J-1) including the second TFT array backplane device 1040-2 bonded with an array of green color LEDs 1022.

A second sub-array of blue color LEDs 1012 can be selectively separated from the substrate 1011 and locally bonded on the second TFT backplane device 1040-2, for example, by laser pulses. As discussed above, the substrate 1001 can be a sapphire substrate. Since sapphire is transparent and GaN (the material of the buffer layer 1013) is opaque (which absorbs light), a GaN film can be photochemically decomposed from the sapphire substrate by a short pulse KrF UV excimer laser with a wavelength of 248 nm or 308 nm, e.g., in a power range of 0.4-0.8 J/cm$^2$. The short pulse laser is absorbed by the GaN film to generate a high temperature, e.g., more than 1000° C. Even a brief heating of an interface between the sapphire substrate and the GaN film to >1000° C. can result in decomposition of GaN into Ga, a low melting-point metal, and nitrogen which remains trapped at the interface. By controlling the KrF UV excimer laser pulses, the second sub-array of blue color LEDs 1012 can be locally bonded on the second TFT backplane device 1040-2 through respective intermediate metallic layers 1018 by eutectic bonding.

As illustrated in FIG. 10P-1, the remaining first sub-array of blue color LEDs 1012 remain formed on the substrate 1001 and can be removed together with the substrate 1001. After the removing, the blue color LED device 1010' becomes the blue color LED device 1010" that includes the first sub-array of blue color LEDs 1012 on the substrate 1001. Similar to the green color LED device 1020", the blue color LED device 1010" can be reused to bond on another backplane device bonded with (or without) an array of different color LEDs, for example, in FIG. 10Q. In such a way, the utilization efficiency of the blue color LEDs can be further increased.

As illustrated in FIG. 10P-1, the second sub-arrays of blue color LEDs 1012 remain bonded with the second backplane device 1040-2 to form a bonded device 1070-2. Each blue color LED 1012 is bonded to and conductively coupled to a respective drive electrode 1056 of a respective pixel circuit of the second backplane device 1040-2 through a respective intermediate metallic layer 1018'. Adjacent blue color LEDs 1012 that remain bonded on the second backplane device 1040-2 are separated from each other by an adjacent green color LED 1022 and a drive electrode 1056, which can be used for bonding with a red color LED 1032, as illustrated with further details in FIG. 10V-1.

Similarly, as illustrated in FIG. 10P-2, multiple red color LED devices 1030' with first and second sub-arrays of red color LEDs 1032 (formed in FIG. 10H) can be processed according to the procedures described in FIGS. 10K to 10N for multiple green color LED devices 1020'. The red color LED devices 1030' can be integrated on the bonded device 1060-3 (formed in FIG. 10J-2) including the third TFT array backplane device 1040-3 bonded with an array of blue color LEDs 1012.

A second sub-array of red color LEDs 1032 can be selectively separated from the substrate 1031 and locally bonded on the third TFT backplane device 1040-3, for example, by laser pulses. By controlling the laser pulses, the second sub-array of red color LEDs 1032 can be locally bonded on the third TFT backplane device 1040-3 through respective intermediate metallic layers 1038 by eutectic bonding.

As illustrated in FIG. 10P-2, the remaining first sub-array of red color LEDs 1032 remain formed on the substrate 1031 and can be removed together with the substrate 1031. After the removing, the red color LED device 1030' becomes the red color LED device 1030" that includes the first sub-array of red color LEDs 1032 on the substrate 1031. Similar to the green color LED device 1020", the red color LED device 1030" can be reused to bond on another backplane device bonded with (or without) an array of different color LEDs, for example, in FIG. 10V-1. In such a way, the utilization efficiency of the red color LEDs can be further increased.

As illustrated in FIG. 10P-2, the second sub-arrays of red color LEDs 1032 remain bonded with the third backplane device 1040-3 to form a bonded device 1070-3. Each red color LED 1032 is bonded to and conductively coupled to a respective drive electrode 1056 of a respective pixel circuit of the third backplane device 1040-3 through a respective intermediate metallic layer 1038'. Adjacent red color LEDs 1032 that remain bonded on the third backplane device 1040-3 are separated from each other by an adjacent blue color LED 1012 and a drive electrode 1056, which can be used for bonding with a green color LED 1022, as illustrated with further details in FIG. 10V-2.

FIGS. 10Q to 10T illustrate procedures similar to the procedures in FIGS. 10E to 10H or FIGS. 10K to 10N, except that blue color LED devices 1010" including remaining first sub-arrays of blue color LEDs 1012 on the substrates 1001 are used to integrate with the bonded device 1070 including the first backplane device 1040 bonded with the third sub-arrays of red color LEDs 1032 and the second sub-arrays of green color LEDs 1022.

Figure 10Q:
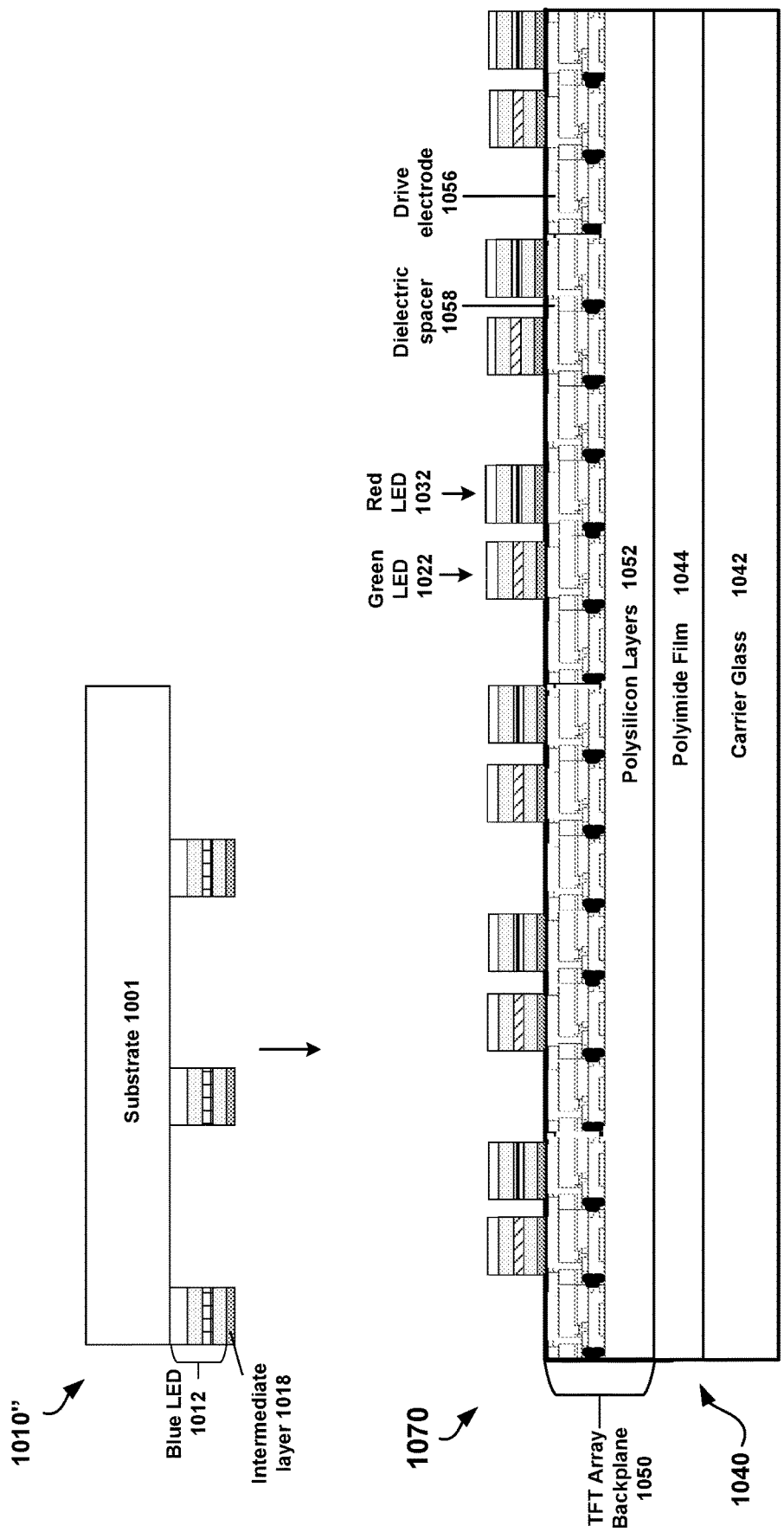
FIG. 10Q is a schematic diagram showing aligning the remaining blue color LEDs on the first substrate of FIG. 10P-1 onto the first TFT array backplane device bonded with the first array of red color LEDs and the second array of green color LEDs.

As illustrated in FIG. 10Q, a blue color LED device 1010", for example, obtained in FIG. 10P-1, is aligned with the bonded device 1070. As discussed above in FIGS. 10O-1 and 10O-2, an array of red color LEDs 1032 and an array of green color LEDs 1022 are bonded on respective drive electrodes 1056 of the backplane device 1040. Adjacent green color LEDs 1022 are separated by an adjacent red color LED 1032 and a drive electrode 1056 that can be further bonded with a blue color 1012.

As discussed above in FIG. 10P-1, the blue color LED device 1010" includes a first sub-array of blue color LEDs 1012 formed on the substrate 1001. Adjacent blue color LEDs 1012 are separated by a space that is larger than twice of a size of a blue color LED 1012. The blue color LED 1012, the red color LED 1032 and the green color LED 1022 can have a substantially same size. Thus, the space between the adjacent blue color LEDs 1012 on the substrate 1001 can accommodate to enclose a red color LED 1032 and a green color LED 1022 on the backplane device 1040.

During the alignment, the blue color LED device 1010" can be aligned with the backplane device 1040, for example, optically aligning marks on the substrate 1001 with marks on the backplane device 1040, such that each blue color LED 1012 is aligned to a corresponding pixel circuit of the backplane device 1040, e.g., to a drive electrode 1056 of the corresponding pixel circuit in the top layer of the backplane device 1040. The alignment can be similar to the alignment illustrated in FIG. 10E.

As noted above, before the alignment, bonding surfaces, e.g., the respective intermediate metallic layers 1018 of the blue color LEDs 1012 and/or the surfaces of the drive electrodes 1056 and the dielectric spacers 1058, can be pre-treated, e.g., by plasma activation.

Figure 10R:
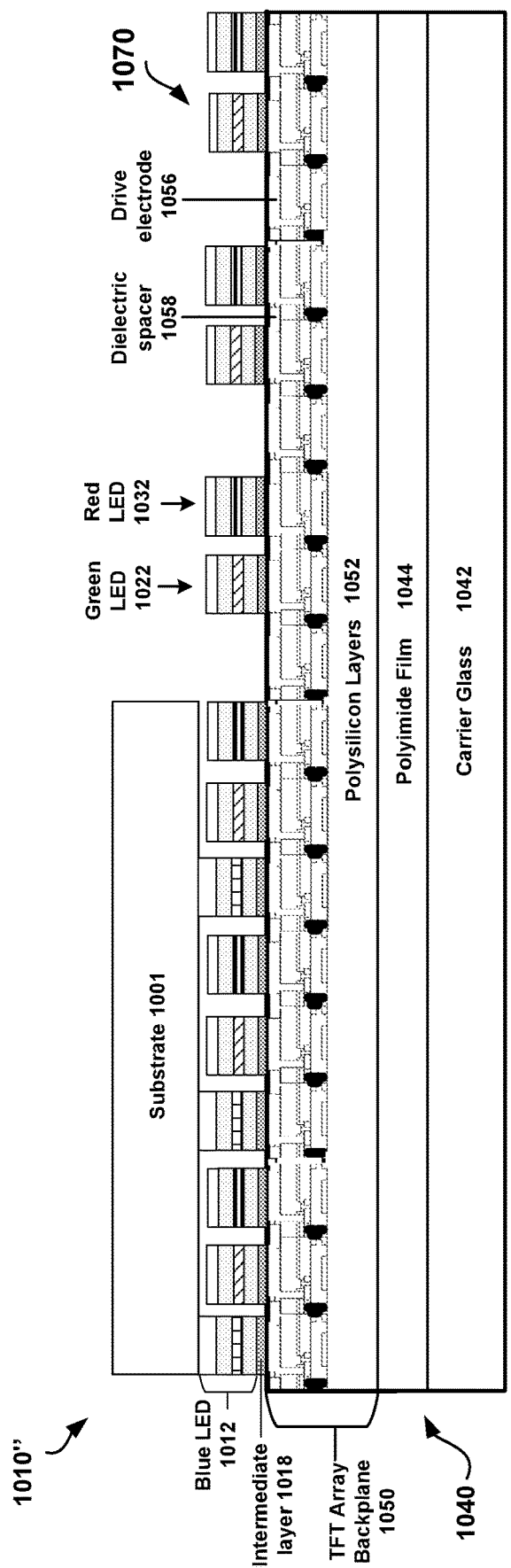
FIG. 10R is a schematic diagram showing integrating the remaining third array of blue color LED arrays of FIG. 10P-1 on the first TFT array backplane device bonded with the first array of red color LEDs and the second array of green color LEDs.

After the alignment, as illustrated in FIG. 10R, the blue color LED device 1010" can be integrated with the bonded device 1070 by attaching the surfaces of the respective intermediate metallic layers 1018 to the surfaces of the drive electrodes 1056 and/or the dielectric spacers 1058, e.g., by surface adhesion and/or room temperature direct bonding.

As noted above, the red color LED 1032 can have a buffer layer 1033' that has a thickness smaller than the buffer layer 1033 of an original red color LED 1032. That is, the red color LED 1032 bonded on the backplane device 1040 can be lower than the original red color LED 1032. Similarly, the green color LED 1022 bonded on the backplane device 1040 can be lower than the original green color LED 1022. The original blue color LED 1012 formed on the substrate 1001 can have the same height as the original red color LED 1032 formed on the substrate 1031 (in FIG. 10D) and the original green color LED 1022 formed on the substrate 1021 (in FIG. 10C).

Thus, the red color LED 1032 and the green color LED 1022 on the backplane device 1040 have a height lower than the height of the blue color LED 1012 on the substrate 1001. Accordingly, during the integration, the red color LEDs 1032 and the green color LEDs 1022 bonded on the backplane device 1040 will not obstruct the blue color LEDs 1012 attaching to the drive electrodes 1056 through respective intermediate metallic layers 1018. After the integration, as illustrated in FIG. 10R, the intermediate metallic layers 1018 on the blue color LEDs 1012 are attached to the surfaces of the drive electrodes 1056, while the buffer layers 1033' and 1023' of the red color LEDs 1032 and the green color LEDs 1022 do not touch the surface of the substrate 1001.

Figure 10S:
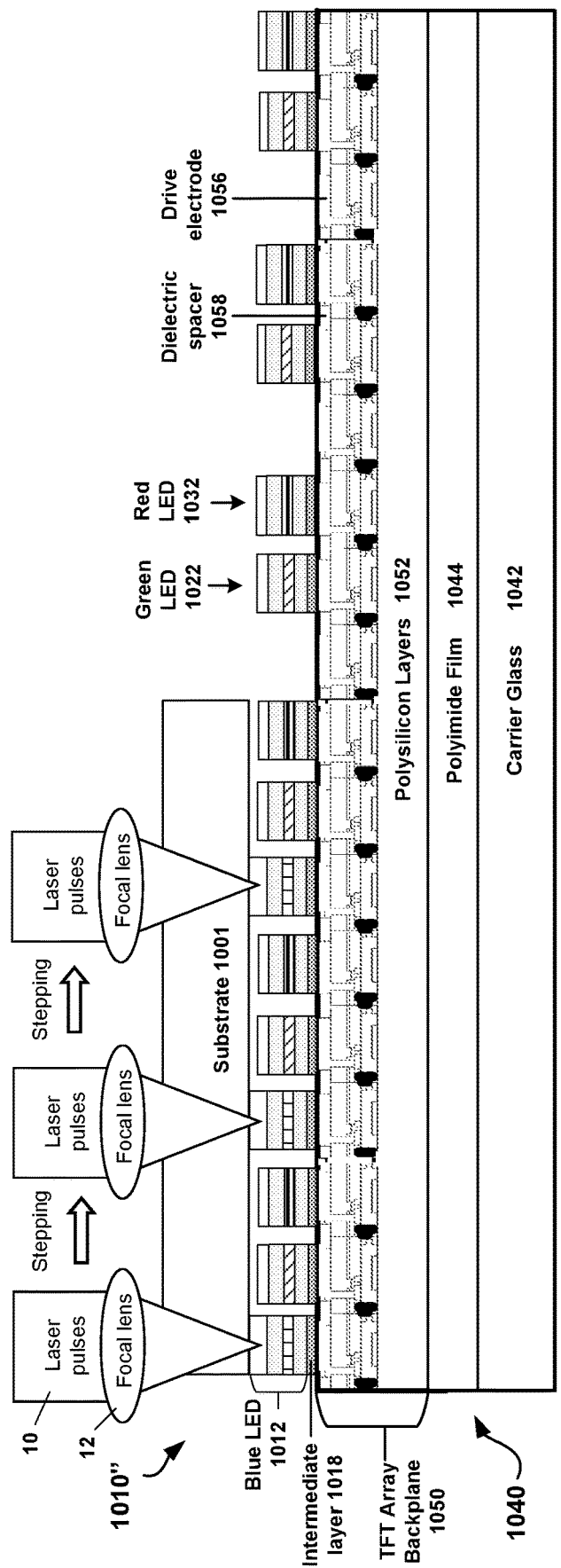
FIG. 10S is a schematic diagram showing an example process of using laser pulses to individually separate the third array of blue color LEDs from the first substrate and bond the third array of blue color LEDs on the first TFT array backplane device.

FIG. 10S is a schematic diagram showing an example process of using laser pulses 10 to individually separate the remaining first sub-array of blue color LEDs 1012 from the substrate 1001 and bond the first sub-array of blue color LEDs 1012 on the first TFT array backplane device 1040. The process of FIG. 10S can be similar to the process of FIG. 10G or 10M.

Also as discussed above in FIG. 10J-2, the substrate 1001 can be a sapphire substrate. Since sapphire is transparent and GaN (the material of the buffer layer 1013) is opaque (which absorbs light), a GaN film can be photochemically decomposed from the sapphire substrate by a short pulse KrF UV excimer laser with a wavelength of 248 nm or 308 nm, e.g., in a power range of 0.4-0.8 J/cm$^2$. The short pulse laser is absorbed by the GaN film to generate a high temperature, e.g., more than 1000° C. Even a brief heating of an interface between the sapphire substrate and the GaN film to >1000° C. can result in decomposition of GaN into Ga, a low melting-point metal, and nitrogen which remains trapped at the interface. By controlling the KrF UV excimer laser pulses, the first sub-array of blue color LEDs 1012 can be locally bonded on the backplane device 1040 through respective intermediate metallic layers 1018 by eutectic bonding.

Then, the substrate 1001 can be removed from the first TFT array backplane device 1040. As the first sub-array of blue color LEDs 1012 is bonded on corresponding drive electrodes 1056 of the backplane device 1040 through the respective intermediate metallic layers 1028 by eutectic bonding, the remaining first sub-array of blue color LEDs 1012 remains bonded on the backplane device 1040 when the substrate 1001 is removed.

Figure 10T:
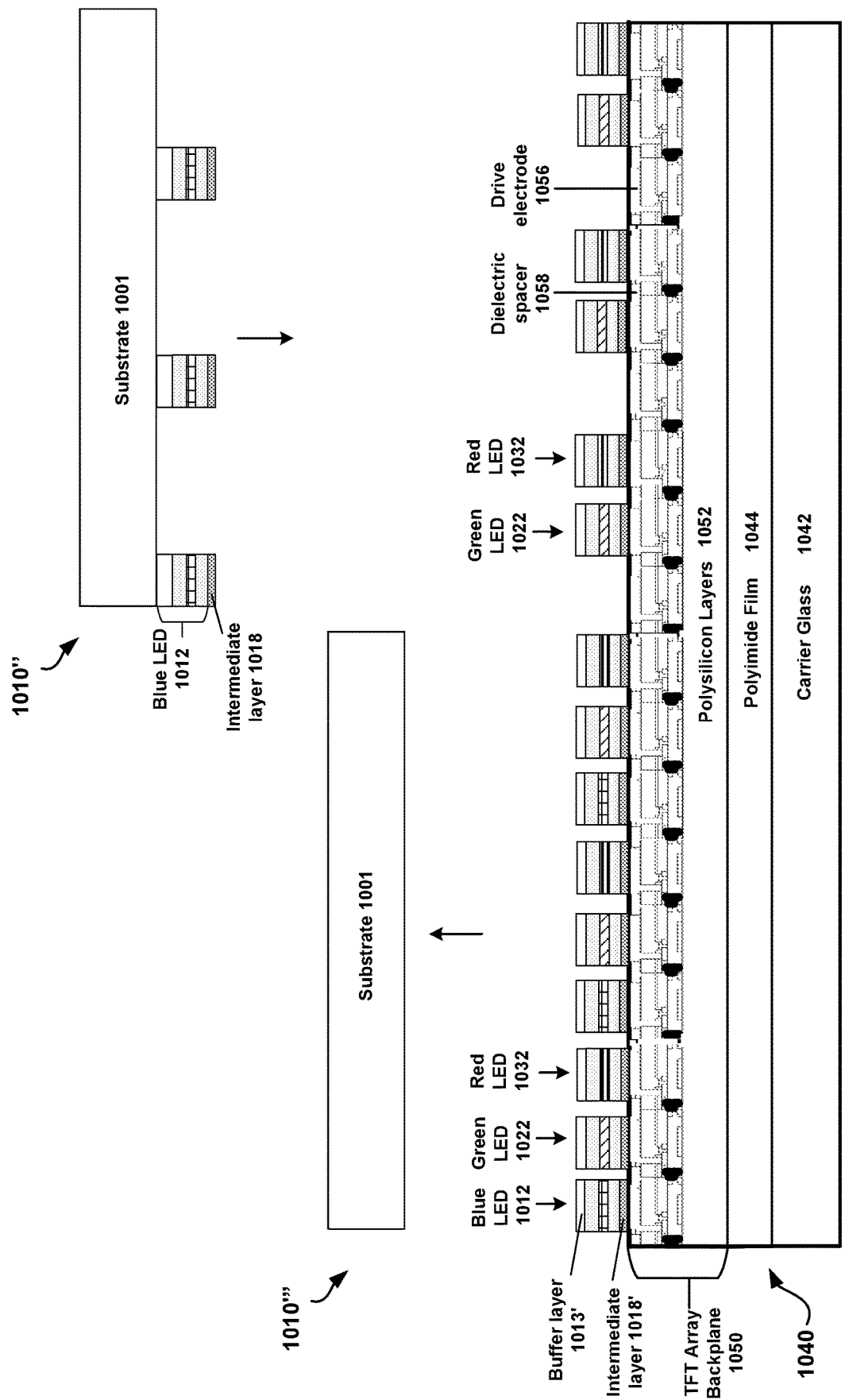
FIG. 10T is a schematic diagram showing removing the first substrate from the first TFT array backplane device and integrating another remaining third array of blue color LEDs formed on another first substrate of FIG. 10P-1 on a different region of the first TFT array backplane device.

As illustrated in FIG. 10T, after the removing, the blue color LED device 1010" becomes the blue color LED device 1010''' that includes only the empty substrate 1001. No blue color LED is left on the substrate 1001. That is, all the blue color LEDs formed on the substrate 1001 in FIG. 10B have been utilized with 100% efficiency. The empty substrate 1001 can be cleaned and reused.

Also as illustrated in FIG. 10T, after the removing, the first sub-array of blue color LEDs 1012 remains bonded on the backplane device 1040. Due to the eutectic bonding, the respective intermediate metallic layer 1018 between the particular blue color LED 1012 and the drive electrode 1056 may be changed to an intermediate metallic layer 1018'. Due to decomposition by the laser pulses 10, part of the buffer layer 1013 of each particular red color LED 1012 may be removed, and the buffer layer 1013 may be changed to the buffer layer 1013' that has a smaller thickness than the buffer layer 1013.

Similar to FIGS. 10H and 10N, FIG. 10T illustrates that multiple blue color LED devices 1010" can be sequentially bonded on different regions of the backplane device 1040. After a first blue color LED device 1020" is removed from the backplane device 1040, with a first sub-array of blue color LEDs 1012 remaining bonded on a first region of the backplane device 1040, a second blue color LED device 1010" is aligned and bonded onto a second region of the backplane device 1040, the second region being adjacent to the first region. The second blue color LED device 1010" can be processed in the same way as the first blue color LED device 1010" as illustrated in FIGS. 10Q to 10T.

Figures 1, 10U:
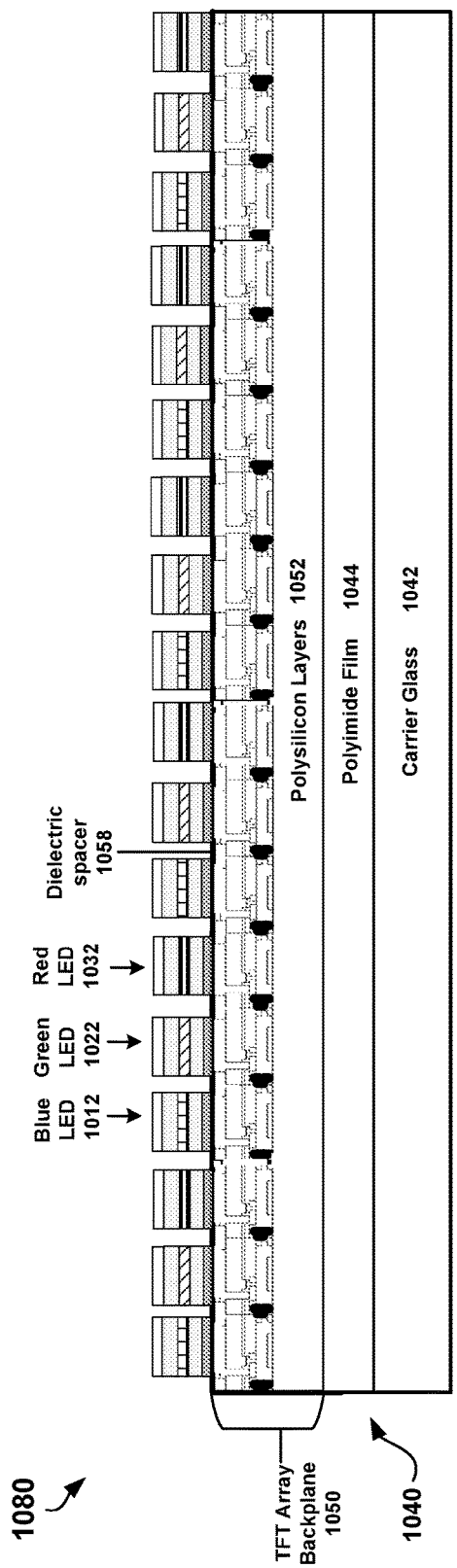
Figures 2, 10U:
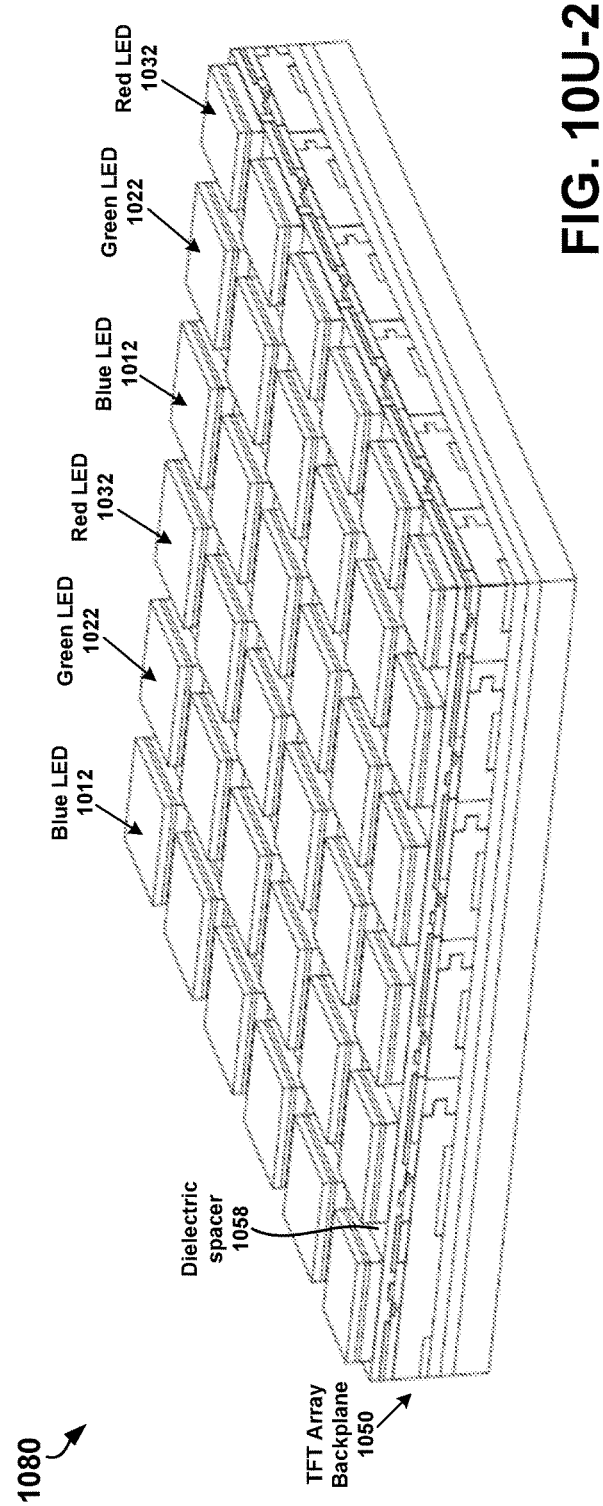

FIGS. 10U-1 and 10U-2 show a bonded device 1080 obtained by laser-assisted bonding multiple blue color LED devices 1020" onto the bonded device 1080 including the first TFT array backplane device 1040 bonded with the third sub-arrays of red color LEDs 1032 and the second sub-arrays of green color LEDs 1022 and then removing the substrates 1001 from the first backplane device 1040. The first sub-arrays of blue color LEDs 1012 are separated from the substrates 1001 and remain bonded on the first backplane device 1040.

The bonded device 1080 can be similar to the bonded device 480 of FIGS. 4J-1 and 4J-2, except that, each of the blue color LEDs 1012, the green color LEDs 1022, and the red color LEDs 1032 is bonded to and conductively coupled to a respective drive electrode 1056 of a respective pixel circuit of the backplane device 1040 through a respective intermediate metallic layer 1018', 1028' or 1038', respectively.

On the bonded device 1080, adjacent LEDs are separated by gaps and are conductively isolated by dielectric spacers 1058 in the gaps. On one hand, to increase a pixel filling coefficient that is defined as a ratio between a light-emitting area in a single pixel and a pixel physical surface area, the gaps between adjacent LEDs should be minimized. On the other hand, the adjacent LEDs should be conductively isolated from each other. The adjacent LEDs are bonded on drive electrodes 1056 of respective pixel circuits that are conductively isolated by dielectric spacers 1058. Thus, a size of an LED (in both row and column) can be configured to be larger than a size of a drive electrode 1056 but smaller than a sum of a size of a drive electrode 1056 and a size of two dielectric spacers 1058.

Figures 1, 10V:
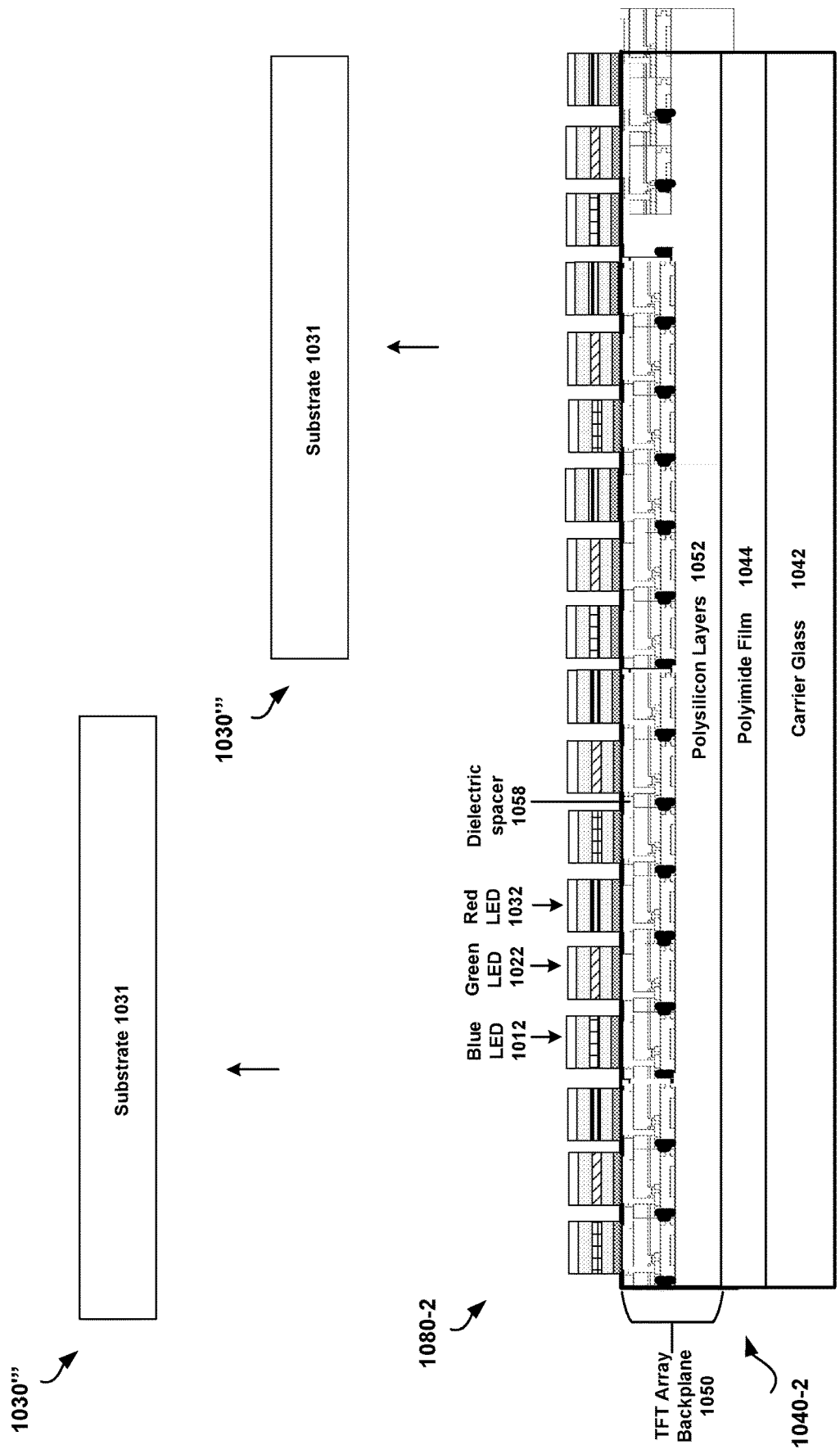
Figures 2, 10V:
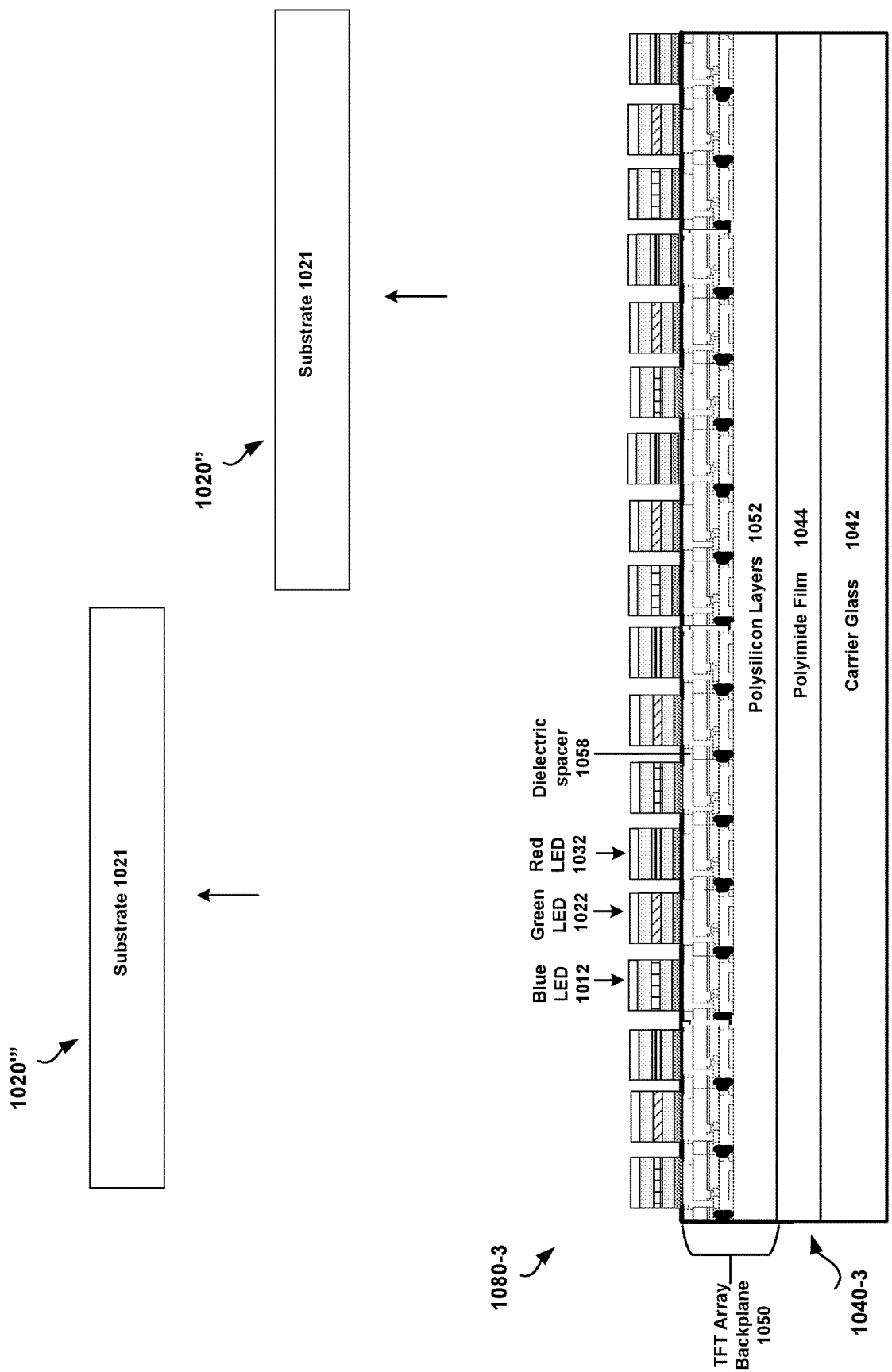

Similarly, as illustrated in FIG. 10V-1, multiple red color LED devices 1030" with first sub-arrays of red color LEDs 1032 (formed in FIG. 10P-2) can be processed according to the procedures described in FIGS. 10Q to 10T for multiple blue color LED devices 1010". The red color LED devices 1030" can be integrated on the bonded device 1070-2 (formed in FIG. 10P-1) including the second TFT array backplane device 1040-2 bonded with an array of green color LEDs 1022 and an array of blue color LEDs 1012.

The remaining first sub-array of red color LEDs 1032 can be selectively separated from the substrate 1031 and locally bonded on the second TFT backplane device 1040-2, for example, by laser pulses. As illustrated in FIG. 10V-1, no red color LEDs 1032 is left on the substrate 1031 and the substrate 1031 becomes an empty substrate. After the removing, the red color LED device 1030" becomes the red color LED device 1010''' that includes only the empty substrate 1031. That is, all the red color LEDs 1032 formed on the substrate 1031 in FIG. 10D have been utilized with an efficiency of 100%. The empty substrate 1031 can be cleaned and reused.

As illustrated in FIG. 10V-1, the remaining first sub-arrays of red color LEDs 1032 remain bonded with the second backplane device 1040-2 to form a bonded device 1080-2. The bonded device 1080-2 can be same as the bonded device 1080 of FIGS. U-1 and U-2. Each of the blue color LEDs 1012, the green color LEDs 1022, and the red color LEDs 1032 is bonded to and conductively coupled to a respective drive electrode 1056 of a respective pixel circuit of the second backplane device 1040-2 through a respective intermediate metallic layer 1018', 1028' or 1038', respectively.

Similarly, as illustrated in FIG. 10V-2, multiple green color LED devices 1020" with first sub-arrays of green color LEDs 1022 (formed in FIG. 10N) can be processed according to the procedures described in FIGS. 10Q to 10T for multiple blue color LED devices 1010". The green color LED devices 1020" can be integrated on the bonded device 1070-3 (formed in FIG. 10P-2) including the third TFT array backplane device 1040-3 bonded with an array of blue color LEDs 1012 and an array of red color LEDs 1032.

The remaining first sub-array of green color LEDs 1022 can be selectively separated from the substrate 1021 and locally bonded on the third TFT backplane device 1040-3, for example, by laser pulses. As illustrated in FIG. 10V-2, no green color LED 1022 is left on the substrate 1021 and the substrate 1021 becomes an empty substrate. After the removing, the green color LED device 1020" becomes the green color LED device 1020''' that includes only the empty substrate 1021. That is, all the green color LEDs 1022 formed on the substrate 1021 in FIG. 10C have been utilized with an efficiency of 100%. The empty substrate 1021 can be cleaned and reused.

As illustrated in FIG. 10V-2, the remaining first sub-arrays of green color LEDs 1022 remain bonded with the third backplane device 1040-3 to form a bonded device 1080-3. The bonded device 1080-3 can be same as the bonded device 1080 of FIGS. U-1 and U-2. Each of the blue color LEDs 1012, the green color LEDs 1022, and the red color LEDs 1032 is bonded to and conductively coupled to a respective drive electrode 1056 of a respective pixel circuit of the third backplane device 1040-3 through a respective intermediate metallic layer 1018', 1028' or 1038', respectively.

The bonded device 1080 (and/or the bonded devices 1080-2, 1080-3) can be further processed according to FIGS. 10W to 10Z that can be similar to FIGS. 4K-4N.

FIG. 10W is a schematic diagram of a device with dielectric spacers filled in the bonded device of FIG. 10U-1. After the bonded device 1080 is formed, an electrically insulative material can be deposited to fill into gaps between adjacent LEDs in the bonded device 1080 to form the isolation spacers 1083. The isolated material can be an opaque dielectric material or a dielectric material with a light-absorbing material such as a black material, such that light from an LED is blocked or eliminated from propagating to an adjacent LED and thus there is no or little cross-talk between the adjacent LEDs. The opaque dielectric material can include silicon nitride (SiNx). SiNx has a hexagonal crystal structure at an ambient pressure and sintered ceramic of this phase is opaque. SiNx can be deposited in the gaps by chemical vapor deposition (CVD).

Then, topology planarization is performed to remove the buffer layers of the LEDs to form a common surface 1084 with exposure of n-contact electrodes of the LEDs, e.g., n-InGaP electrodes 1034 of red color LEDs 1032, n-GaN electrodes 1024 of green color LEDs 1022, and n-GaN electrodes 1014 of blue color LEDs 1012. The common surface 1084 is a surface after the topology planarization and can be a flat surface.

For TFT backplane device formed on the carrier glass 1042, an etch-back planarization can be carried out by isotropic inductive-coupled plasma etching to remove the isolation material and the epitaxial buffer layers or sacrificial layers to expose the n-contact electrodes (e.g., n-GaN layers or n-InGaP layers). The isotropic inductive-coupled plasma etching can be reactive-ion etching with inert gases, such as Argon or xenon. In some cases, etch-back can be further used for thinning the n-contact electrodes by etching a portion of the n-contact electrodes.

In some implementations, a CMOS backplane device is used. After the multiple color LEDs are integrated on the CMOS backplane device and isolation spacers are filled into gaps between adjacent LEDs, a CMP (Chemical-Mechanical-Polishing) planarization can be carried out to remove the isolation material and the epitaxial buffer layers and sacrificial layers to expose n-contact electrodes of the LEDs. The CMP planarization can form a continuous and flat surface across the n-contact electrodes of the LEDs and the isolation spacers therebetween. The CMP process can be further used for thinning the n-contact electrodes of the LEDs by removing a portion of the n-contact electrodes. In some cases, an etch-back planarization can be carried out on the CMOS backplane device, and the etch-back planarization can form a continuous and flat surface across the n-contact electrodes of the LEDs and the isolation spacers therebetween.

FIG. 10X is a schematic diagram of a device 1086 including a transparent conductive layer (or a transparent electrode) 1085 formed on the common surface 1084 of the device 1082 of FIG. 10W. The transparent conductive layer 1085, e.g., an ITO layer, is deposited on top of the common surface 1084 including the surfaces of the n-contact electrodes of the LEDs 1012, 1022, and 1032 to form a common electrode, e.g., an electrical common ground. The transparent conductive layer 1085 can be a flat layer. The device 1086 can be the integrated device 900 of FIGS. 9A-9B.

FIG. 10Y is a schematic diagram of a device 1090 including a transparent protective layer 1088 and a polarizing film 1087 formed on the device 1086 of FIG. 10X. The polarizer film 1087 can be deposited on the transparent conductive layer 1085. The polarizer film 1087 is configured to allow light from the LEDs to propagate through along a polarization direction to become a polarized light, which can also reduce scattering and get more uniform light. The transparent protective layer 1088 can be then formed on the polarizer film 1087. The transparent protective layer 1088 can be a touch-sensitive transparent layer and can form, together with the transparent conductive layer 1085, a capacitive touch screen position sensor. The transparent protective layer 1088 can be made of transparent material, e.g., glass or plastic, coated with a conductive material, e.g., indium tin oxide (ITO).

FIG. 10Z shows a schematic diagram of a device 1092 after removing the carrier glass 1042 from the device 1090 of FIG. 10Y. The integrated device 1090 has the polyimide film 1044 on the carrier glass 1042 as the substrate. To form a flexible device, the carrier glass 1042 can be removed from the integrated device 1090, e.g., by laser lift-off. For example, the polyimide-coated carrier glass 1042 can be delaminated via UV excimer laser lift-off, e.g., at 308 nm, with an ablation threshold, e.g., at 235 mJ/cm^2.

Example Processes Using Laser-Assisted Bonding

FIGS. 11A-11C show example processes of forming integrated devices by laser-assisted bonding different color light emitting elements formed on different substrates onto one or more backplane devices. The integrated devices can be the integrated LED pixel array based display system 100 of FIG. 1, or 900 of FIGS. 9A-9B. The example processes can be similar to the processes described according to FIGS. 10A to 10Z. Compared to the process 700 of FIG. 7, the example processes in FIGS. 11A-11C increase the utilization efficiency of the light emitting elements formed on the substrates to 100%.

FIG. 11A is a flow diagram of an example process 1100 of forming an integrated device by laser-assisted bonding first color light emitting elements formed on a first substrate onto a backplane device. The process 1100 can be similar to the processes described according to FIGS. 10A to 10I-2.

An array of first color light emitting elements and respective first intermediate metallic layers are formed on a first substrate (1102). Each of the first color light emitting elements is configured to emit light with a first color. The array of first color light emitting elements and the respective first intermediate metallic layers can be formed by patterning a first color light emitting structure and a first intermediate metallic film formed on the first substrate. The first color light emitting structure can include multiple semiconductor layers epitaxially grown on the first substrate. The plurality of semiconductor layers can be epitaxial semiconductor layers grown on the substrate, e.g., by MOCVD. For example, the first light emitting structure can include a buffer layer, a first contact electrode layer, e.g., an n-type contact electrode layer, multiple quantum well (MQW) semiconductor layers, and a second contact electrode layer, e.g., a p-type contact electrode layer.

The MQW layers can include Group III-V compounds and be configured to be activated to emit light with the single color. In some examples, the MQW layers include pairs of $In0.3Ga0.7N/GaN$ layers, and the first color light emitting element is a blue color LED, and the first substrate can be a sapphire substrate or a silicon substrate. In some examples, the MQW layers include pairs of $In(0.5)Ga(0.5)N/GaN$ layers, and the first color light emitting element is a green color LED, and the first substrate can be a sapphire wafer or a GaN wafer. In some examples, the MQW layers include pairs of InN/GaN layers, and the first color light emitting element is a red color LED, and the first substrate can be a GaP wafer or a GaN wafer. As noted above, different color LED arrays can be sequentially boned on the backplane device. A sequence of the different color LED arrays can be in any suitable order.

The first intermediate metallic film can be formed, e.g., by sputtering, dual source evaporation or electroplating, on top of the first color light emitting structure, e.g., on the second contact electrode of the structure, e.g., as illustrated in FIG. 10A. The first intermediate metallic film is configured for eutectic bonding. The first intermediate metallic film can include one or more metallic films including: an iridium-tin-oxide (ITO) film with a titanium (Ti) film, a cupper (Cu) film with a Tantalum (Ta) film, an aluminum (Al) film with a Tin (Sn) film, or a gold (Au) or silver (Ag) film with at least one adhesive film including chromium (Cr), Platinum (Pt), Palladium (Pd), or Titanium (Ti).

The first color light emitting structure with the first intermediate metallic layer can be simultaneously patterned according to information of drive electrodes of pixel circuits in a backplane device to be integrated, e.g., as illustrated in FIG. 10B. Each of the pixel circuits includes a drive electrode in a top layer of the pixel circuit that is in a top layer of the backplane. Adjacent drive electrodes are separated by dielectric spacers. The drive electrodes can be formed on the backplane by patterning with a protective mask. The first color light emitting structure with the first intermediate metallic layer can be patterned based on the protective mask for the drive electrodes.

Each first color light emitting element includes first semiconductor layers epitaxially grown on the first substrate and is configured to emit light with a first color. The first semiconductor layers includes a first conductive outer layer, e.g., the p-type electrode layer, on a side of the first semiconductor layers further from the first substrate. A respective first intermediate metallic layer is formed on the first conductive outer layer. Due to simultaneously patterning, each of the first light-emitting elements has a size same as the respective first intermediate conductive layer and is self-aligned with the respective first intermediate conductive layer.

Adjacent first color light emitting elements in the array of first color light emitting elements are separated by a gap. The gap can have a size no larger than a size of the dielectric spacer. The gap can be the substantially same as a distance between adjacent light emitting elements in the formed integrated device. Each of the first color light emitting elements can have a size no smaller than a size of each of the pixel circuits (or a size of a drive electrode) and no larger than a sum of the size of the pixel circuit (e.g., a size of the drive electrode) and twice of the size of the dielectric spacer. In some implementations, the first color light emitting element can have a size substantially same as the size of the drive electrode.

The array of first color light emitting elements formed on the first substrate is integrated with an array of pixel circuits in the backplane device (1104). The backplane device can be a CMOS backplane device or a TFT array backplane device, e.g., the TFT backplane device 440 as illustrated in FIGS. 4D-1 to 4D-3. The backplane device includes at least one backplane having a plurality of pixel circuits. Each of the pixel circuits can include a non-volatile memory including at least one transistor conductively coupled to a corresponding drive electrode in a top layer of the backplane device. The drive electrode can be a conductive outer layer of the pixel circuit. The integration of the array of first color light emitting elements and the array of pixel circuits can include attaching surface of the respective first intermediate metallic layers on the first conductive outer layers (e.g., the p-type electrodes) of the first color light emitting elements to surfaces of the conductive outer layers of the pixel circuits (e.g., surfaces of the corresponding drive electrodes).

To achieve good bonding, one or more to-be-bonded surfaces can be pre-treated to remove any contamination and to increase adhesion between the surfaces. For example, surfaces of the respective first intermediate metallic layers on the first color light emitting elements and/or surfaces of the drive electrodes in the top layer of the backplane device can be pretreated with plasma activation.

Before the integrating, as illustrated in FIG. 10E, the array of first color light emitting elements formed on the first substrate can be aligned with drive electrodes of the respective pixel circuits in the backplane device, for example, by optically aligning marks on the first substrate and marks on the backplane device. After the alignment, as illustrated in FIG. 10F, surfaces of the respective first intermediate metallic layers for the first light emitting elements with surfaces of the conductive outer layers of the pixel circuits can be detachably bonded together, e.g., by surface adhesion and/or room temperature direct bonding.

Laser pulses are selectively injected into particular first color light emitting elements of the array of first color light emitting elements (1106). As illustrated in FIG. 10G, the laser pulses can be controlled such that each of the particular first color light emitting elements is individually separated from the first substrate and locally bonded with a respective particular first pixel circuit of the array of pixel circuits through a respective particular first intermediate metallic layer. For example, the first color light emitting element includes a first buffer layer directly formed on the first substrate. The laser pulses can transmit through the first substrate that can be transparent and be injected on the first buffer layer. The first buffer layer can be photochemically decomposed by the laser pulses and separated from the first substrate.

Meanwhile, the laser pulses can be controlled, e.g., by controlling at least one of a power, a repetition rate, a spot size, or a stepping speed of the laser pulses, such that heat generated by the laser pulses is locally transferred to the respective particular first intermediate metallic layer to cause eutectic bonding between the first conductive outer layer of the particular first color light emitting element, e.g., the p-type electrode, and the conductive outer layer of the respective pixel circuit, e.g., the drive electrode, through the respective particular first intermediate metallic layer.

A spot size of the laser pulses injected into the particular first light emitting element can be no smaller than a size of the particular first light emitting element and no larger than a sum of the size of the particular first color light emitting element and twice of a size of a gap between adjacent first light emitting element. The spot size can be smaller enough to selectively lift off the particular first color light emitting elements from the first substrate and locally cause eutectic bonding between the particular first color light emitting elements and the respective pixel circuits through the respective first intermediate metallic layers, without affecting the adjacent first color light emitting elements.

The laser pulses can be moved to other particular first color light emitting elements for selective separation from the substrate and local bonding with the backplane device. A high precision (e.g., <10 micrometers accuracy) X-Y stepping platform can be used to move the laser pulses in two dimensions. For example, as illustrated in FIG. 10G, the array of first color light emitting elements can be divided into three sub-arrays. Adjacent first color light emitting elements in each sub-array can be separated by two light emitting elements in the other two sub-arrays. The laser pulses can selectively be injected on one of the three sub-arrays.

In some implementations, multiple laser pulse beams can be simultaneously injected into multiple particular first color light emitting elements, which can increase the fabrication speed. The multiple laser pulse beams can be also moved to other particular first color light emitting elements.

The first substrate is removed from the backplane device (1108). As illustrated in FIG. 10H, the particular first color light emitting elements can remain bonded on the backplane device. Each of the particular first color light emitting elements is bonded to and conductively coupled to a respective pixel circuit through a respective particular first intermediate metallic layer.

In some implementations, the backplane device can have a large area to accommodate multiple devices including an array of first color light emitting elements formed on first substrates. The multiple devices can be sequentially bonded on different regions of the backplane device. For example, as illustrated in FIG. 10H, the array of first color light emitting elements can be integrated with the array of pixel circuits in a first region of the backplane device. The process 1100 can further include: integrating another array of first color light emitting elements on another first substrate with another array of pixel circuits in a second region of the backplane device, the second region being adjacent to the first region; selectively injecting the laser pulses into particular another first color light emitting elements of another array of first color light emitting elements, such that each of the particular another first color light emitting elements is individually separated from the another first substrate and locally bonded with a respective particular another pixel circuit of the another array of pixel circuits through a respective particular another first intermediate metallic layer; and removing the another first substrate from the backplane device, with the particular another first color light emitting elements remaining bonded with and conductively coupled to the respective another particular pixel circuits in the second region of the backplane device.

Adjacent particular first color light emitting elements can be separated from each other by one or more additional first color light emitting element in the array of first color light emitting elements. For example, as illustrated in FIG. 10G, the particular first color light emitting elements can be a third sub-array of the array of first color light emitting elements. The additional first color light emitting elements, that is, first and second sub-arrays, are not affected by the laser pulses and remain formed on the first substrate. Thus, as illustrated in FIG. 10H, removing the first substrate from the backplane device includes removing the first substrate together with the additional first color light emitting elements remaining formed on the first substrate.

Adjacent additional first color light emitting elements that remain formed on the first substrate are separated by a space caused by the separation of the sub-array of particular first color light emitting elements by the laser pulses. As discussed with further details in FIG. 11B, the additional first color light emitting elements on the first substrate can be further used to bond on an array of second pixel circuits bonded with an array of different color light emitting elements, as illustrated in FIG. 10K, 10P-1 or 10P-2. In such a way, the utilization efficiency of the first color light emitting elements can be increased.

Adjacent particular first color light emitting elements that remain bonded on the backplane device are separated from each other by a space including one or more drive electrodes with dielectric spacers therebetween. Thus, as discussed with further details in FIG. 11C, the backplane device bonded with the particular first color light emitting elements can be used for bonding with one or more other different color light emitting elements, as illustrated in FIG. 10K.

Referring to FIG. 11B, an example process 1130 of reusing the remaining first color light emitting elements on the first substrate onto an array of second pixel circuits bonded with second color light emitting elements is shown. The remaining first color light emitting elements on the first substrate can be obtained in step 1108 of FIG. 11A. The array of second pixel circuits can be in a second backplane device different from the backplane device, or in a second region of the backplane device that is different from a first region including the array of pixel circuits.

The first substrate with the additional first color light emitting elements is integrated on the array of second pixel circuits bonded with the array of second color light emitting elements (1132). Each of the second color light emitting elements is configured to emit light with a second color different from the first color. The array of second color light emitting elements are bonded on respective particular second pixel circuits of the array of second pixel circuits and separated from one another by at least one additional second pixel circuit. The array of second color light emitting elements bonded on the array of second pixel circuits can be obtained by the process 1100, e.g., as illustrated in FIG. 10N, 10P-1 or 10P-2. During the integration, respective first intermediate metallic layers on the additional first color light emitting elements can be attached to conductive outer layers (e.g., drive electrodes) of the additional second pixel circuits, e.g., by surface adhesion and/or room temperature direct bonding.

Laser pulses are selectively injected into second particular first color light emitting elements in the additional first color light emitting elements (1134). The laser pulses can be controlled such that each of the second particular first color light emitting elements, e.g., a second sub-array of the array of first color light emitting elements, is individually separated from the first substrate and locally bonded with a respective second pixel circuit of the additional second pixel circuits through a respective second particular first intermediate metallic layer.

The first substrate is removed from the array of second pixel circuits (1136). The second particular first color light emitting elements remain bonded with and are conductively coupled to the respective second pixel circuits of the additional second pixel circuits through the respective second particular first intermediate metallic layers.

In some embodiments, the adjacent particular first color light emitting elements are separated from each other by one of the second particular first color light emitting elements and a third particular first color light emitting element in the array of first color light emitting elements. For example, as noted above, the array of first color light emitting elements can include three sub-arrays. The light emitting elements in the first sub-array are separated from each other by one light emitting element in the second sub-array and one light emitting element in the third sub-array. The first sub-array can be first bonded on the backplane device, e.g., in step 1106 of FIG. 11A, and the second sub-array can be then bonded on the array of second pixel circuits, e.g., in step 1134 of FIG. 11B. Thus, in step 1136, the first substrate can be removed, together with the third sub-array including the third particular first light emitting elements that remain formed on the first substrate.

The first substrate with the third particular first color light emitting elements can be further used to bond on an array of third pixel circuits bonded with arrays of different color light emitting elements, as illustrated in FIG. 10Q, 10V-1 or 10V-2. In such a way, the utilization efficiency of the first color light emitting elements can be further increased. The array of third pixel circuits can be in a third backplane device different from the backplane device and the second backplane device, in a third region of the backplane device that is different from the first region including the array of pixel circuits and the second region including the array of second pixel circuits, or in a fourth region of the second backplane device that is different from a fifth region including the array of second pixel circuits.

In some implementations, as illustrated in FIG. 10R, the first substrate with the third particular first color light emitting elements is integrated on an array of third pixel circuits with an array of second color light emitting elements and an array of third color light emitting elements that are bonded on respective particular third pixel circuits of the array of third pixel circuits. Each of the third color light emitting elements is configured to emit light with a third color different from the first color and the second color. Adjacent third light emitting elements bonded on the array of third pixel circuits can be separated from each other by one of the array of second color light emitting elements and an additional third pixel circuit. During the integrating, respective third particular first intermediate conductive layers on the third particular first light emitting elements can be attached to conductive outer layers (e.g., drive electrodes) of the additional third pixel circuits.

Then, as illustrated in FIG. 10S, laser pulses can be selectively injected into the third particular first light emitting elements, such that each of the third particular first light emitting elements is individually separated from the first substrate and locally bonded with a respective additional third pixel circuit of the additional third pixel circuits through a respective third particular first intermediate metallic layer.

Then, as illustrated in FIG. 10T, the first substrate is removed from the array of third pixel circuits, and the third particular first light emitting elements remain bonded with and conductively coupled to the respective additional third pixel circuits through the respective third particular first intermediate metallic layers. As illustrated in FIGS. 10U-1 and 10U-2, on the array of third pixel circuits, each of the third particular first color light emitting elements is adjacent to a respective second color light emitting element of the second array of second color light emitting elements and a respective third color light emitting element of the array of third color light emitting elements. The first substrate can be an empty substrate without any first color light emitting element left. That is, all the first color light emitting elements formed on the first substrate can be utilized with an efficiency of 100%.

FIG. 11C is a flow diagram of an example process 1150 of laser-assisted selectively bonding second color light emitting elements formed on a second substrate onto the backplane device bonded with the first color light emitting elements, e.g., obtained in step 1108 of FIG. 11A. The example process 1150 can be similar to the processes described in FIGS. 10K to 10N.

On the backplane device, two adjacent particular first color light emitting elements bonded are separated by one or more second pixel circuits of the array of pixel circuits. For example, as illustrated in FIG. 10K, adjacent first color light emitting elements are separated by two pixel circuits (or two drive electrodes) and dielectric spacers therebetween, that can be bonded with two other different color light emitting elements.

An array of second color light emitting elements with respective second intermediate metallic layers formed on a second substrate is integrated with the backplane device bonded with the particular first color light emitting elements (1152). Each of the second color light emitting elements on the second substrate is configured to emit light with a second color different from the first color. Adjacent second color light emitting elements can be separated from each other by a space that can be caused by using laser pulses to separate one second color light emitting element, e.g., as illustrated in FIG. 10H, 10J-1 or 10J-2.

For the integration, the respective second intermediate metallic layers on the second color light emitting elements can be attached to conductive outer layers (e.g., drive electrodes) of the second pixel circuits, e.g., by surface adhesion and/or room temperature direct bonding. The particular first color light emitting elements bonded on the backplane device can be enclosed within the spaces between the second color light emitting elements on the second substrate. A height of each of the array of second color light emitting elements formed on the second substrate can be substantially identical to a height of each of the array of first color light emitting elements formed on the first substrate. Moreover, as noted above, the particular first color light emitting elements boned on the backplane device can have a thickness smaller than the original first color light emitting elements formed on the first substrate. Thus, the particular first color light emitting elements bonded on the backplane device will not obstruct the integration of the second color light emitting elements and the second pixel circuits.

Second laser pulses are selectively injected into particular second light emitting elements of the array of second light emitting elements (1154), such that each of the particular second light emitting elements is individually separated from the second substrate and locally bonded with a respective particular second pixel circuit of the second pixel circuits through a respective particular second intermediate metallic layer.

The second laser pulses can be same as or different from the laser pulses in step 1106 of FIG. 11A. For example, if the first color light emitting element is a red color LED and the first substrate is GaP substrate, UV Excimer laser pulses (with a wavelength at 248 nm or 308 nm) can be used; if the first color light emitting element is a red color LED and the first substrate is GaAs substrate, Nd:YAG laser pulses (with a wavelength of 1064 nm) can be used; if the second color light emitting element is a green color LED and the second substrate is sapphire substrate, UV Excimer laser pulses (with a wavelength at 248 nm or 308 nm) can be used.

The second substrate is removed from the backplane device (1156). As illustrated in FIG. 10N, the particular second light emitting elements remain bonded with and conductively coupled to the respective particular second pixel circuits in the backplane device through the respective particular second intermediate metallic layers. Each of the particular second light emitting elements can be adjacent to a corresponding particular first light emitting element on the backplane device. A distance between the adjacent particular second light emitting element and the corresponding particular first light emitting element can be no larger than a distance between adjacent pixel circuits in the backplane device, e.g., a size of the dielectric spacer between adjacent drive electrodes.

In some implementations, the remaining second color light emitting elements without exposure of the second laser pulses are removed with the second substrate, which can be further used in other applications, as illustrated in FIG. 10Q, 10V-1 or 10V-2.

In some implementations, as illustrated in FIGS. 10O-1 and 10O-2, two adjacent particular second light emitting elements bonded on the backplane device are separated by one of the particular first color light emitting elements boned on the backplane device and at least one third pixel circuit of the second pixel circuits of the array of pixel circuits in the backplane device.

The process 1150 can further include: integrating an array of third color light emitting elements with respective third intermediate metallic layers formed on a third substrate with the backplane device bonded with the particular first light emitting elements and the particular second light emitting elements. Each of the third light emitting elements on the third substrate is configured to emit light with a third color different from the first color and the second color. Each of the third color light emitting elements can be separated from each other by a second space that can accommodate two light emitting elements. The third substrate with the array of third color light emitting elements can be obtained in FIG. 10N, 10P-1 or 10P-2.

A height of each of the array of third light emitting elements formed on the third substrate can be substantially identical to a height of each of the array of second light emitting elements formed on the second substrate that can be substantially identical to a height of each of the array of first light emitting elements formed on the first substrate. Thus, the particular first light emitting elements and the particular second light emitting elements bonded on the backplane device can be enclosed within the second spaces between the third light emitting elements on the third substrate. As illustrated in FIG. 10Q, the array of third color light emitting elements can be integrated with the backplane device by attaching the respective third intermediate metallic layers on the third color light emitting elements to conductive outer layers (e.g., drive electrodes) of the third pixel circuits, e.g., by surface adhesion and/or direct bonding at room temperature.

The third laser pulses are selectively injected into particular third color light emitting elements of the array of third color light emitting elements, such that each of the particular third color light emitting elements is individually separated from the third substrate and locally bonded with a respective particular third pixel circuit of the third pixel circuits through a respective particular third intermediate metallic layer. The third laser pulses can be the same as or different from the second laser pulses or the laser pulses.

The third substrate can be then removed from the backplane device, with the array of third color light emitting elements remaining bonded with and conductively coupled to the respective particular third pixel circuits in the backplane device through the respective particular third intermediate metallic layers. The third substrate can be an empty substrate without any third color light emitting elements left. The third substrate can be cleaned and reused.

As illustrated in FIGS. U-1 and U-2, on the backplane device, each of the particular third color light emitting elements is adjacent to a corresponding particular second color light emitting element, and a corresponding particular first color light emitting element. A distance between the adjacent light emitting elements bonded on the backplane device is no larger than a distance between adjacent pixel circuits in the backplane device.

In some implementations, the particular first color light emitting elements are conductively connected to the particular first pixel circuits to form first sub-pixels of active-matrix multi-color pixels, the particular second light emitting elements are conductively connected to the particular second pixel circuits to form second sub-pixels of the active-matrix multi-color pixels, the particular third light emitting elements are conductively connected to the particular third pixel circuits to form third sub-pixels of the active-matrix multi-color pixels. Each of the active-matrix multi-color pixels can include a first sub-pixel having a particular first light emitting element and a particular first pixel circuit, a second sub-pixel having a particular second light emitting element and a particular second pixel circuit, and a third sub-pixel having a particular third light emitting element and a particular third pixel circuit. The particular first, second, and third light emitting elements in each of the active-matrix multi-color pixels can be adjacent and conductively isolated from each other, and the respective particular first, second, and third pixel circuits can be adjacent and conductively isolated from each other. In some embodiments, each of the active-matrix multi-color pixels includes a red color light-emitting diode (LED), a green color LED, and a blue color LED.

In some implementations, the process 1150 further includes: filling an isolation material in gaps between adjacent particular first color, second color and third color light emitting elements that remain integrated on the backplane device. The isolation material can include an opaque and conductively isolated dielectric material.

Each of the particular first color, second color, third color light emitting elements can include a first contact electrode as a conductive outer layer of the light emitting element and a second contact electrode formed on a buffer layer that is formed on a corresponding substrate. The process 1150 can include planarizing the particular first, second, third color light emitting elements with the isolation material filled in the gaps to remove the buffer layers to form a common surface with exposure of the second contact electrodes of the particular first, second, third color light emitting elements. A transparent conductive layer can be formed on the common surface to form a common electrode for the particular first, second, and third color light emitting elements.

Embodiments of the subject matter and the functional operations described in this specification can be implemented in digital electronic circuitry, in tangibly-embodied computer software or firmware, in computer hardware, including the structures disclosed in this specification and their structural equivalents, or in combinations of one or more of them. Embodiments of the subject matter described in this specification can be implemented as one or more computer programs, i.e., one or more modules of computer program instructions encoded on a tangible non-transitory program carrier for execution by, or to control the operation of, data processing apparatus. Alternatively or in addition, the program instructions can be encoded on an artificially-generated propagated signal, e.g., a machine-generated electrical, optical, or electromagnetic signal, that is generated to encode information for transmission to suitable receiver apparatus for execution by a data processing apparatus. The computer storage medium can be a machine-readable storage device, a machine-readable storage substrate, a random or serial access memory device, or a combination of one or more of them.

The processes and logic flows described in this specification can be performed by one or more programmable computers executing one or more computer programs to perform functions by operating on input data and generating output. The processes and logic flows can also be performed by, and apparatus can also be implemented as, special purpose logic circuitry, e.g., an FPGA (field programmable gate array) or an ASIC (application-specific integrated circuit).

Computers suitable for the execution of a computer program include, by way of example, can be based on general or special purpose microprocessors or both, or any other kind of central processing unit Generally, a central processing unit will receive instructions and data from a read-only memory or a random access memory or both. The essential elements of a computer are a central processing unit for performing or executing instructions and one or more memory devices for storing instructions and data. Generally, a computer will also include, or be operatively coupled to receive data from or transfer data to, or both, one or more mass storage devices for storing data, e.g., magnetic, magneto-optical disks, or optical disks. However, a computer need not have such devices. Moreover, a computer can be embedded in another device, e.g., a mobile telephone, a personal digital assistant (PDA), a mobile audio or video player, a game console, a Global Positioning System (GPS) receiver, or a portable storage device, e.g., a universal serial bus (USB) flash drive, to name just a few.

Computer-readable media suitable for storing computer program instructions and data include all forms of non-volatile memory, media and memory devices, including by way of example semiconductor memory devices, e.g., EPROM, EEPROM, and flash memory devices; magnetic disks, e.g., internal hard disks or removable disks; magneto-optical disks; and CD-ROM and DVD-ROM disks. The processor and the memory can be supplemented by, or incorporated in, special purpose logic circuitry.

While this specification contains many specific implementation details, these should not be construed as limitations on the scope of any invention or on the scope of what may be claimed, but rather as descriptions of features that may be specific to particular embodiments of particular inventions. Certain features that are described in this specification in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. In certain circumstances, multitasking and parallel processing may be advantageous. Moreover, the separation of various system modules and components in the embodiments described above should not be understood as requiring such separation in all embodiments.

Thus, particular embodiments of the subject matter have been described. Nevertheless, it will be understood that various modifications may be made without departing from the spirit and scope of the subject matter. Accordingly, other embodiments are within the scope of the following claims.

What is claimed is:

1. A method of fabricating an integrated device, comprising:
    forming an array of first light emitting elements and respective first intermediate metallic layers on a first substrate, wherein each of the first light emitting elements comprises first semiconductor layers epitaxially grown on the first substrate and is configured to emit light with a first color, the first semiconductor layers comprising a first conductive outer layer on a side of the first semiconductor layers further from the first substrate, a respective first intermediate metallic layer being formed on the first conductive outer layer;
    integrating the array of first light emitting elements formed on the first substrate with an array of pixel circuits in a backplane device by contacting the respective first intermediate metallic layers on the first light emitting elements to conductive outer layers of the pixel circuits, the pixel circuits being conductively isolated from each other;
    injecting laser pulses into particular first light emitting elements from the array of first light emitting elements, such that each of the particular first light emitting elements is individually separated from the first substrate and locally bonded with a respective particular first pixel circuit of the array of pixel circuits through a respective particular first intermediate metallic layer; and
    removing the first substrate from the backplane device, with the particular first light emitting elements remaining bonded with and conductively coupled to the respective particular first pixel circuits in the backplane device through the respective particular first intermediate metallic layers.

2. The method of claim 1, wherein the first semiconductor layers comprise a first buffer layer directly formed on the first substrate, and
    wherein injecting laser pulses into particular first light emitting elements comprises controlling the laser pulses such that
        the first buffer layer is decomposed and separated from the first substrate and
        heat generated in the particular first light emitting elements by the laser pulses is locally transferred to the respective particular first intermediate metallic layer to cause eutectic bonding between the first conductive outer layer of the particular first light emitting element and the conductive outer layer of the respective pixel circuit through the respective particular first intermediate metallic layer.

3. The method of claim 1, wherein adjacent particular first light emitting elements are separated from each other by one or more additional first light emitting element in the array of first light emitting elements, and
    wherein removing the first substrate from the backplane device comprises:
        removing the first substrate together with the additional first light emitting elements remaining formed on the first substrate.

4. The method of claim 3, further comprising:
    integrating the additional first light emitting elements remaining formed on the first substrate with an array of second pixel circuits bonded with an array of second light emitting elements, the array of second light emitting elements being bonded on respective particular second pixel circuits of the array of second pixel circuits and separated from one another by at least one additional second pixel circuit, wherein respective first intermediate metallic layers on the additional first light emitting elements are attached to conductive outer layers of the additional second pixel circuits, and wherein each of the second light emitting elements is configured to emit light with a second color different from the first color;
    injecting the laser pulses into second particular first light emitting elements in the additional first light emitting elements, such that each of the second particular first light emitting elements is individually separated from the first substrate and locally bonded with a respective second pixel circuit of the additional second pixel circuits through a respective second particular first intermediate metallic layer; and
    removing the first substrate from the array of second pixel circuits, with the second particular first light emitting elements remaining bonded with and conductively coupled to the respective second pixel circuits of the additional second pixel circuits through the respective second particular first intermediate metallic layers,
    wherein the array of second pixel circuits is
        in a second backplane device different from the backplane device, or
        in a second region of the backplane device that is different from a first region including the array of pixel circuits.

5. The method of claim 4, wherein the adjacent particular first light emitting elements are separated from each other by one of the second particular first light emitting elements and a third particular first light emitting element in the array of first light emitting elements, wherein removing the first substrate from the array of second pixel circuits comprises: removing the first substrate together with the third particular first light emitting elements that remain formed on the first substrate, wherein the method further comprises:

integrating the third particular first light emitting elements remaining formed on the first substrate with an array of third pixel circuits, wherein a second array of second light emitting elements and an array of third light emitting elements are bonded on respective particular third pixel circuits of the array of third pixel circuits, wherein each of the third light emitting elements is configured to emit light with a third color different from the first color and the second color, wherein adjacent third light emitting elements bonded on the array of third pixel circuits are separated from each other by one of the second array of second light emitting elements and an additional third pixel circuit, and wherein respective third particular first intermediate conductive layers on the third particular first light emitting elements are attached to conductive outer layers of the additional third pixel circuits;

injecting the laser pulses into the third particular first light emitting elements, such that each of the third particular first light emitting elements is individually separated from the first substrate and locally bonded with a respective additional third pixel circuit of the additional third pixel circuits through a respective third particular first intermediate metallic layer; and removing the first substrate from the array of third pixel circuits, with the third particular first light emitting elements remaining bonded with and conductively coupled to the respective additional third pixel circuits through the respective third particular first intermediate metallic layers, wherein, on the array of third pixel circuits, each of the third particular first light emitting elements is adjacent to a respective second light emitting element of the second array of second light emitting elements and a respective third light emitting element of the array of third light emitting elements, and wherein the array of third pixel circuits is
in a third backplane device different from the backplane device and the second backplane device,
in a third region of the backplane device that is different from the first region including the array of pixel circuits and the second region including the array of second pixel circuits, or
in a fourth region of the second backplane device that is different from a fifth region including the array of second pixel circuits.

6. The method of claim 1, wherein injecting laser pulses into particular first light emitting elements of the array of first light emitting elements comprises:
sequentially injecting the laser pulses into the particular first light emitting elements by step by step moving the laser pulses to the particular first light emitting elements.

7. The method of claim 1, wherein a spot size of the laser pulses injected into the particular first light emitting element is no smaller than a size of the particular first light emitting element and
no larger than a sum of the size of the particular first light emitting element and twice of a gap between two adjacent first light emitting elements.

8. The method of claim 1, wherein two adjacent pixel circuits in the backplane device are separated by a dielectric spacer,
wherein adjacent first light emitting elements in the array of first light emitting elements are separated by a gap having a size no larger than a size of the dielectric spacer, and
wherein each of the first light emitting elements has a size no smaller than a size of each of the pixel circuits and no larger than a sum of the size of the pixel circuit and twice of the size of the dielectric spacer.

9. The method of claim 1, wherein integrating the first light emitting elements on the first substrate with the backplane device comprises:
pretreating with plasma activation at least one of surfaces of the respective first intermediate metallic layers for the first light emitting elements or surfaces of the conductive outer layers of the array of pixel circuits.

10. The method of claim 1, wherein integrating the first light emitting elements on the first substrate with the backplane device comprises:
detachably bonding surfaces of the respective first intermediate metallic layers for the first light emitting elements with surfaces of the conductive outer layers of the pixel circuits.

11. The method of claim 1, wherein forming an array of first light emitting elements and respective first intermediate metallic layers on a first substrate comprises:
epitaxially growing multiple first semiconductor films on the first substrate to form a first light emitting structure;
forming a first intermediate metallic film on top of the first light emitting structure on the side further from the first substrate; and
patterning the first light emitting structure and the first intermediate metallic film to form the array of first light emitting elements with the respective first intermediate metallic layers.

12. The method of claim 11, wherein patterning the first light emitting structure and the first intermediate metallic film comprises:
patterning the first light emitting structure and the first intermediate metallic film according to a pattern of the array of pixel circuits in the backplane device, such that each of the array of first light emitting elements is integrated on a respective one of the array of pixel circuits in the backplane device.

13. The method of claim 1, further comprising:
before the integrating, aligning the array of first light emitting elements with the array of pixel circuits in the backplane device.

14. The method of claim 1, wherein integrating the array of first light emitting elements formed on the first substrate on an array of pixel circuits in a backplane device comprises:
integrating the array of first light emitting elements with the array of pixel circuits in a first region of the backplane device, and
wherein the method further comprises:
integrating another array of first light emitting elements on another first substrate with another array of pixel circuits in a second region of the backplane device, the second region being adjacent to the first region;

injecting the laser pulses into particular another first light emitting elements of another array of first light emitting elements, such that each of the particular another first light emitting elements is individually separated from the another first substrate and locally bonded with a respective particular another pixel circuit of the another array of pixel circuits through a respective particular another first intermediate metallic layer; and removing the another first substrate from the backplane device, with the particular another first light emitting elements remaining bonded with and conductively coupled to the respective another particular pixel circuits in the second region of the backplane device.

15. The method of claim 1, wherein each of the pixel circuits comprises a non-volatile memory including at least one transistor conductively coupled to a corresponding drive electrode that is a conductive outer layer of the pixel circuit, the corresponding drive electrodes in adjacent pixel circuits being separated by dielectric spacers, wherein each of the first light emitting elements comprises a corresponding contact electrode as the first conductive outer layer, wherein each of the particular first light emitting elements is conductively coupled to a non-volatile memory in the respective particular first pixel circuit through the corresponding contact electrode of the particular first light emitting element, the respective particular first intermediate metallic layer, and the corresponding drive electrode of the respective first particular pixel circuit, and wherein the corresponding drive electrode has a size substantially same as a size of the particular first light emitting element.

16. The method of claim 1, wherein each of the first light emitting elements comprises:
a buffer layer directly formed on the first substrate,
a first contact electrode formed on the buffer layer,
one or more quantum well layers as an active medium formed on the first contact electrode, and
a second contact electrode formed on the quantum well layers, the second contact electrode being the first conductive outer layer.

17. The method of claim 1, wherein the respective first intermediate metallic layer comprises one or more metallic films including:
an iridium-tin-oxide (ITO) film with a titanium (Ti) film,
a cupper (Cu) film with a Tantalum (Ta) film,
an aluminum (Al) film with a Tin (Sn) film, or
a gold (Au) or silver (Ag) film with at least one adhesive film including chromium (Cr), Platinum (Pt), Palladium (Pd), or Titanium (Ti).

18. The method of claim 1, wherein two adjacent particular first light emitting elements bonded on the backplane device are separated by one or more second pixel circuits of the array of pixel circuits, and wherein the method further comprises:
integrating an array of second light emitting elements with respective second intermediate metallic layers formed on a second substrate with the backplane device bonded with the particular first light emitting elements by contacting the respective second intermediate metallic layers to the second light emitting elements on conductive outer layers of the second pixel circuits, wherein each of the second light emitting elements on the second substrate is configured to emit light with a second color different from the first color and separated from each other by a space, and wherein the particular first light emitting elements bonded on the backplane device are enclosed within the spaces between the second light emitting elements;

injecting second laser pulses into particular second light emitting elements of the array of second light emitting elements, such that each of the particular second light emitting elements is individually separated from the second substrate and locally bonded with a respective particular second pixel circuit of the second pixel circuits through a respective particular second intermediate metallic layer; and removing the second substrate from the backplane device, with the particular second light emitting elements remaining bonded with and conductively coupled to the respective particular second pixel circuits in the backplane device through the respective particular second intermediate metallic layers.

19. The method of claim 18, wherein a height of each of the array of second light emitting elements formed on the second substrate is substantially identical to a height of each of the array of first light emitting elements formed on the first substrate.

20. The method of claim 18, wherein each of the particular second light emitting elements is adjacent to a corresponding particular first light emitting element on the backplane device, and wherein a distance between the particular second light emitting element and the corresponding particular first light emitting element is no larger than a distance between adjacent pixel circuits in the backplane device.

21. The method of claim 18, wherein two adjacent particular second light emitting elements bonded on the backplane device are separated by one of the particular first light emitting elements boned on the backplane device and at least one third pixel circuit of the second pixel circuits of the array of pixel circuits, and wherein the method further comprises:
integrating an array of third light emitting elements with respective third intermediate metallic layers formed on a third substrate with the backplane device bonded with the particular first light emitting elements and the particular second light emitting elements by contacting the respective third intermediate metallic layers on the third light emitting elements to conductive outer layers of the third pixel circuits, wherein each of the third light emitting elements on the third substrate is configured to emit light with a third color different from the first color and the second color and separated from each other by a second space, and wherein the particular first light emitting elements and the particular second light emitting elements bonded on the backplane device are enclosed within the second spaces between the third light emitting elements;

injecting third laser pulses into particular third light emitting elements of the array of third light emitting elements, such that each of the particular third light emitting elements is individually separated from the third substrate and locally bonded with a respective particular third pixel circuit of the third pixel circuits through a respective particular third intermediate metallic layer; and removing the third substrate from the backplane device, with the array of third light emitting elements remaining bonded with and conductively coupled to the respective particular third pixel circuits in the backplane device through the respective particular third intermediate metallic layers.

22. The method of claim 21, wherein the particular first light emitting elements are conductively connected to the particular first pixel circuits to form first sub-pixels of active-matrix multi-color pixels,
  wherein the particular second light emitting elements are conductively connected to the particular second pixel circuits to form second sub-pixels of the active-matrix multi-color pixels,
  wherein the particular third light emitting elements are conductively connected to the particular third pixel circuits to form third sub-pixels of the active-matrix multi-color pixels,
  wherein each of the active-matrix multi-color pixels comprises a first sub-pixel having a particular first light emitting element and a particular first pixel circuit, a second sub-pixel having a particular second light emitting element and a particular second pixel circuit, and a third sub-pixel having a particular third light emitting element and a particular third pixel circuit, and
  wherein the particular first, second, and third light emitting elements in each of the active-matrix multi-color pixels are adjacent and conductively isolated from each other, and the respective particular first, second, and third pixel circuits are adjacent and conductively isolated from each other.

23. The method of claim 21, further comprising:
  filling an isolation material in gaps between adjacent particular first, second and third light emitting elements that remain integrated on the backplane device,
  wherein the isolation material comprises an opaque and conductively isolated dielectric material.

24. The method of claim 23, wherein each of the particular first, second, third light emitting elements comprises a first contact electrode as a conductive outer layer of the light emitting element and a second contact electrode formed on a buffer layer that is formed on a corresponding substrate, and
  wherein the method further comprises:
    planarizing the particular first, second, third light emitting elements with the isolation material filled in the gaps to remove the buffer layers to form a common surface with exposure of the second contact electrodes of the particular first, second, third light emitting elements.

25. The method of claim 24, further comprising:
  forming a transparent conductive layer on the common surface to form a common electrode for the particular first, second, and third light emitting elements.

* * * * *